(12) United States Patent
Hatano et al.

(10) Patent No.: US 12,046,532 B2
(45) Date of Patent: Jul. 23, 2024

(54) POWER MODULE AND FABRICATION METHOD OF THE SAME, GRAPHITE PLATE, AND POWER SUPPLY EQUIPMENT

(71) Applicant: ROHM CO., LTD., Kyoto (JP)

(72) Inventors: Maiko Hatano, Kyoto (JP); Takukazu Otsuka, Kyoto (JP); Hirotaka Otake, Kyoto (JP); Tatsuya Miyazaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/746,760

(22) Filed: May 17, 2022

(65) Prior Publication Data

US 2022/0310479 A1 Sep. 29, 2022

Related U.S. Application Data

(63) Continuation of application No. 15/813,929, filed on Nov. 15, 2017, now Pat. No. 11,367,669.

(51) Int. Cl.
*H01L 23/373* (2006.01)
*H01L 23/00* (2006.01)
(Continued)

(52) U.S. Cl.
CPC ...... *H01L 23/3735* (2013.01); *H01L 23/3675* (2013.01); *H01L 23/373* (2013.01);
(Continued)

(58) Field of Classification Search
None
See application file for complete search history.

(56) References Cited

U.S. PATENT DOCUMENTS 5,721,455 A * 2/1998 Takashita ............... H01L 23/34
257/178
6,831,359 B2 12/2004 Heilbronner
(Continued)

FOREIGN PATENT DOCUMENTS

JP 2002-83915 3/2002
JP 2002-93967 3/2002
(Continued)

OTHER PUBLICATIONS

Y. Yamada, A. Kuno, M. Sawaki, Y. Narita, K.Chikuba, "Study for Power Semiconductor Module Using Carbon-Based Anisotropic Thermal Conducting Material", vol. 50 (2014), pp. 133-137, with English abstract.

(Continued)

*Primary Examiner* — Nishath Yasmeen
(74) *Attorney, Agent, or Firm* — HSML P.C.

(57) ABSTRACT

A power module (PM) includes: an insulating substrate; a semiconductor device disposed on the insulating substrate, the semiconductor device including electrodes on a front surface side and a back surface side thereof; and a graphite plate having an anisotropic thermal conductivity, the graphite plate of which one end is connected to the front surface side of the semiconductor device and the other end is connected to the insulating substrate, wherein heat of the front surface side of the semiconductor device is transferred to the insulating substrate through the graphite plate. There is provide an inexpensive power module capable of reducing a stress and capable of exhibiting cooling performance not inferior to that of the double-sided cooling structures.

23 Claims, 80 Drawing Sheets

(51) Int. Cl.
  *H01L 23/367*    (2006.01)
  *H01L 23/495*    (2006.01)
  *H01L 23/498*    (2006.01)
  *H01L 25/00*     (2006.01)
  *H01L 25/11*     (2006.01)
  *H01L 25/18*     (2023.01)
  *H01L 29/16*     (2006.01)
  *H01L 29/739*    (2006.01)
  *H01L 29/78*     (2006.01)

(52) U.S. Cl.
  CPC .... *H01L 23/4952* (2013.01); *H01L 23/49541* (2013.01); *H01L 23/49838* (2013.01); *H01L 23/49861* (2013.01); *H01L 24/48* (2013.01); *H01L 25/115* (2013.01); *H01L 25/18* (2013.01); *H01L 25/50* (2013.01); *H01L 23/49811* (2013.01); *H01L 23/49877* (2013.01); *H01L 24/32* (2013.01); *H01L 24/33* (2013.01); *H01L 24/40* (2013.01); *H01L 24/73* (2013.01); *H01L 29/1608* (2013.01); *H01L 29/7395* (2013.01); *H01L 29/7397* (2013.01); *H01L 29/7802* (2013.01); *H01L 29/7804* (2013.01); *H01L 29/7805* (2013.01); *H01L 29/7813* (2013.01); *H01L 2224/0603* (2013.01); *H01L 2224/29139* (2013.01); *H01L 2224/32245* (2013.01); *H01L 2224/33181* (2013.01); *H01L 2224/40225* (2013.01); *H01L 2224/40245* (2013.01); *H01L 2224/45124* (2013.01); *H01L 2224/45147* (2013.01); *H01L 2224/48091* (2013.01); *H01L 2224/48106* (2013.01); *H01L 2224/48247* (2013.01); *H01L 2224/73221* (2013.01); *H01L 2224/73263* (2013.01); *H01L 2224/73265* (2013.01); *H01L 2924/10272* (2013.01); *H01L 2924/1203* (2013.01); *H01L 2924/13055* (2013.01); *H01L 2924/13091* (2013.01); *H01L 2924/19107* (2013.01)

(56) References Cited

U.S. PATENT DOCUMENTS

| | | |
|---|---|---|
| 7,760,507 B2 | 7/2010 | Jewram et al. |
| 8,059,408 B2 | 11/2011 | Lemark et al. |
| 8,822,036 B1 | 9/2014 | Wereszezak |
| 9,380,733 B2 | 6/2016 | Nagata et al. |
| 2006/0192253 A1 | 8/2006 | Okumura et al. |
| 2007/0003721 A1 | 1/2007 | Ohta et al. |
| 2008/0203550 A1* | 8/2008 | Ewe .............. H01L 23/4334 438/122 |
| 2009/0137086 A1 | 5/2009 | Otremba et al. |
| 2009/0168354 A1 | 7/2009 | Jewram et al. |
| 2011/0303399 A1* | 12/2011 | Sakimichi .......... H01L 23/36 165/185 |
| 2014/0355218 A1* | 12/2014 | Vinciarelli ......... H05K 5/065 361/728 |
| 2015/0179551 A1 | 6/2015 | Naamura et al. |
| 2016/0093551 A1 | 3/2016 | Venugopal et al. |
| 2017/0213778 A1 | 7/2017 | Yamamoto et al. |
| 2018/0025963 A1* | 1/2018 | Miller .............. H01L 23/467 257/721 |
| 2018/0240728 A1 | 8/2018 | Konno |

FOREIGN PATENT DOCUMENTS

| | | |
|---|---|---|
| JP | 2005-210035 | 8/2005 |
| JP | 2006-237419 | 9/2006 |
| JP | 2006-237429 | 9/2006 |
| JP | 2007-019130 | 1/2007 |
| JP | 2011-258755 | 12/2011 |
| JP | 2012-238733 | 12/2012 |
| JP | 2013-77666 | 4/2013 |
| JP | 2013-118336 | 6/2013 |
| JP | 2013-179744 | 9/2013 |
| JP | 2013-243248 | 12/2013 |
| JP | 2014-22479 | 2/2014 |
| JP | 2005-159318 | 6/2015 |
| JP | 2015-138970 | 7/2015 |
| JP | 2015-162516 | 9/2015 |
| JP | 2015-220239 | 12/2015 |
| JP | 2016-004796 | 1/2016 |
| JP | 2016-100401 | 5/2016 |
| WO | 2015/076257 | 5/2015 |
| WO | 2016/152258 | 9/2016 |

OTHER PUBLICATIONS

Office Action issued for Japanese Patent Application No. 2017-217293, mailed on Sep. 7, 2021, 23 pages Including machine translation.

* cited by examiner

FIG. 4
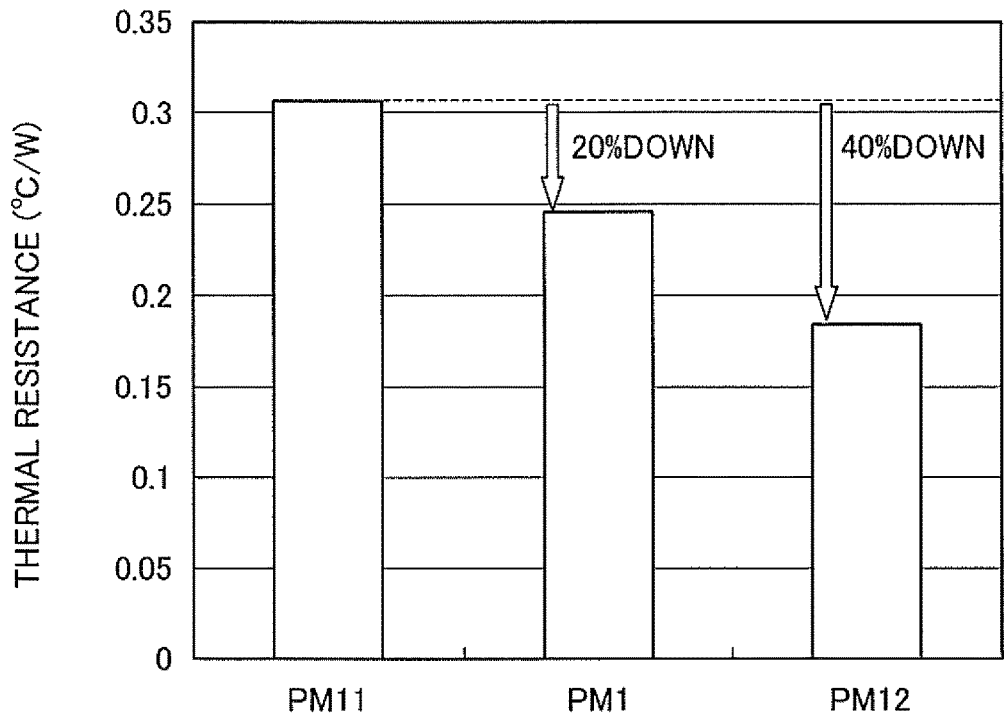
FIG. 5
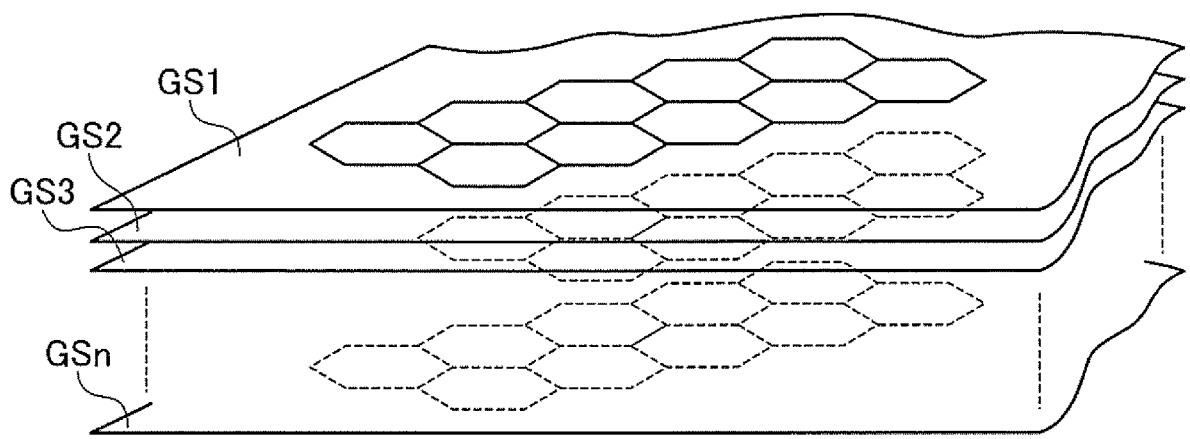
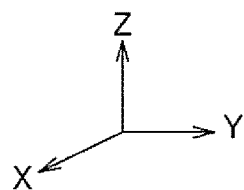

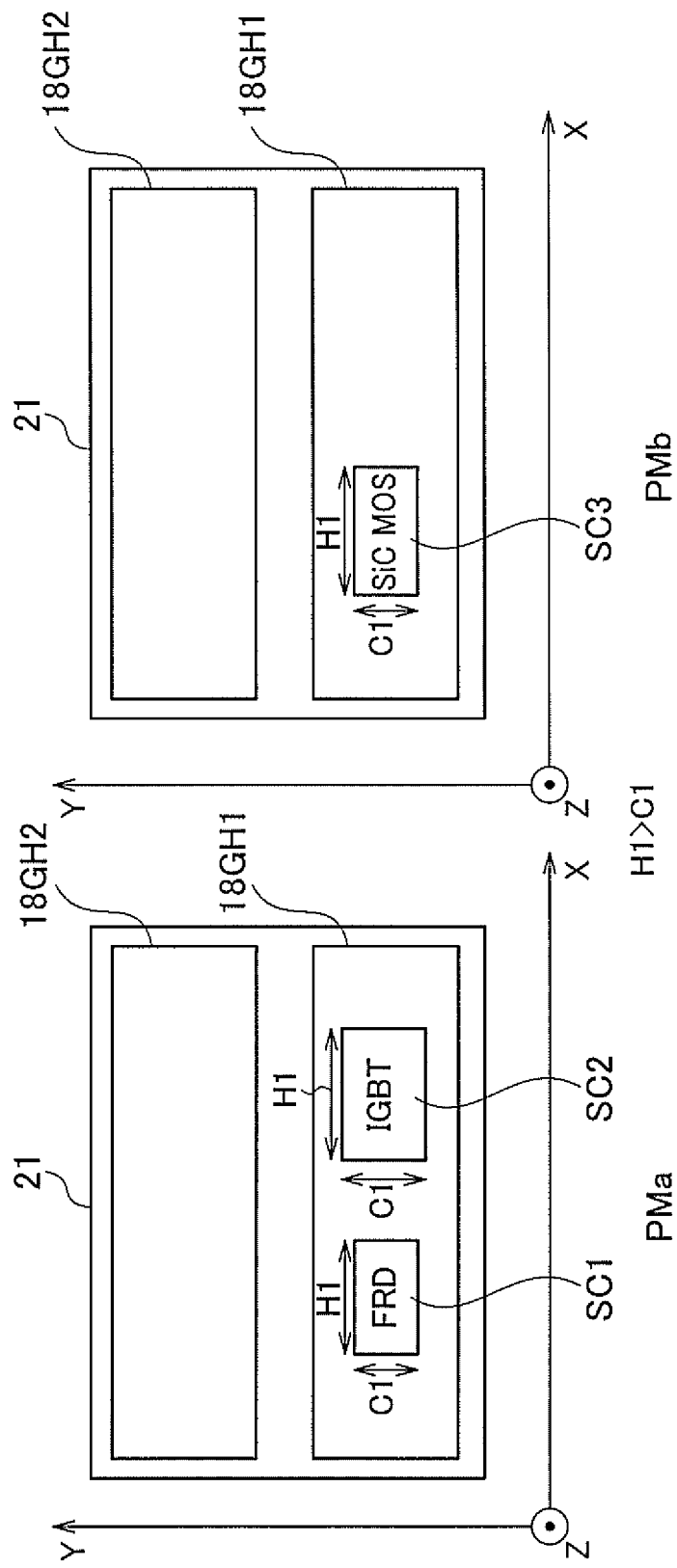

FIG. 21

|  | THICKNESS(mm) |
|---|---|
| SEMICONDUCTOR DEVICE 10 | 0.35 |
| Ag FIRED LAYER 27 | 0.05 |
| DRAIN ELECTRODE PATTERN 22U1 | 0.3 |
| GRAPHITE SUBSTRATE 18GH1 | 1.5 |
| CERAMICS SUBSTRATE 21 | 0.32 |
| BACK ELECTRODE PATTERN 23D | 0.2 |

$H1 \times C1$ mm² (MD1)

MAXIMUM VALUE: 22.599
MINIMUM VALUE: 0.128

MAXIMUM VALUE: 22.972
MINIMUM VALUE: 0.322

MAXIMUM VALUE: 22.313
MINIMUM VALUE: 0.146

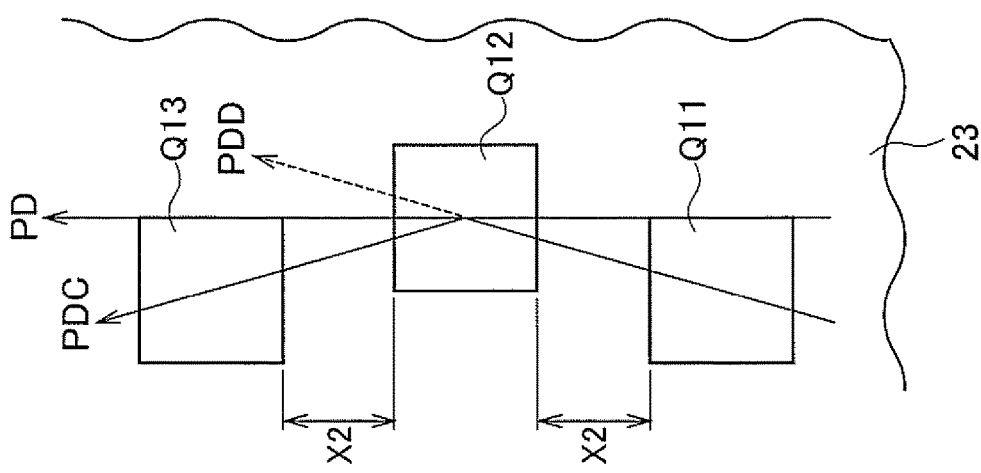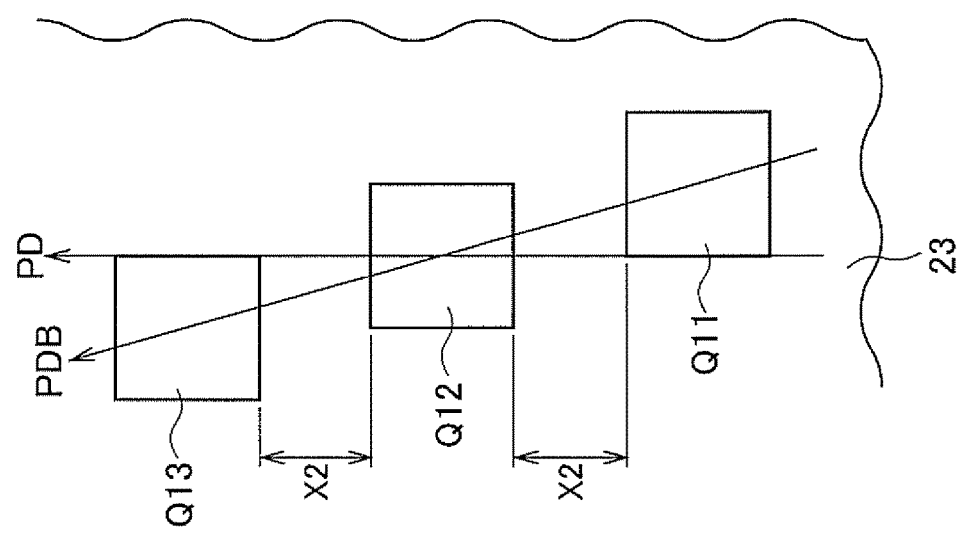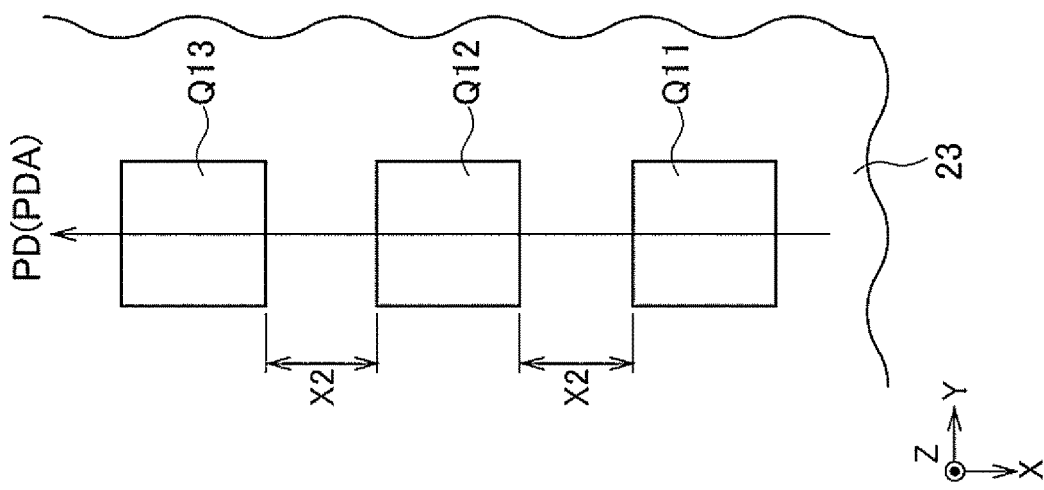

FIG. 92A
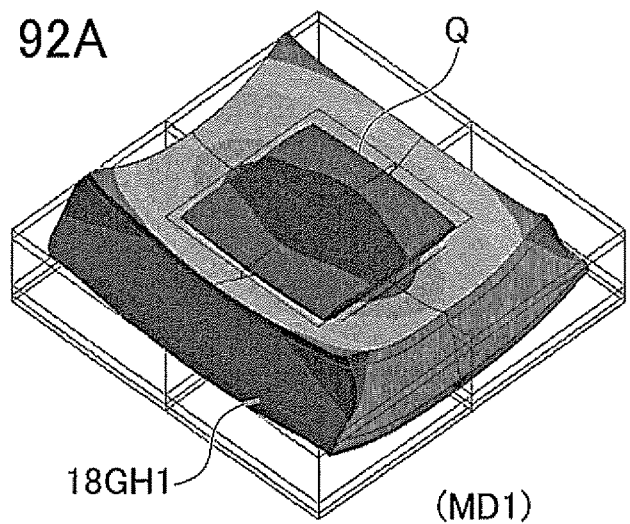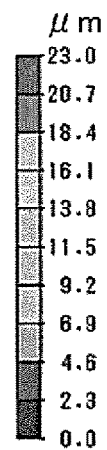
(MD1)
MAXIMUM VALUE: 22.599
MINIMUM VALUE: 0.128
FIG. 92B
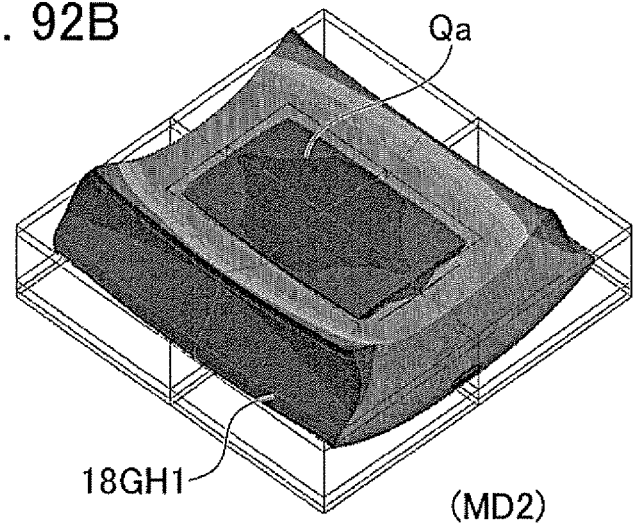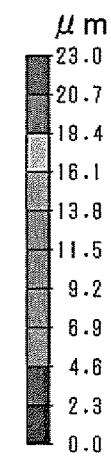
(MD2)
MAXIMUM VALUE: 22.313
MINIMUM VALUE: 0.146
FIG. 92C
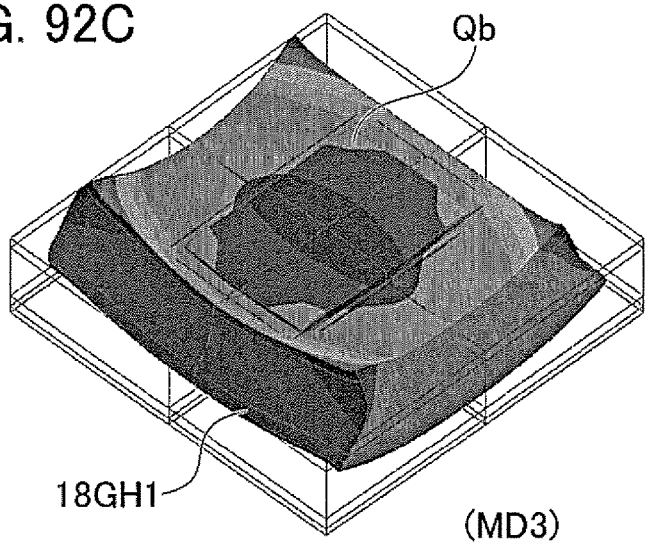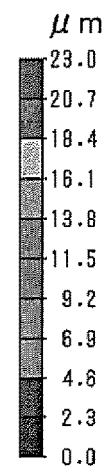
(MD3)
MAXIMUM VALUE: 22.972
MINIMUM VALUE: 0.322

POWER MODULE AND FABRICATION METHOD OF THE SAME, GRAPHITE PLATE, AND POWER SUPPLY EQUIPMENT

CROSS REFERENCE TO RELATED APPLICATIONS

This application is based upon and claims the benefit of priority from prior Japanese Patent Application Nos. P2016-226021 filed on Nov. 21, 2016, P2016-231253 filed on Nov. 29, 2016, P2016-234263 filed on Dec. 1, 2016, P2016-244166 filed on Dec. 16, 2016, P2017-211769 filed on Nov. 1, 2017, and P2017-217293 filed on Nov. 10, 2017, the entire contents of which are incorporated herein by reference.

FIELD

Embodiments described herein relate to a power module and a fabrication method of such a power module, a graphite plate, and power supply equipment.

BACKGROUND

Conventionally, as one of the power modules, there have been known power modules in which a perimeter of semiconductor device (s) including a power element (s) (chip (s)) such as Insulated Gate Bipolar Transistor (IGBT) is molded with resin.

Since such a semiconductor device generates heat in an operating state, it is general to dispose heat radiators, e.g. heat sinks or fins, on a back surface side of a substrate in order to radiate the heat, and thereby to cool the semiconductor device.

Particularly, in recent years, thick copper substrates and double-sided cooling structures have also been used for reduction of a thermal resistance.

However, there is concern of reliability of the thick copper substrates. Moreover, the double-sided cooling structures are excellent in cooling performance, but fabrication costs are expensive, as compared with single-sided cooling structures, from a viewpoint of productivity enhancement.

Meanwhile, there has been examined a possibility of applicability of graphite plates having anisotropic thermal conductivity to power modules.

Moreover, since such a semiconductor device generates heat during operations, it is important to secure reliability of wire connections with respect to high temperatures particularly in inverter modules for high temperature operations, etc.

Furthermore, insulating substrates have been used for substrates used for such power modules. Thick copper substrates etc. have been developed for further reducing thermal resistances. However, there is concern of reliability of the thick copper substrates. Moreover, the double-sided cooling structures are excellent in cooling performance, but fabrication costs are expensive, as compared with single-sided cooling structures, from a viewpoint of productivity enhancement.

In order to further reduce the thermal resistances with respect to such thick copper substrates, there has been examined a possibility of applicability of graphite plates having anisotropic thermal conductivity to power modules.

On the other hand, as the spread of hybrid electric vehicles and Electric Vehicles (EVs) progresses in recent years, power modules are now in increasing demand. Since such power modules generate heat in an operating state, water cooling systems have been used for the power modules to be used for on-vehicle. Although single-sided water cooling systems have been ordinarily used in a present state, double-sided water cooling systems etc. have also been developed in order to further reduce thermal resistances. Meanwhile, there has also been examined a possibility of applicability of graphite plates having anisotropic thermal conductivity to power modules.

SUMMARY

However, since two water cooling machines are required for the double-sided water cooling system, it becomes difficult to design flow paths, etc. Moreover, it is difficult to reduce costs since the water cooling machine is expensive.

Moreover, if a large current is flowed through an inverter module using Silicon Carbide Metal Oxide Semiconductor Field Effect Transistor (SiC MOSFET), heat is generated due to the electric current flow through the FET. Moreover, since control signals are directly entered, a bonding portion of a wire for source sense bonded on a source pad electrode also reaches high temperatures.

Accordingly, since the bonding portion of the wire for source sense reaches approximately junction temperatures, it is easy to rupture the wire in conventional case type power modules having a tendency of coarsening of a diameter of the wire.

On the other hand, in the case of mold type power modules, coarsening of the diameter of the wire does not easily occur, but there is concern of a rupture in an interface of the bonding portion due to a thermal stress.

Since degradation due to thermal stress is feared in each case, countermeasures against wire connections for realizing of higher heat resistance are required.

The embodiments provide an inexpensive power module capable of reducing a stress and capable of exhibiting cooling performance not inferior to that of the double-sided cooling structures.

Moreover, the embodiments provide: an inexpensive power module having cooling performance near the cooling performance of double-sided cooling system which can be exhibited even by one cooling apparatus; and a graphite plate used therefor.

Moreover, the embodiments provide: a power module capable of reducing an influence of thermal stress due to high temperature operations, and capable of realizing higher heat resistance and improving reliability with respect to wire connections; and a fabrication method of such a power module.

Furthermore, the embodiments provide a power module and a power supply equipment, each capable of reducing a thermal resistance.

According to one aspect of the embodiments, there is provided a power module comprising: an insulating substrate; a power device disposed on the insulating substrate, the power device including respectively electrodes on a front surface side and a back surface side thereof; and a graphite wiring provided with an anisotropic thermal conductivity, the graphite wiring of which one end is connected to the front surface side of the power device, and the other end is connected to the insulating substrate, wherein heat of the front surface side of the power device is transferred to the insulating substrate through the graphite wiring.

According to another aspect of the embodiments, there is provided a power module comprising: an insulating substrate comprising an insulative substrate, a first electrode pattern and a second electrode pattern disposed on a first surface of the substrate, and a third electrode pattern disposed on a second surface opposite to the first surface; a power device disposed on the first electrode pattern, the power device comprising electrodes on a front surface side and a back surface side thereof; a heat radiator disposed on the third electrode pattern; a block electrode disposed on the second electrode pattern; and a wiring lead portion comprising a graphite wiring provided with an anisotropic thermal conductivity, a first wiring pattern disposed on a first main face of the graphite wiring, and a second wiring pattern disposed on a second main face opposite to the first main face, the wiring lead portion of which one end side is connected to the front surface side of the power device and the other end side is connected to the second electrode pattern via the block electrode, the other end side is at a position separated from a position of the one end side on the same plane, wherein the graphite wiring is provided with a first orientation of which a thermal conductivity in a plane direction is higher than the thermal conductivity in a thickness direction or a second orientation of which a thermal conductivity in the thickness direction is higher than the thermal conductivity in a plane direction, wherein the graphite wiring comprises a plate structure composed by laminating a plurality of graphite sheets having the first orientation, or a plate structure composed by laminating a plurality of graphite sheets having the second orientation, wherein heat of the front surface side of the power device is transferred to the insulating substrate through the graphite wiring.

According to still another aspect of the embodiments, there is provided a power module comprising: an insulating substrate comprising an insulative substrate, a first electrode pattern and a second electrode pattern disposed on a first surface of the substrate, and a third electrode pattern disposed on a second surface opposite to the first surface; a power device disposed on the first electrode pattern, the power device comprising electrodes on a front surface side and a back surface side thereof; a heat radiator disposed on the third electrode pattern; and a wiring lead portion comprising a graphite wiring provided with an anisotropic thermal conductivity, and a first wiring pattern disposed on a first main face of the graphite wiring, which has an L-shaped cross-sectional shape from which a thickness of a wiring pattern is partially different so that it may, the first wiring pattern of which one end side is connected to the front surface side of the power device and the other end side is connected to the second electrode pattern, the other end side is at a position separated from a position the one end side on the same plane, wherein the graphite wiring is provided with a first orientation of which a thermal conductivity in a plane direction is higher than the thermal conductivity in a thickness direction or a second orientation of which a thermal conductivity in the thickness direction is higher than the thermal conductivity in a plane direction, wherein the graphite wiring comprises a plate structure composed by laminating a plurality of graphite sheets having the first orientation, or a plate structure composed by laminating a plurality of graphite sheets having the second orientation, wherein heat of the front surface side of the power device is transferred to the insulating substrate through the graphite wiring.

According to yet another aspect of the embodiments, there is provided a power module comprising: an insulative substrate; a graphite substrate having anisotropy in a coefficient of thermal expansion disposed on the substrate; a power device disposed on the graphite substrate, the power device comprising electrodes on a front surface side and a back surface side thereof; and a graphite wiring provided with an anisotropic thermal conductivity connected to the front surface side of the power device, wherein heat of the front surface side of the power device is transferred to the substrate via the graphite wiring.

According to a further aspect of the embodiments, there is provided a power module comprising: a graphite insulating substrate comprising an insulative substrate, and a graphite substrate having anisotropy in a coefficient of thermal expansion disposed on the substrate; a power device disposed on the graphite insulating substrate, the power device comprising electrodes on a front surface side and a back surface side thereof; and a graphite wiring provided with an anisotropic thermal conductivity connected to the front surface side of the power device, wherein heat of the front surface side of the power device is transferred to the substrate via the graphite wiring.

According to a further aspect of the embodiments, there is provided a power module comprising a first surface and a second surface opposite to the first surface, the power module generating heat due to operations, the power module comprising: a cooling apparatus disposed on a first surface side of the power module; and a graphite plate of which one surface is bonded on a surface of the cooling apparatus to which a first surface of the power module is bonded and the other surface is bonded on a second surface of the power module 1, wherein the graphite plate has a structure in which two types of the graphite plates of which orientations of thermal conduction are different from each other are bonded along a direction so that the thermal conductivity is increased.

According to a further aspect of the embodiments, there is provided a power module comprising: a power device connected in series between a first power terminal and a second power terminal, the power device disposed on a first surface of a substrate, the first surface opposite to a second surface of the substrate; and a cooling apparatus disposed on the second surface side of the substrate, wherein the power device is configured so that a connecting point of the power device is connected to an output terminal, and the power device has a first surface and a second surface opposite to the first surface, the power module further comprising a graphite plate configured to thermally connect the second surface side of the substrate of the cooling apparatus to the second surface side of the power device, wherein the graphite plate has a structure in which two types of the graphite plates of which orientations of thermal conduction are different from each other are bonded along a direction so that the thermal conductivity is increased.

According to a further aspect of the embodiments, there is provided a graphite plate comprised in the above-mentioned power module According to a further aspect of the embodiments, there is provided a power module comprising: a substrate comprising a first main electrode pattern and a signal wiring pattern; a semiconductor device comprising a main pad electrode on a front side surface thereof, the semiconductor device disposed on the substrate; a leadframe connected between the main pad electrode and the first main electrode pattern; a second bonded portion separated from a first bonded portion between the leadframe and the main pad electrode, the second bonded portion between the leadframe and the first main electrode pattern; and a first bonding wire connected between the second bonded portion and the signal wiring pattern, wherein the second bonded portion has a temperature relatively lower than the first bonded portion at a time of operation of the semiconductor device.

According to a further aspect of the embodiments, there is provided a power module comprising: an insulating substrate comprising an insulative substrate, and a first main electrode pattern, a second main electrode pattern, a signal wiring pattern and a control signal wiring pattern are disposed on the substrate; a semiconductor device comprising a main pad electrode and a control pad electrode on a front surface side thereof, and comprising a main electrode on a back surface side thereof, the semiconductor device disposed in a face up on the second main electrode pattern; a leadframe connected between the main pad electrode and the first main electrode pattern; a first bonding wire connected between a second bonded portion between the leadframe and the first main electrode pattern and the signal wiring pattern, the second bonded portion separated from a first bonded portion between the leadframe and the main pad electrode, wherein a temperature of the second bonded portion is relatively lower than that of the first bonded portion at a time of operation of the semiconductor device; and a second bonding wire connected between the control pad electrode and the control signal wiring pattern, wherein one end of the first bonding wire is connected to the signal wiring pattern, and the other end of the first bonding wire is connected to the leadframe or the first main electrode pattern of the second bonded portion.

According to a further aspect of the embodiments, there is provided a power module comprising: an insulating substrate comprising an insulative substrate, and a first main electrode pattern, a second main electrode pattern, a signal wiring pattern and a control signal wiring pattern are disposed on the substrate; a semiconductor device comprising a main pad electrode and a control pad electrode on a front surface side thereof, and comprising a main electrode on a back surface side thereof, the semiconductor device disposed in a face up on the second main electrode pattern; a leadframe connected between the main pad electrode and the first main electrode pattern, a connecting end side of the leadframe with the main pad electrode is extended to be connected to the wiring electrode pattern; a first bonded portion between the leadframe and the main pad electrode, a second bonded portion between the leadframe and the first main electrode pattern, the second bonded portion separated from the first bonded portion, a temperature of the second bonded portion is relatively lower than that of the first bonded portion at a time of operation of the semiconductor device, and a third bonded portion between the leadframe and the wiring electrode pattern, a temperature of the third bonded portion is relatively lower than that of the first bonded portion at a time of operation of the semiconductor device; a first bonding wire of which one end is connected to the signal wiring pattern and the other end is connected to the third bonded portion; and a second bonding wire connected between the control pad electrode and the control signal wiring pattern, wherein the other end of the first bonding wire is connected to the leadframe or the wiring electrode pattern of the third bonded portion.

According to a further aspect of the embodiments, there is provided a power module comprising: a conductive substrate; a main electrode pattern, a signal wiring pattern, and a control signal wiring pattern disposed via an insulation layer on the substrate; a semiconductor device comprising a main pad electrode on a front side surface thereof, the semiconductor device disposed on the substrate; a leadframe connected between the main pad electrode and the main electrode pattern; and a first bonding wire connected between a second bonded portion and the signal wiring pattern, the second bonded portion bonding between the leadframe and the main electrode pattern, the second bonded portion separated from a first bonded portion between the leadframe and the main pad electrode, wherein a temperature of the second bonded portion is relatively lower than that of the first bonded portion at a time of operation of the semiconductor device.

According to a further aspect of the embodiments, there is provided a fabrication method of a power module, the fabrication method comprising: disposing a semiconductor device in a face up on a second main electrode pattern of the insulating substrate, the semiconductor device comprising a main pad electrode and a control pad electrode on a front surface side thereof, and a main electrode on a back surface side thereof, the insulating substrate comprising an insulative substrate, and a first main electrode pattern, the second main electrode pattern, a signal wiring pattern and a control signal wiring pattern are disposed on the substrate; connecting a leadframe between the main pad electrode and the first main electrode pattern; connecting a first bonding wire between a second bonded portion and the signal wiring pattern, the second bonded portion between the leadframe and the first main electrode pattern, the first bonded portion between the leadframe and the main pad electrode, the second bonded portion separated from the first bonded portion, a temperature of the second bonded portion is relatively lower than that of the first bonded portion at a time of operation of the semiconductor device; and connecting a second bonding wire between the control pad electrode and the control signal wiring pattern.

According to a further aspect of the embodiments, there is provided a power module comprising: a graphite substrate provided with an anisotropic thermal conductivity; and a plurality of semiconductor devices arranged side by side and on the graphite substrate, the semiconductor devices generating heat during operation, wherein an arrangement direction of the plurality of semiconductor devices is within a range from −45 degree to +45 degrees, on the basis of the orientation direction where a thermal conductivity of the graphite substrate is relatively low, on a substrate face of the graphite substrate.

According to a further aspect of the embodiments, there is provided a power module comprising: a substrate; a graphite substrate provided with an anisotropic thermal conductivity disposed on a first surface of the substrate; a first electrode pattern disposed on a second surface opposite to the first surface of the substrate; a second electrode pattern disposed on the graphite substrate; and a plurality of semiconductor devices arranged side by side and on the graphite substrate, the semiconductor devices generating heat during operation via the second electrode pattern, wherein the graphite substrate is provided with an orientation where a coefficient of thermal conductivity in a thickness direction is relatively higher than the coefficient of thermal conductivity in a plane direction, wherein an arrangement direction of the plurality of the semiconductor devices is within a range from −45 degree to +45 degrees, on the basis of the orientation direction where a thermal conductivity of the graphite substrate is relatively low, on a substrate face of the graphite substrate.

According to a further aspect of the embodiments, there is provided a power module comprising: a graphite insulating substrate comprising a substrate, and a graphite substrate provided with an anisotropic thermal conductivity disposed on a first surface of the substrate; and a plurality of semiconductor devices arranged side by side and on the graphite substrate, the semiconductor devices generating heat during operation, wherein the graphite substrate is provided with an orientation where a coefficient of thermal conductivity in a thickness direction is relatively higher than the coefficient of thermal conductivity in a plane direction, wherein an arrangement direction of the plurality of the semiconductor devices is within a range from −45 degree to +45 degrees, on the basis of the orientation direction where a thermal conductivity of the graphite substrate is relatively low, on a substrate face of the graphite substrate.

According to a further aspect of the embodiments, there is provided a power module comprising: an insulating layer; a graphite substrate provided with an anisotropic thermal conductivity disposed on the insulating layer; and a semiconductor device disposed on the graphite substrate, the semiconductor devices generating heat during operation.

According to a further aspect of the embodiments, there is provided power supply equipment comprising: a connecting point where a first switching device and a second switching device are connected in series between the first power source and the second power source, wherein the power supply equipment uses voltage of the connecting point as an output, each switching device is composed by including a plurality of chips, and disposed on a graphite substrate, and an interval distance between the chips in an arrangement direction of the plurality of chips is shorter than a distance from the each chip to an end surface of the graphite substrate.

According to the embodiments, there can be provided the inexpensive power module capable of reducing a stress and capable of exhibiting cooling performance not inferior to that of the double-sided cooling structures.

Moreover, according to the embodiments, there can be provided: the inexpensive power module having cooling performance near the cooling performance of double-sided cooling system which can be exhibited even by one cooling apparatus; and the graphite plate used therefor.

Moreover, according to the embodiments, there can be provided: the power module capable of reducing an influence of thermal stress due to high temperature operations, and capable of realizing higher heat resistance and improving reliability with respect to wire connections; and the fabrication method of such a power module.

Moreover, according to the embodiments, there can be provided the power module and a power supply equipment, each capable of reducing a thermal resistance.

BRIEF DESCRIPTION OF DRAWINGS

FIG. 4 is a diagram showing thermal resistance characteristics of a power module according to the first embodiment (PM 1), as compared to the comparative example 1 (PM 11) of the first embodiment and the comparative example 2 (PM 12) of the first embodiment.

FIG. 5 is a schematic bird's-eye view configuration diagram of a laminated structure of a graphite sheet composing a graphite plate applicable to the power module according to the first embodiment.

FIG. 19A is a schematic planar pattern configuration diagram for explaining an arrangement direction of a graphite substrate and an IGBT, in an example of applying a graphite substrate having anisotropy in a coefficient of thermal expansion (CTE) to the power module according to embodiments.

FIG. 19B is a schematic planar pattern configuration diagram for explaining an arrangement direction of the graphite substrate and an SiC MOSFET, in an example of applying the graphite substrate having anisotropy in the CTE to the power module according to embodiments.

FIG. 21 is a diagram showing an example of a thickness of each portion in which the thermal resistance becomes the lowest, in the simulation model shown in FIG. 20.

FIG. 81B is a diagram for explaining an arrangement direction of devices with respect to the YZ orientation, in an example of the graphite substrate applicable to the power module according to the fifteenth embodiment.

FIG. 81C is a schematic bird's-eye view configuration diagram showing an application example of a graphite substrate of XZ orientation, in an example of a graphite substrate applicable to the power module according to the fifteenth embodiment.

FIG. 81D is a diagram for explaining an arrangement direction of devices with respect to the XZ orientation, in an example of the graphite substrate applicable to the power module according to the fifteenth embodiment.

FIG. 82A is a diagram for explaining thermal resistance characteristics of the power module according to the fifteenth embodiment, in an example of the case of XZ orientation.

FIG. 82B is a diagram for explaining thermal resistance characteristics of the power module according to the fifteenth embodiment, in an example of the case of YZ orientation.

FIG. 83A is a schematic bird's-eye view pattern configuration diagram showing a schematic structure of a power module according to a sixteenth embodiment.

FIG. 83B is a schematic planar pattern configuration diagram schematic structure of the power module according to the sixteenth embodiment.

FIG. 84A is a schematic cross-sectional diagram for explaining a thermal interference action in an example of a case of increasing a distance between devices, in power modules according to fifteenth to eighteenth embodiments.

FIG. 84B is a schematic plain diagram corresponding to FIG. 84A.

FIG. 85A is a schematic cross-sectional diagram for explaining a thermal interference action in an example of a case of decreasing the distance between devices, in the power modules according to fifteenth to eighteenth embodiments.

FIG. 85B is a schematic plain diagram corresponding to FIG. 85A.

FIG. 86A is a schematic cross-sectional diagram for explaining a thermal interference action in an example of a case of increasing a thickness of the graphite substrate, in the power modules according to fifteenth to eighteenth embodiments.

Figure 86A:
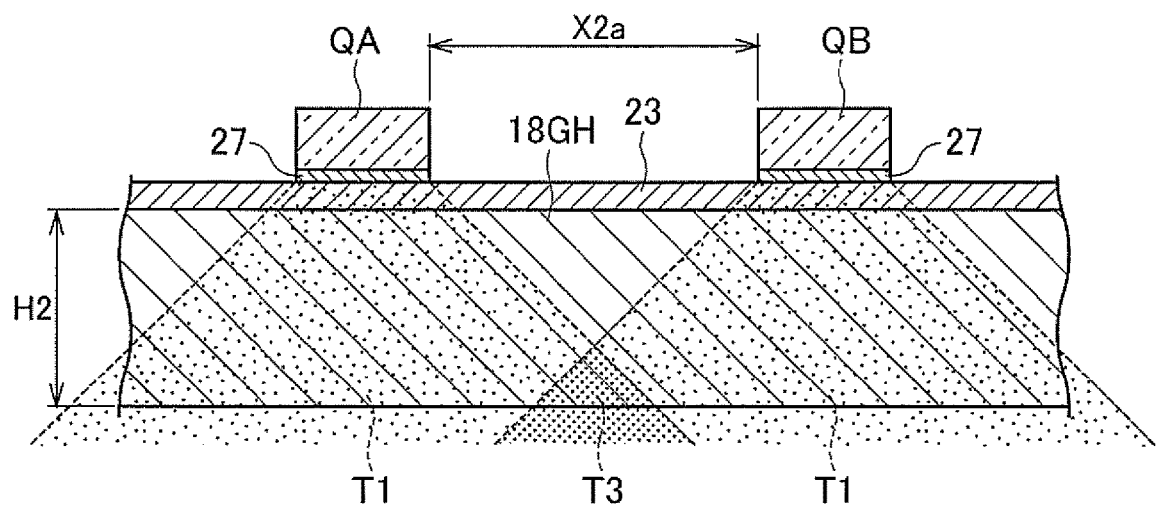
Figure 86B:
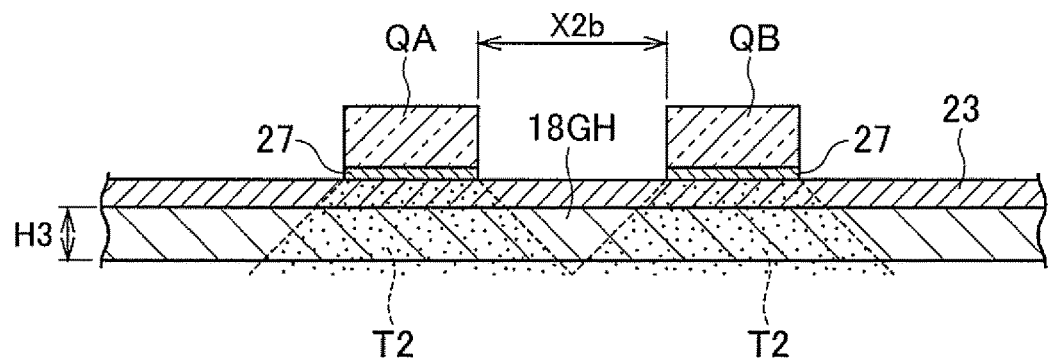

FIG. 86B is a schematic cross-sectional diagram for explaining a thermal interference action in an example of a case of decreasing the thickness of the graphite substrate, in the power modules according to fifteenth to eighteenth embodiments.

FIG. 87A shows an example of linearly arranging a plurality of devices, in an arrangement example of the devices, in the power modules according to fifteenth to eighteenth embodiments.

FIG. 87B shows an example of obliquely arranging a plurality of devices at a predetermined angle, in an arrangement example of the devices, in the power modules according to fifteenth to eighteenth embodiments.

FIG. 87C shows an example of arranging a plurality of devices in zigzag, in an arrangement example of the devices, in the power modules according to fifteenth to eighteenth embodiments.

Figure 88A:
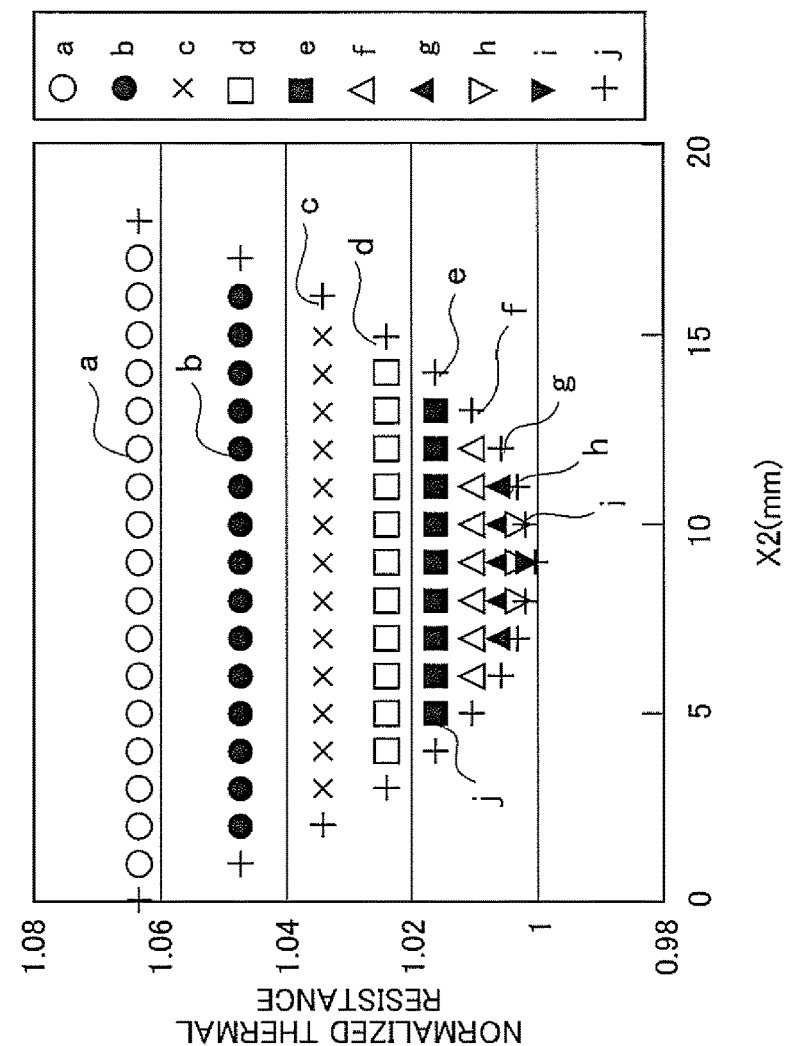

FIG. 88A is a schematic plain diagram of a simulation model used for a simulation, for explaining a relationship between an amount of displacement of arranged devices and thermal resistance, in the power modules according to fifteenth to eighteenth embodiments.

Figure 88B:
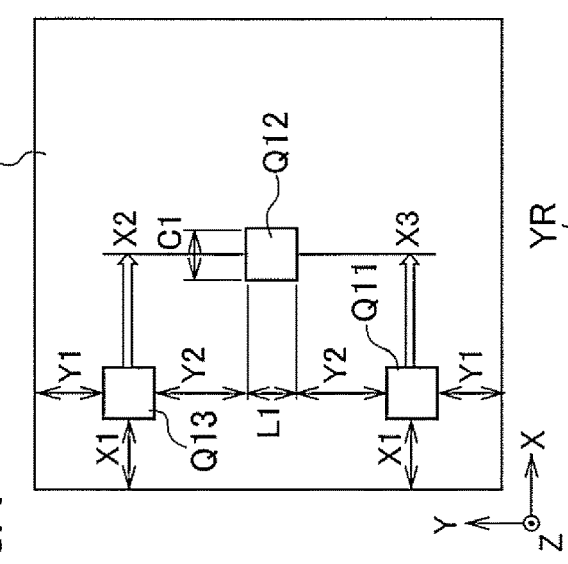

FIG. 88B is a characteristic diagram showing a normalized result of the simulation, for explaining the relationship between the amount of displacement of the arranged devices and the thermal resistance, in the power modules according to fifteenth to eighteenth embodiments.

Figure 88C:
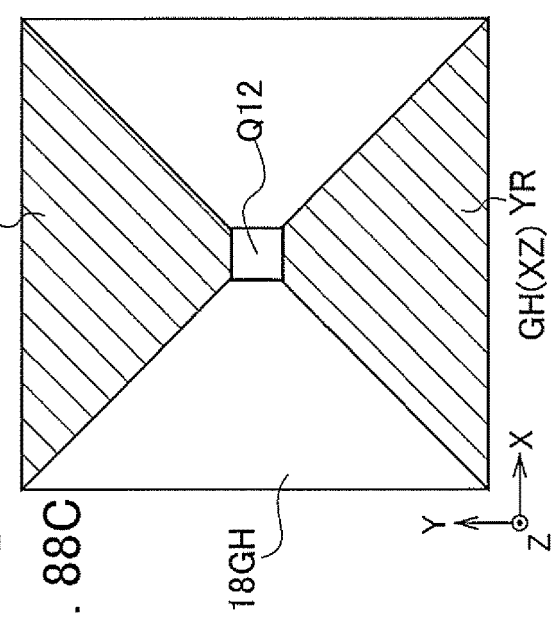

FIG. 88C is a schematic diagram showing an allowable amount of displacement, for explaining the relationship between the amount of displacement of the arranged devices and the thermal resistance, in the power modules according to fifteenth to eighteenth embodiments.

Figure 89:
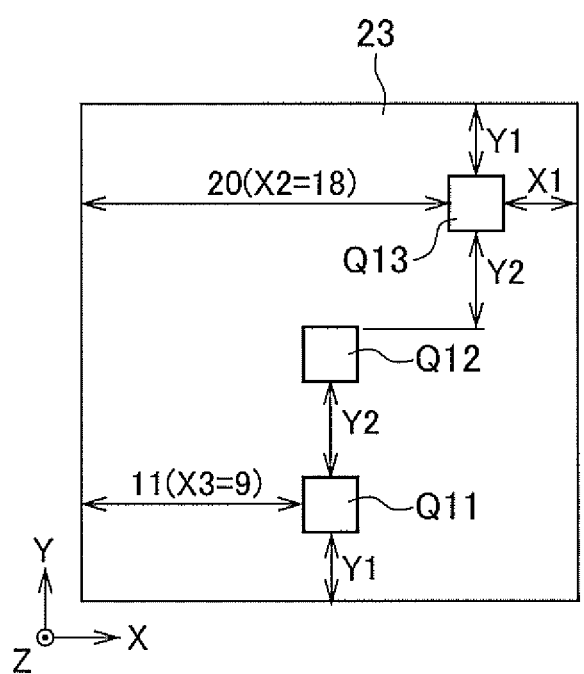

FIG. 89 is a schematic plain diagram showing another example of the simulation model, for explaining the relationship between the amount of displacement of the arranged devices and the thermal resistance, in the power modules according to fifteenth to eighteenth embodiments.

Figure 90A:
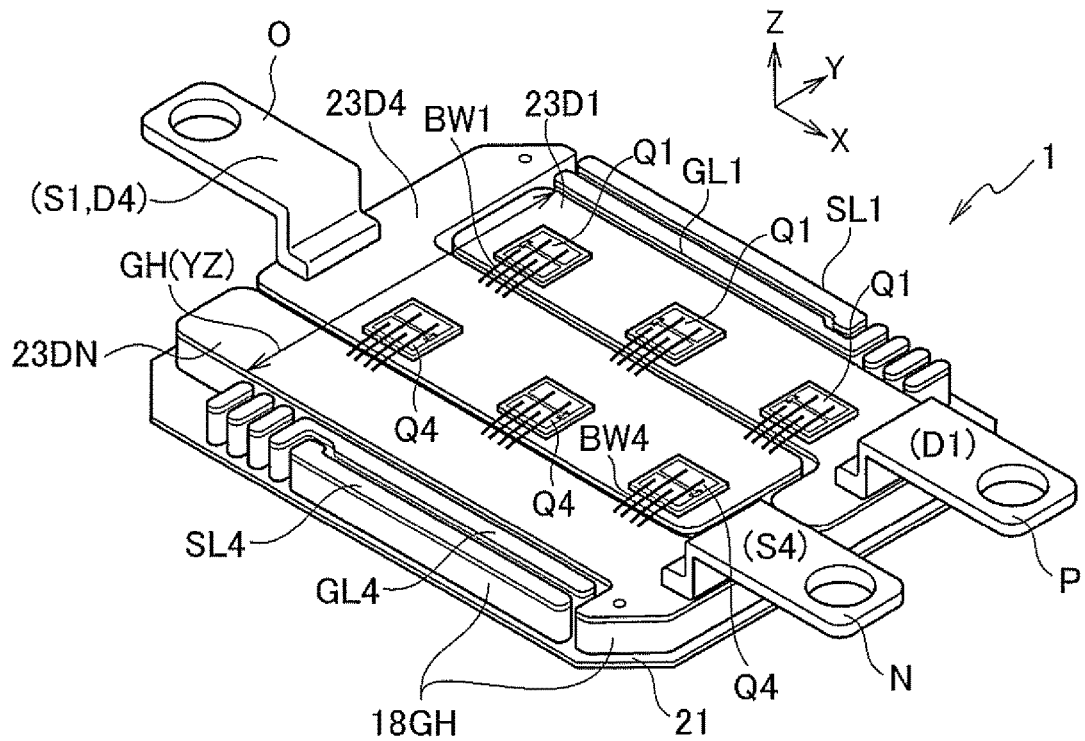

FIG. 90A is a schematic bird's-eye view pattern configuration diagram showing a schematic structure of the power module according to the seventeenth embodiment.

Figure 90B:
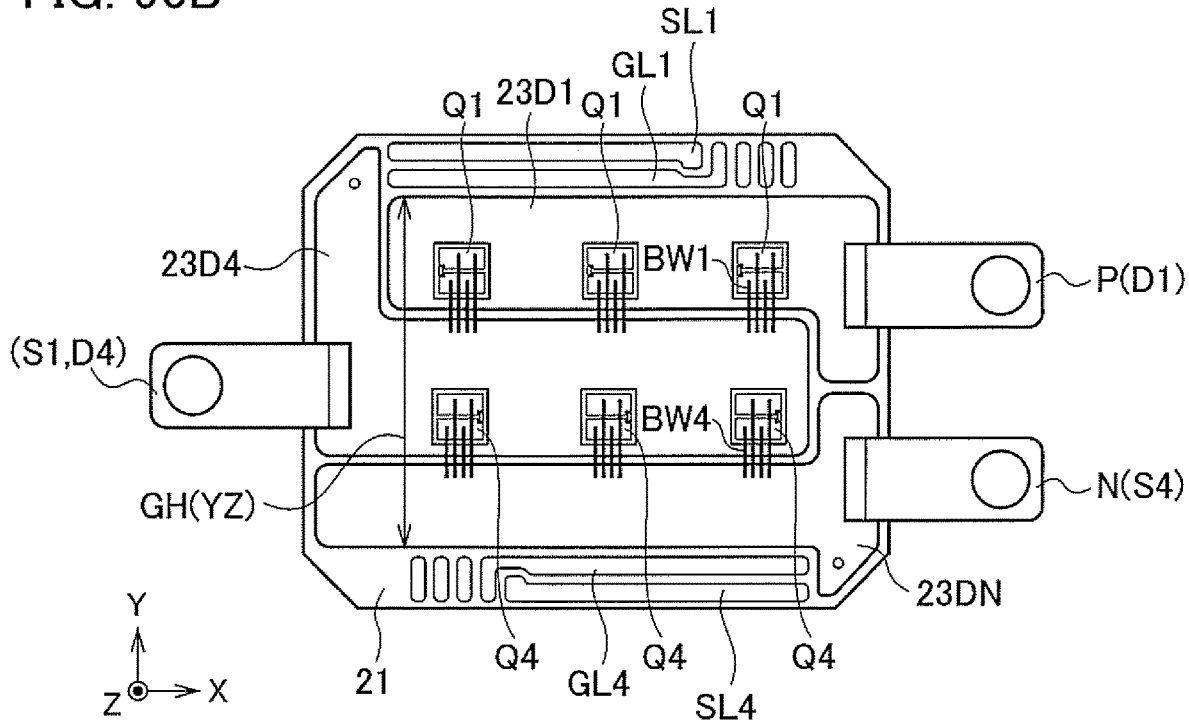

FIG. 90B is a schematic planar pattern configuration diagram showing the schematic structure of the power module according to the seventeenth embodiment.

Figure 91:
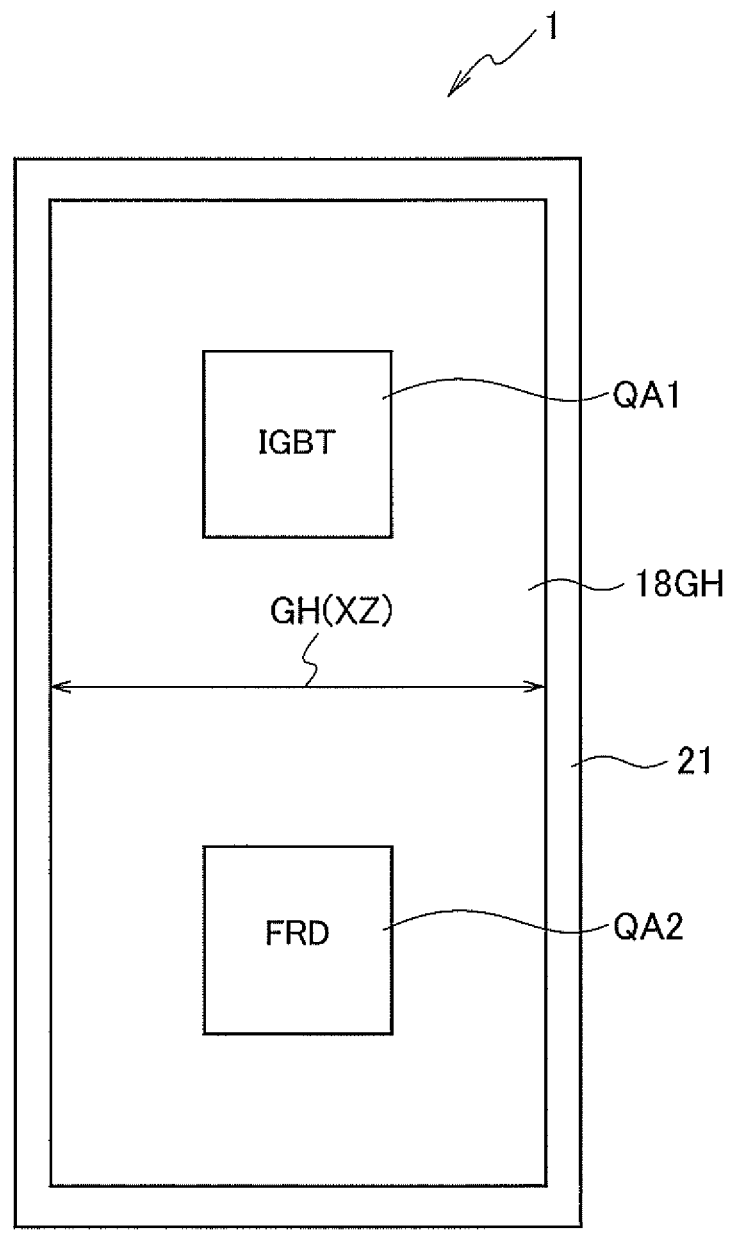

FIG. 91 is a schematic plain diagram showing a schematic structure of a power module according to the eighteenth embodiment.

FIG. 92A is a diagram showing a result of executing the simulation using the simulation model MD1, in an example of the case of applying the graphite substrate having anisotropy in the CTE, in the power module according to the fifteenth to eighteenth embodiments.

FIG. 92B is a diagram showing a result of executing the simulation using the simulation model MD2, in an example of the case of applying the graphite substrate having anisotropy in the CTE, in the power module according to the fifteenth to eighteenth embodiments.

FIG. 92C is a diagram showing a result of executing the simulation using the simulation model MD3, in an example of the case of applying the graphite substrate having anisotropy in the CTE, in the power module according to the fifteenth to eighteenth embodiments.

DESCRIPTION OF EMBODIMENTS

Next, certain embodiments will now be described with reference to drawings. In the description of the following drawings, the identical or similar reference numeral is attached to the identical or similar part. However, it should be noted that the drawings are schematic and a ratio of each size differs from an actual thing. Therefore, detailed size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

In the following description, although a height (thickness) direction (height (thickness) direction of modules) which is orthogonal to the rectangular shaped drawing sheets is defined as ZY, a direction along one side of the drawing sheets (one direction orthogonal to the height direction Z) is defined as XY, and a direction (other direction) along the other side orthogonal to the one side is defined as Y, for convenience, it is not limited to these definitions, and the X, Y, and Z can be arbitrarily set.

First Embodiment (Basic Configuration)

Figure 1A:
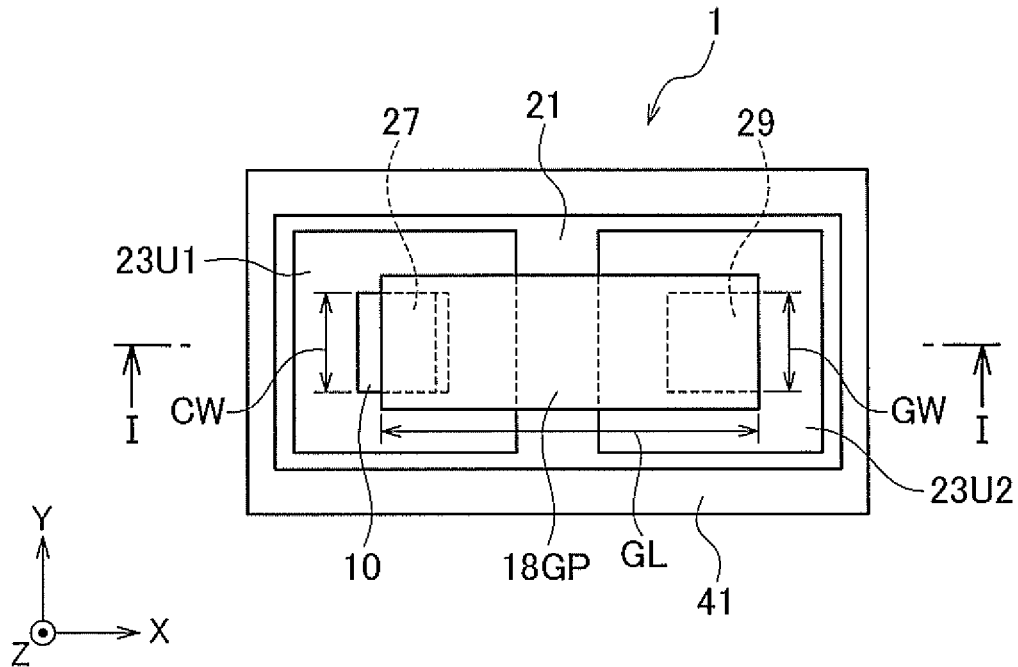
FIG. 1A is a schematic planar pattern configuration diagram showing a schematic structure of a power module according to a first embodiment.
Figure 1B:
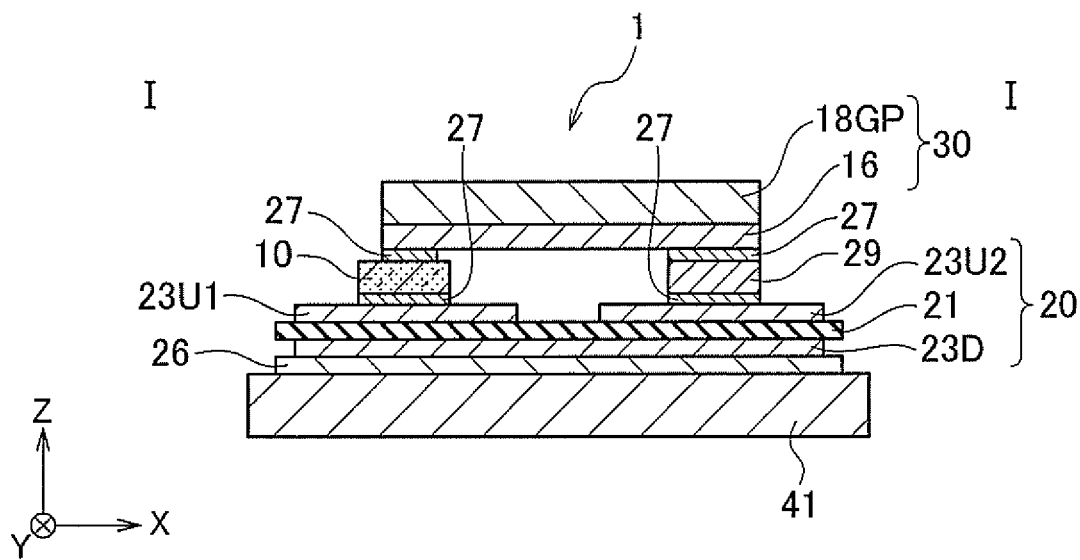
FIG. 1B is a schematic cross-sectional structure diagram taken in the line I-I of FIG. 1A.

FIG. 1A shows a schematic planar pattern configuration of a power module (PM) 1 according to the first embodiment, and FIG. 1B shows a schematic cross-sectional structure taken in the line I-I of FIG. 1A. FIGS. 1A and 1B show a case of applying a 1-in-1 module type PM 1 thereto.

In FIG. 1B, an upper side of an insulating substrate 20 is defined as an UP (U) side, and a lower side of the insulating substrate 20 is defined as a DOWN (D) side, herein. This definition is also applied to all of the drawings shown hereinafter.

As shown in FIGS. 1A and 1B, the PM 1 according to the first embodiment includes: an insulating substrate 20 including a drain electrode pattern (first electrode pattern) 23U1 and a source electrode pattern (second electrode pattern) 23U2, e.g. Cu foils, each disposed on an upper surface (first surface) of an SiN-based ceramics substrate 21, and a back electrode pattern (third electrode pattern) 23D, e.g. Cu foil, disposed on a lower surface (second surface) of the ceramics substrate 21; a semiconductor device (power device) 10 for power elements disposed on the drain electrode pattern 23U1; a heat radiator 41 disposed on the back electrode pattern 23D of the insulating substrate 20; and an upper wiring (wiring lead portion) 30 including an electrically-conductive graphite plate (graphite wiring) 18GP having anisotropic thermal conductivity and a Cu wiring pattern 16 used as a first wiring pattern formed on a lower surface (first main face) thereof, the upper wiring 30 configured to connect a source pad electrode (not shown) of the semiconductor device 10 and the source electrode pattern 23U2.

More specifically, the PM 1 according to the first embodiment includes: an insulating substrate 20; a semiconductor device 10 disposed on the insulating substrate 20, the semiconductor device 10 including an electrode on each of a front surface side and a back surface side; and a graphite plate 18GP having an anisotropic thermal conductivity, the graphite plate 18GP of which one end is connected to the front surface side of the semiconductor device 10 and the other end is connected to the insulating substrate 20, wherein heat of the front surface side of the semiconductor device 10 is transferred to the insulating substrate 20 through the graphite plate 18GP.

For example, the graphite plate 18GP has: a length GL composed of one end side connected to the semiconductor device 10 and the other end side separated from the one end side on a same plane; and a width GW in a direction orthogonal to the length GL in planar view. The width GW is wider than a width CW of the semiconductor device 10. Thus, high thermal conductivity (heat diffusibility) of the graphite plate 18GP can easily be secured.

The semiconductor device 10 is arranged so that the U side is a side of the source electrode and the D side is a side of the drain electrode. Other semiconductor devices mentioned below are similar to such an arrangement.

In the upper wiring 30, the Cu wiring pattern 16 at a lower layer side is connected to the source electrode pattern 23U2 via the block electrode 29.

The block electrode 29 is composed by including Cu (metallic column), for example, and between the Cu wiring pattern 16 of upper wiring 30 and the block electrode 29 and between the source electrode pattern 23U2 and the block electrode 29 are respectively contacted via Ag (silver) fired layers 27.

Between the semiconductor device 10 and the Cu wiring pattern 16 of upper wiring 30 and between the semiconductor device 10 and the drain electrode pattern 23U1 are respectively contacted via Ag fired layers 27.

Although illustration is omitted herein except for the PM 1 shown in FIG. 16, an Al (aluminum) electrode 61 portion and an Ni (nickel) plated layer 63 are actually sequentially formed on the upper surface of the semiconductor device 10, and between the semiconductor device 10 and the Cu wiring pattern 16 is contacted via the Al (aluminum) electrode 61 portion, the Ni plated layer 63, and the Ag fired layer 27. However, since the thickness of the Al (aluminum) electrode 61 formed on the semiconductor device 10 is thin, it can almost be ignored, from a thermal viewpoint.

Between the heat radiator 41 and the back electrode pattern 23D is bonded to a bonding member 26 composed by including SnAgCu-based solder etc.

The heat radiator 41 may be a heat sink made by Al (aluminum), a heat radiation fin or heat radiation pin, each which absorbs heat generated from the semiconductor device 10 and radiates the heat, or a cooling apparatus configured to cools the heat generated from the semiconductor device 10.

In the case of the cooling apparatus, cooling apparatuses having a sufficient thermal conductivity, such as coolant water (water, or a mixed solution to which water and ethylene glycol are mixed at a rate of every 50%), cooling gas (cold air), etc., are used, for example.

The upper wiring 30 is bonded to the upper surface of the semiconductor device 10 for wire bonding with the gate pad electrode (not shown) so as to expose the gate pad electrode.

It is not limited to the power device as the semiconductor device 10. For example, diodes including FRD, modules in which the perimeter of one or more chips is sealed with a mold resin or case may be used therefor.

Although Active Metal Brazed, Active Metal Bond (AMB) substrates can be applied to the insulating substrate 20, for example, Direct Bonding Copper (DBC) substrates or Direct Brazed Aluminum (DBA) substrates can also be applied to the insulating substrate 20, for example.

According to the PM 1 according to the first embodiment, a thermal diffusion effect at the upper wiring 30 can be expected by adopting the graphite plate 18GP which is a high heat conduction material as upper wiring 30, in such a single-sided cooling and upper wiring structure.

Comparative Examples of First Embodiment

Comparative Example 1 of First Embodiment

Figure 2:
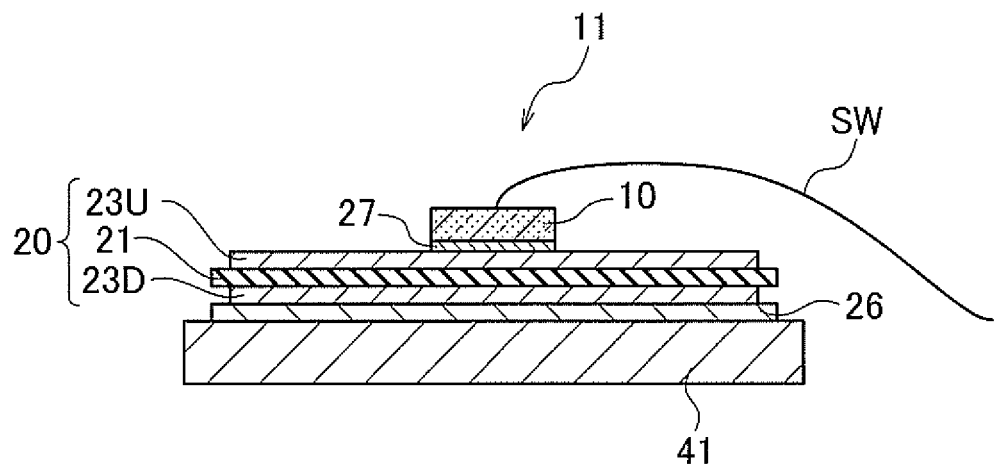
FIG. 2 is a schematic cross-sectional structure diagram showing a schematic structure of a power module according to a comparative example 1 of the first embodiment.

A PM 11 according to a comparative example 1 of the first embodiment has a single-sided cooling and wire bonding structure. As shown in FIG. 2, the PM 11 includes: an insulating substrate 20 including a drain electrode pattern 23U disposed on a ceramics substrate 21; a semiconductor device 10 for power elements disposed on the drain electrode pattern 23U via an Ag fired layer 27; a heat radiator 41 disposed via a bonding member 26 on a back electrode pattern 23D at a surface side opposed to the drain electrode pattern 23U side of the insulating substrate 20; and a source bonding wire SW configured to connect a source pad electrode (not shown) of the semiconductor device 10 and a source electrode pattern (not shown).

Comparative Example 2 of First Embodiment

Figure 3:
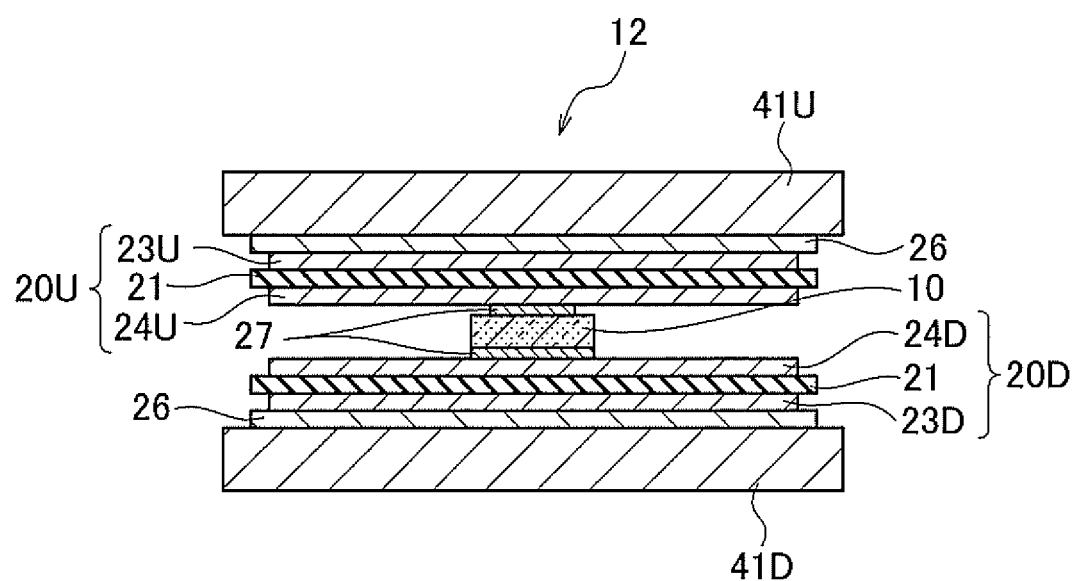
FIG. 3 is a schematic cross-sectional structure diagram showing a schematic structure of a power module according to a comparative example 2 of the first embodiment.

A PM 12 according to a comparative example 2 of the first embodiment has a double-sided cooling structure. As shown in FIG. 3, the PM 12 includes: a lower insulating substrate 20D having electrode patterns 23D and 24D respectively disposed on both surfaces of a ceramics substrate 21D; a semiconductor device 10 for power elements disposed on the electrode pattern 24D via an Ag fired layer 27; an upper insulating substrate 20U disposed via an Ag fired layer 27 so as to face the semiconductor device 10, the upper insulating substrate 20U having electrode patterns 23U and 24U respectively disposed on both surfaces of a ceramics substrate 21U; a lower heat radiator 41D disposed on the electrode pattern 23D of the lower insulating substrate 20D via a bonding member 26; and an upper heat radiator 41U disposed on the electrode pattern 23U of the upper insulating substrate 20U via a bonding member 26.

[Thermal Resistance Characteristics]

FIG. 4 shows a result of a thermal simulation (thermal resistance characteristics) executed to the PM 1 according to the first embodiment, and the PM 11 (comparative example 1) and PM (comparative example 2).

As shown in FIG. 4, since the PM 12 according to the comparative example 2 of the first embodiment has a double-sided cooling structure excellent in cooling performance, the thermal resistance of the PM 12 can be reduced by approximately 40% as compared with the thermal resistance of the PM 11 according to the comparative example 1 of the first embodiment.

On the other hand, although the reduction of the thermal resistance by the PM 1 according to the first embodiment is less than the reduction of the thermal resistance by the PM 12 according to the comparative example 2 of the first embodiment, the thermal resistance of the PM 1 can be reduced by approximately 20% as compared with the thermal resistance of the PM 11 according to the comparative example 1 of the first embodiment.

More specifically, since the structure where the Cu wiring pattern 16 is bonded to the graphite plate 18GP which is the high heat conduction material having anisotropic thermal conductivity as the upper wiring 30 is adopted, improvement in the cooling performance (thermal diffusion effect) at the upper wiring 30 can be expected in the PM 1 according to the first embodiment.

A size (thickness) of each part of the PM 1, the PM 11, and the PM 12 used for the above-mentioned thermal simulation is as follows, and temperature on the back side surface of the heat radiator 41 is kept at 65° C.

For example, the heat radiators 41, 41D, and 41U have 1.0 mm thickness, the bonding member 26 has 0.2 mm thickness, the ceramics substrates 21, 21D, and 21U have 0.25 mm thickness, the electrode patterns 23D, 23U1, 23U2, 23U, 24D, and 24U have 1.0 mm thickness, and an SiC MOSFET having 350 μm thickness is used for the semiconductor device 10. Moreover, the Ag fired layer 27 has 60 μm thickness, the block electrode 29 has 350 μm thickness, the Cu wiring pattern 16 has 0.2 mm thickness, and the graphite plate 18GP has 0.7 mm thickness.

According to the PM 1 according to the first embodiment, the single-sided cooling structure is used as the fundamental structure, and the graphite upper wiring structure (graphite structure) of bonding the Cu wiring pattern 16 to the graphite plate 18GP having the anisotropic thermal conductivity as the upper wiring 30 on the semiconductor device 10 is applied, and thereby cooling performance which is not inferior to cooling performance of the double-sided cooling structure can be exhibited.

Moreover, in the PM 1 according to the first embodiment, the graphite plate 18GP is applied to the upper wiring 30, and thereby also simultaneously realizing the reduction of the stress.

Accordingly, there can be provided the power module which is advantageous in reliability and productivity enhancement and is inexpensive compared with the double-sided cooling structure, and thereby exhibiting the cooling performance which is not inferior to cooling performance of the double-sided cooling structure and also simultaneously realizing the reduction of the stress.

(Graphite Plate 18GP)

(Basic Configuration)

In the PM 1 according to the first embodiment, two types of graphite plates respectively having different orientations can be used as the graphite plate 18GP.

FIG. 5 shows a schematic configuration (an example of laminated structure) of the graphite sheet (graphene) GS composing the graphite plate 18GP.

As the graphite plate 18GP, there are a graphite plate 18GP (XY) having an XY orientation (first orientation) of which the thermal conductivity in a plane direction is higher than the thermal conductivity in a thickness direction, and a graphite plate 18GP (XZ) having an XZ orientation (second orientation) of which the thermal conductivity in the thickness direction is higher than the thermal conductivity in the plane direction. The graphite plate 18GP (XY) is expressed as shown in FIG. 6A, and the graphite plate 18GP (XZ) is expressed as shown in FIG. 6B.

As shown in FIG. 5, graphite sheets GS1, GS2, GS3, . . . , GSn of each surface composed of n layers have many covalent bonding of hexagonal crystal in one laminated crystal structure, and between the graphite sheets GS1, GS2, GS3, . . . , GSn of each surface are bonded to one another with Van der Waals force.

More specifically, the graphite which is a carbon-based anisotropic thermal conducting material is a laminated crystal body of a hexagonal mesh structure of carbon atom, and the thermal conduction thereof also has anisotropy, and the graphite sheets GS1, GS2, GS3, . . . , GSn shown in FIG. 5 have an amount of thermal conductivity (high thermal conductivity) larger than that in a thickness direction of Z-axis with respect to a crystal surface direction (on the XY plane).

Figure 6A:
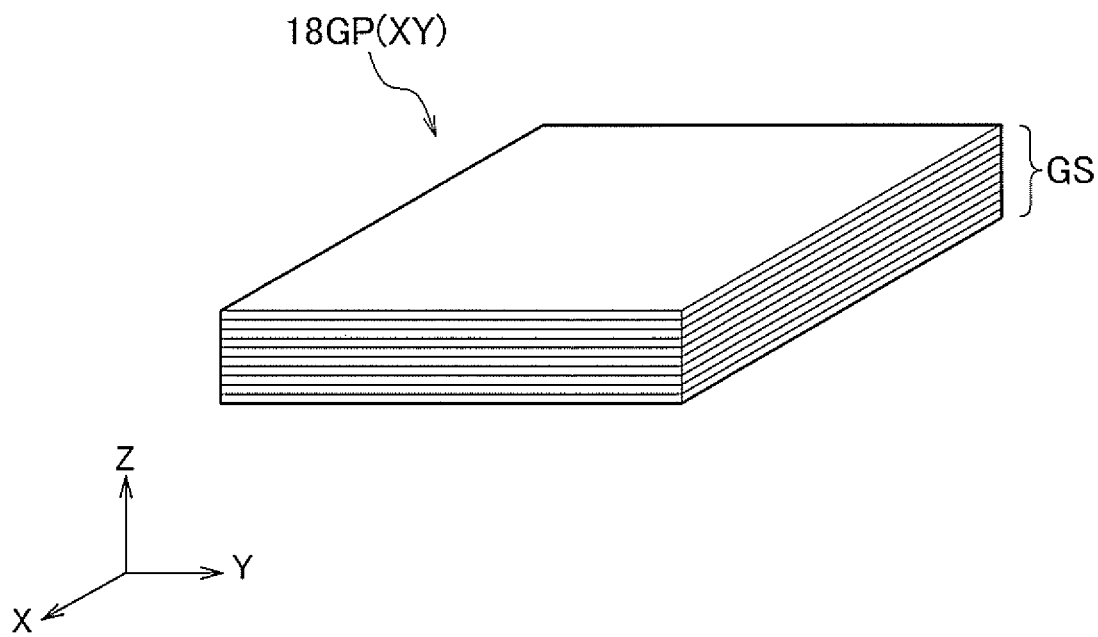
FIG. 6A is a schematic bird's-eye view configuration diagram showing a graphite plate of an XY orientation, in an example of a graphite plate applicable to the power module according to the first embodiment.
Figure 6B:
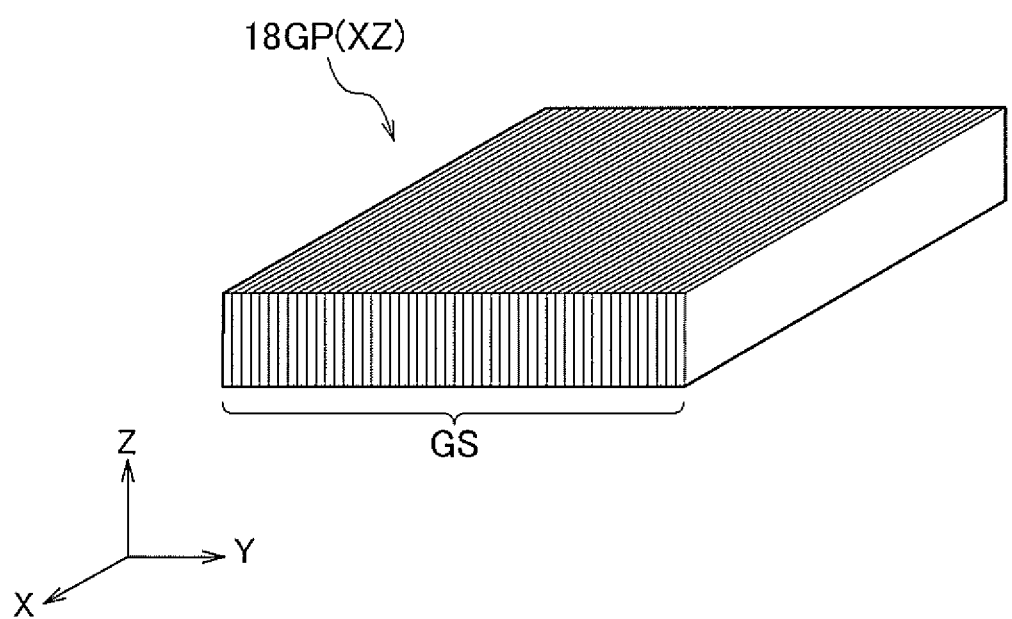
FIG. 6B is a schematic bird's-eye view configuration diagram showing a graphite plate of an XZ orientation, in the example of a graphite plate applicable to the power module according to the first embodiment.

Accordingly, as shown in FIG. 6A, the graphite plate 18GP (XY) having the XY orientation is provided with thermal conductivities X=1500 (W/mK), Y=1500 (W/mK), and Z=5 (W/mK), for example.

On the other hand, as shown in FIG. 6B, the graphite plate 18GP (XZ) having XZ orientation is provided with thermal conductivities X=1500 (W/mK), Y=5 (W/mK), and Z=1500 (W/mK), for example.

In addition, the density of each graphite plate 18GP (XY) and 18GP (XZ) is 2.2 (g/cm$^3$), and the thickness thereof is 2 mm to 10 mm, and the size thereof is equal to or less than 40 mm×40 mm.

Second Embodiment (Schematic Structure)

Figure 7A:
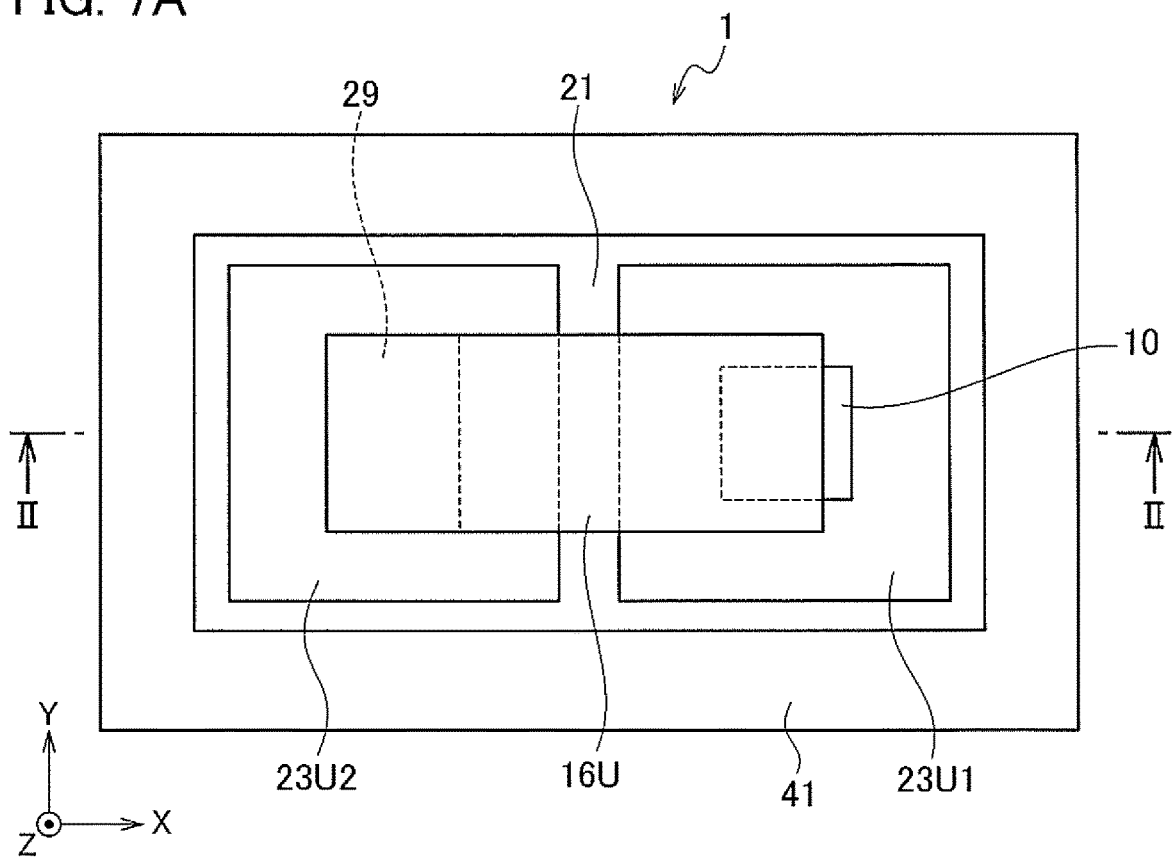
FIG. 7A is a schematic planar pattern configuration diagram showing a schematic structure of the power module according to the second embodiment.
Figure 7B:
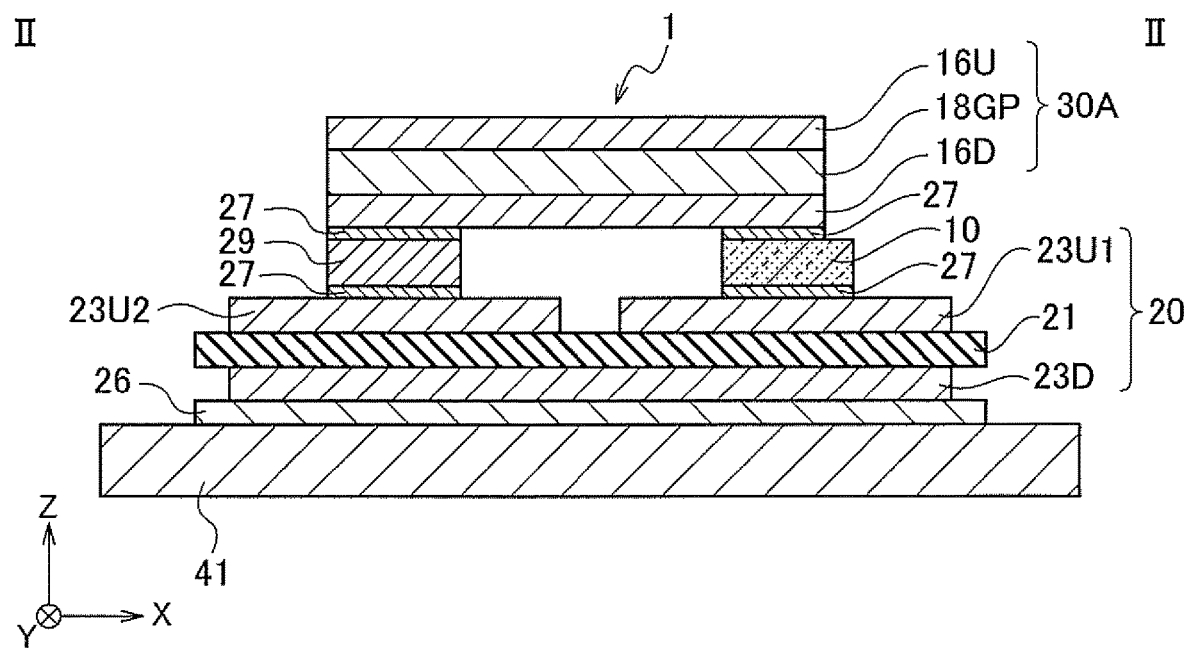
FIG. 7B is a schematic cross-sectional structure diagram taken in the line II-II of FIG. 7A.
Figure 8:
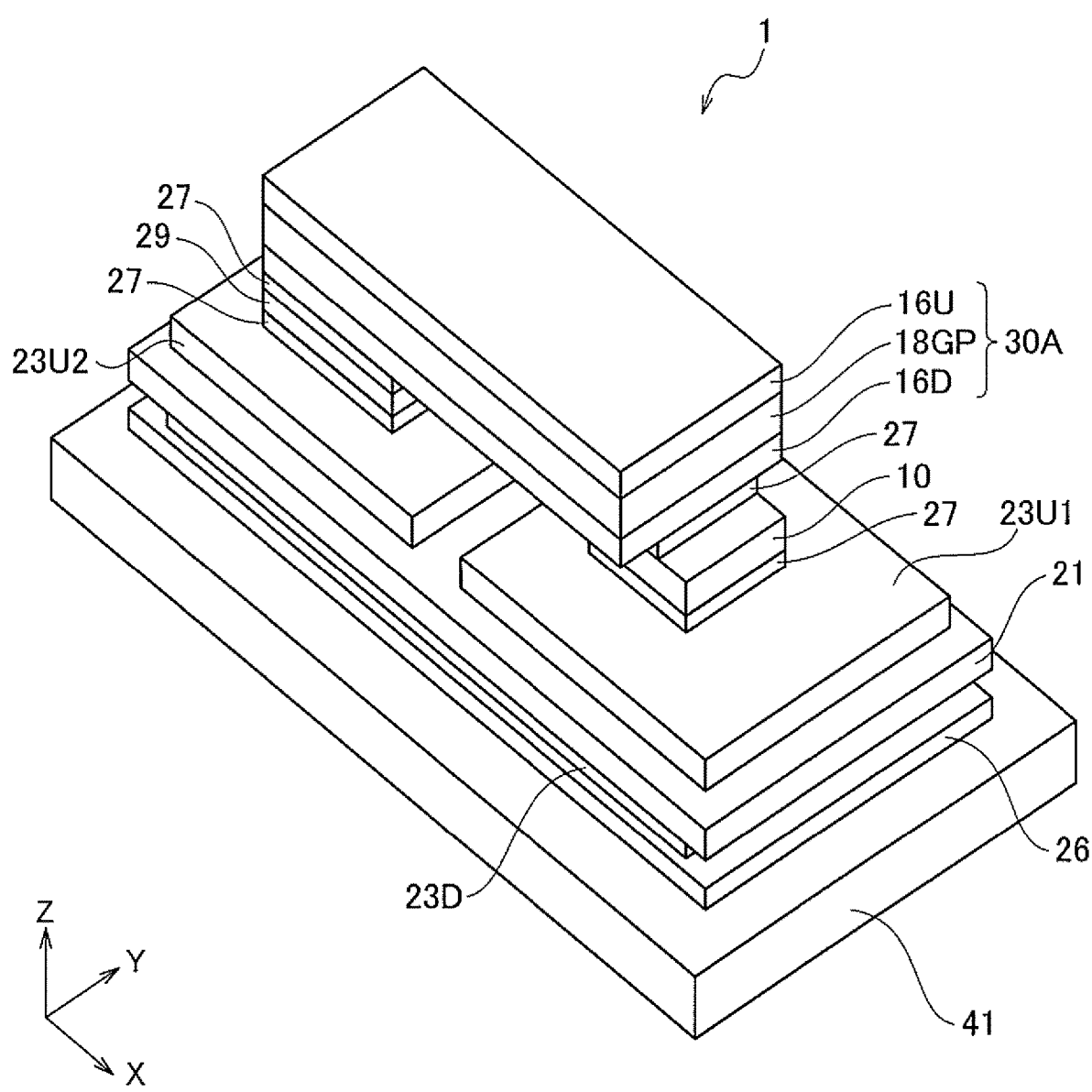
FIG. 8 is a schematic bird's-eye view configuration diagram showing a schematic structure of a power module according to a second embodiment.

FIG. 7A shows a schematic planar pattern configuration of a PM 1 according to a second embodiment, and FIG. 7B shows a schematic cross-sectional structure taken in the line II-II of FIG. 7A. Moreover, FIG. 8 shows a schematic bird's-eye view configuration of the PM 1 according to the second embodiment. In FIGS. 7A, 7B, 8 shows a case of applying a 1-in-1 module type PM 1 thereto.

As shown in FIGS. 7A, 7B, and 8, the PM 1 according to the second embodiment includes the substantially same configuration as that of the PM 1 according to the first embodiment, except for a configuration of an upper wiring (wiring lead portion) 30A.

As shown in FIGS. 7A, 7B, and 8, the PM 1 according to the second embodiment includes: an insulating substrate 20 including an insulating ceramics substrate 21, a drain electrode pattern (first electrode pattern) 23U1 and a source electrode pattern (second electrode pattern) 23U2, each disposed on an upper surface (first surface) of the ceramics substrate 21, and a back electrode pattern (third electrode pattern) 23D disposed on a lower surface (second surface) of the ceramics substrate 21; a semiconductor device (power device) 10 disposed on the drain electrode pattern 23U1, the semiconductor device 10 having electrodes (not shown) respectively formed on a front surface side and a back surface side thereof; a heat radiator 41 disposed on the back electrode pattern 23D; a block electrode 29 disposed on the source electrode pattern 23U2; and an upper wiring (wiring lead portion) 30A including a graphite plate (graphite wiring) 18GP having anisotropic thermal conductivity, a Cu wiring pattern (first wiring pattern) 16D disposed on a lower surface (first main face) of the graphite plate 18GP, and a Cu wiring pattern (second wiring pattern) 16U disposed on an upper surface (the 2nd principal surface) of the graphite plate 18GP, the upper wiring (wiring lead portion) 30A of which one end side is connected to a source pad electrode on the front surface side of the semiconductor device 10 and the other end side separated from the one end side in the same plane is connected to the source electrode pattern 23U2 via the block electrode 29.

Figure 9A:
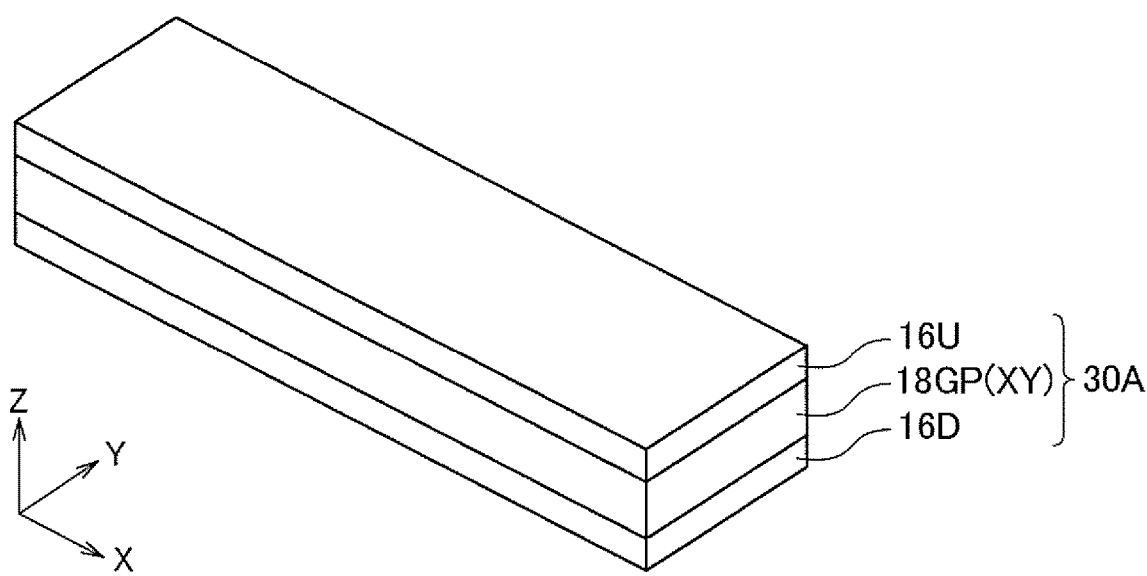
FIG. 9A is a schematic bird's-eye view configuration diagram of an upper wiring including a graphite plate applied to the power module according to the second embodiment.
Figure 9B:
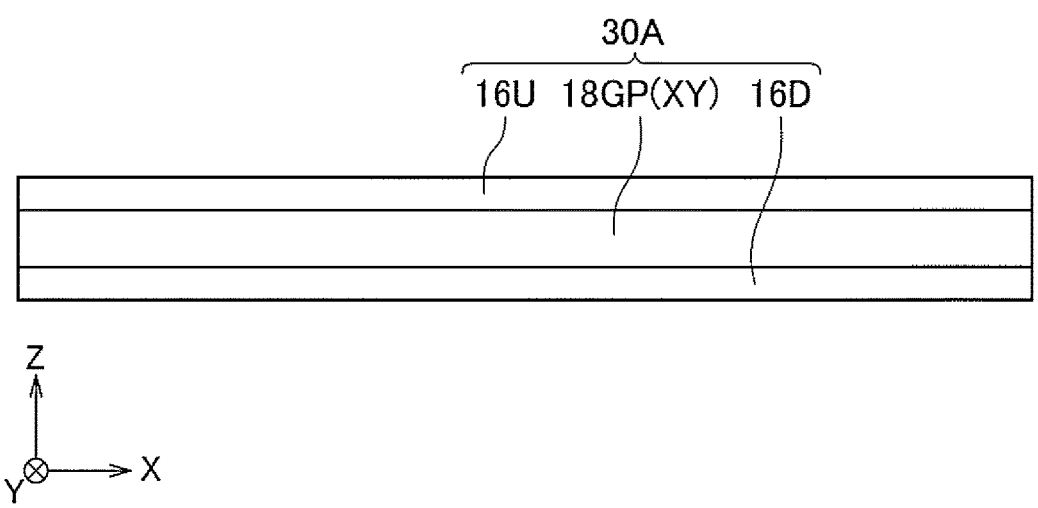
FIG. 9B is a schematic front face configuration diagram of the upper wiring provided with the graphite plate applied to the power module according to the second embodiment.

In the PM 1 according to the second embodiment, FIG. 9A shows a schematic bird's-eye view configuration of the upper wiring 30A, and FIG. 9B shows a schematic front face (side surface) configuration thereof.

In the PM 1 according to the second embodiment, as shown in FIGS. 9A and 9B, the upper wiring 30A includes: a graphite plate 18GP (XY) having the XY orientation; a Cu wiring pattern 16D bonded on a lower surface (first main face) of the graphite plate 18GP (XY); and a Cu wiring pattern 16U bonded on an upper surface (second main face) of the graphite plate 18GP (XY). The Cu wiring pattern 16D in a lower layer has an I-shaped cross-sectional shape formed separately from the block electrode 29 with respect to the XZ plane.

More specifically, the PM 1 according to the second embodiment includes: an insulating substrate 20 including an insulative ceramics substrate 21, a drain electrode pattern 23U1 and a source electrode pattern 23U2, each disposed on an upper surface (first surface) of the ceramics substrate 21, and a back electrode pattern 23D disposed on a lower surface (second surface) opposite to the upper surface; a semiconductor device 10 disposed on the drain electrode pattern 23U1, the semiconductor device 10 having a source electrode on a front surface side thereof and a drain electrode on a back surface side thereof; a heat radiator 41 disposed on the back electrode pattern 23D; a block electrode 29 disposed on the source electrode pattern 23U2; an upper wiring 30A including a graphite plate 18GP having anisotropic thermal conductivity, a Cu wiring pattern 16D disposed on the lower surface (first main face) of graphite plate 18GP and a Cu wiring pattern 16U disposed on upper surface (second main face) opposite to the lower surface, the upper wiring 30A of which one end side is connected to the front surface side of the semiconductor device 10 and the other end side separated from the one end side in the same plane is connected to the Cu electrode pattern 23U2 via the block electrode 29, wherein the graphite plate 18GP is provided with any one of an XY orientation of which a thermal conductivity in a plane direction is higher than the thermal conductivity in a thickness direction or an XZ orientation of which a thermal conductivity in the thickness direction is higher than the thermal conductivity in a plane direction, wherein the graphite plate 18GP is provided with a plate structure (18GP (XY)) composed by laminating a plurality of graphite sheets GS having the XY orientation or a plate structure (18GP (XZ)) composed by laminating a plurality of graphite sheet GS having the XZ orientation, wherein heat of the front surface side of the semiconductor device 10 is transferred to the insulating substrate 20 through the graphite plate 18GP.

In addition, the graphite plate 18GP (XY) having the XY orientation is provided with thermal conductivities X=1500 (W/mK), Y=1500 (W/mK), and Z=5 (W/mK), for example.

Accordingly, the upper wiring 30A to which the graphite plate 18GP (XY) is applied can expect a higher thermal diffusion effect with respect to the XY plane, and it becomes simultaneously possible to also effectively reduce a warpage (stress) by including the upper Cu wiring pattern 16U.

Modified Examples

Figure 10:
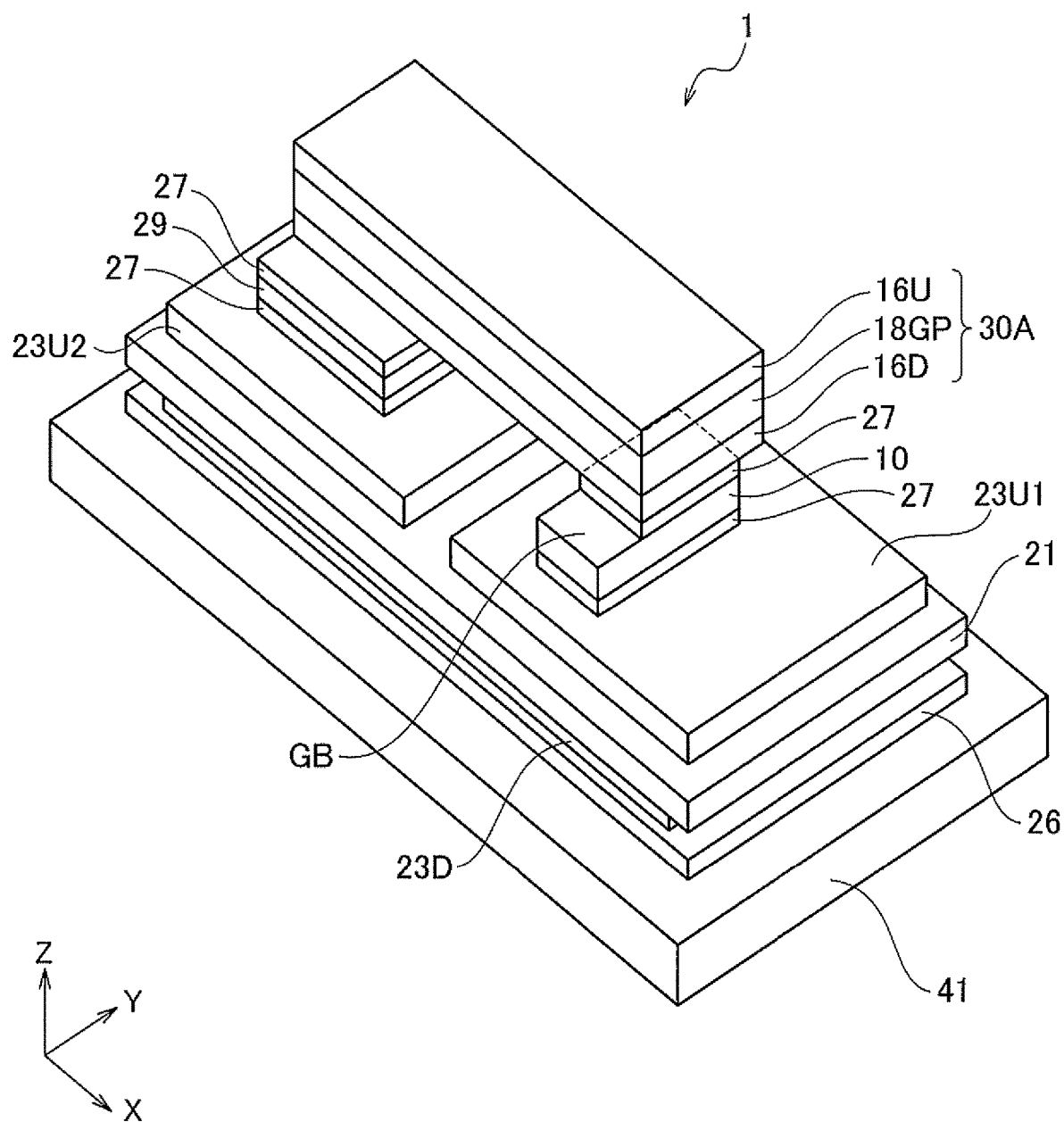
FIG. 10 is a schematic bird's-eye view configuration diagram showing a schematic structure of a power module according to a modified example of the second embodiment.

FIG. 10 shows a schematic bird's-eye view configuration of a PM 1 according to a modified example of the second embodiment.

The PM 1 according to the modified example of the second embodiment exemplifies that the semiconductor device 10 is disposed so that a direction of the semiconductor device 10 is different from that of the PM 1 according to the second embodiment, as shown in FIG. 10, for example. The PM 1 according to the modified example of the second embodiment has the substantially same configuration as that of the PM 1 according to the second embodiment except for the orientation of the semiconductor device 10 and therefore the detailed description is omitted.

More specifically, it is also possible to dispose an orientation of a gate pad electrode (not shown) in a direction orthogonal to the extending direction of the upper wiring 30A, in the semiconductor device 10, as the PM 1 according to the modified example of the second embodiment.

The upper wiring 30A is bonded to the upper surface of the semiconductor device 10 so that the gate pad electrode (bonding surface GB of the gate wire) is exposed therefrom for wire bonding with the gate pad electrode (not shown).

Although the detailed description is omitted, the configuration of the PM 1 according to the modified example of the second embodiment shown in FIG. 10 can be similarly applied also to configurations of PMs 1 according to other embodiments.

Third Embodiment

Figure 11A:
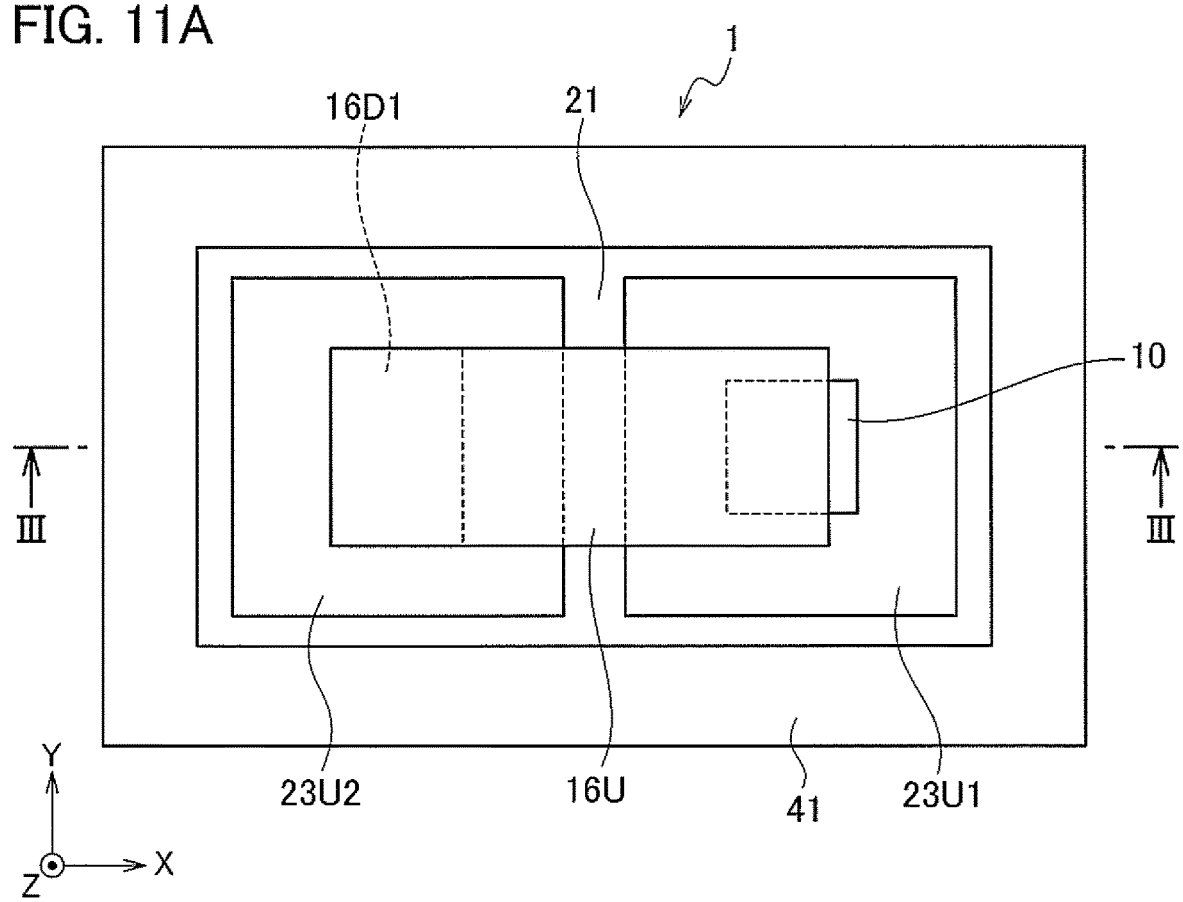
FIG. 11A is a schematic planar pattern configuration diagram showing a schematic structure of a power module according to a third embodiment.
Figure 11B:
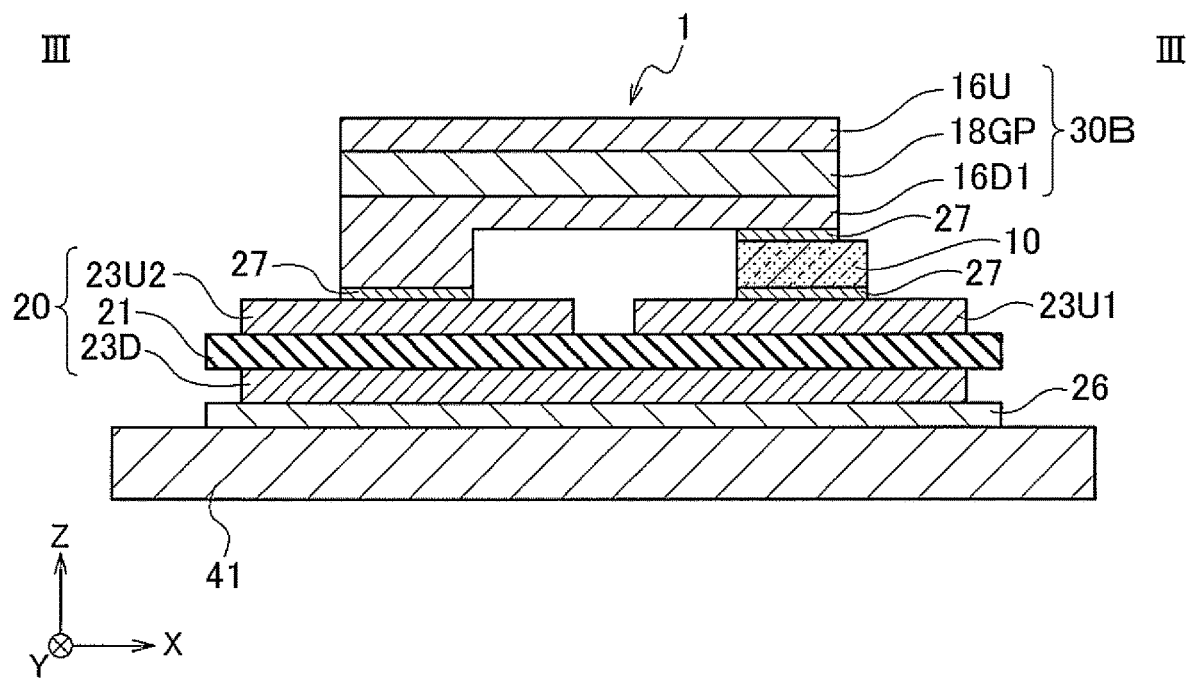
FIG. 11B is a schematic cross-sectional structure diagram taken in the line III-III of FIG. 11A.

FIG. 11A shows a schematic planar pattern configuration of a PM 1 according to a third embodiment, and FIG. 11B shows a schematic cross-sectional structure taken in the line of FIG. 11A. FIGS. 11A and 11B exemplify a case of applying a 1-in-1 module type PM 1 thereto.

As shown in FIGS. 11A and 11B, the PM 1 according to the third embodiment includes the substantially same configuration as that of the PM 1 according to the second embodiment, except for a configuration of an upper wiring (wiring lead portion) 30B.

More specifically, as shown in FIGS. 11A and 11B, the PM 1 according to the third embodiment includes: a ceramics substrate 21; an insulating substrate 20 including a drain electrode pattern (first electrode pattern) 23U1 and a source electrode pattern (second electrode pattern) 23U2, each disposed on an upper surface (first surface) of the ceramics substrate 21, and a back electrode pattern (third electrode pattern) 23D disposed on an lower surface (second surface) of the ceramics substrate 21; a semiconductor device (power device) 10 disposed on the drain electrode pattern 23U1, the semiconductor device 10 having source pad electrode (not shown) formed on a front surface thereof; a heat radiator 41 disposed on the back electrode pattern 23D; and an upper wiring (wiring lead portion) 30B including a graphite plate (graphite wiring) 18GP provided with anisotropic thermal conductivity, a cu wiring pattern (first wiring pattern) 16D1 disposed on a lower surface (first main face) of the graphite plate 18GP, the one end side is connected to the source pad electrode of the semiconductor device 10 and the other end side is connected to the source electrode pattern 23U2, and a cu wiring pattern (second wiring pattern) 16U disposed on an upper surface (second main face) of the graphite plate 18GP.

Figure 12A:
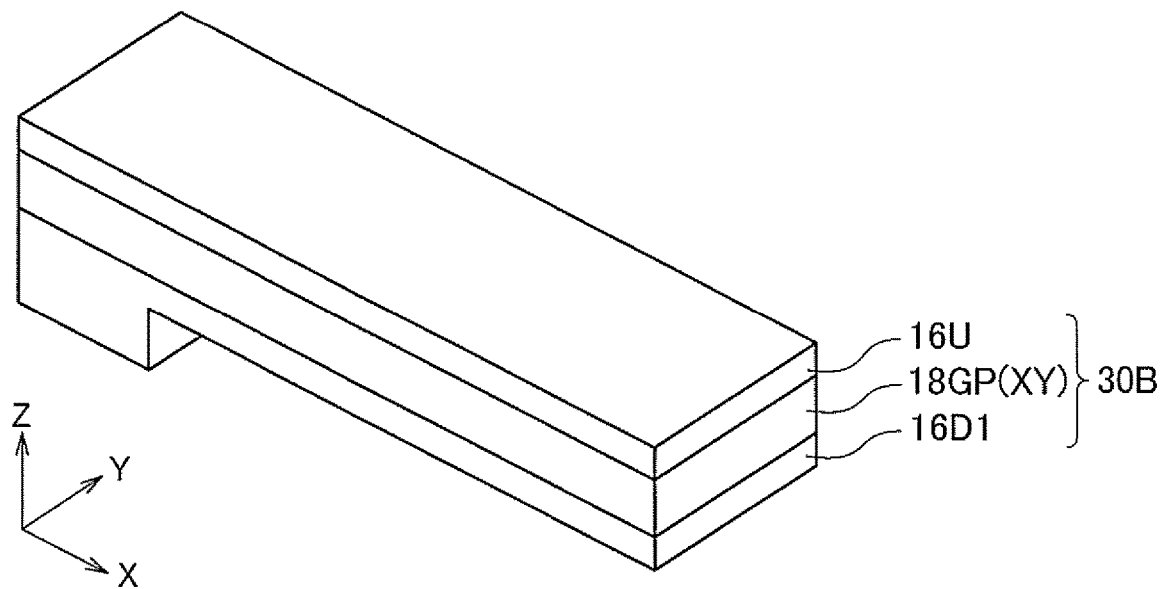
FIG. 12A is a schematic bird's-eye view configuration diagram of an upper wiring including a graphite plate applied to the power module according to the third embodiment.
Figure 12B:
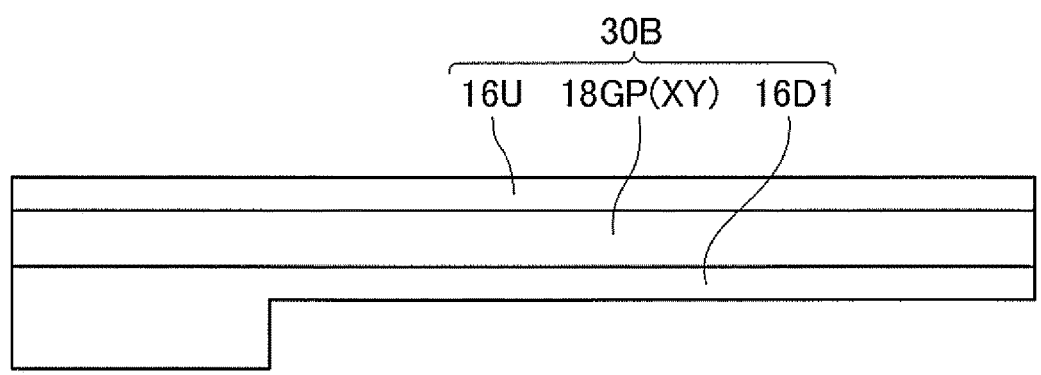
FIG. 12B is a schematic front face configuration diagram of the upper wiring provided with the graphite plate applied to the power module according to the third embodiment.

In the PM 1 according to the third embodiment, FIG. 12A shows a schematic bird's-eye view configuration of the upper wiring 30B, and FIG. 12B shows a schematic front face (side surface) configuration thereof.

More specifically, in the PM 1 according to the third embodiment, as shown in FIGS. 12A and 12B, the upper wiring 30B includes: a graphite plate 18GP (XY) having the XY orientation; a Cu wiring pattern 16D1 bonded on a lower surface of the graphite plate 18GP (XY); and a Cu wiring pattern 16U bonded on an upper surface of the graphite plate 18GP (XY). The Cu wiring pattern 16D1 in a lower layer has an L-shaped cross-sectional shape formed integrally with a block-shaped connection electrode portion (block electrode) with respect to the XZ plane.

Accordingly, in the upper wiring 30B to which the graphite plate 18GP is applied, the Cu wiring pattern of the lower layer and the block electrode are formed integrally with each other to be used in conjunction with the Cu wiring pattern 16U of the upper layer, as the Cu wiring pattern 16D1, and thereby a higher thermal diffusion effect can be expected with respect to the XY plane, and a warpage (stress) can be more effectively reduced.

According to the PM 1 according to the third embodiment, the upper wiring 30B composed by bonding the Cu wiring patterns 16U and 16D1 on the both of the front and back surfaces of the graphite plate 18GP is adopted, and thereby cooling performance which is not inferior to cooling performance of the double-sided cooling structure can be secured, even when the single-sided cooling structure is adopted from a viewpoint of productivity enhancement.

Simultaneously, a relaxation effect with respect to a stress can also be expected (for example, it can be reduced by approximately 50% by bonding the graphite plate and the Cu wiring pattern to each other, compared with the case of providing only the Cu wiring pattern.

Moreover, electrical conductivity of the upper wiring 30B is not degraded by being used in conjunction with the Cu wiring pattern 16D1.

Although the detailed description is omitted, the configuration (upper wiring structure) of the PM 1 according to the third embodiment can also be similarly applied to configurations of PMs 1 according to other embodiments, e.g. the first embodiment.

More specifically, although the configuration of the upper wiring 30B including the Cu wiring pattern 16U disposed on the upper surface of the graphite plate 18GP is shown, the upper Cu wiring pattern 16U is not necessary constituent element, and a configuration of omitting the Cu wiring pattern 16U can be adopted.

Also in the PM 1 according to each of the embodiments, not only the graphite plate 18GP (XY) having XY orientation but also the graphite plate 18GP (XZ) having XZ orientation, for example can be applied.

More specifically, the PM 1 according to the third embodiment includes: an insulating substrate 20 including an insulative ceramics substrate 21, a drain electrode pattern 23U1 and a source electrode pattern 23U2, each disposed on an upper surface of the ceramics substrate 21, and aback electrode pattern 23D disposed on a lower surface opposite to the upper surface; a semiconductor device 10 disposed on the drain electrode pattern 23U1, the semiconductor device 10 including electrodes on a front surface side and a back surface side thereof; a heat radiator 41 disposed on the back electrode pattern 23D; and an upper wiring 30B including a graphite wiring 18GP provided with anisotropic thermal conductivity, and a Cu wiring pattern 16D1 disposed on a lower surface of the graphite wiring 18GP, the Cu wiring pattern 16D1 has an L-shaped cross-sectional shape from which a thickness of a wiring pattern is partially varied so that one end side is connected on the front surface side of the semiconductor device 10 and the other end side separated from the one end side at the same plane is connected to source electrode pattern 23U2, wherein the graphite wiring 18GP is provided with any one of an XY orientation of which a thermal conductivity in a plane direction is higher than the thermal conductivity in a thickness direction or an XZ orientation of which a thermal conductivity in the thickness direction is higher than the thermal conductivity in a plane direction, wherein the graphite plate 18GP is provided with a plate structure (18GP (XY)) composed by laminating a plurality of graphite sheets GS having the XY orientation or a plate structure (18GP (XZ)) composed by laminating a plurality of graphite sheet GS having the XZ orientation, wherein heat of the front surface side of the semiconductor device 10 is transferred to the insulating substrate 20 through the graphite wiring 18GP.

[Thermal Resistance Characteristics]

Next, a result of executed simulation (relationship between the upper wiring and thermal resistance) will now be explained using a PM 1 according to a fourth embodiment as a model.

Fourth Embodiment (Schematic Structure)

Figure 13A:
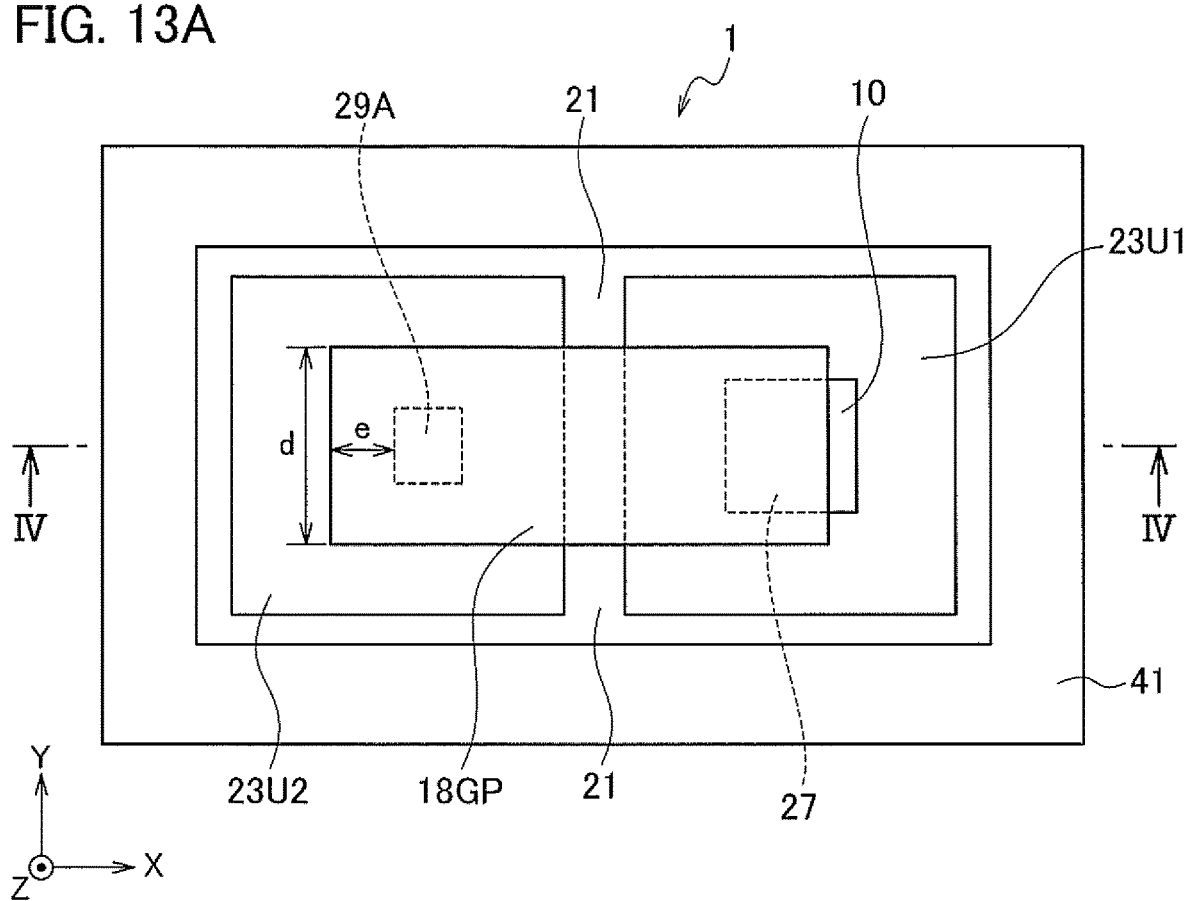
FIG. 13A is a schematic planar pattern configuration diagram showing a schematic structure of a power module according to a fourth embodiment.
Figure 13B:
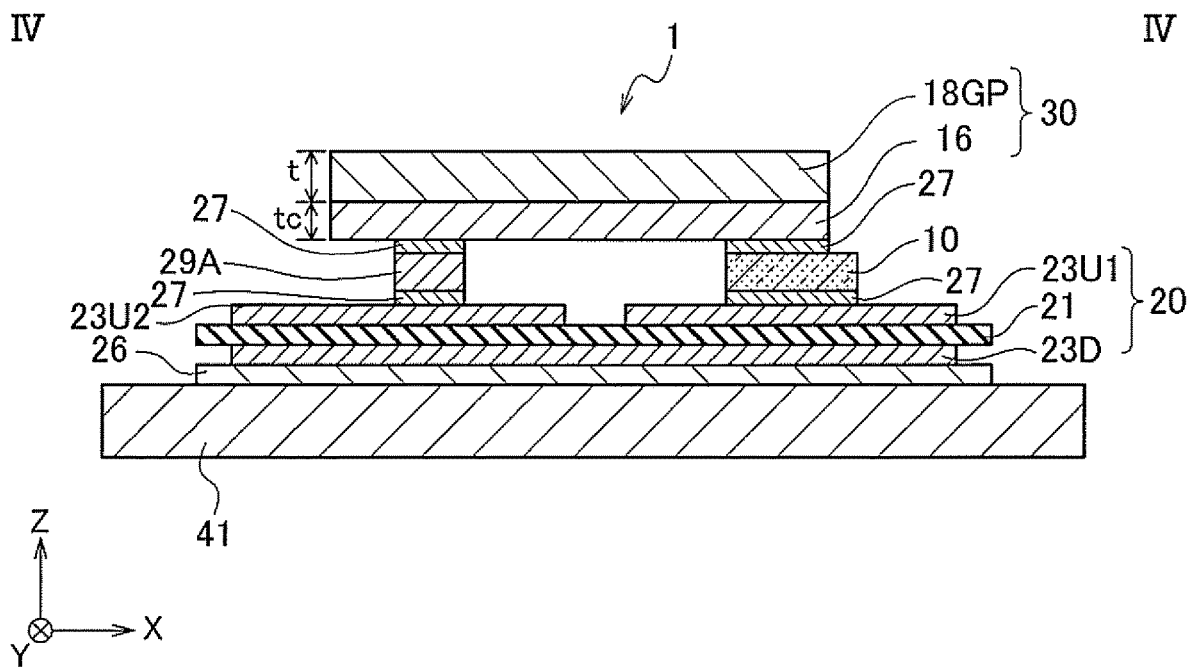
FIG. 13B is a schematic cross-sectional structure diagram taken in the line IV-IV of FIG. 13A.

FIG. 13A shows a schematic planar pattern configuration of a PM 1 according to a fourth embodiment, and FIG. 13B shows a schematic cross-sectional structure taken in the line IV-IV of FIG. 13A. FIGS. 13A and 13B exemplify a case of applying a 1-in-1 module type PM 1 thereto.

As shown in FIGS. 13A and 13B, the PM 1 according to the fourth embodiment includes the substantially same configuration as that of the PM 1 according to the first embodiment, except for a configuration of an block electrode 29A.

More specifically, the PM 1 according to the fourth embodiment includes an upper wiring 30 composed by bonding a Cu wiring pattern 16 on a lower surface (first main face) of the graphite plate 18GP, as shown in FIGS. 13A and 13B.

In the upper wiring 30, a thickness t of the graphite plate 18GP is 0.7 mm, and a thickness tc of the Cu wiring pattern 16 is 0.2 mm. Reference numeral d denotes a width (the length in a Y direction) of the upper wiring 30.

In addition, the graphite plate 18GP (XY) having XY orientation is provided with thermal conductivities X=1500 (W/mK), Y=1500 (W/mK), and Z=5 (W/mK), for example.

As the insulating substrate 20 of the PM 1 according to the fourth embodiment, a thickness of the SiN-based ceramics substrate 21 is set as 0.25 mm, for example, and the drain electrode pattern 23U1 of the upper layer and the source electrode pattern 23U2 are formed of a Cu foil having 1.0 mm thickness and a size of 15 mm×15 mm.

A Cu foil of 1.0=thickness is used for the back electrode pattern 23D of the lower layer, for example.

An SiC MOSFET having 350 μm thickness and a size of 5 mm×5 mm, for example is used for the semiconductor device 10.

A thickness of the Ag fired layer 27 is 60 μm.

The block electrode 29A is formed of a Cu foil having 0.35 mm thickness and a size of 3.2 mm×3.2 mm, for example.

The block electrode 29A is disposed at a substantially center portion of the upper wiring 30 in the Y direction, and a distance from the edge in the X direction of upper wiring 30 is set as the distance e.

Figure 14A:
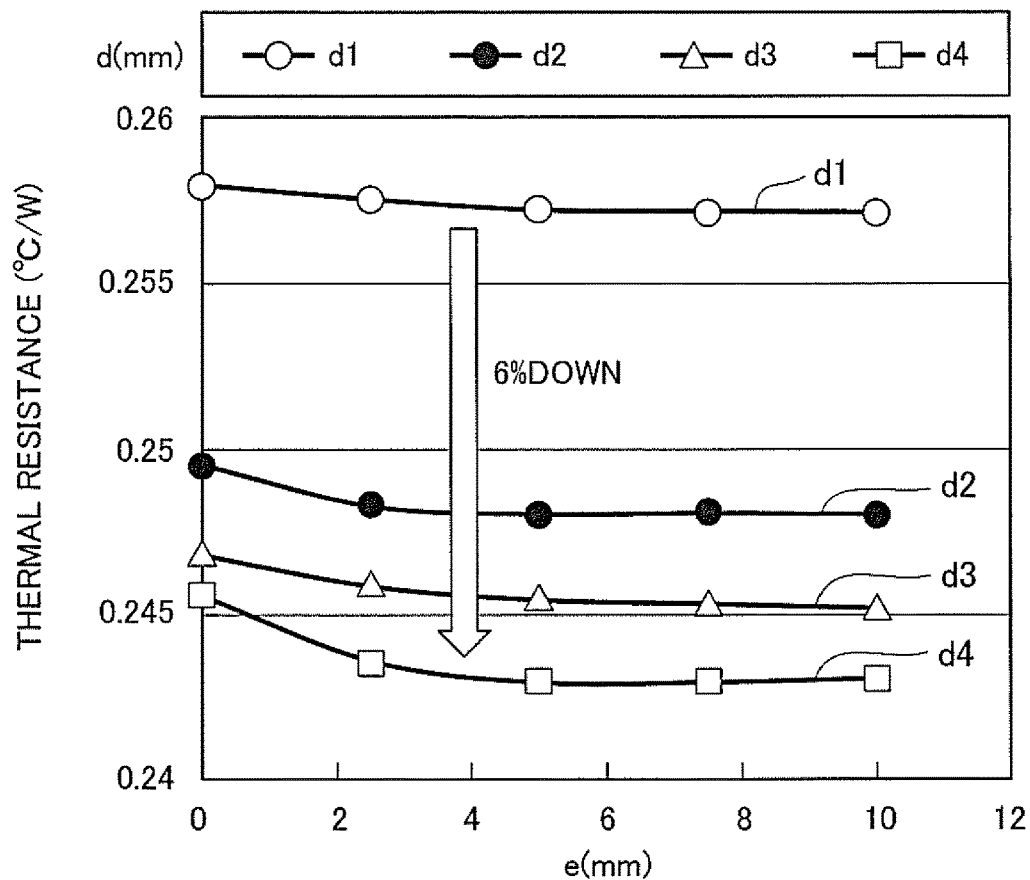
FIG. 14A is a characteristic diagram for explaining a relationship between a width and a thermal resistance of upper wiring (Phase 1), in an example of the power module according to the fourth embodiment.
Figure 14B:
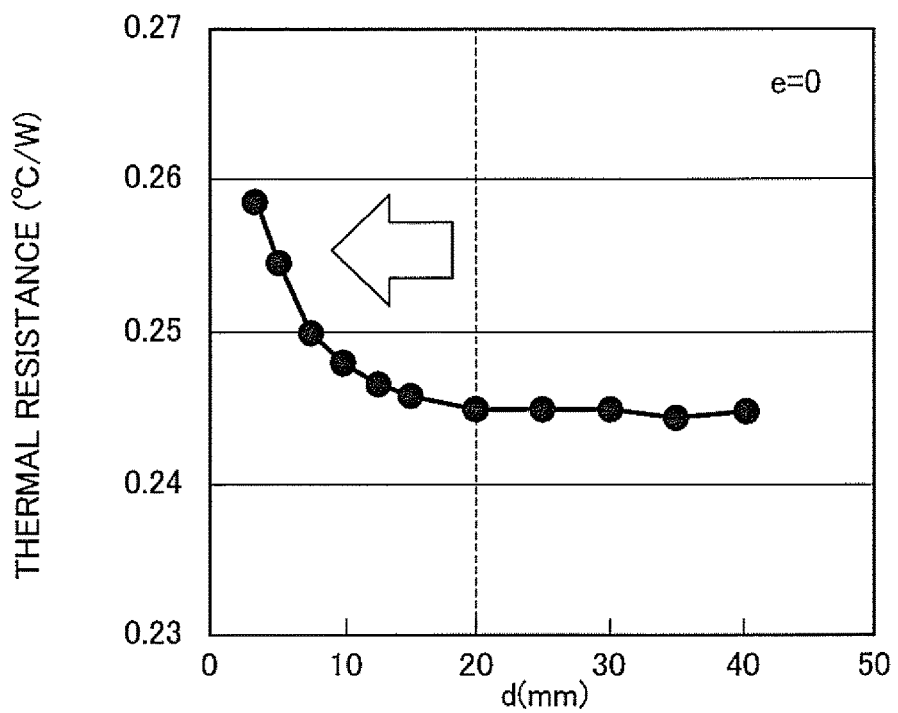
FIG. 14B is a characteristic diagram for explaining a relationship between the width and the thermal resistance of the upper wiring (Phase 2), in an example of the power module according to the fourth embodiment.

FIGS. 14A and 14B show a result of simulations of thermal resistances (° C./W) in a case where the width d of the upper wiring 30 is set as d1=3.2 mm, d2=7.5 mm, d3=10 mm, and d4=15 mm, using the PM 1 having such a configuration as a simulation model.

FIG. 14A shows a result of a case of the distance e from the edge in the X direction of the upper wiring 30 of the block electrode 29A is set as 0 mm, 2.5 mm, 5 mm, 7.5 mm, and 10 mm, and FIG. 14B shows a result of a case where the distance e is set as 0.

In the upper wiring 30, the thermal resistance is reduced (reduction of the maximum approximately 6%) since a thermal diffusion region is increased as the width d is increased, as clearly also from FIG. 14A.

As shown in FIG. 14B with the arrow, it is effective that the width d of the upper wiring 30 is equal to or less than 20 mm (the distance e from the block electrode 29 to the edge should be equal to or less than approximately 5 mm).

Figure 15A:
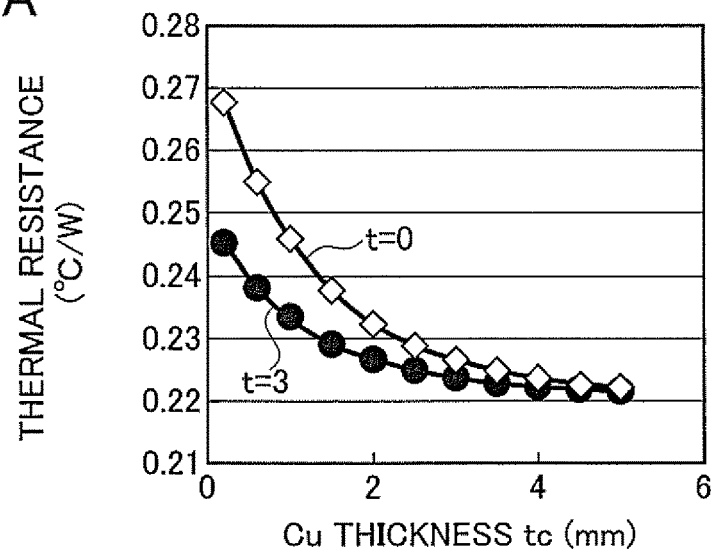
FIG. 15A is a characteristic diagram for explaining a relationship between a thickness and a thermal resistance of upper wiring (Phase 1), in an example of the power module according to the fourth embodiment.
Figure 15B:
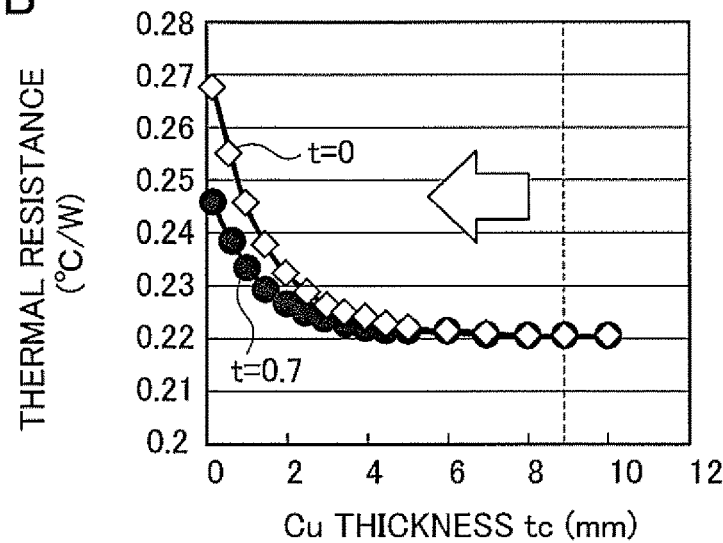
FIG. 15B is a characteristic diagram for explaining the relationship between the thickness and the thermal resistance of the upper wiring (Phase 2), in an example of the power module according to the fourth embodiment.
Figure 15C:
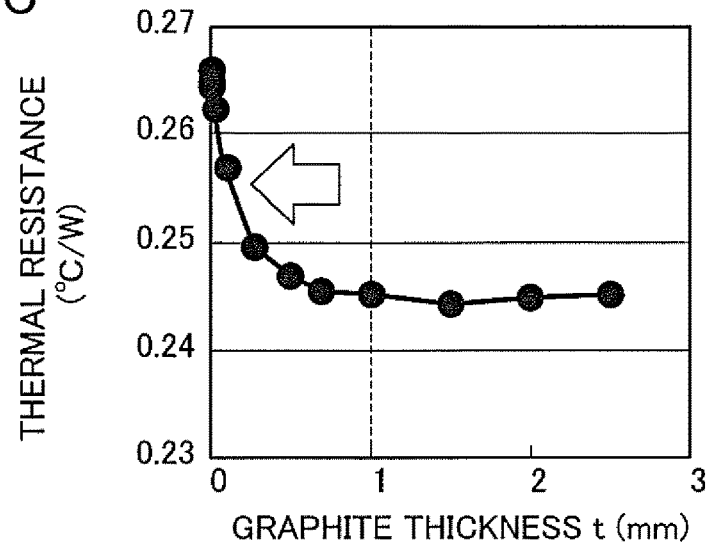
FIG. 15C is a characteristic diagram for explaining the relationship between the thickness and the thermal resistance of the upper wiring (Phase 3), in an example of the power module according to the fourth embodiment.

FIGS. 15A to 15C respectively show results of simulations, i.e., a relationship between the upper wiring 30 and the thermal resistance. FIG. 15A shows a relationship between the thickness tc of the Cu wiring pattern 16 (tc is equal to or less than 5 mm) and thermal resistance, FIG. 15B shows a relationship between the thickness tc of the Cu wiring pattern 16 (tc is equal to or less than 10 mm) and thermal resistance, and FIG. 15C shows a relationship between the thickness of the graphite plate 18GP t (thickness tc of the Cu wiring pattern 16 is 0.2 mm) and the thermal resistance.

FIG. 15A shows a case where the thickness t of the graphite plate 18GP is t=3 mm, and a case where the thickness t is t=0 (Cu wiring pattern 16 is singly used), and FIG. 15B shows a case where the thickness t of the graphite plate 18GP is t=0.7 mm, and a case where the thickness t is t=0.

In the upper wiring 30, as shown in FIG. 15B with the arrow, when the thickness tc of the Cu wiring pattern 16 is equal to or less than approximately 9 mm, the thermal resistance can be reduced rather than that of the case where the Cu wiring pattern 16 is singly used.

If thickness t of the graphite plate 18GP is approximately 1 mm, the effect of the reduction of thermal resistance can fully be expected, as shown in FIG. 15C with the arrow.

[Stress Relaxation Structure]

Next, a stress relaxation structure of the PM by applying the graphite structure will now be explained using a PM 1 according to a fifth embodiment as a model.

Fifth Embodiment (Schematic Structure)

Figure 16A:
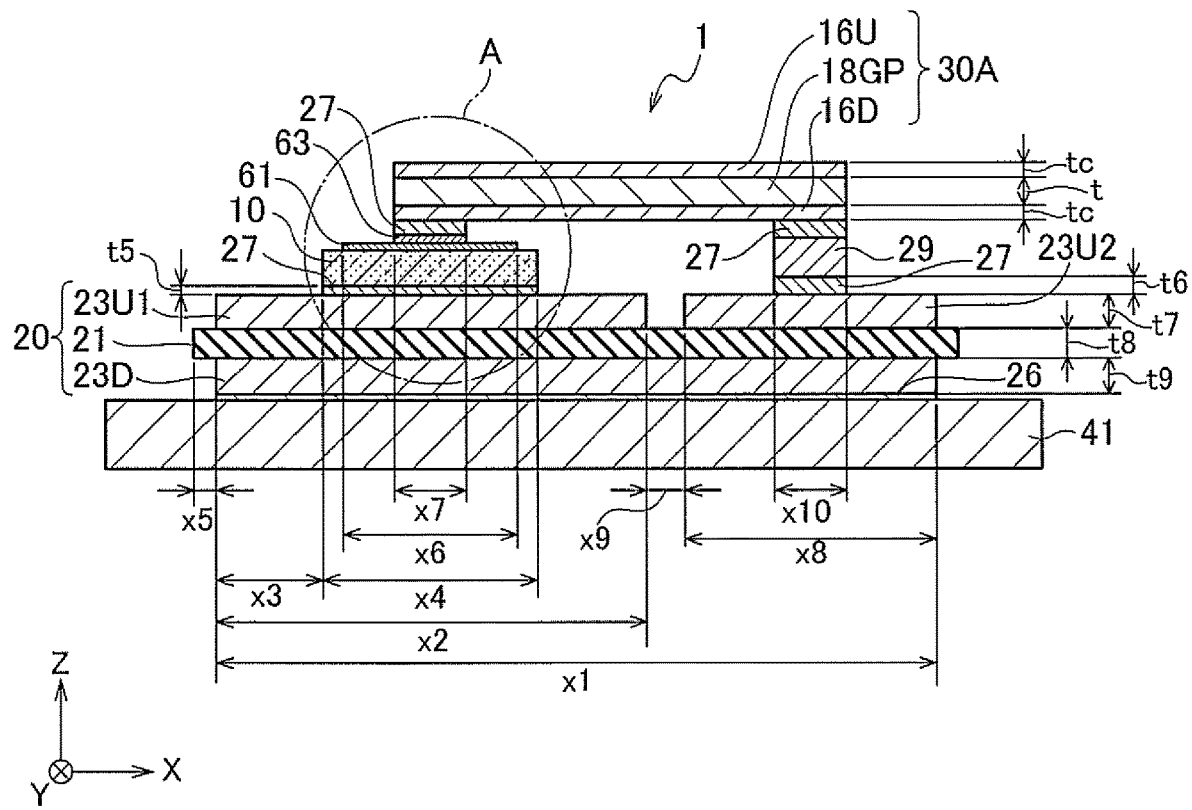
FIG. 16A is a schematic cross-sectional structure diagram showing a stress relaxation structure of a power module according to fifth embodiment.

FIG. 16A shows a schematic cross-sectional structure of a model for executing a simulation of a stress relaxation structure of the PM 1 according to the fifth embodiment.

Figure 16B:
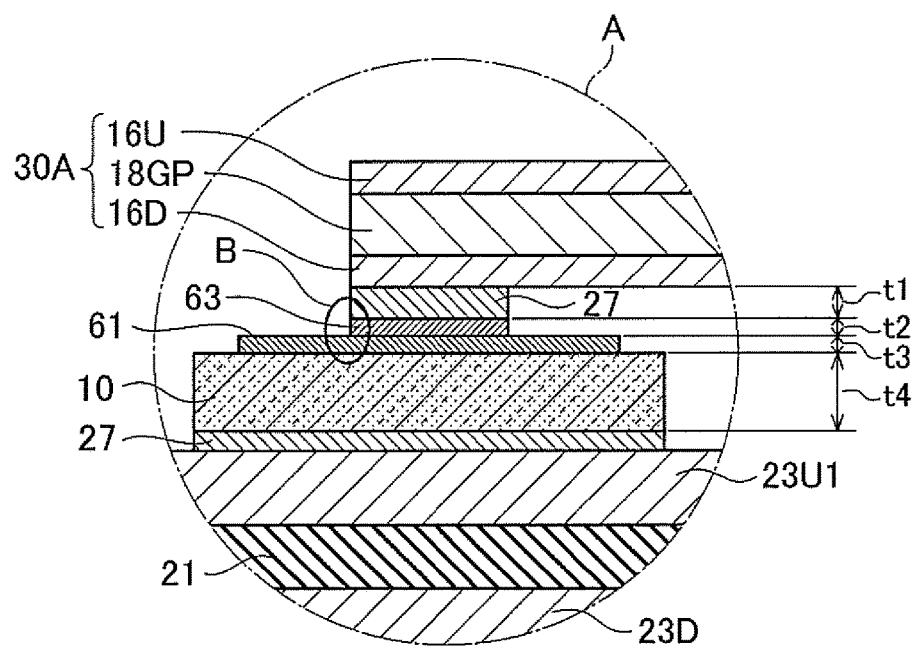
FIG. 16B is an enlarged view diagram showing an enlarged portion A shown in FIG. 16A.

FIG. 16B is an enlarged view diagram showing an enlarged portion A shown in FIG. 16A.

An obtaining portion of Mises stress in a PM 1 is expressed by the portion B shown in FIG. 16B with a Coefficient of Thermal Expansion (CTE) of the graphite plate 18GP.

In the PM 1 shown in FIGS. 16A and 16B, for example, with regard to sizes in the X direction, the length x1 of the back electrode pattern 23D is 28 mm, the length x2 of the drain electrode pattern 23U1 is 15 mm, the distance (length) x3 from the edge of the drain electrode pattern 23U1 to the semiconductor device 10 is 5 mm, the length x4 of the semiconductor device 10 is 5 mm, the distance (length) x5 from the edge of the back electrode pattern 23D to the edge of the ceramics substrate 21 is 0.5 mm, the length x6 of the Al electrode 61 portion on the device is 4.94 mm, the length x7 of the Ni plated layer 63 and Ag fired layer 27 on the device is 2.5 mm, the length x8 of the source electrode pattern 23U2 is 12.5 mm, the distance (length) x9 between the both electrode patterns 23U1 and 23U2 is 0.5 mm, and the length x10 of the block electrode 29 is 2.5 mm.

On the other hand, for example, with regard to sizes of the PM 1 (thickness) in the Z axial direction, the thicknesses t1 and t6 of the Ag fired layer 27 is 0.1 μm (0.01 in Mesh), the thickness t2 of the Ni plated layer 63 on the device is 3 μm (0.0005 in Mesh), the thickness t3 of the Al electrode 61 portion on the device is 0.005 μm (0.0005 in Mesh), the thickness t4 of the semiconductor device 10 is 0.35 mm, the thickness t5 of the Ag fired layer 27 under the device is 0.05 mm, the thicknesses t7 of the electrode pattern 23U1 and 23U2 are 0.5 mm, the thickness t8 of the ceramics substrate 21 is 0.32 mm, and the thickness t9 of the back electrode pattern 23D is 0.5=(the interface between the Ag fired layer and Al electrode portion is 0.0001 in Mesh).

The CTE of the graphite plate 18GP is X=0.1 ppm/K, Y=0.1 ppm/K, and Z=25 ppm/K, and the CTE of the Cu wiring patterns 16U and 16D is 17 ppm/K. The CTE in a case of the thickness t8 of the SiN-based ceramics substrate 21 being 0.3 mm is 3 ppm/K, the CTE in a case of the thickness t7 (=t9) of the electrode patterns 23U1, 23U2, and 23D being 0.3 mm is 17 ppm/K, and it is adjusted so that the whole of the CTEs may be within a range of approximately 8 ppm/K to approximately 9 ppm/K.

Moreover, there was examined a case where the thickness t of the graphite plate 18GP of the upper wiring 30 is 0.1 mm, 0.3 mm, 0.5 mm, or 0.7 mm, and the thickness tc of the Cu wiring patterns 16D and 16U is 0.1 mm, 0.3 mm, or 0.5 mm.

In order to observe an effect of the anisotropy of the graphite plate 18GP (CTE: X=0.1 ppm/K, Y=0.1 ppm/K, and Z=25 ppm/K), a coefficient of elasticity (Mises stress) GPa is set to 120 GPa which is the same as that of Cu.

Figure 17:
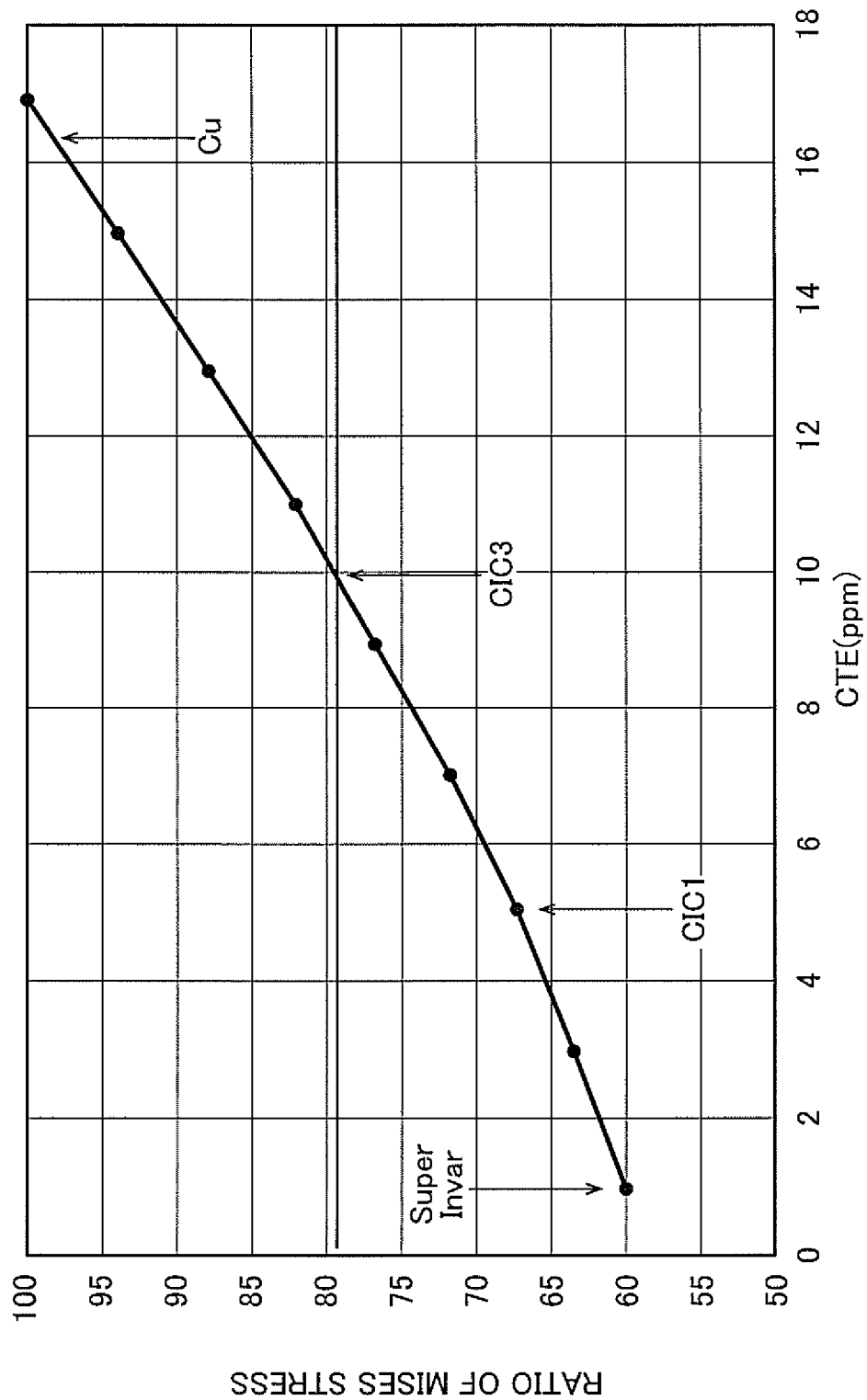
FIG. 17 is a characteristic diagram for explaining the stress relaxation structure as an example of the power module according to fifth embodiments.

FIG. 17 shows a relationship between the CTE (ppm) and the Mises stress (ratio of Mises stress of the graphite structure), which is a ratio of Mises stress using the CTE=17 ppm as a base of 100. In FIG. 17, in order to execute the simulation of the graphite structure, Cu and INV are used.

In this context, Mises stress is one of equivalent stresses used in order to indicate a stress state which occurs inside a substance as a single value. The definitional equation of Mises stress is expressed as follows:

$$\sigma_w = \sqrt{\frac{1}{2}\{(\sigma 1 - \sigma 2)^2 + (\sigma 2 - \sigma 3)^2 + (\sigma 3 - \sigma 1)^2\}}$$

where σ1 is the maximum principal stress, σ2 is an intermediate principal stress, and σ3 is the minimum principal stress, in the definitional equation. In this case, the principal stress σ1, σ2, and σ3 applied to the Ag fired layer 27 are respectively selected from a principal stress in the X direction, a principal stress in the Y direction, and a principal stress in the Z axial direction.

In FIG. 17, Cu corresponds to a case where the simulation model is a simple substance of Cu, Super Invar corresponds to a case where the simulation model is a simple substance of INV, CIC1 corresponds to a case where a ratio of the thicknesses of Cu, INV and Cu is 1:1:1, and CIC3 corresponds to a case where a ratio of the thicknesses of Cu, INV and Cu is 1:3:1.

In the graphite structure, the ratio of Mises stress can be reduced by approximately 50%, as clearly also from FIG. 17.

More specifically, the ratio of Mises stress in the simulation model can be reduced by varying the CTEs of Cu and INV. This suggests a possibility that Mises stress to be applied to the Al electrode 61 portion can be largely improved, by changing the CTE of the upper wiring 30 although a change of Mises stress of the Al (aluminum) electrode 61 portion is small even if varying the thickness of the Cu wiring pattern 16.

Accordingly, the upper wiring 30 of the graphite structure composed by bonding the Cu wiring patterns 16D and 16U to the graphite plate 18GP can become a structure excellent also from a viewpoint of the stress.

In FIG. 17, if the ratio of Mises stress exceeds 80 (CTE is equal to or greater than approximately 10 ppm), destruction is observed in the model.

Sixth Embodiment (Schematic Structure)

Figure 18A:
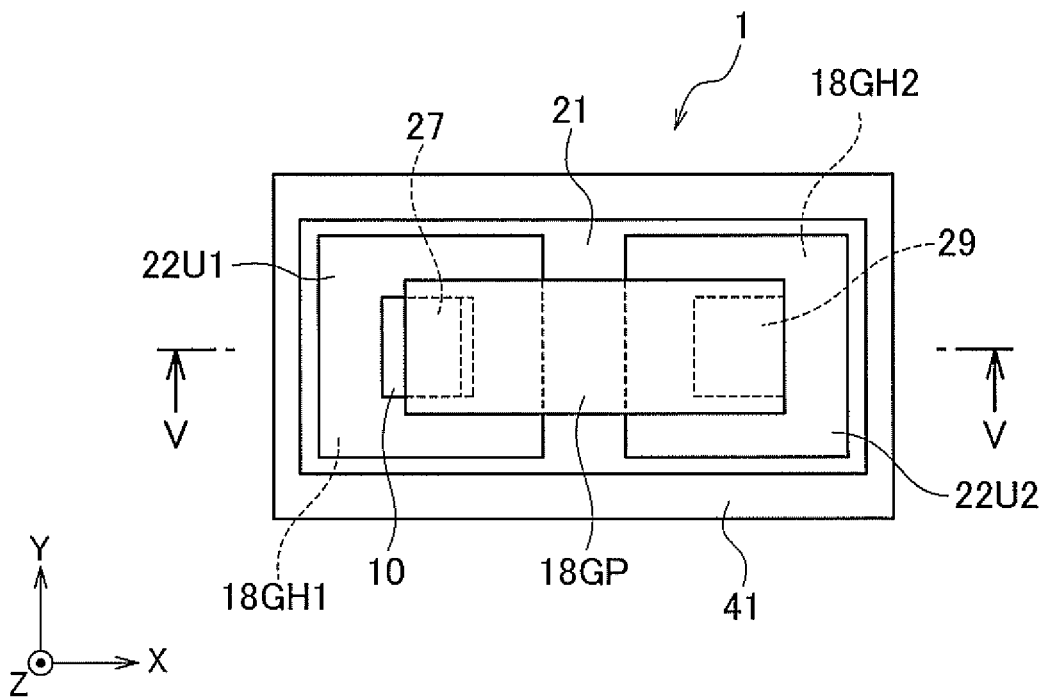
FIG. 18A is a schematic planar pattern configuration diagram showing a schematic structure of a power module according to a sixth embodiment.
Figure 18B:
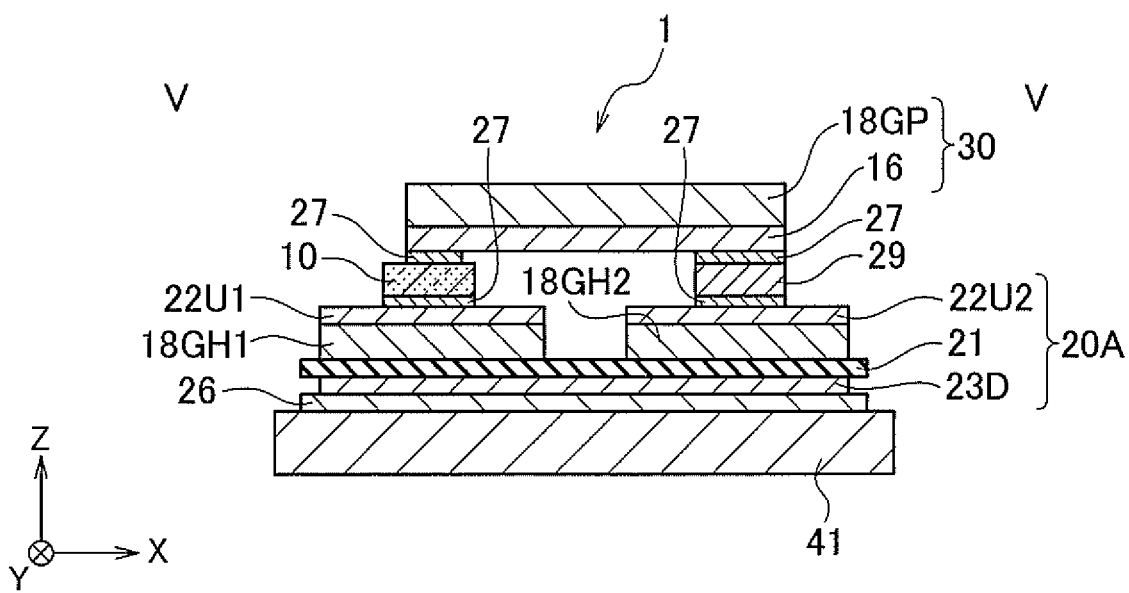
FIG. 18B is a schematic cross-sectional structure diagram taken in the line V-V of FIG. 18A.

FIG. 18B shows a schematic cross-sectional structure taken in the line V-V of FIG. 18A. FIGS. 18A and 18B exemplify a case of applying a 1-in-1 module type PM 1 thereto.

As shown in FIGS. 18A and 18B, the PM 1 according to the sixth embodiment includes the substantially same configuration as that of the PM 1 according to the first embodiment, except for a configuration of graphite substrates 18GH1 and 18GH2.

As shown in FIGS. 18A and 18B, the PM 1 according to the sixth embodiment further includes graphite substrates 18GH1 and 18GH2 having anisotropy in the CTE disposed on an upper surface (first surface) of the ceramics substrate 21. Moreover, the drain electrode pattern (first electrode pattern) 22U1 to which the semiconductor device (power device) 10 is bonded is disposed on the graphite substrate 18GH1, and the source electrode pattern (second electrode pattern) 22U2 to which the block electrode 29 is bonded is disposed on the graphite substrate 18GH2.

More specifically, the PM 1 according to the sixth embodiment includes: an insulative ceramics substrate 21; graphite substrates 18GH1 and 18GH2 having anisotropy in the CTE disposed on the ceramics substrate 21; a semiconductor device 10 disposed on the graphite substrates 18GH1 and 18GH2, the semiconductor device 10 including electrodes on a front surface side and a back surface side thereof; and graphite wiring 30 having an anisotropic thermal conductivity connected to the front surface side of the semiconductor device 10, wherein heat of the front surface side of the semiconductor device 10 is transferred to the ceramics substrate 21 through the graphite wiring 30.

Moreover, the PM 1 according to the sixth embodiment includes: a graphite insulating substrate 20A including an insulative ceramics substrate 21 and graphite substrates 18GH1 and 18GH2 having anisotropy in the CTE disposed on the ceramics substrate 21; a semiconductor device 10 disposed on the graphite insulating substrate 20A, the semiconductor device 10 including an electrode on each of a front surface side and a back surface side; and graphite wiring 30 having an anisotropic thermal conductivity connected to the front surface side of the semiconductor device 10, wherein heat of the front surface side of the semiconductor device 10 is transferred to the ceramics substrate 21 through the graphite wiring 30.

In the PM 1 according to the sixth embodiment, a stress applied on the bonded portion (the Ag fired layer 27 and the Al electrode 61 portion) can be reduced by changing shapes (orientation and size vertical and horizontal directions) of the semiconductor device 10 bonded on the drain electrode pattern 22U1, in addition to the thermal diffusion effect due to the graphite structure.

The strong stress is applied to the bonded portion due to a difference between both CTEs in an orientation where the CTE is large since the thermal conductivity and CTE have an anisotropy on the graphite substrate 18GH1 when square-shaped device(s) (module(s)) are bonded on the graphite substrate 18GH1. However, the stress applied to the bonded portion can be reduced by successfully matching the shape of the device with the CTE of the graphite substrate 18GH1.

Hereinafter, the stress applied to the bonded portion will now be explained, as an example of a case where the graphite substrate 18GH1 having anisotropy in the CTE is applied to the PM 1 according to the sixth embodiment.

FIG. 19A shows a schematic planar pattern configuration (PMa) for explaining an arrangement example of an FRD SC1 and an IGBT SC2 with respect to the graphite substrate 18GH1. FIG. 19B shows a schematic planar pattern configuration (PMb) for explaining an arrangement example of an SiC MOSFET SC3 with respect to the graphite substrate 18GH1.

Although illustration of the semiconductor device 10 is omitted in this explanation, the semiconductor device 10 is actually bonded to the drain electrode pattern 22U1 disposed on the graphite substrate 18GH1.

In the case of the IGBT including a diode etc., as shown in FIG. 19A, the FRD SC1 and the IGBT SC2 are bonded as the semiconductor device 10, on the graphite substrate 18GH1.

In the case of the SiC MOSFET, as shown in FIG. 19B, the SiC MOS SC3 is bonded as the semiconductor device 10 on the graphite substrate 18GH1.

If the orientation of the CTE of the graphite substrate 18GH1 is X=0.5 ppm/K, Y=25 ppm/K, and Z=0.5 ppm/K, for example, a rectangular device (H1>C1) having a size H1 in the longitudinal (X) direction and a size C1 in the non-longitudinal (Y) direction is used for each of the FRD SC1, the IGBT SC2, and the SiC MOS SC3, each non-longitudinal direction C1 is made to correspond to an orientation (Y) of which the CTE is larger.

The configuration of the PM 1 according to the sixth embodiment can similarly be applied also to configurations of the PMs 1 according to other embodiments.

[Stress Reduction Effect]

Hereinafter, a stress reduction effect by applying the graphite substrate to the PMs according to the first to sixth embodiments will now further be explained.

Working Example 1

Figure 20A:
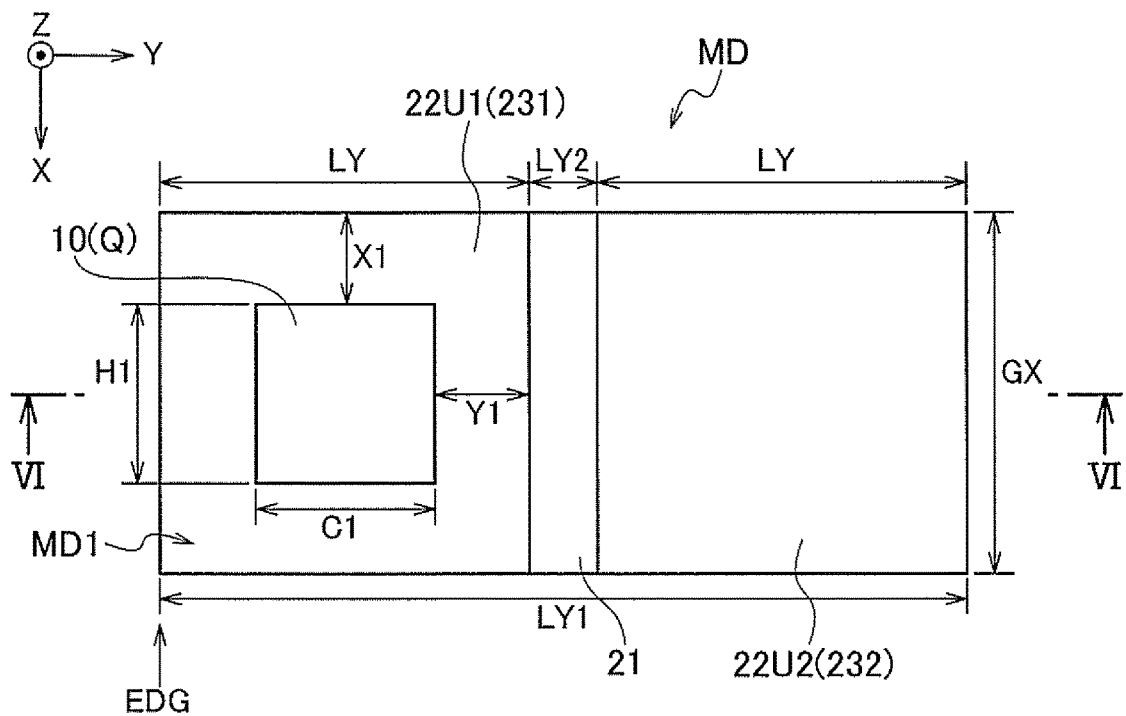
FIG. 20A is a schematic planar pattern configuration diagram of a simulation model MD for simulating a stress applied to the bonded portion, in a case of applying the graphite substrate having anisotropy in the CTE to the power module according to embodiments.
Figure 20B:
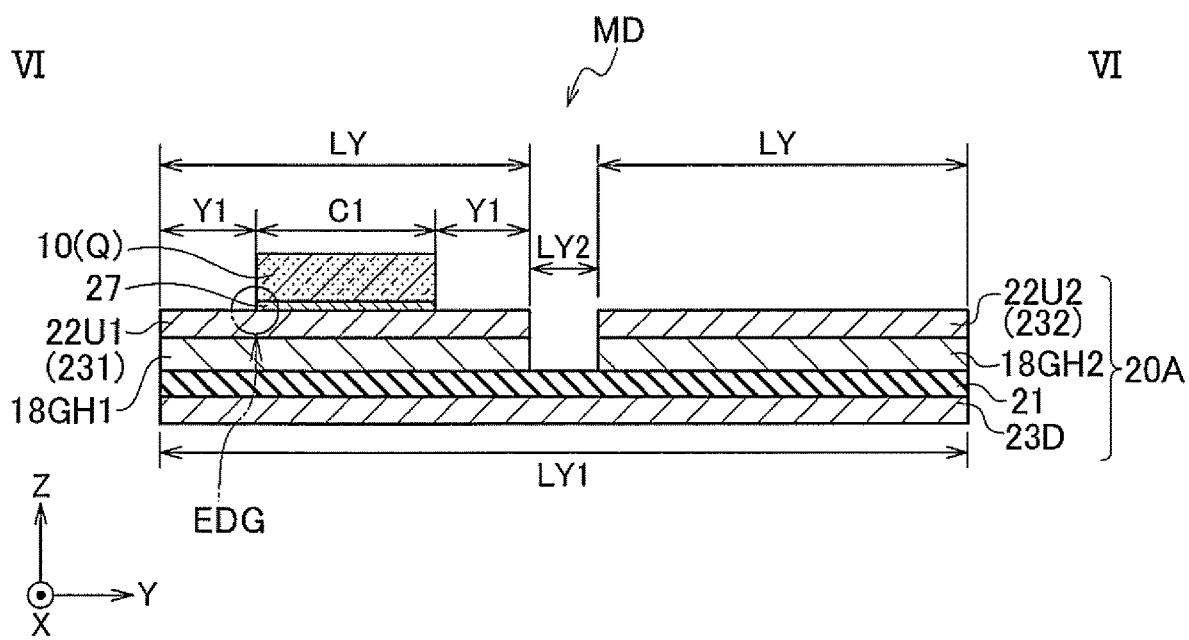
FIG. 20B is a schematic cross-sectional structure diagram taken in the line VI-VI of FIG. 20A for simulating the stress applied to the bonded portion, in the case of applying the graphite substrate having anisotropy in the CTE to the power module according to embodiments.

FIG. 20A shows an example of a schematic planar pattern configuration of a simulation model MD for executing a simulation of a stress applied to the bonded portion, when the graphite substrate having anisotropy in the CTE is applied thereto. FIG. 20B shows a schematic cross-sectional structure taken in the line VI-VI of FIG. 20A.

In this context, in the simulation model MD having the configuration shown in FIGS. 20A and 20B, a laminated substrate structure composed by including a lower surface Cu foil (back electrode pattern 23D)/an $Si_3N_4$ substrate (ceramics substrate 21)/a graphite plate (graphite substrates 18GH1 and 18GH2)/an upper surface Cu foil (electrode patterns 22U1 and 22U2) is referred to as a graphite insulating substrate.

Since the graphite plate included in the graphite insulating substrate has an anisotropy in the thermal conductivity and the CTE, a strong stress is applied on the bonded portion due to a difference between the CTEs in an orientation of which the CTE is larger, when die bonding of square-shaped device is performed. However, the stress applied to the bonded portion can be reduced by successfully matching the shape of the device with the CTE of the graphite plate.

In the simulation model MD, as shown in FIGS. 20A and 20B, an SiN-based ceramics substrate 21 of 10 mm (GX)×21 mm (LY1) is used, a Cu foil of 10 mm (GX)×10 mm (LY) is used as the drain electrode pattern 22U1 to which the semiconductor device 10 is bonded, and the source electrode pattern 22U2 to which a block electrode (not shown) is bonded.

The drain electrode pattern 22U1 and the source electrode pattern 22U2 are separated from each other by the distance LY2=1 mm.

The size of the back electrode pattern 23D is identical to the size of the ceramics substrate 21 (10 mm×21 mm).

The size of the graphite substrates 18GH1 and 18GH2 is identical to the size of the drain electrode pattern 22U1 and the source electrode pattern 22U2 (10 mm×21 mm).

A square-shaped SiC MOSFET of 5 mm (H1)×5 mm (C1) is used (H1=C1) as the semiconductor device 10, and is bonded on a substantially center portion of the drain electrode pattern 22U1 (at distances of X1 (2.5 mm) and Y1 (2.5 mm) from edges of the drain electrode pattern 22U1) with the Ag fired layer 27.

The orientation of the CTE of the graphite substrates 18GH1 and 18GH2 is X=25 ppm/K, Y=0.1 ppm/K, and Z=0.1 ppm/K, for example.

As shown in FIG. 21, the thickness (mm) of each part is optimized so that the thermal resistance may become the lowest. In the case of the simulation model MD, for example, the semiconductor device 10 is optimized to approximately 0.35 mm thickness, the graphite substrates 18GH1 and 18GH2 are optimized to approximately 1.5 mm thickness, the ceramics substrate 21 is optimized to approximately 0.32 mm thickness, the drain electrode patterns 22U1 and 22U2 are optimized to approximately 0.3 mm thickness, the back electrode pattern 23D is optimized to approximately 0.2 mm thickness, and the Ag fired layer 27 is optimized to approximately 0.05 mm thickness.

In such a configuration, a stress applied to the Ag fired layer 27 is obtained by calculating Mises stress under 25° C., as a non-stress state is at 200° C., for example.

Figure 22:
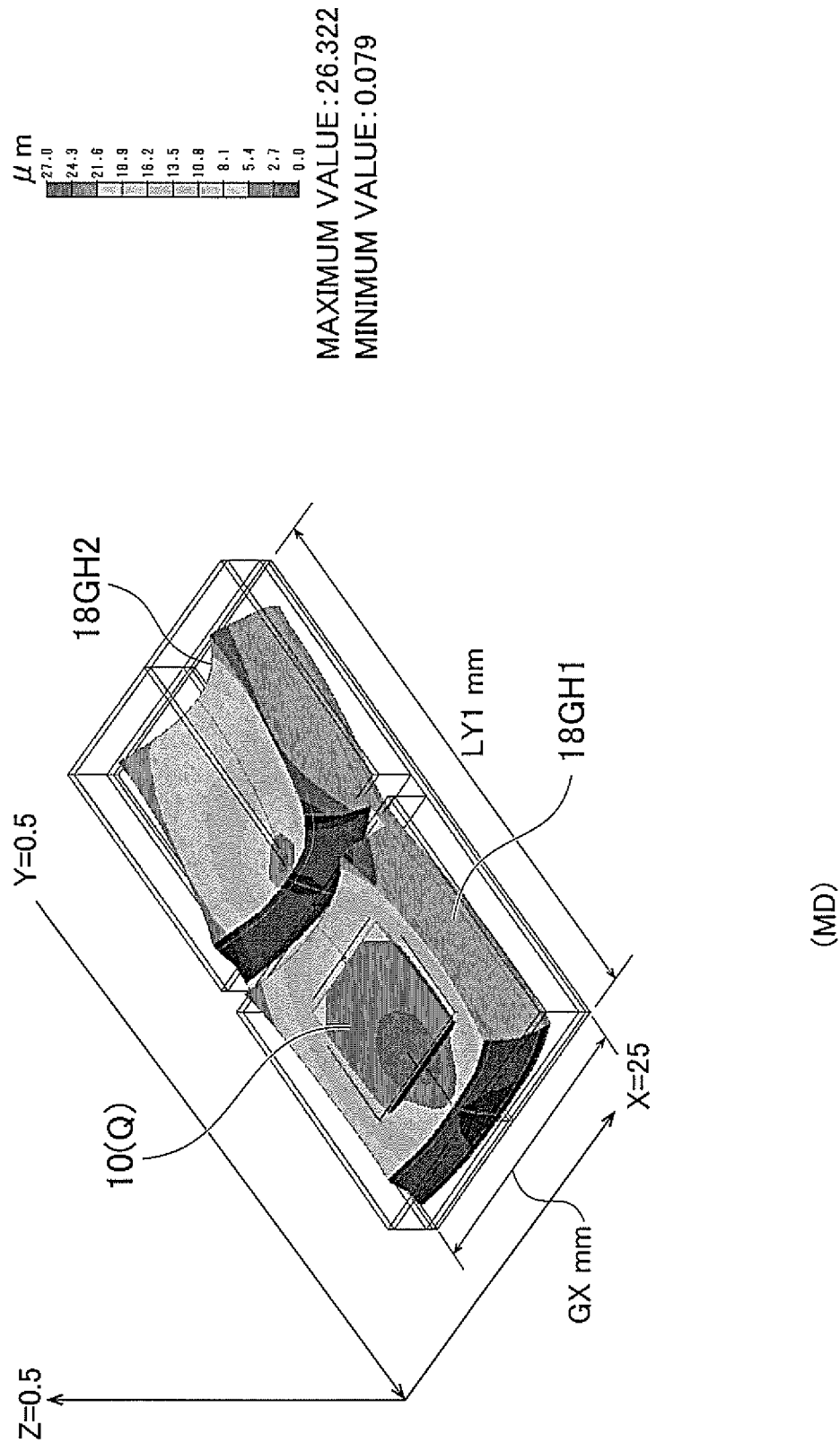
FIG. 22 is a diagram showing a simulation result (entire warped shape) of the stress applied to the bonded portion using the simulation model shown in FIG. 20.

FIG. 22 shows a result (whole warped shape) of executing a simulation of a stress applied to the Ag fired layer 27 in the case of the orientation of CTE of the graphite substrates 18GH1 and 18GH2 is X=25 ppm/K, Y=0.5 ppm/K, and Z=0.5 ppm/K, for example, in the simulation model MD of the configuration shown in FIG. 20.

The warpage of the simulation model MD is 0.079 µm at maximum, but is 26.322 µm at minimum.

Next, simulation models respectively having different configurations will now be explained. In the simulation model MD having the configuration shown in FIG. 20, a simulation model MD1 is corresponds to a case of bonding the square-shaped semiconductor device 10.

Figure 23A:
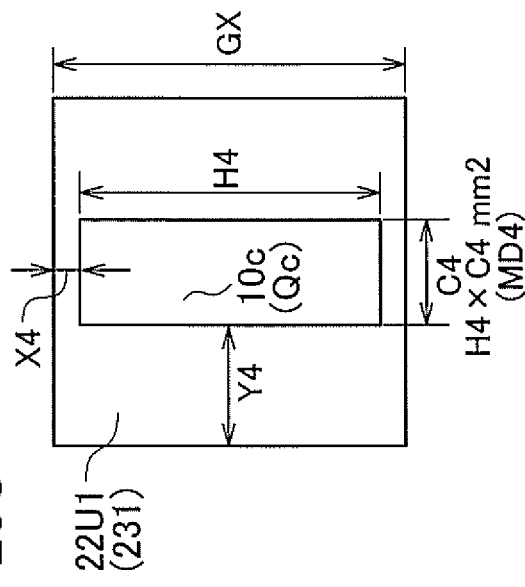
FIG. 23A is a schematic planar pattern configuration diagram of a simulation model MD2 for executing the simulation by changing a shape of the device (simulation models MD1 to MD5), in an example of a case of applying the graphite substrate having anisotropy in the CTE, in the power module according to the embodiments.

FIG. 23A illustrates a case where bonding a longwise semiconductor device (H2×C2, H2>C2) 10a (simulation model MD2), in the simulation model MD having the configuration shown in FIG. 20. A rectangular SiC MOSFET of 6.25 mm (H2)×4 mm (C2) is used as the semiconductor device 10a, and is bonded on a substantially center portion of the drain electrode pattern 22U1 (at distances of X2 (1.875 mm) and Y2 (3 mm) from edges of the drain electrode pattern 22U1).

Figure 23B:
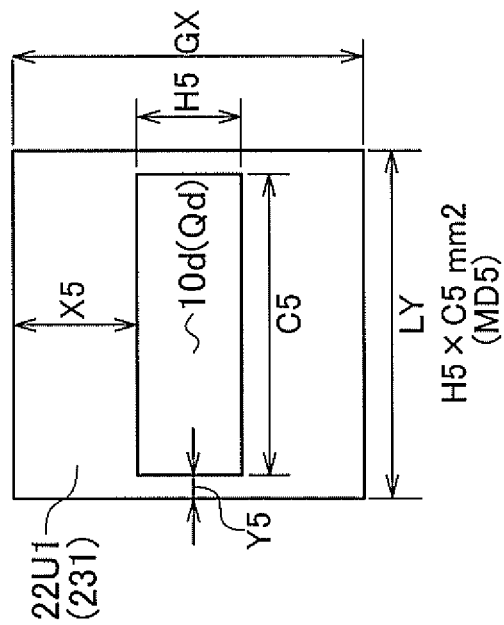
FIG. 23B is a schematic planar pattern configuration diagram of a simulation model MD3 for executing the simulation by changing a shape of the device (simulation models MD1 to MD5), in an example of the case of applying the graphite substrate having anisotropy in the CTE, in the power module according to the embodiments.

FIG. 23B illustrates a case where bonding a laterally-long semiconductor device (H3×C3, H3<C3) 10b (simulation model MD3), in the simulation model MD having the configuration shown in FIG. 20. A rectangular SiC MOSFET of 4 mm (H3)×6.25 mm (C3) is used as the semiconductor device 10b, and is bonded on a substantially center portion of the drain electrode pattern 22U1 (at distances of X3 (3 mm) and Y3 (1.875 mm) from edges of the drain electrode pattern 22U1).

Figure 23C:
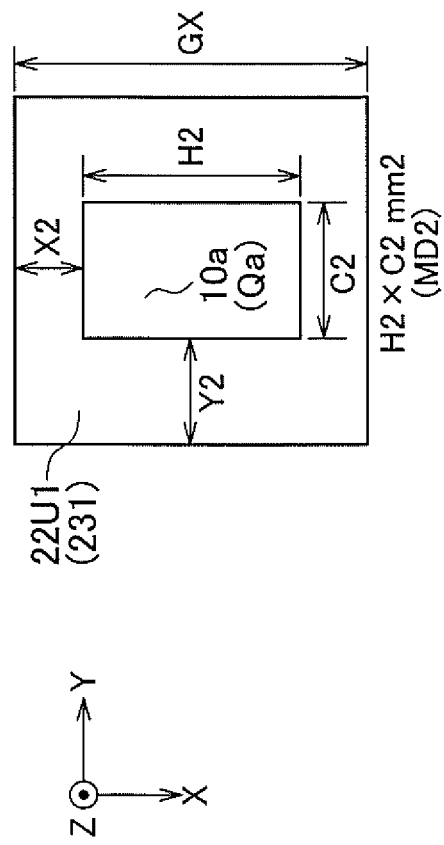
FIG. 23C is a schematic planar pattern configuration diagram of a simulation model MD4 for executing the simulation by changing a shape of the device (simulation models MD1 to MD5), in an example of the case of applying the graphite substrate having anisotropy in the CTE, in the power module according to the embodiments.

FIG. 23C illustrates a case where bonding a longwise semiconductor device (H4×C4, H4 is extremely larger than C4) 10c (simulation model MD4), in the simulation model MD having the configuration shown in FIG. 20. A rectangular SiC MOSFET of 8.33 mm (H4)×3 mm (C4) is used as the semiconductor device 10c, and is bonded on a substantially center portion of the drain electrode pattern 22U1 (at distances of X4 (0.835 mm) and Y4 (3.5 mm) from edges of the drain electrode pattern 22U1).

Figure 23D:
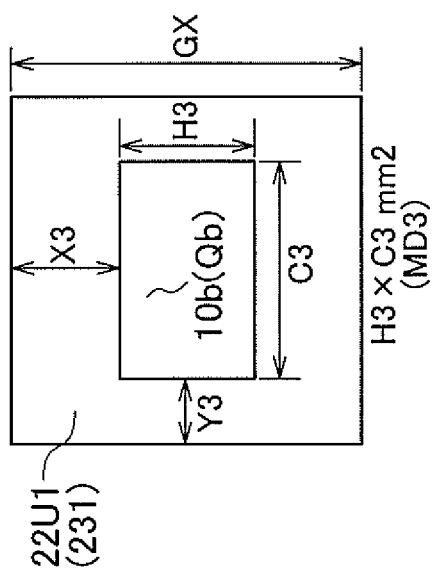
FIG. 23D is a schematic planar pattern configuration diagram of a simulation model MD5 for executing the simulation by changing a shape of the device (simulation models MD1 to MD5), in an example of the case of applying the graphite substrate having anisotropy in the CTE, in the power module according to the embodiments.

FIG. 23D illustrates a case where bonding a laterally-long semiconductor device (H5×C5, C5 is extremely larger than H5) 10d (simulation model MD5), in the simulation model MD having the configuration shown in FIG. 20. A rectangular SiC MOSFET of 3 mm (H5)×8.33 mm (C5) is used as the semiconductor device 10s, and is bonded on a substantially center portion of the drain electrode pattern 22U1 (at distances of X5 (3.5 mm) and Y5 (0.835 mm) from edges of the drain electrode pattern 22U1).

Figure 24B:
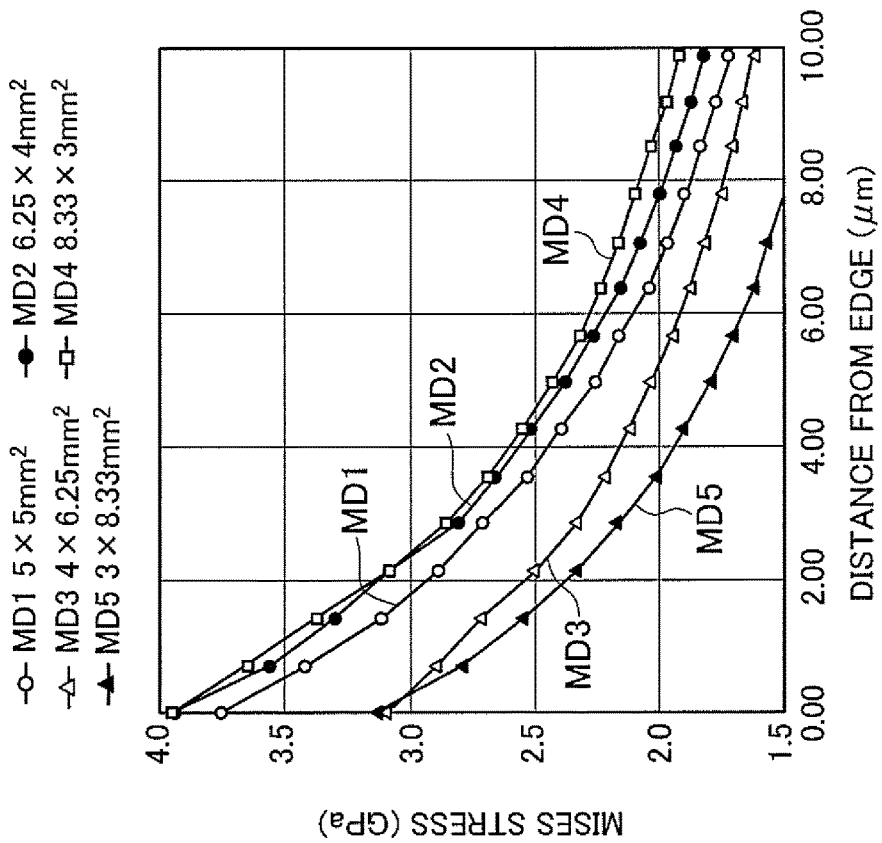
FIG. 24B is a characteristic diagram for explaining a relationship between the simulation model MD and the Mises stress when executing the simulation by changing a shape of the device (simulation models MD1 to MD5), in an example of the case of applying the graphite substrate having anisotropy in the CTE, in the power module according to the embodiments.
Figure 24A:
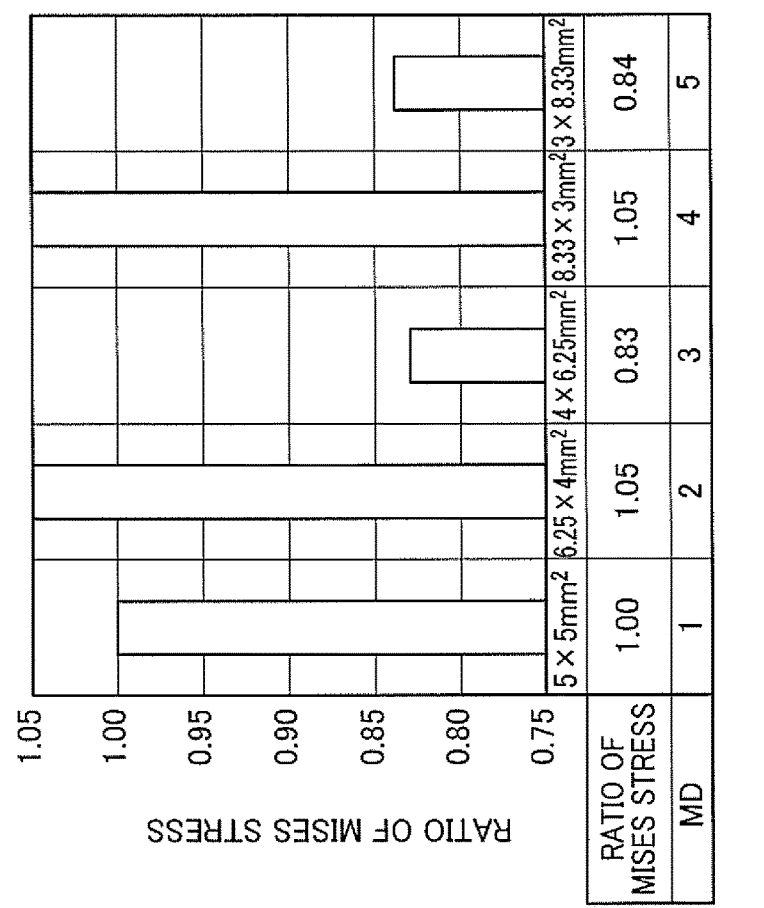
FIG. 24A is a characteristic diagram for explaining a relationship between a distance (Y) from an edge and Mises stress when executing the simulation by changing a shape of the device (simulation models MD1 to MD5), in an example of the case of applying the graphite substrate having anisotropy in the CTE, in the power module according to the embodiments.

FIG. 24A is a characteristic diagram for explaining a relationship between the distance (Y1 to Y5) from the edge (EDG shown in FIG. 20A and FIG. 20B) and Mises stress (GPa) when executing the simulation using the simulation models MD1 to MD5, in the case of applying the graphite substrate having anisotropy in the CTE, in the power modules according to the first to sixth embodiments. FIG. 24B is a characteristic diagram for explaining a relationship between the simulation models MD1 to MD5 and a ratio of Mises stress.

FIGS. 24A and 24B show an example where the orientation of the CTE of the graphite substrate 18GH1 is X=25 ppm/K, Y=0.5 ppm/K, and Z=0.5 ppm/K, for example. FIG. 24A shows Mises stress to be applied to the Ag fired layer 27. The CTE is set as 1 GPa with respect to the case of a simulation model MD1 in FIG. 24B.

As shown in FIG. 24A and FIG. 24B, if the ratio of Mises stress of the simulation model MD1 is set as 1, the ratio of Mises stress of the simulation models MD2 and MD4 is 1.05, the ratio of Mises stress of the simulation model MD3 is 0.83, and the ratio of Mises stress of the simulation model MD5 is 0.84.

More specifically, if the orientation of the CTE of the graphite substrate 18GH1 is X=25 ppm/K, Y=0.5 ppm/K, and Z=0.5 ppm/K, and a non-stress state is at 200° C., for example, the stress (at 25° C.) applied to the Ag fired layer 27 of the simulation models MD1 to MD5 can be reduced by decreasing the size of the orientation (X) of which the CTE is larger, like the stress in the semiconductor devices 10b and 10d of the simulation models MD3 and MD5.

Working Example 2

Next, an example of a stress applied to the Ag fired layer 27 where there is no source electrode pattern will now be explained.

Figure 25A:
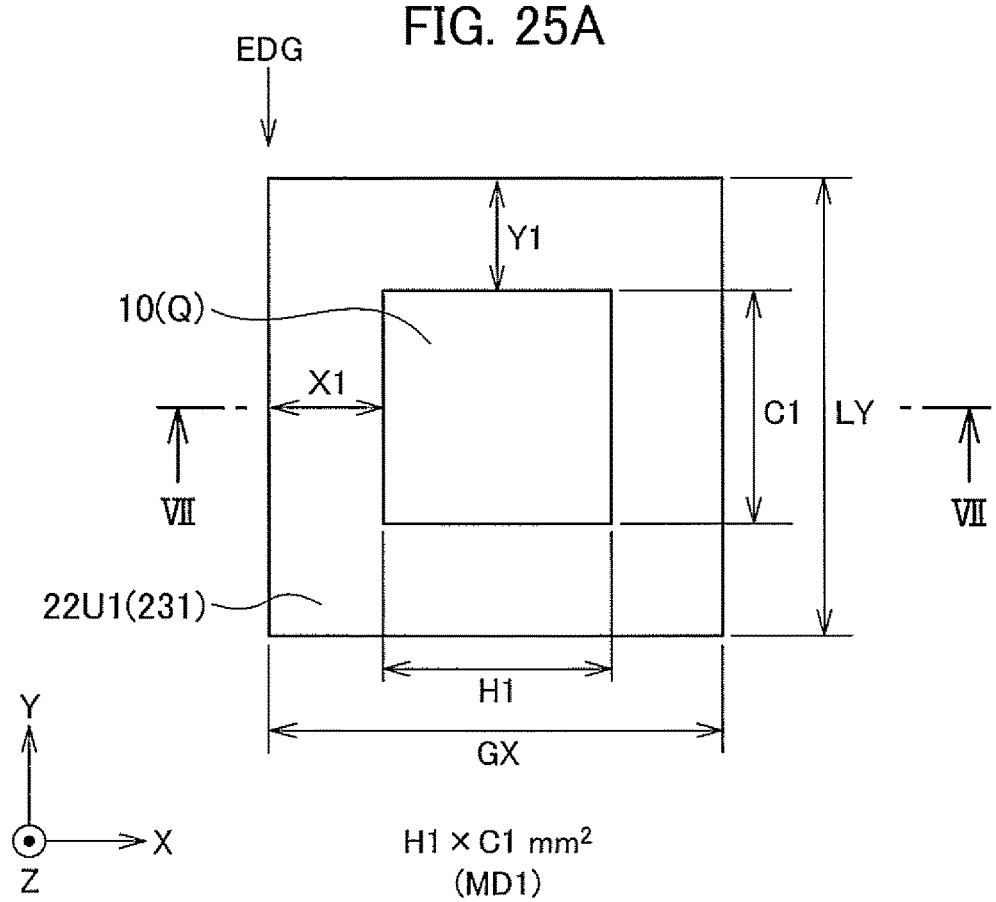
FIG. 25A is a schematic planar pattern configuration diagram of the simulation model MD1 for executing a simulation of a stress applied to the bonded portion in the case of applying the graphite substrate having anisotropy in the CTE, in the power module according to the embodiments.
Figure 25B:
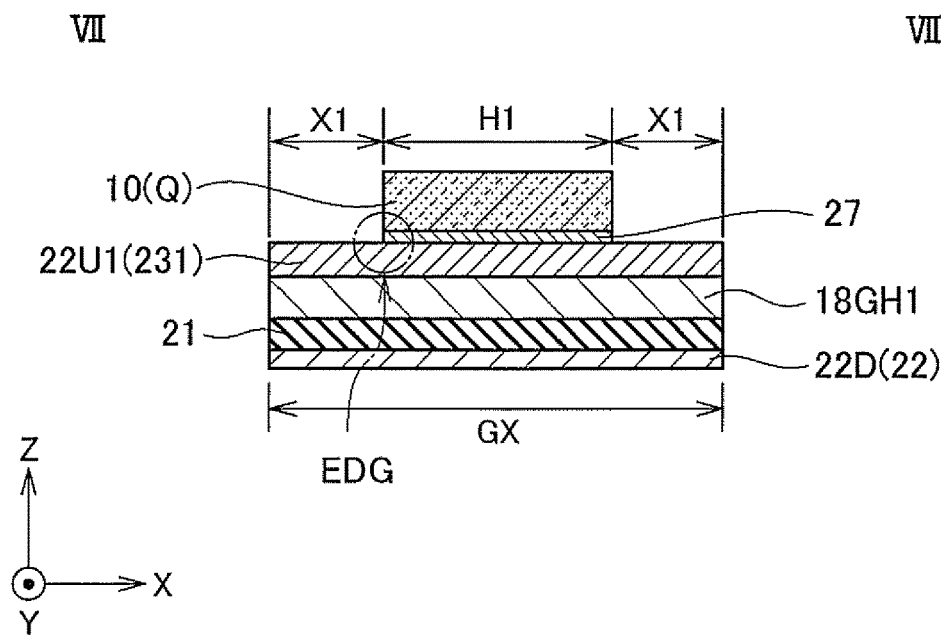
FIG. 25B is a schematic cross-sectional structure diagram taken in the line VII-VII of FIG. 25A for executing a simulation of a stress applied to the bonded portion in the case of applying the graphite substrate having anisotropy in the CTE, in the power module according to the embodiments.

FIG. 25A shows a schematic planar pattern configuration of the simulation model MD1 in the case of including no source electrode pattern, and FIG. 25B shows a schematic cross-sectional structure taken in the line VII-VII of FIG. 25A.

The orientation of CTE of the graphite substrate 18GH1 is X=0.1 ppm/K, Y=25 ppm/K, and Z=0.1 ppm/K, for example, and as shown in FIG. 21, the thickness (mm) of each part (10, 18GH1, 21, 22U1, and 27) is optimized so that the thermal resistance may become the lowest.

Also the cases of the simulation models MD2 and MD3 are substantially similar thereto, except for shapes of the semiconductor devices 10a and 10b being different.

Figure 26B:
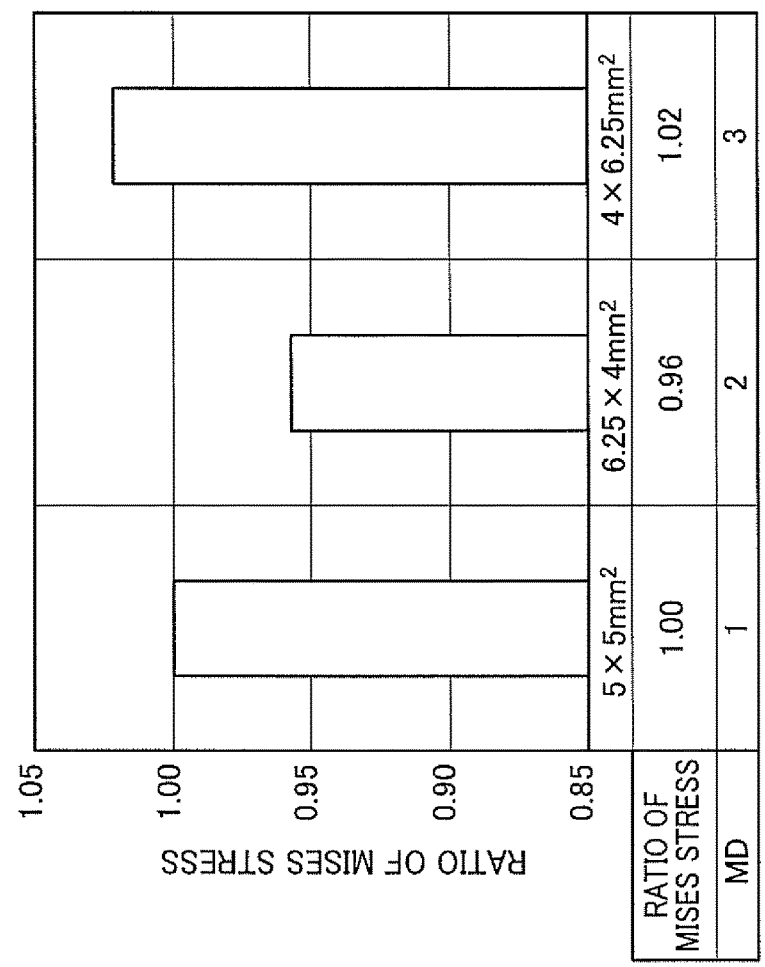
FIG. 26B is a characteristic diagram for explaining a relationship between the simulation model MD and the Mises stress when executing the simulation by changing a shape of the device (simulation models MD1 to MD3), in an example of the case of applying the graphite substrate having anisotropy in the CTE, in the power module according to the embodiments.
Figure 26A:
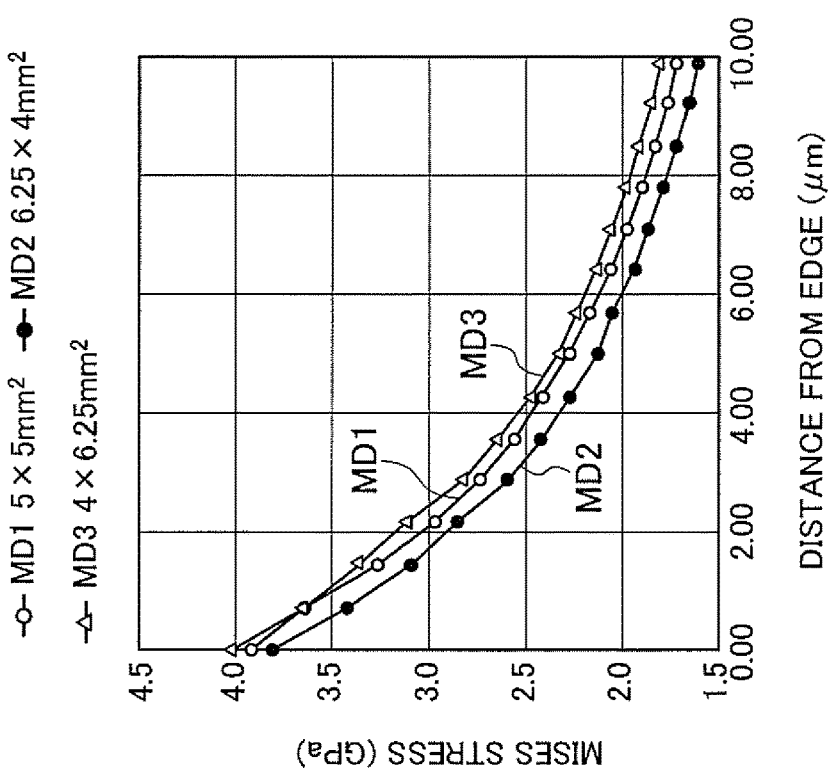
FIG. 26A is a characteristic diagram for explaining a relationship between a distance (X) from an edge and Mises stress when executing the simulation by changing a shape of the device (simulation models MD1 to MD3), in an example of the case of applying the graphite substrate having anisotropy in the CTE, in the power module according to the embodiments.
Figure 27A:
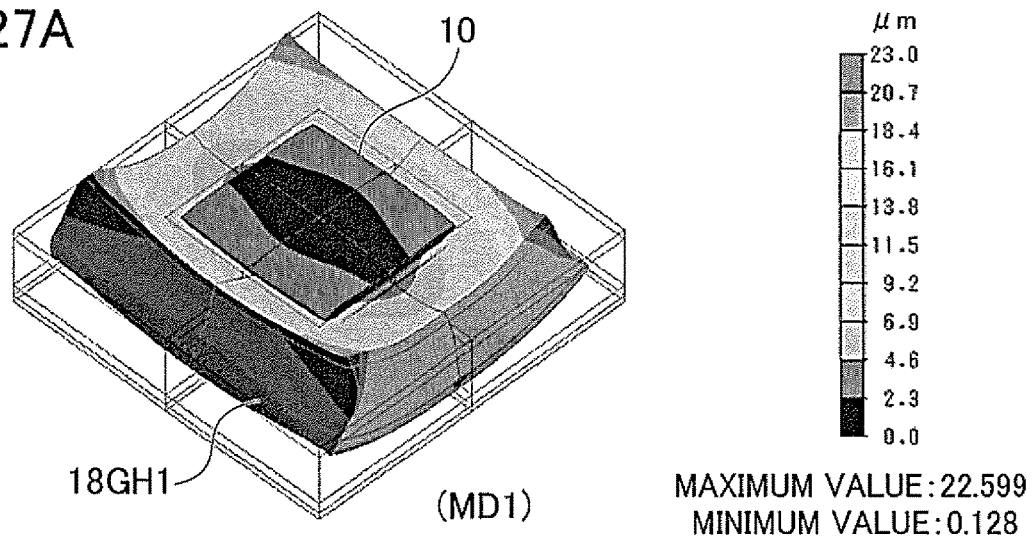
FIG. 27A is a diagram showing a result of executing the simulation using the simulation model MD1, in an example of the case of applying the graphite substrate having anisotropy in the CTE, in the power module according to the embodiments.
Figure 27B:
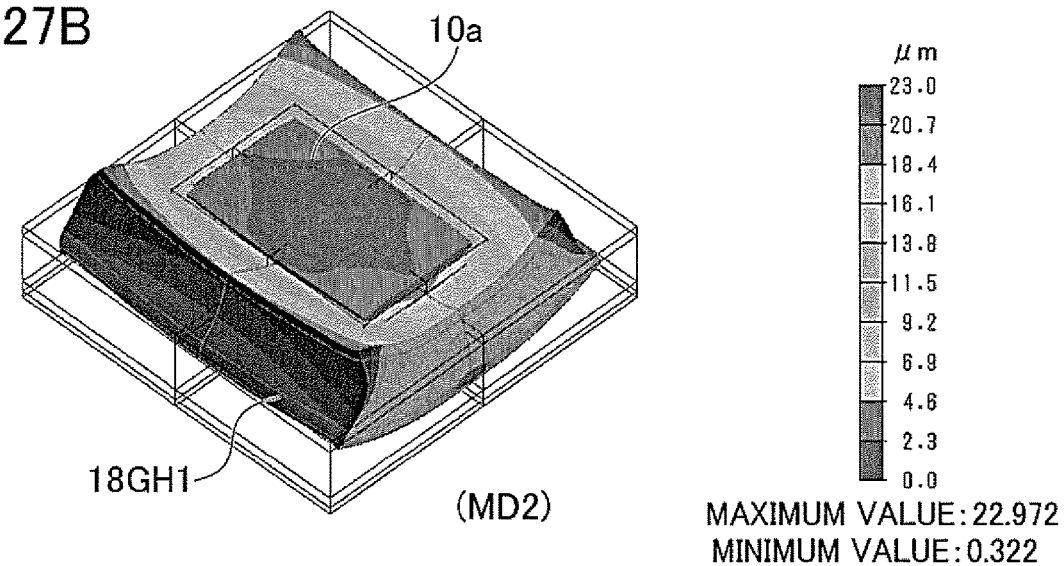
FIG. 27B is a diagram showing a result of executing the simulation using the simulation model MD2, in an example of the case of applying the graphite substrate having anisotropy in the CTE, in the power module according to the embodiments.
Figure 27C:
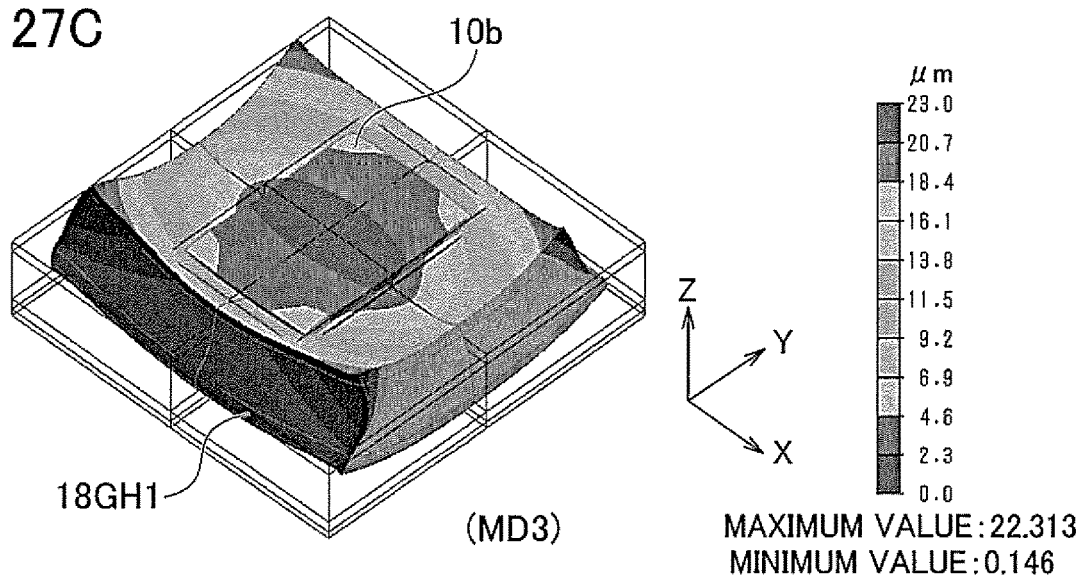
FIG. 27C is a diagram showing a result of executing the simulation using the simulation model MD3, in an example of the case of applying the graphite substrate having anisotropy in the CTE, in the power module according to the embodiments.

FIG. 26A is a characteristic diagram for explaining a relationship between the distance (X1 to X3) from the edge (EDG shown in FIG. 25A and FIG. 25B) and Mises stress (GPa) when executing the simulation using the simulation models MD1 to MD3, in the case of applying the graphite substrate having anisotropy in the CTE, in the power modules according to the first to sixth embodiments. FIG. 26B is a characteristic diagram for explaining a relationship between the simulation models MD1 to MD3 and a ratio of Mises stress.

FIGS. 26A and 26B show an example where the orientation of the CTE of the graphite substrate 18GH1 is X=0.5 ppm/K, Y=25 ppm/K, and Z=0.5 ppm/K, for example. FIG. 26A shows Mises stress to be applied to the Ag fired layer 27. The CTE is set as 1 GPa with respect to the case of a simulation model MD1 in FIG. 26B.

As shown in FIGS. 26A and 26B, if the ratio of Mises stress of the simulation model MD1 is 1, the ratio of Mises stress of the simulation model MD2 is 0.96, and the ratio of Mises stress of the simulation model MD3 is 1.02.

More specifically, if the orientation of the CTE of the graphite substrate 18GH1 is X=0.5 ppm/K, Y=25 ppm/K, and Z=0.5 ppm/K, and a non-stress state is at 200° C., for example, the stress (at 25° C.) applied to the Ag fired layer 27 of the simulation models MD1 to MD3 can be reduced by decreasing the size of the orientation (Y) of which the CTE is larger, like the stress in the semiconductor device 10a of the simulation model MD2.

In the simulation models MD1 to MD3 of the configuration shown in FIG. 25, FIGS. 27A to 27C show a result (whole warped shape) of executing a simulation of a stress applied to the Ag fired layer 27 in the case of the orientation of CTE of the graphite substrate 18GH1 is X=0.1 ppm/K, Y=25 ppm/K, and Z=0.1 ppm/K, for example.

The warpage of the simulation model MD1 is 22.599 μm at maximum, but is 0.128 μm at minimum. The warpage of the simulation model MD2 is 22.972 μm at maximum, but is 0.322 μm at minimum. The warpage of the simulation model MD3 is 22.313 μm at maximum, but is 0.146 μm at minimum.

The cases of being applied to the 1-in-1 module type PMs as the semiconductor device have been explained for the PMs 1 according to the first to sixth embodiments, but it is not limited thereto. For example, it is applicable to 2-in-1 module type PMs, 4-in-1 module type PMs, 6-in-1 module type PMs, 7-in-1 module type PMs composed of 6-in-1 module type PMs including a snubber capacitor etc., 8-in-1 module type PMs, 12-in-1 module type PMs, 14-in-1 module type PMs, etc.

(Concrete Example of Semiconductor Device)

Figure 28:
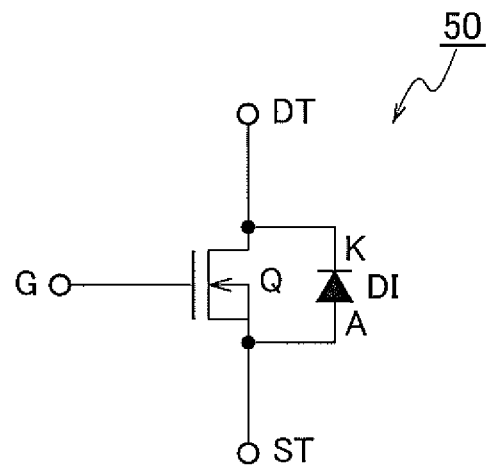
FIG. 28 is a schematic circuit representative diagram of an SiC MOSFET of a 1-in-1 module, which is the power module according to the embodiments.

FIG. 28 shows a schematic circuit representation of SiC MOSFET of 1-in-1 module 50 applicable as a semiconductor device, in the PMs 1 according to the first to sixth embodiments.

The diode DI connected to the MOSFET Q inversely in parallel is shown in FIG. 28. A main electrode of the MOSFET Q is expressed with a drain terminal DT and a source terminal ST. Moreover, an IGBT (not shown) of the 1 in 1 module 50 applicable as the semiconductor device, corresponding to the PMs 1 according to the first to sixth embodiments, can also be realized.

Figure 29:
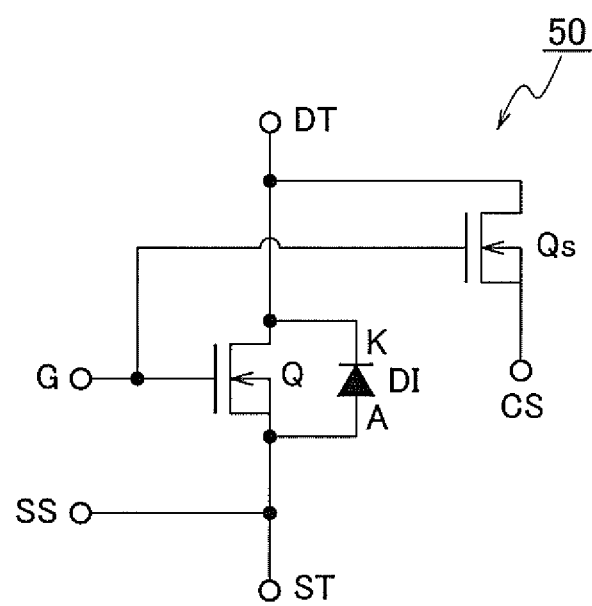
FIG. 29 is a detail circuit representative diagram of the SiC MOSFET of the 1-in-1 module, which is the power module according to the embodiments.

FIG. 29 shows a detailed circuit representation of SiC MOSFET of 1-in-1 module 50 applicable as a semiconductor device, in the PMs 1 according to the first to sixth embodiments.

The PMs 1 according to the first to sixth embodiments includes a configuration in which the semiconductor device is the 1-in-1 module 50, for example. More specifically, one piece of the MOSFET Q is included in one module. As an example, five chips (MOSFET×5) can be mounted thereon, and a maximum of five pieces of the MOSFETs Q respectively can be connected to one another in parallel. Note that it is also possible to mount a part of five pieces of the chips for the diode DI thereon.

More particularly, as shown in FIG. 29, a sense MOSFET Qs is connected to the MOSFET Q in parallel. The sense MOSFET Qs is formed as a minuteness transistor in the same chip as the MOSFET Q.

In FIG. 29, reference numeral SS denotes a source sense terminal, reference numeral CS denotes a current sense terminal, and reference numeral G denotes a gate signal terminal. Note that, also in the semiconductor chip Q according to the first to sixth embodiments, the sense MOSFET Qs may be formed as a minuteness transistor in the same chip.

(Circuit Configuration)

Next, a circuit configuration example of the semiconductor device in the PMs 1 according to the first to sixth embodiments will now be more specifically explained.

There will now be explained a semiconductor package device (the so-called 2-in-1 type of module) in which two semiconductor devices Q1 and Q4 are sealed into one mold resin, as a module applicable as the semiconductor device of PMs 1 according to the first to sixth embodiments.

Figure 30:
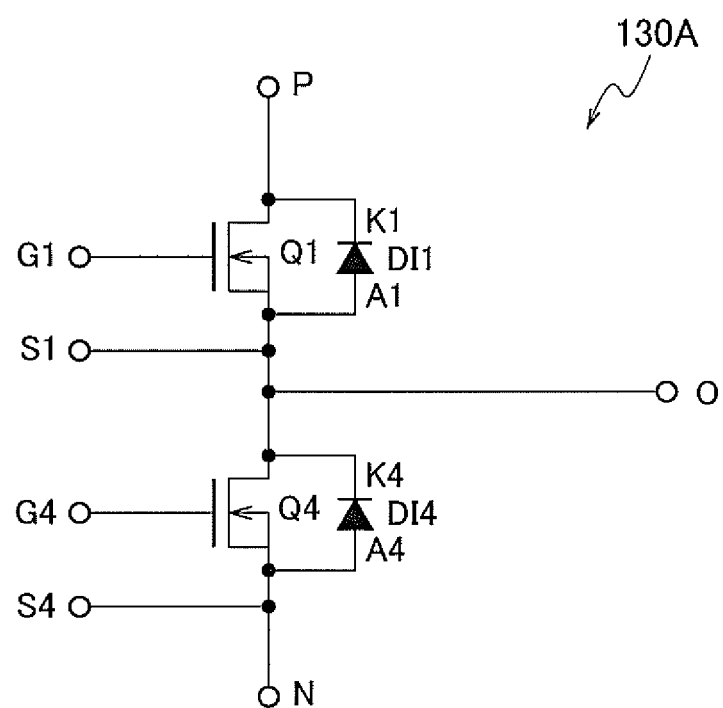
FIG. 30 is a schematic circuit representative diagram of an SiC MOSFET of a 2-in-1 module, which is the power module according to the embodiments.

More specifically, as shown in FIG. 30, the 2 in 1 module 130A includes a configuration of module with the built-in half-bridge in which two SiC MOSFETs Q1 and Q4 is included as one module.

More specifically, as 2 in 1 module 130A is shown in FIG. 30, two SiC MOSFETs Q1 and Q4 are provided with a configuration of a module with the built-in half-bridge contained as one module.

In this case, although the module can be considered as one large transistor, one chip or a plurality of chips may be contained therein. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 30, the 2-in-1 module 130A includes two SiC MOSFETs Q1 and Q4, and diodes DI1 and DI4 connected in reversely parallel to the SiC MOSFETs Q1 and Q4, as one module.

In FIG. 30, reference numeral G1 denotes a lead terminal for gate signal of the SiC MOSFET Q1, and reference numeral S1 denotes a lead terminal for source signal of the SiC MOSFET Q1. Similarly, reference numeral G4 denotes a lead terminal for gate signal of the SiC MOSFET Q4, and reference numeral S4 denotes a lead terminal for source signal of the SiC MOSFET Q4.

Reference numeral P denotes a positive side power input terminal electrode, reference numeral N denotes a negative side power input terminal electrode, and reference numeral O denotes an output terminal electrode.

Moreover, a 2-in-1 module (not shown) to which the IGBT is applied as the semiconductor devices Q1 and Q4 can also be realized, as a module applicable as the semiconductor device of the PMs 1 according to the first to sixth embodiments.

The semiconductor devices Q2 and Q5 and semiconductor devices Q3 and Q6 applicable to the PMs 1 according to the first to sixth embodiments can also be similarly realized.
(Device Structure)

Figure 31:
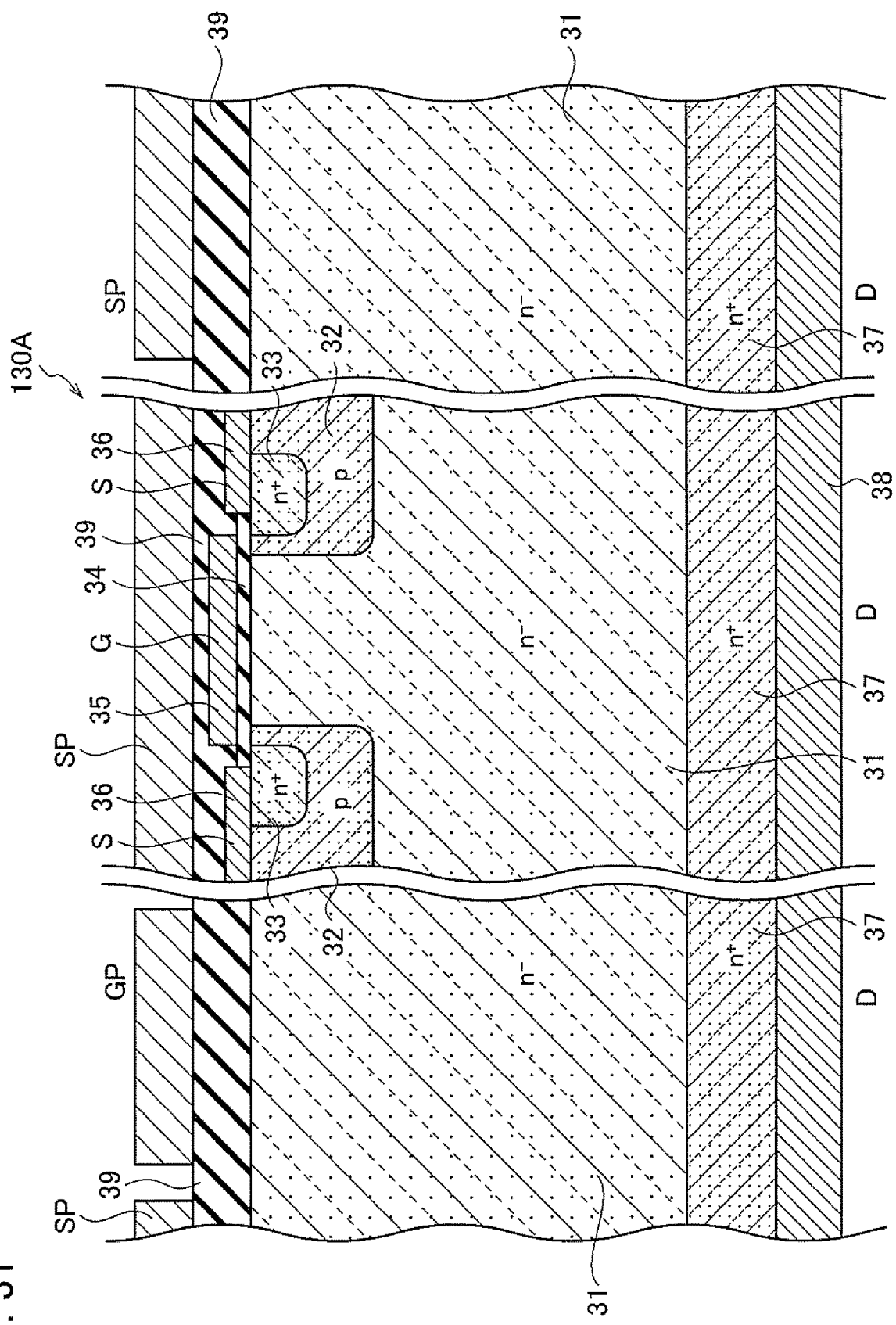
FIG. 31 is a schematic cross-sectional structure diagram showing an SiC MOSFET including a source pad electrode SP and a gate pad electrode GP, which is an example of the semiconductor device applicable to the power module according to the embodiments.

FIG. 31 shows a schematic cross-sectional structure of an SiC MOSFET 130A including a source pad electrode SP and a gate pad electrode GP, which is an example of the semiconductor devices Q1 and Q4 applicable to the PMs 1 according to the first to sixth embodiments.

As shown in FIG. 31, the SiC MOSFET 130A includes: a semiconductor layer 31 composed by including an n− type high resistivity layer; a p body region 32 formed on a front surface side of the semiconductor layer 32; a source region 33 formed on a front side surface of the p body region 32; a gate insulating film 33 disposed on a front side surface of the semiconductor layer 31 between the p body regions 32; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

The gate pad electrode GP is connected to the gate electrode 35 disposed on the gate insulating film 34, and the source pad electrode SP is connected to the source electrode 36 connected to the source region 33 and the p body region 32. Moreover, as shown in FIG. 31, the gate pad electrode GP and the source pad electrode SP are disposed on an interlayer insulating film 39 for passivation which covers the surface of the SiC MOSFET 130A.

In addition, a microstructural transistor structure (not shown) may be formed in the semiconductor layer 31 below the gate pad electrode GP and the source pad electrode SP.

Furthermore, as shown in FIG. 31, the source pad electrode SP may be disposed to be extended onto the interlayer insulating film 39 for passivation, also in the transistor structure of the center portion.

Figure 34:
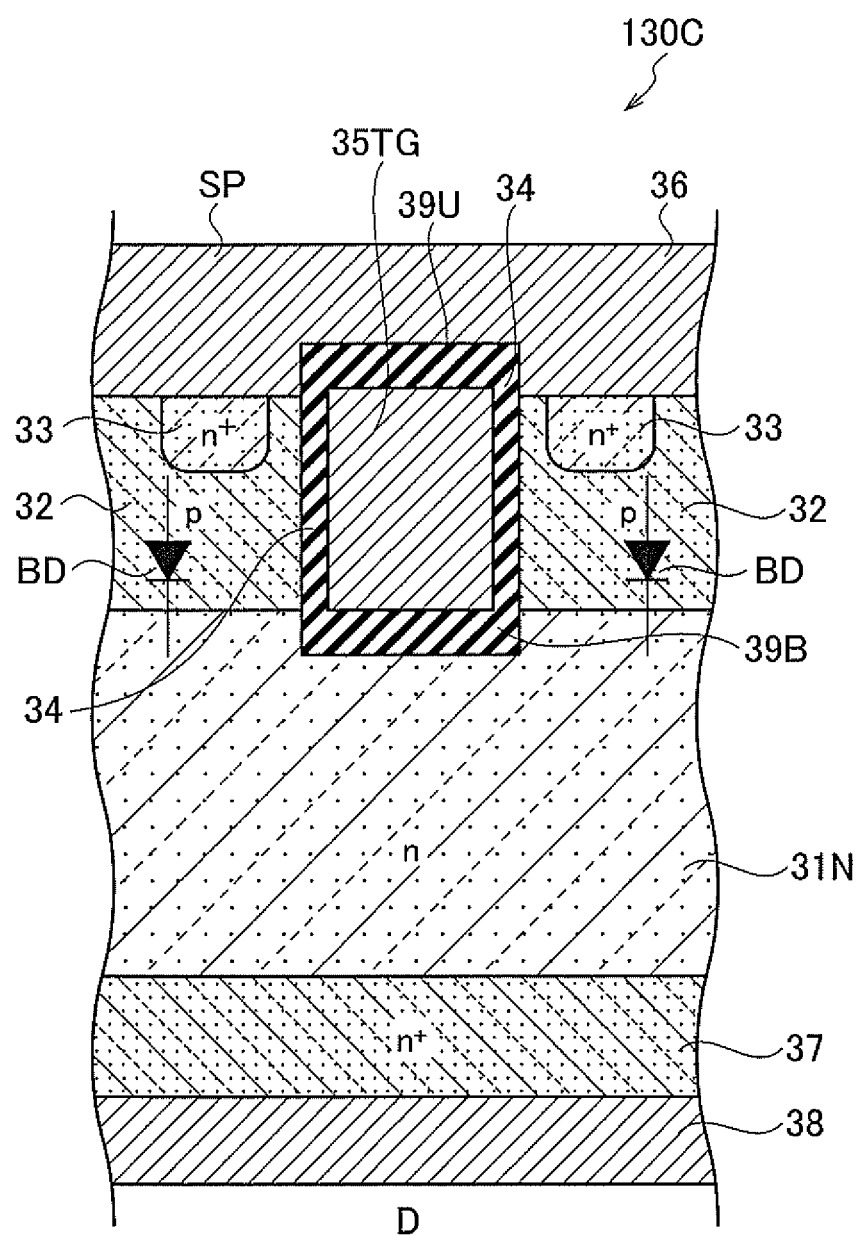
FIG. 34 is a schematic cross-sectional structure diagram of an SiC Trench MOSFET (SiC TMOSFET), which is an example of the semiconductor device applicable to the power module according to the embodiments.

Although the SiC MOSFET 130A is composed by including a planar-gate-type n channel vertical SiC-MOSFET in FIG. 31, it may be composed by including a trench-gate type n channel vertical SiC Trench MOSFET (SiC TMOSFET) etc, as shown in FIG. 34 mentioned below.

Alternatively, a GaN-based FET etc. instead of the SiC-based MOSFET can also be adopted to the semiconductor device (Q1, Q4) which can be applied to the PMs 1 according to the first to sixth embodiments.

The semiconductor devices Q2 and Q5 and semiconductor devices Q3 and Q6 applicable to the PMs 1 according to the first to sixth embodiments can also be similarly realized.

Furthermore, a wide-bandgap type semiconductor of which the bandgap energy is from 1.1 eV to 8 eV, for example, can be used for the semiconductor devices Q1 to Q9 applicable to the PMs 1 according to the first to sixth embodiments.

Figure 32:
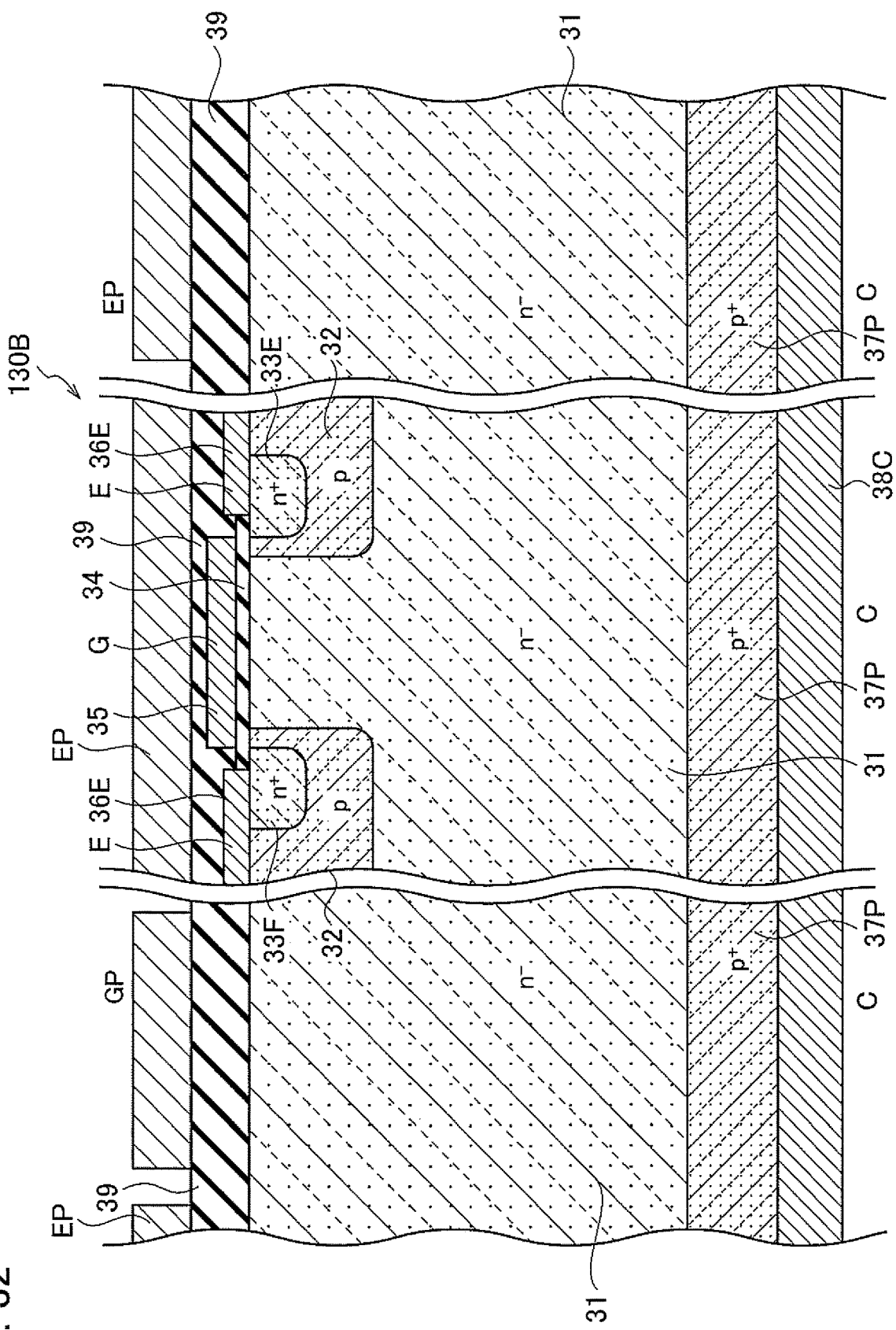
FIG. 32 is a schematic cross-sectional structure diagram of the IGBT including an emitter pad electrode EP and a gate pad electrode GP, which is an example of the semiconductor device applicable to the power module according to the embodiments.

Similarly, FIG. 32 shows a schematic cross-sectional structure of an IGBT 130B including an emitter pad electrode EP and a gate pad electrode GP, which is an example of the semiconductor devices Q1 and Q4 applicable to the PMs 1 according to the first to sixth embodiments.

As shown in FIG. 32, the IGBT 130B includes: a semiconductor layer 31 composed by including an n− type high resistivity layer; a p body region 32 formed on a front surface side of the semiconductor layer 32; an emitter region 33E formed on a front side surface of the p body region 32; a gate insulating film 33 disposed on a front side surface of the semiconductor layer 31 between the p body regions 32; a gate electrode 35 disposed on the gate insulating film 34; an emitter electrode 36E connected to the emitter region 33E and the p body region 32; a p+ collector region 37P disposed on aback side surface opposite to the surface of the semiconductor layer 31; and a collector electrode 38 connected to the p+ collector region 37P.

The gate pad electrode GP is connected to the gate electrode 35 disposed on the gate insulating film 34, and the emitter pad electrode EP is connected to the emitter electrode 36E connected to the emitter region 33E and the p body region 32. Moreover, as shown in FIG. 32, the gate pad electrode GP and the emitter pad electrode EP are disposed on an interlayer insulating film 39 for passivation which covers the surface of IDBT 130B.

In addition, a microstructural IGBT structure (not shown) may be formed in the semiconductor layer 31 below the gate pad electrode GP and the emitter pad electrode EP.

Furthermore, as shown in FIG. 32, the emitter pad electrode EP may be disposed to be extended onto the interlayer insulating film 39 for passivation, also in the IGBT structure of the center portion.

In FIG. 32, although the IGBT 130B is composed by including a planar-gate-type n channel vertical IGBT, the IGBT 130B may be composed by including a trench-gate-type n channel vertical IGBT, etc.

The semiconductor devices Q2 and Q5 and semiconductor devices Q3 and Q6 applicable to the PMs 1 according to the first to sixth embodiments can also be similarly realized.

SiC based power devices, e.g. SiC DIMOSFET and SiC TMOSFET, or GaN based power devices, e.g. GaN based High Electron Mobility Transistor (HEMT), are applicable as the semiconductor devices Q1 to Q6. In some instances, power devices, e.g. Si based MOSFETs and IGBT, are also applicable thereto.

—SiC DIMOSFET—

Figure 33:
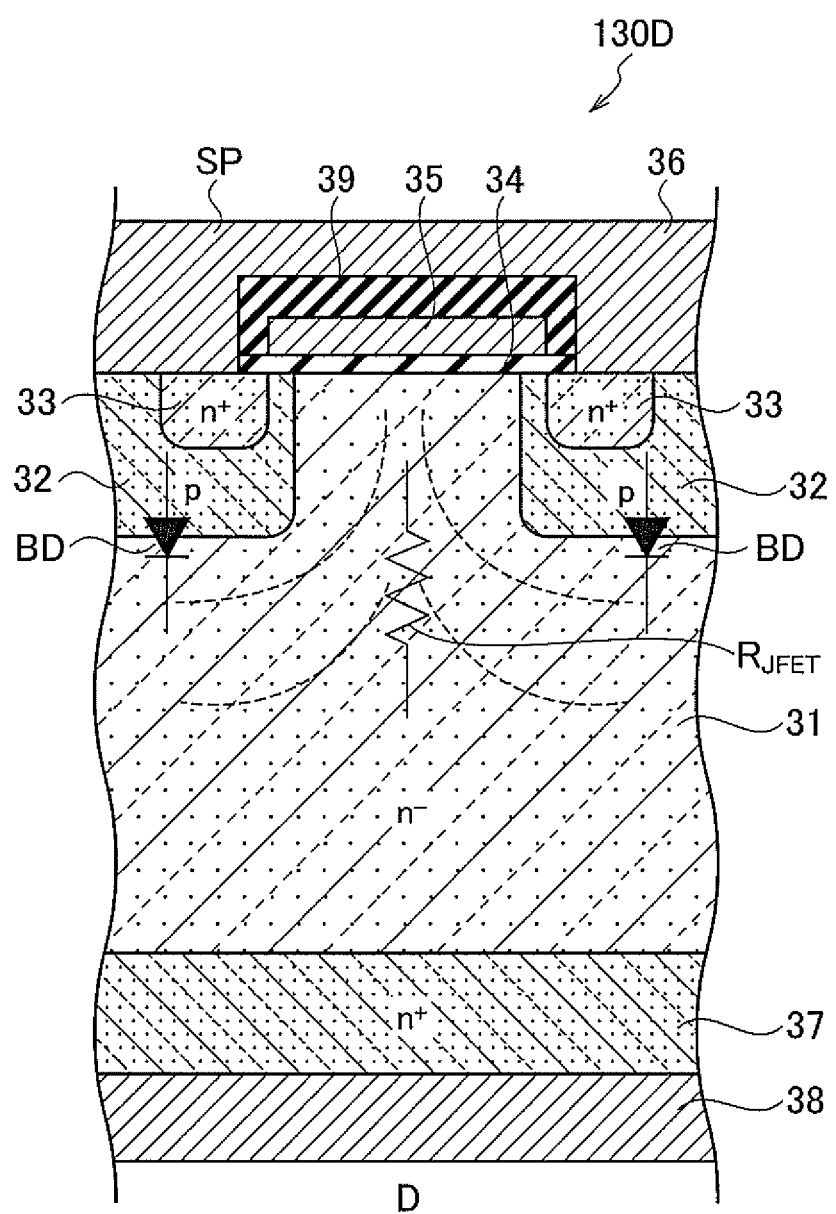
FIG. 33 is a schematic cross-sectional structure diagram of an SiC Double Implanted MOSFET (SiC DIMOSFET), which is an example of the semiconductor device applicable to the power module according to the embodiments.

FIG. 33 shows a schematic cross-sectional structure of an SiC DIMOSFET 130D, which is an example of a semiconductor device which can be applied to the PMs 1 according to the first to sixth embodiments.

As shown in FIG. 33, the SiC DIMOSFET 130D includes: a semiconductor layer 31 composed by including an n− type high resistivity layer; a p body region 32 formed on a front surface side of the semiconductor layer 32; an n+ source region 33 formed on a front side surface of the p body region 32; a gate insulating film 33 disposed on a front side surface of the semiconductor layer 31 between the p body regions 32; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

In the SiC DIMOSFET 130D shown in FIG. 33, the p body region 32 and the n+ source region 33 formed on the front side surface of the p body region 32 are formed with double ion implantation (DII), and the source pad electrode SP is connected to the source region 33 and the source electrode 36 connected to the p body region 32.

Moreover, a gate pad electrode GP (not shown) is connected to the gate electrode 35 disposed on the gate insulating film 34. Moreover, as shown in FIG. 33, the gate pad electrode GP and the source pad electrode SP are disposed on an interlayer insulating film 39 for passivation which covers the surface of the SiC DIMOSFET 130D.

As shown in FIG. 33, in the SiC DIMOSFET, since a depletion layer as shown with the dashed lines is formed in the semiconductor layer 31 composed of a n– type high resistivity layer inserted into the p body regions 32, channel resistance $R_{JFET}$ accompanying the junction type FET (JFET) effect is formed. Moreover, as shown in FIG. 32, body diodes BD are respectively formed between the p body regions 32 and the semiconductor layers 31.

—SiC TMOSFET—

FIG. 34 shows a schematic cross-sectional structure of an SiC TMOSFET, which is an example of a semiconductor device which can be applied to the PMs 1 according to the first to sixth embodiments.

As shown in FIG. 34, the SiC TMOSFET 130C includes: a semiconductor layer 31 composed by including an n layer; a p body region 32 formed on a front surface side of the semiconductor layer 31N; an n+ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n+ drain region 37 disposed on a back side surface opposite to the surface of the semiconductor layer 31N; and a drain electrode 38 connected to the n+ type drain area 37.

In FIG. 34, a trench gate electrode 35TG passing through the p body region 32 is formed in the trench formed up to the semiconductor layer 31N via the gate insulating film 34 and the interlayer insulating films 39U and 39B; and the source pad electrode SP is connected to the source region 33 and the source electrode 36 connected to the p body region 32.

Moreover, a gate pad electrode GP (not shown) is connected to the trench gate electrode 35TG disposed on the gate insulating film 34. Moreover, as shown in FIG. 34, the gate pad electrode GP and the source pad electrode SP are disposed on an interlayer insulating film 39U for passivation which covers the surface of the SiC TMOSFET 130C.

In the SiC TMOSFET 130C, channel resistance $R_{JFET}$ accompanying the junction type FET (JFET) effect as the SiC DIMOSFET 130D is not formed. Moreover, body diodes BD are respectively formed between the p body regions 32 and the semiconductor layers 31N, in the same manner as FIG. 33.

(Example of Application)

Figure 35:
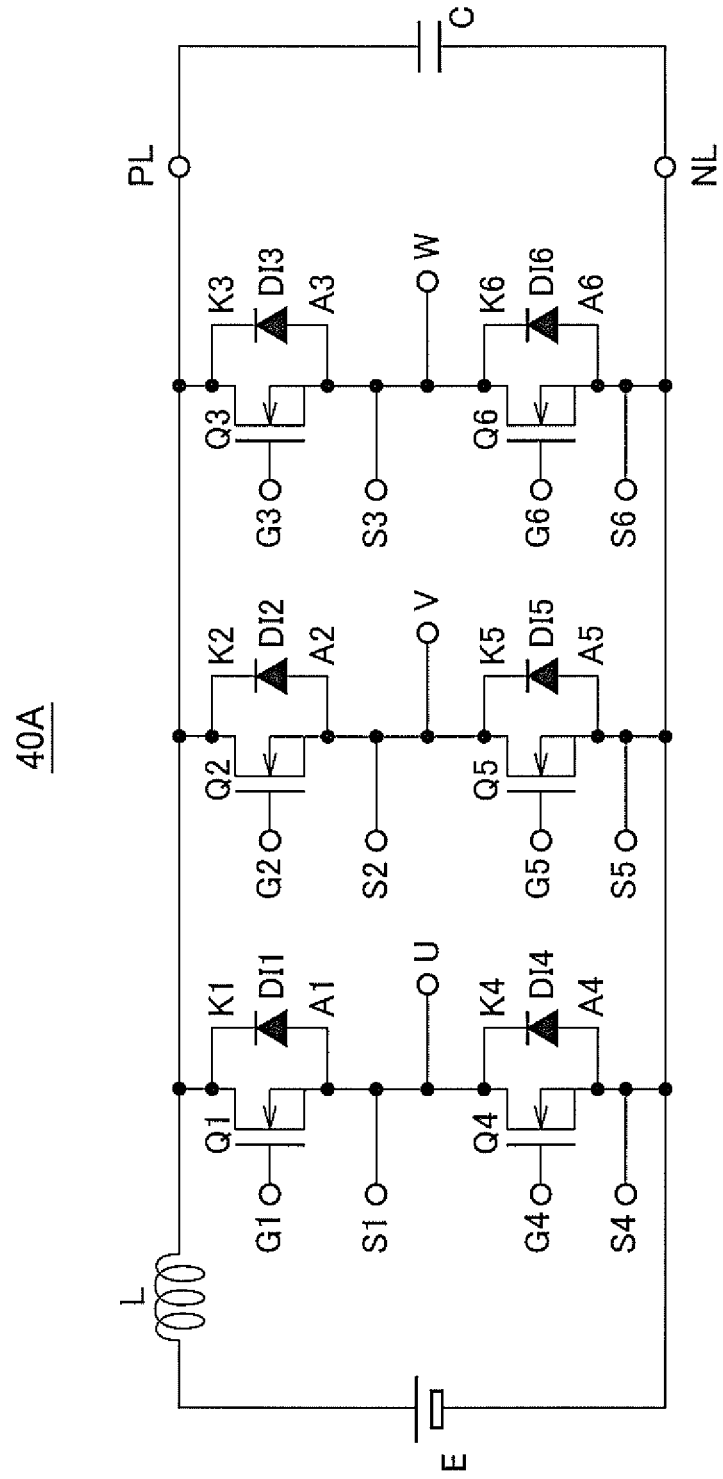
FIG. 35 shows an example of a circuit configuration in which the SiC MOSFET is applied as a semiconductor device, and a snubber capacitor is connected between a power terminal PL and an earth terminal (ground terminal) NL, in a circuit configuration of a three-phase alternating current (AC) inverter composed using the power module according to the embodiments.

FIG. 35 shows an example of a circuit configuration in which the SiC MOSFET is applied as a semiconductor device, and a snubber capacitor C is connected between the power terminal PL and the earth terminal (ground terminal) NL, in a three-phase AC inverter 40A composed using the PMs 1 according to the first to sixth embodiments.

Similarly, a three-phase AC inverter (not shown) in which a snubber capacitor C is connected between the power terminal PL and the earth terminal (ground terminal) NL can also be realized by applying the IGBT as the semiconductor device.

When connecting the PM1 according to the embodiments to the power source E to execute switching operations, large surge voltage Ldi/dt is produced by an inductance L included in a connection line due to a high switching speed of the SiC MOSFET and IGBT. For example, the surge voltage Ldi/dt is expressed as follows: Ldi/dt=$3\times10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

(Concrete Example)

Next, there will now be explained the three-phase AC inverter 42A composed using the PMs 1 according to the first to sixth embodiments to which the SiC MOSFET is applied as the semiconductor device, with reference to FIG. 36.

Figure 36:
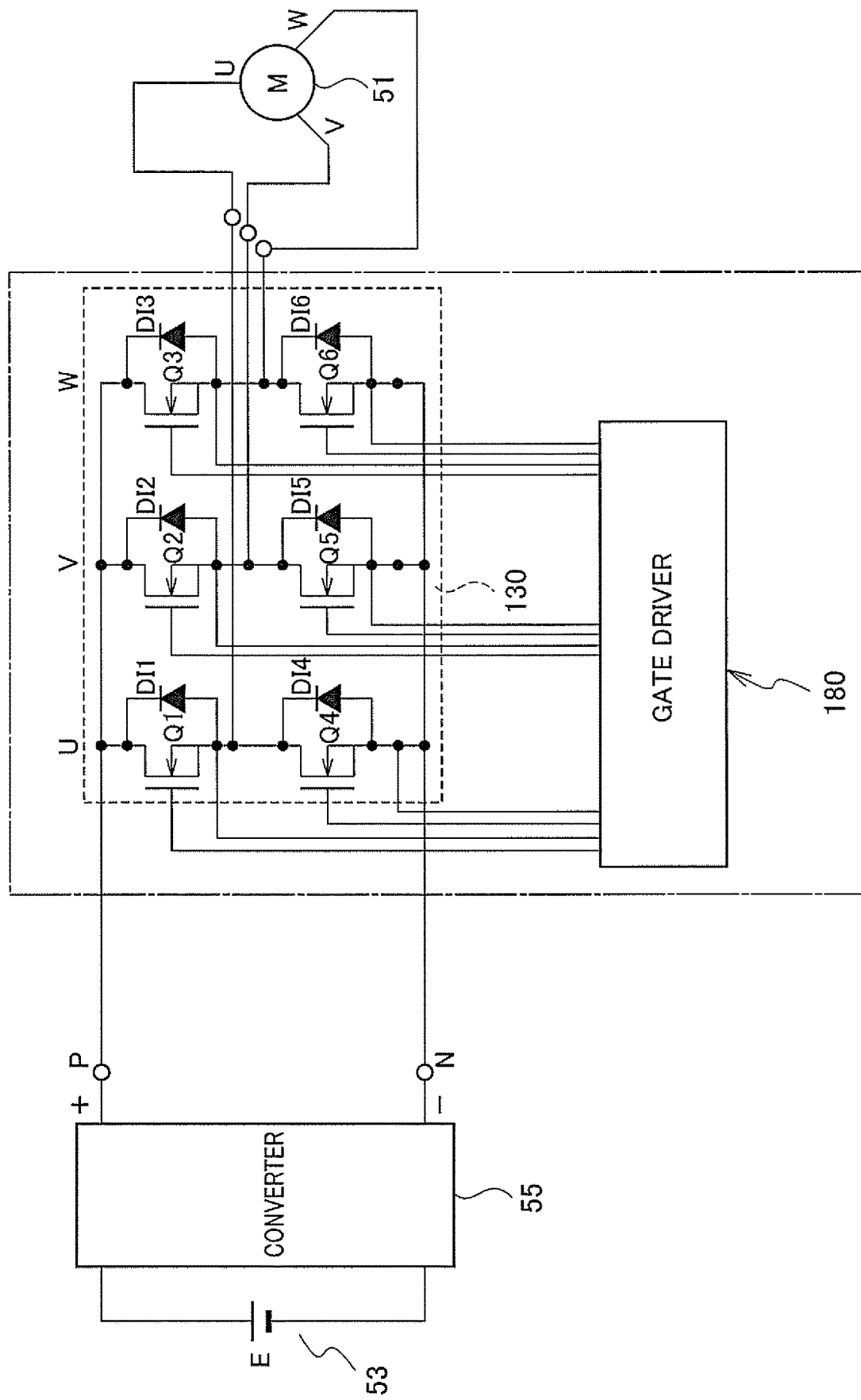
FIG. 36 shows an example of a circuit configuration in which the SiC MOSFET is applied as the semiconductor device, in a circuit configuration of a three-phase AC inverter composed using the power module according to the embodiments.

As shown in FIG. 36, the three-phase AC inverter 42A includes: a power module unit 130 connected to a gate driver (GD) 180; a three-phase AC motor unit 51; a power supply or storage battery (E) 53; and a converter 55. U-phase, V-phase, and W-phase inverters are respectively connected to the three-phase AC motor unit 54 so as to correspond to U phase, V phase, and W phase of the three-phase AC motor unit 51, in the power module unit 130.

In this case, the GD 180 is connected to SiC MOSFETs Q1 and Q4, SiC MOSFETs Q2 and Q5, and SiC MOSFETs Q3 and Q6.

The power module unit 130 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. Moreover, flywheel diodes DI1 to DI6 are respectively connected reversely in parallel between the source and the drain of the SiC MOSFETs Q1 to Q6.

Although not shown, a three-phase AC inverter composed by using the PMs 1 according to the first to sixth embodiments can also be realized by applying the IGBT as the semiconductor device.

As explained above, according to the first to sixth embodiments, there can be realized the inexpensive PM capable of exhibiting the cooling performance which is not inferior to cooling performance of the double-sided cooling structure and also simultaneously realizing the reduction of the stress.

In the PMs according to the first to sixth embodiments, molded-type power modules, e.g. a four terminal electrodes structure, can also be adopted, as a module applicable as the semiconductor device, for example.

As the semiconductor device applicable to the PMs according to the first to sixth embodiments, not only SiC based power devices but also wide-bandgap type power devices, e.g. GaN-based or Si-based power device, can be adopted.

Moreover, it can be applied to not only molded-type power modules by which resin molding is performed but also power modules packaged with case type packages.

Comparative Examples of Seventh Embodiment

Firstly, a power module according to a comparative example of the seventh embodiment will now be explained. The present embodiment shows a power modules in which a perimeter of power device(s) (semiconductor device(s)) including a power element (s) (chip(s)) such as Insulated Gate Bipolar Transistor (IGBT) is molded with resin, as one of the power modules.

(Single-Sided Cooling Structure: Air Cooling)

Figure 37:
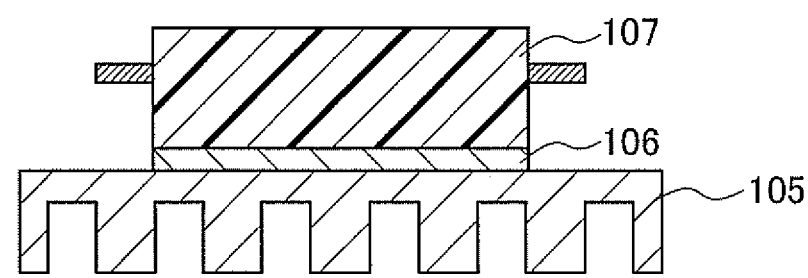
FIG. 37 is a schematic cross-sectional structure diagram of a power module according to a comparative example of a seventh embodiment.

FIG. 37 shows a schematic cross-sectional structure of a power module according to the comparative example of the seventh embodiment. For the power module according to the comparative example of the seventh embodiment, a single-sided cooling structure (air cooling) is adopted. More specifically, as shown in FIG. 37, a heat sink 105 is disposed via bonding material 106 on a lower surface of a power module 107. Cooling performance is relatively low because of the single-sided cooling structure (air cooling). Such a power module is used for power modules for industrial equipment etc.

(Single-Sided Cooling Structure: Water Cooling)

Figure 38:
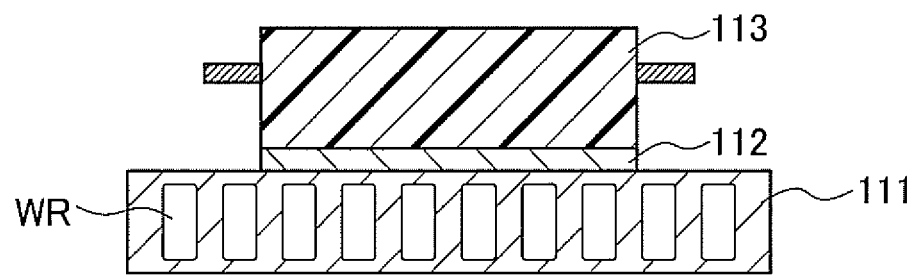
FIG. 38 is a schematic cross-sectional structure diagram of the power module according to the comparative example of the seventh embodiment.

FIG. 38 shows a schematic cross-sectional structure of a power module according to the comparative example of the seventh embodiment. For the power module according to the comparative example of the seventh embodiment, a single-sided cooling structure (water cooling) is adopted. More specifically, as shown in FIG. 38, a water cooling machine 111 is disposed via a bonding material 112 on a lower surface of a power module 113. Because of the single-sided cooling structure (water cooling), cooling performance is higher than the cooling performance of the single-sided cooling structure (air cooling) but is inferior to a double-sided cooling structure (water cooling). Such a power module is used for present general in-vehicle modules.

(Double-Sided Cooling Structure: Water Cooling)

Figure 39:
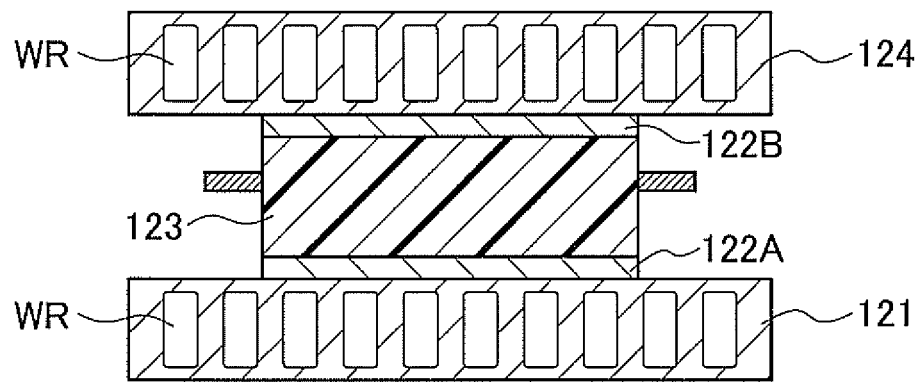
FIG. 39 is a schematic cross-sectional structure diagram of the power module according to the comparative example of the seventh embodiment.

FIG. 39 shows a schematic cross-sectional structure of a power module according to the comparative example of the seventh embodiment. For the power module according to the comparative example of the seventh embodiment, a double-sided cooling structure (water cooling) is adopted. More specifically, as shown in FIG. 39, a water cooling machine 121 is disposed via a bonding material 122A on a lower surface of a power module 123. Moreover, a water cooling machine 124 is disposed via a bonding material 122B on an upper surface of the power module 123. Although cooling performance is extremely high because of the double-sided water cooling, it is difficult to be assembled, and it is extremely expensive since two cooling apparatuses are required. Such a power module is used for next-generation in-vehicle modules.

Seventh Embodiment

The present embodiment illustrates a power module 1 of which a perimeter of the power device is molded by a resin.

(Fundamental Structure)

Figure 40:
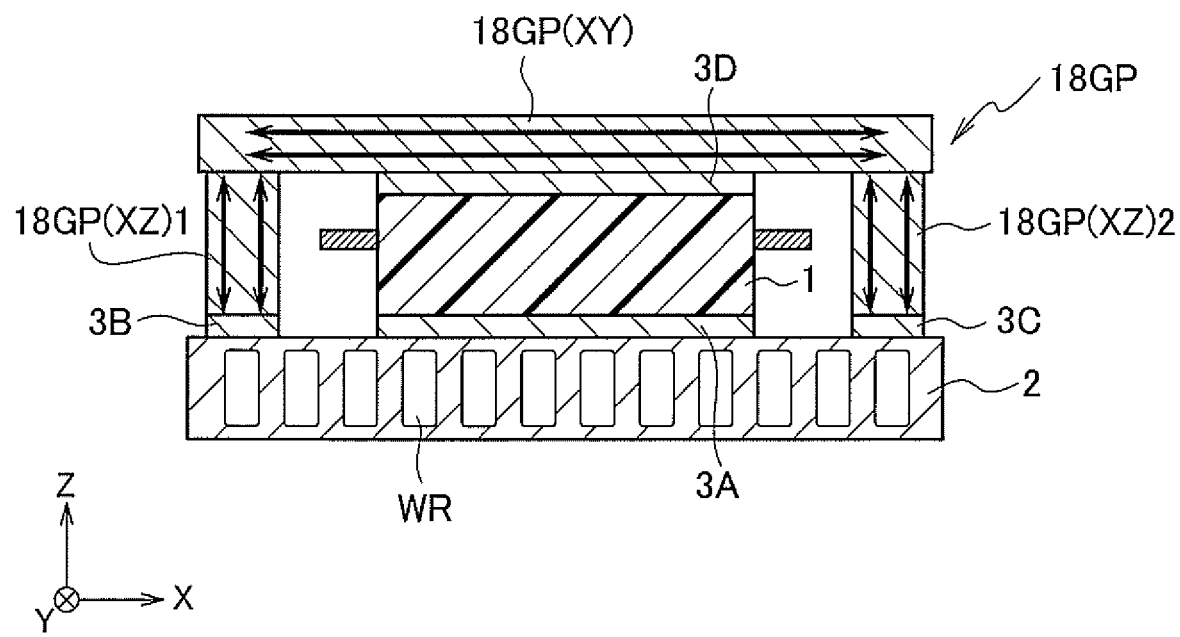
FIG. 40 is a schematic cross-sectional structure diagram of a power module according to the seventh embodiment.
Figure 41:
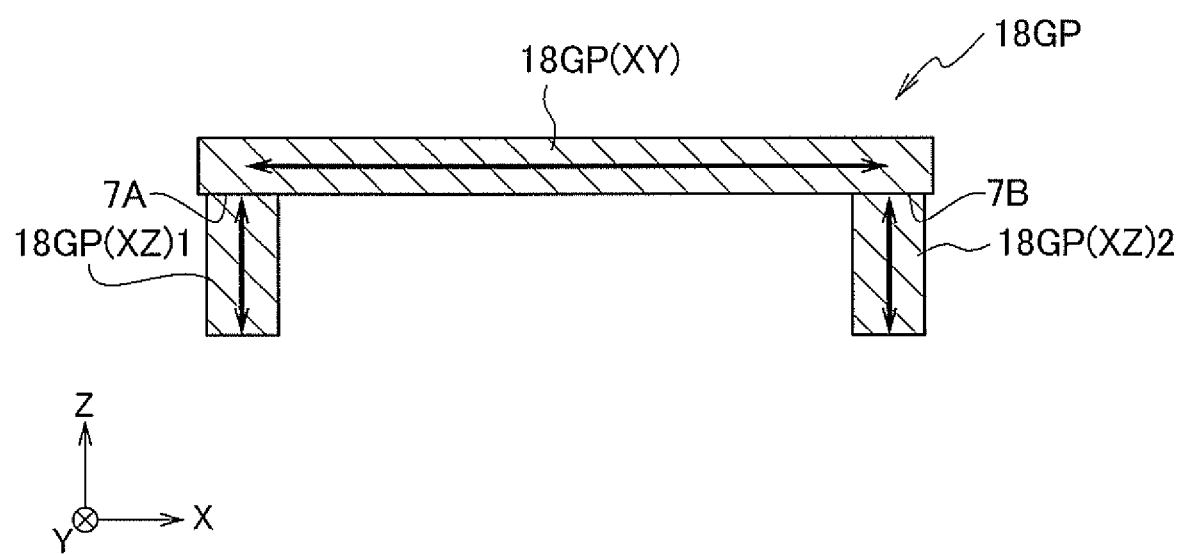
FIG. 41 is a schematic cross-sectional structure diagram of a graphite plate applicable to the power module according to the seventh embodiment.
Figure 42:
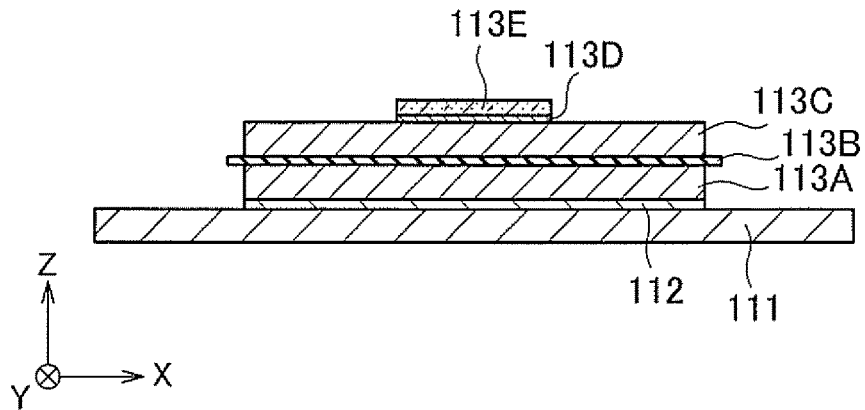
FIG. 42 is a schematic cross-sectional structure diagram showing a structure model of a thermal resistance simulation of the power module according to the comparative example of the seventh embodiment.

FIG. 40 shows a schematic cross-sectional structure of a power module according to the seventh embodiment. FIG. 41 shows a schematic cross-sectional structure of a graphite plate 18GP included in the power module shown in FIG. 40. The arrow in FIGS. 41 and 42 show a high thermally-conductive direction in the graphite plate 18GP.

As shown in FIGS. 40 and 41, the power module according to the seventh embodiment is a power module 1 having a lower surface (first surface) and an upper surface (second surface) opposite to the lower surface, configured to seal a semiconductor circuit which generates heat during operations mentioned below. The power module according to the seventh embodiment includes: a cooling apparatus 28 for water cooling disposed on a lower surface side of the power module 1; and a graphite plate 18GP of which one surface is bonded on a surface of the cooling apparatus 28 to which a lower surface of the power module 1 is bonded and the other surface is bonded on an upper surface of the power module 1, wherein the power module 1 is disposed between second graphite plates 18GP (XZ)1 and 18GP (XZ)2. The graphite plate 18GP has a structure in which two types of the graphite plates 18GP of which orientations of thermal conduction are different from each other are bonded along a direction so that the thermal conductivity is increased.

Although details will be mentioned below, the graphite plate 18GP has a structure of bonded second graphite plates 18GP (XZ)1 and 18GP (XZ) 2 to the first graphite plate 18GP (XY) in a direction orthogonal to each other. The orthogonal direction used herein may be a substantially orthogonal direction, and it may allow for a certain amount of error.

The first graphite plate 18GP (XY) has an XY orientation (first orientation) of which a thermal conductivity in a plane direction is higher than a thermal conductivity in a thickness direction.

Moreover, the first graphite plate 18GP (XY) may have a plate structure of laminating a plurality of graphite sheets GS having the XY orientation (refer to FIG. 6).

Moreover, the second graphite plates 18GP (XZ)1 and 18GP (XZ) 2 may have an XZ orientation (second orientation) of which a thermal conductivity in a thickness direction is higher than a thermal conductivity in a plane direction.

Moreover, the second graphite plates 18GP (XZ)1 and 18GP (XZ)2 have a plate structure of laminating a plurality of graphite sheets GS having the XZ orientation (refer to FIG. 6).

Moreover, the upper surface (one surface) of the second graphite plates 18GP (XZ)1 and 18GP (XZ)2 is bonded to the first graphite plate 18GP (XY), and a lower surface (the other surface) of the second graphite plates 18GP (XZ)1 and 18GP (XZ)2 is bonded to the cooling apparatus 28.

Moreover, a plurality of the second graphite plates 18GP (XZ)1 and 18GP (XZ)2 are bonded to a same plane of one first graphite plate 18GP (XY).

Moreover, a plurality of power modules $1_1$, $1_2$, and $1_3$ may be included therein, and second graphite plates 18GP (XZ)3 and 18GP (XZ) 4 may be disposed at each connecting portion between the plurality of the power modules $1_1$, $1_2$, and $1_3$ (refer to FIG. 52).

Figure 49:
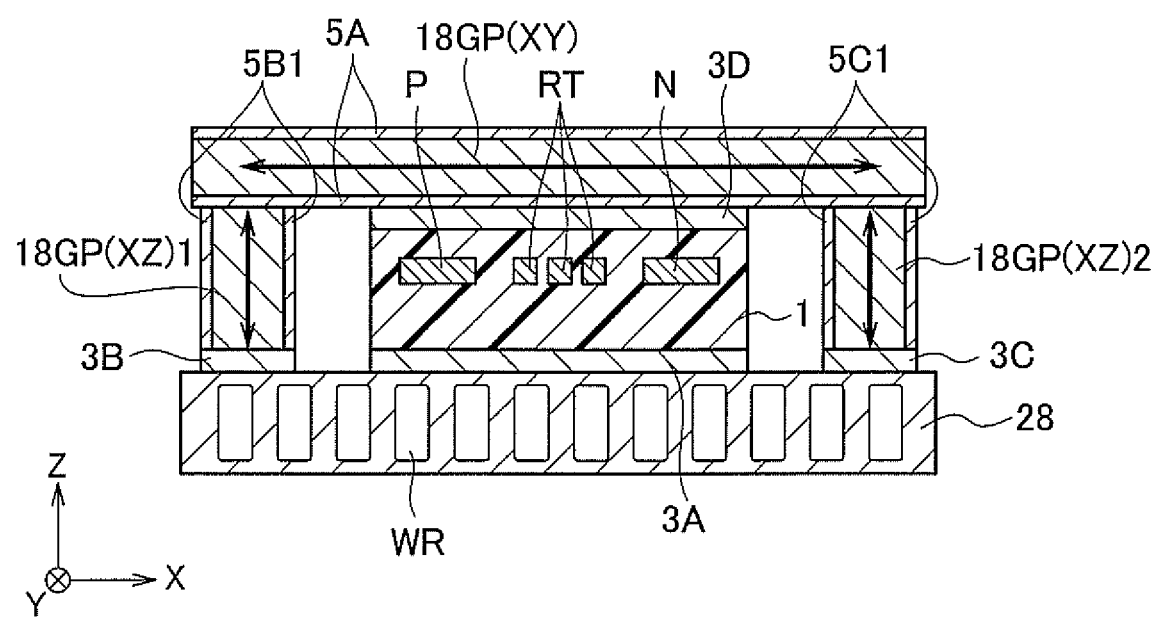
FIG. 49 is a schematic cross-sectional structure diagram of the power module using the graphite plate shown in FIG. 48.

Moreover, a metal layer as a Cu layer 5 may be formed on at least apart of both surfaces of the graphite plate 18GP (refer to FIGS. 49 and 52).

Moreover, the power module 1 includes power terminals P and N, an output terminal O, and a signal unit terminal RT, and is covered with a mold resin except for a part of each of the terminals P, N, and O (refer to FIG. 46).

Figure 53:
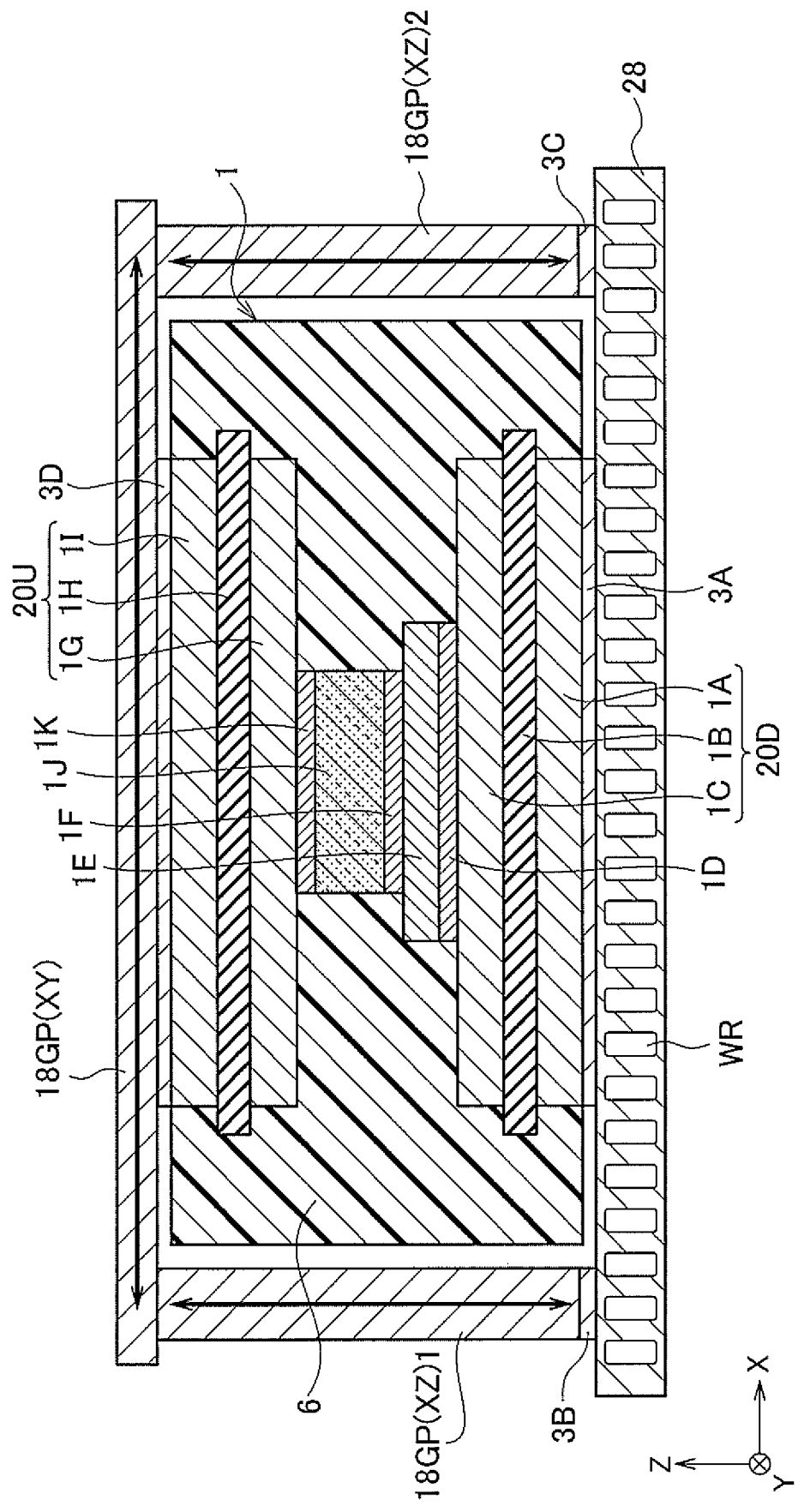
FIG. 53 is a detailed cross-sectional configuration diagram of the power module according to the seventh embodiment.

Moreover, an upper electrode 1I may be exposed from an upper surface of the mold resin, and a lower electrode 1A may be exposed from a lower surface of the mold resin (refer to FIG. 53).

Although solder or an Ag fired body is used as bonding material 3D of the upper electrode 1I and the graphite plate 18GP, other sufficient thermally conductive bonding materials may be used (refer to FIG. 53).

Moreover, although solder or an Ag fired body is used as a lower electrode 1A and a bonding material 3A of the cooling apparatus 28, other sufficient thermally conductive bonding materials may be used (refer to FIG. 53).

Moreover, a heat radiator F may be disposed on a surface opposite to a contact surface with an upper surface of the power module 1 of the graphite plate 18GP (refer to FIG. 52).

Moreover, the cooling apparatus 28 is a water cooling machine through which a coolant liquid WR flows into an inside thereof, and water or a mixed solution in which water and an ethylene glycol by a rate of every 50% are mixed is used as the coolant liquid WR, for example.

Moreover, the power module 1 includes one power semiconductor of an Si based or SiC based IGBT, diode, or MOSFET, or a GaN based FET.

The power module 1 may compose any one module of a 1-in-1 module, a 2-in-1 module, a 4-in-1 module, a 6-in-1 module, a 7-in-1 module, an 8-in-1 module, a 12-in-1 module or a 14-in-1 module.

The power module 1 may compose an inverter or converter using a 6-in-1 module type.

The power module 1 includes: a power device 1E connected in series between a first power terminal P and a second power terminal N, the power device 1E disposed on an upper surface of a substrate (for example, lower insulating substrate 20D) having the upper surface (first surface) and a lower surface (second surface) opposite to the upper surface; and a cooling apparatus 28 disposed on a lower surface side of the substrate. The power module 1 is configured so that a connecting point of the power device 1E is connected to an output terminal O. The power device 1E has a lower surface (first surface) and an upper surface (second surface) opposite to the lower surface, and includes a graphite plate 18GP configured to thermally connect the upper surface side of the power device 1E and the lower surface side of the substrate on the cooling apparatus 28. The graphite plate 18GP has a structure in which two types of the graphite plates 18GP of which orientations of thermal conduction are different from each other are bonded along a direction so that the thermal conductivity is increased (refer to FIG. 53).

Although contact surfaces 7A and 7B between the first graphite plate 18GP (XY) and the second graphite plates 18GP (XZ)1 and 18GP (XZ)2 shown in FIG. 41 are bonded by brazing, other sufficient thermally conductive bonding methods may be used.

(Graphite Plate)

In the power module according to the seventh embodiment, two types of graphite plates respectively having different orientations are used as the graphite plate 18GP.

FIG. 5 shows a schematic configuration (an example of laminated structure) of the graphite sheet (graphene) GS composing the graphite plate 18GP.

The graphite plate 18GP includes: a first graphite plate 18GP (XY) having an XY orientation (first orientation) having a thermal conductivity in a plane direction higher than that in a thickness direction; and a second graphite plate 18GP (XZ) having an XZ orientation (second orientation) having a thermal conductivity in a thickness direction higher than that in a plane direction. The first graphite plate 18GP (XY) is expressed as shown in FIG. 6A, and the second graphite plate 18GP (XZ) is expressed as shown in FIG. 6B.

As shown in FIG. 5, graphite sheets GS1, GS2, GS3, . . . , GSn of each surface composed of n layers have many covalent bonding of hexagonal crystal in one laminated crystal structure, and between the graphite sheets GS1, GS2, GS3, . . . , GSn of each surface are bonded to one another with Van der Waals force.

More specifically, the graphite which is a carbon based anisotropic thermal conducting material is a laminated crystal body of a hexagonal mesh structure of carbon atom, and the thermal conduction thereof also has anisotropy, and the graphite sheets GS1, GS2, GS3, . . . , GSn shown in FIG. 5 have an amount of thermal conductivity (high thermal conductivity) larger than that in a thickness direction of Z-axis with respect to a crystal surface direction (on the XY plane).

Accordingly, as shown in FIG. 6A, the first graphite plate 18GP (XY) having XY orientation is provided with thermal conductivities X=approximately 1500 (W/mK), Y=approximately 1500 (W/mK), and Z=approximately 5 (W/mK), for example.

On the other hand, as shown in FIG. 6B, the second graphite plate 18GP (XZ) having XZ orientation is provided with thermal conductivities X=approximately 1500 (W/mK), Y=approximately 5 (W/mK), and Z=approximately 1500 (W/mK), for example.

In addition, the density of each of the first and second graphite plates 18GP (XY) and 18GP (XZ) is 2.2 (g/cm$^3$), and the thickness thereof is approximately 0.7 mm to approximately 10 mm, and the size thereof is equal to or less than approximately 40 mm×approximately 40 mm.

[Comparison of Thermal Resistance]

Next, a relationship of the cooling structure and the thermal resistance will now be explained.

(Single-Sided Cooling Structure)

Figure 43:
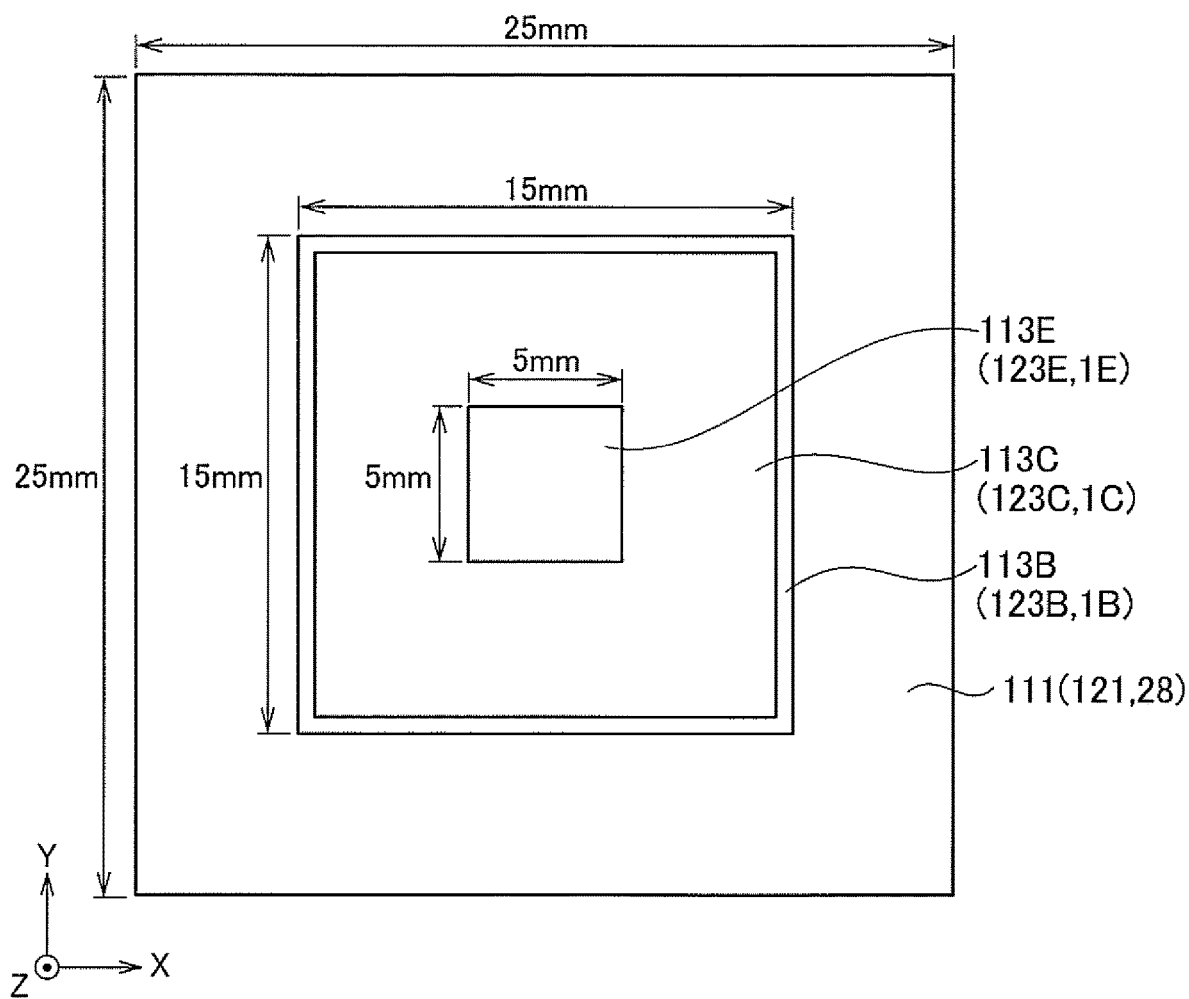
FIG. 43 is a schematic upper surface configuration diagram of an SiC chip of the structure model shown in FIGS. 42, 44, and 45 observed from above.

FIG. 42 shows a schematic cross-sectional structure showing a structure model of a thermal resistance simulation of a power module having a single-sided cooling structure according to a comparative example of the seventh embodiment. FIG. 43 shows a schematic upper surface configuration observing from above of the SiC chip 113E of the structure model shown in FIG. 42.

As the thermal resistance simulation of the single-sided cooling structure shows in FIG. 42, the thickness of the SiC chip 113E is 0.35 mm, the thickness of the Ag fired layer 113D is 0.06 mm, the thickness of the Cu layer 113C is 1.0 mm, the thickness of the Si$_3$N$_4$ layer 113B is 0.25 mm, the thickness of the Cu layer 113A is 1.0 mm, the thickness of the SnAg solder 112 is 0.2 mm, and the thickness of the cooling apparatus (Al (aluminum) layer) 111 is 1.0 mm. As shown in FIG. 43, the size of the SiC chip 113E is 5 mm×5 mm, the size of the Si$_3$N$_4$ layer 113B is 15 mm×15 mm, and the size of the cooling apparatus (Al layer) 111 is 25 mm×25 mm. When such a single-sided cooling structure is adopted, the thermal resistance is 0.304 (° C./W), for example.

(Double-Sided Cooling Structure)

Figure 44:
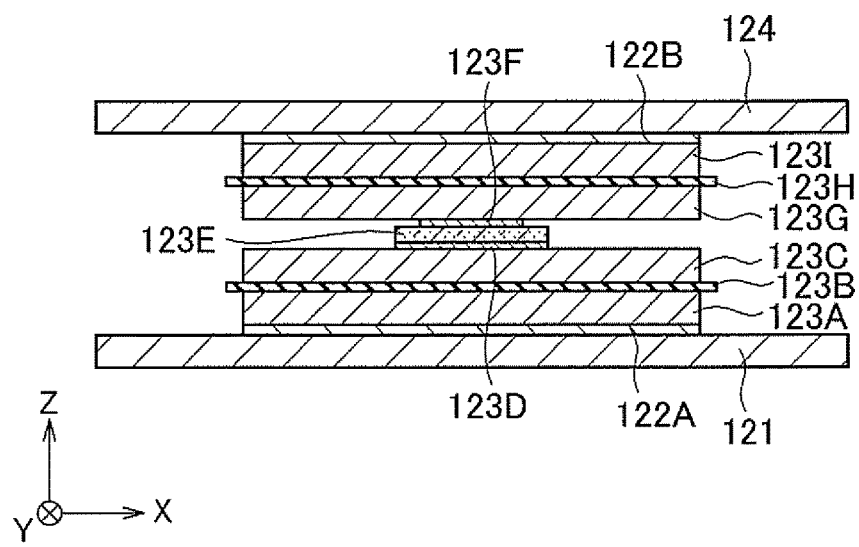
FIG. 44 is a schematic cross-sectional structure diagram showing the structure model of the thermal resistance simulation of the power module according to the comparative example of the seventh embodiment.

FIG. 44 shows a schematic cross-sectional structure showing a structure model of a thermal resistance simulation of a power module having a double-sided cooling structure according to the comparative example of the seventh embodiment. Herein, a schematic upper surface configuration observed from above of the SiC chip 123E will now be explained with reference to FIG. 44.

As shown in FIG. 44, in the thermal resistance simulation of the double-sided cooling structure, the thickness of the cooling apparatus (Al layer) 124 is 1.0 mm, the thickness of the SnAg solder 122B is 0.2 mm, the thickness of the Cu layer 123I is 1.5 mm, the thickness of the Si$_3$N$_4$ layer 123H is 0.25 mm, the thickness of the Cu layer 123G is 1.5 mm, the thickness of the Ag fired layer 123F is 0.06 mm, the thickness of the SiC chip 123E is 0.35 mm, the thickness of the Ag fired layer 123D is 0.06 mm, the thickness of the Cu layer 123C is 1.0 mm, the thickness of the Si$_3$N$_4$ layer 123B is 0.25 mm, the thickness of the Cu layer 123A is 1.0 mm, the thickness of the SnAg solder 122A is 0.2 mm, and a thickness of the cooling apparatus (Al layer) 121 is 1.0 mm. As shown in FIG. 43, the size of the SiC chip 123E is 5 mm×5 mm, the size of the $Si_3N_4$ layer 123B is 15 mm×15 mm, and the size of the cooling apparatus (Al layer) 121 is 25 mm×25 mm. Although illustration is omitted, the size of a bonded portion (Ag fired layer 123F) on the SiC chip 123E is 3 mm×3 mm, for example. When such a double-sided cooling structure is adopted, the thermal resistance is 0.184 (° C./W), and is reduced by approximately 40% compared with the thermal resistance on the single-sided cooling structure, for example.

(Semi-Double-Sided Cooling Structure)

Figure 45:
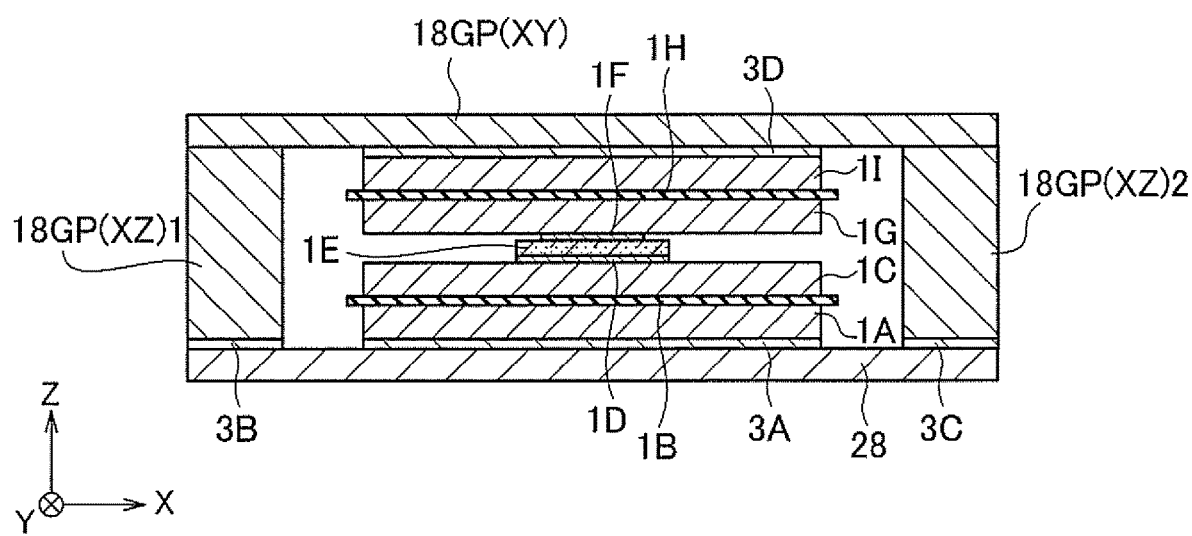
FIG. 45 is a schematic cross-sectional structure diagram showing a structure model of a thermal resistance simulation of the power module according to the seventh embodiment.

FIG. 45 shows a schematic cross-sectional structure showing a structure model of a thermal resistance simulation of a power module having a semi-double-sided cooling structure according to the seventh embodiment. Herein, a schematic upper surface configuration observed from above of the SiC chip 1E will now be explained with reference to FIG. 43.

As shown in FIG. 45, in the thermal resistance simulation of the semi-double-sided cooling structure, the thickness of the first graphite plate 18GP (XY) is 1.0 mm, the width of the second graphite plate 18GP (XZ) is 2 mm, the thickness of the SnAg solder 3D is 0.2 mm, the thickness of the Cu layer 1I is 1.5 mm, the thickness of the $Si_3N_4$ layer 1H is 0.25 mm, the thickness of the Cu layer 1G is 1.5 mm, the thickness of the Ag fired layer 1F is 0.06 mm, the thickness of the SiC chip 1E is 0.35 mm, the thickness of the Ag fired layer 1D is 0.06 mm, the thickness of the Cu layer 1C is 1.0 mm, the thickness of the $Si_3N_4$ layer 1B is 0.25 mm, the thickness of the Cu layer 1A is 1.0 mm, the thickness of the SnAg solders 3A, 3B, and 3C is 0.2 mm, and the thickness of the cooling apparatus (Al layer) 2 is 1.0 mm. As shown in FIG. 43, the size of the SiC chip 1E is 5 mm×5 mm, the size of the $Si_3N_4$ layer 1B is 15 mm×15 mm, and the size of the cooling apparatus (Al layer) 2 is 25 mm×25 mm. Although illustration is omitted, the size of a bonded portion (Ag fired layer 1F) on the SiC chip 1E is 3 mm×3 mm, for example. When such a semi-double-sided cooling structure is adopted, the thermal resistance is 0.209 (° C./W), and is reduced by approximately 32% compared with the thermal resistance on the single-sided cooling structure, for example. More specifically, it is proved that the single cooling apparatus has the cooling performance near the cooling performance of the double-sided cooling system.

As mentioned above, in the power module according to the seventh embodiment, two graphite plates 18GP of which the orientations are different from each other are bonded to each other, in order to act as two cooling apparatuses of the double-sided cooling system only by the single cooling apparatus (water cooling machine) 2, taking advantage of the anisotropic thermal conductivity of the graphite. Accordingly, for example, the heat is diffused in the X-Y direction due to the high thermal conductivity of approximately 1500 W/m·K, and even the temperature of the upper portion of the power module becomes substantially the temperature of the cooling apparatus 28 due to the high thermal conductivity of approximately 1500 W/m·K. Thereby, the single cooling apparatus 28 can have the cooling performance which is simulatively equivalent to the cooling performance of the double-sided cooling apparatus.

Bonding materials 3A, 3B, and 3C and 3D is not limited to neither solder nor the Ag fired body, and a compound and grease may be used therefor. However, it is preferable to use the solder or the Ag fired body since the thermal resistance becomes large if the compound or grease is used.

[Concrete Example]

Next, a concrete example of the power module according to the seventh embodiment will now be explained.

Figure 46B:
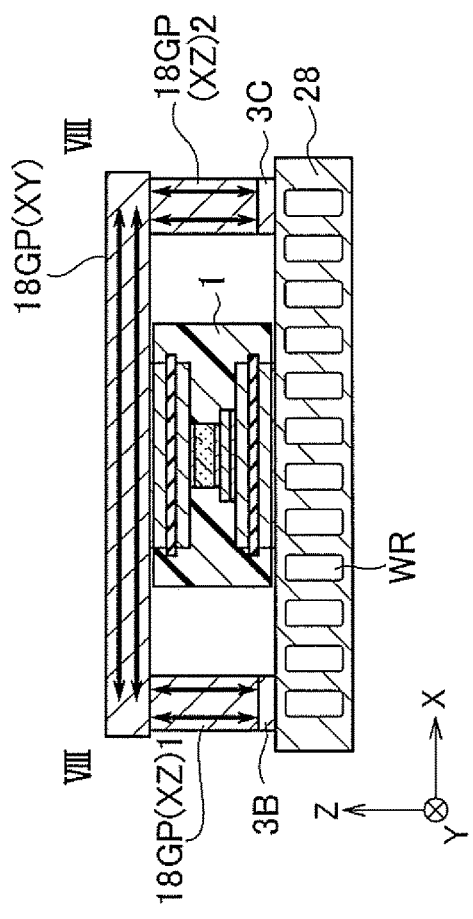
FIG. 46B is a schematic cross-sectional structure diagram taken in the line VIII-VIII of FIG. 46A.
Figure 46C:
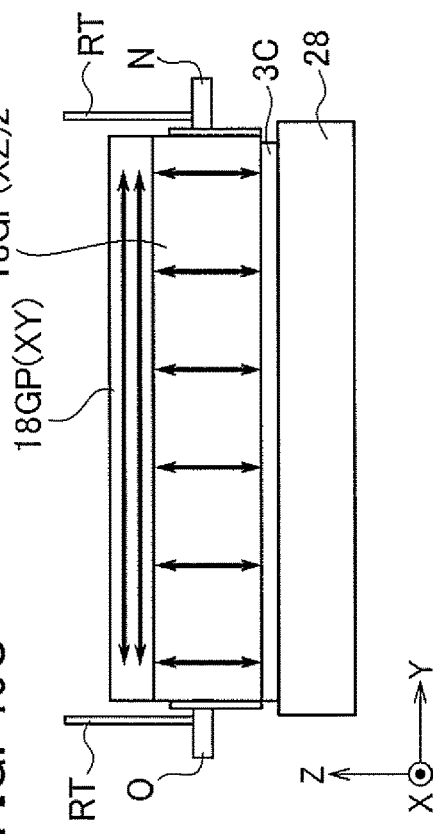
FIG. 46C is a schematic right-side surface configuration diagram of the power module shown in FIG. 46A.
Figure 46A:
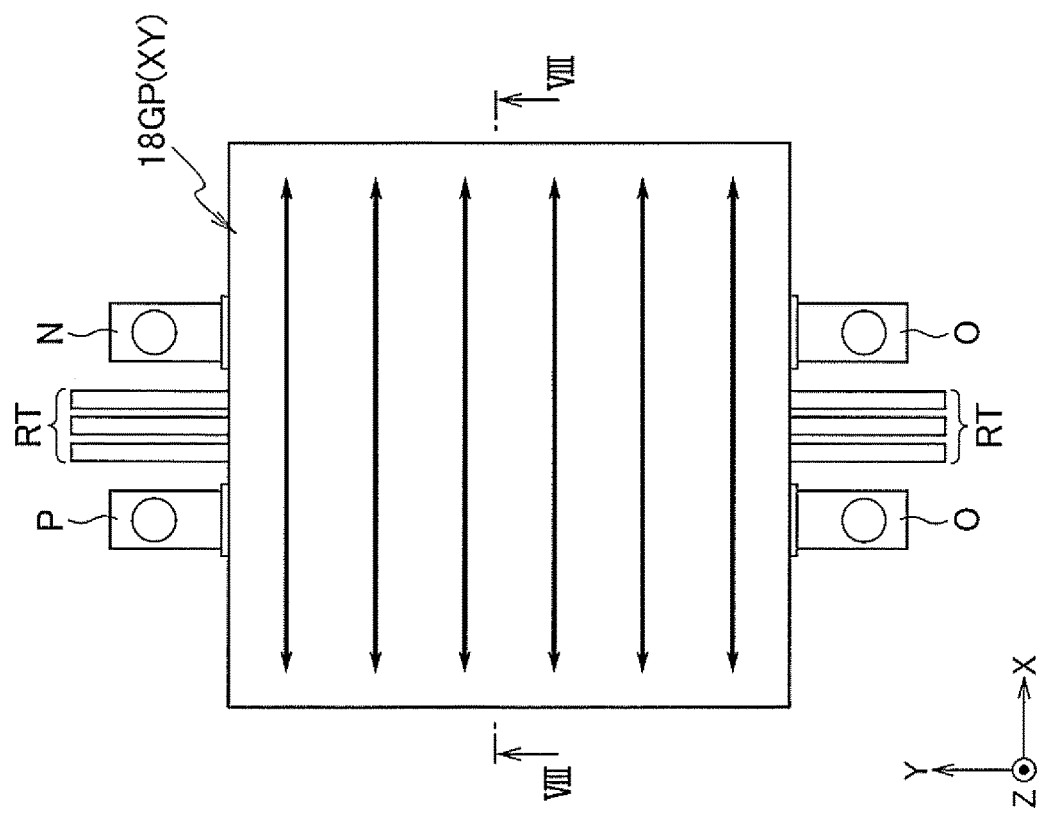
FIG. 46A is a schematic planar pattern configuration diagram showing a concrete example of the power module according to the seventh embodiment.

FIG. 46A shows a schematic planar pattern configuration showing a concrete example of the power module according to the seventh embodiment. FIG. 46B shows a schematic cross-sectional structure taken in the line VIII-VIII of FIG. 46A. Moreover, FIG. 46C shows a schematic right-side surface configuration of the power module shown in FIG. 46A. The "right-side surface" used herein means a side surface observed from a side having no terminal.

In the power module, the 2-in-1 module type power module shown in FIG. 30 is adopted as the power device. More specifically, as shown in FIG. 46, the power module 1 includes the sealed power device, a power terminals P and N for supplying power to the power device, an output terminal O for executing an output from the power device, and a signal unit terminal RT for controlling an operation of the power device. The signal unit terminal RT is bent so as to be connected to a gate drive. It may be covered with a mold resin except for a part of the power terminal P and N, output terminal O, and signal unit terminal RT.

In this example, the size of the first graphite plate 18GP (XY) is larger than the size of the upper surface of the power module 1, and the height of the second graphite plates 18GP (XZ)1 and 18GP (XZ)2 is the same degree as that of the power module 1. According to such a graphite plate 18GP, it is possible to effectively cool the upper surface side of the power module 1.

Moreover, the second graphite plates 18GP (XZ)1 and 18GP (XZ)2 are respectively bonded to both ends of the first graphite plate 18GP (XY). Accordingly, the loop-shaped graphite plate 18GP bonded to the cooling apparatus 28 is configured, and the power module 1 can be disposed inside the loop. According to such a graphite plate 18GP, it is possible to diffuse the heat in the X-Y direction and the XZ direction due to the high thermal conductivity, and thereby to exhibit the high cooling performance.

Naturally, the size, the number, the shape, the positional relationship, etc. of the first graphite plate 18GP (XY) and the second graphite plates 18GP (XZ)1 and 18GP (XZ)2 can be appropriately changed. For example, as shown in FIG. 46B, the both ends in the X direction of the first graphite plate 18GP (XY) may be slightly protruded towards the outward of the second graphite plates 18GP (XZ)1 and 18GP (XZ)2, and the end surface of second graphite plate 18GP (XZ) may be flush with the surface of the outside of the first graphite plate 18GP (XY).

Modified Example

Next, a modified example of the power module according to the seventh embodiment will now be explained.

(Stress Reduction Structure)

Figure 47A:
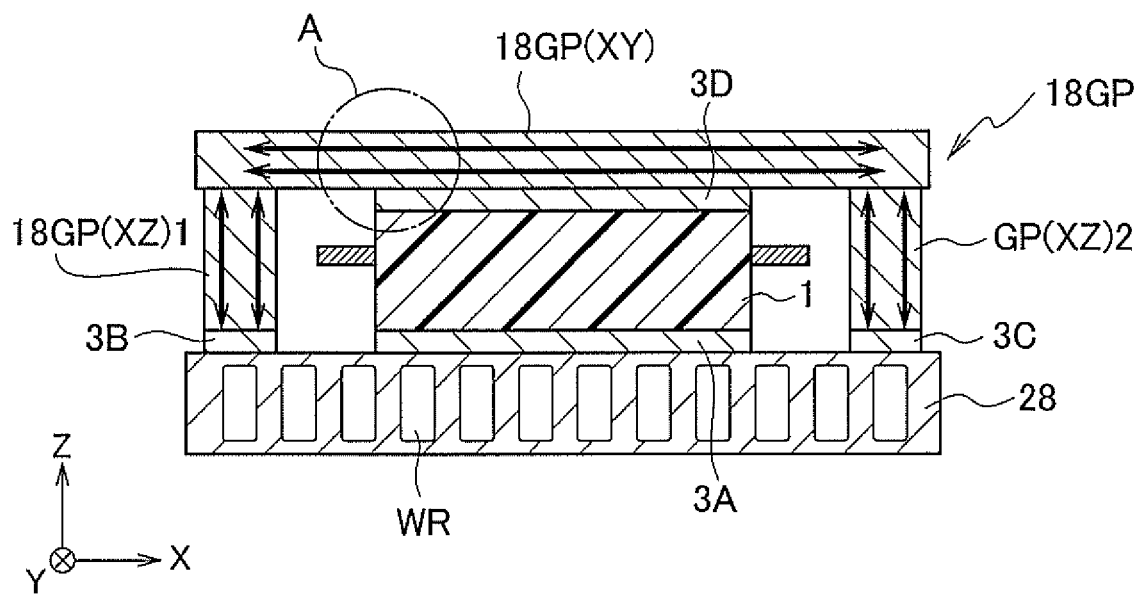
FIG. 47A is a schematic cross-sectional structure diagram of the power module according to the seventh embodiment.

FIG. 47A shows a schematic cross-sectional structure of the power module according to the seventh embodiment. Moreover, FIG. 47B shows an enlarged section structure of the portion A in FIG. 47A.

Figure 47B:
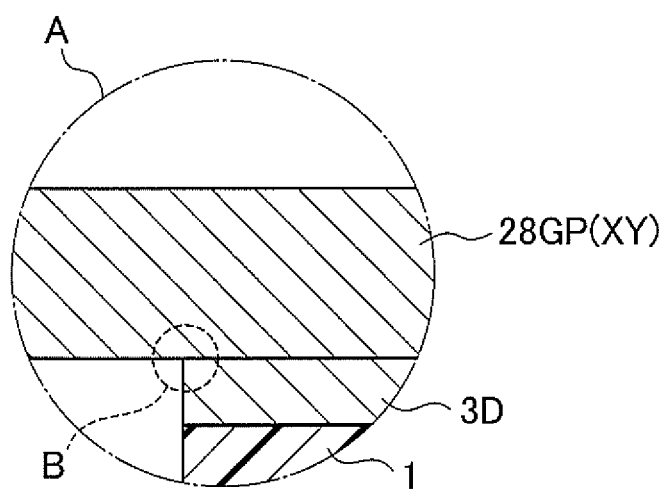
FIG. 47B is an enlarged section structure diagram of the enlarged portion A shown in in FIG. 47A.

Since the synthetic Coefficient of Thermal Expansion (CTE) of the power module 1 itself becomes dominant in the molding resin, a stress is applied extremely to the portion B shown in FIG. 47B. The portion B corresponds to a bonded portion (hereinafter merely "bonded portion") between the graphite plate 18GP and the bonding material 3D, and the bonding material 3D is used for bonding between the power module 1 and graphite plate 18GP. Mises stress to be applied to the bonded portion can be obtained by the following definitional equations:

$$\sigma_w = \sqrt{\frac{1}{2}\{(\sigma 1 - \sigma 2)^2 + (\sigma 2 - \sigma 3)^2 + (\sigma 3 - \sigma 1)^2\}}$$

In this context, Mises stress is one of equivalent stresses used in order to indicate a stress state which occurs inside a substance as a single value. In this case, σ1 is the maximum principal stress, σ2 is an intermediate principal stress, and σ3 is the minimum principal stress, in the definitional equation. In this case, the principal stress σ1, σ2, and σ3 applied to the bonding portion are respectively selected from a principal stress in the X direction, a principal stress in the Y direction, and a principal stress in the Z axial direction.

Figure 48:
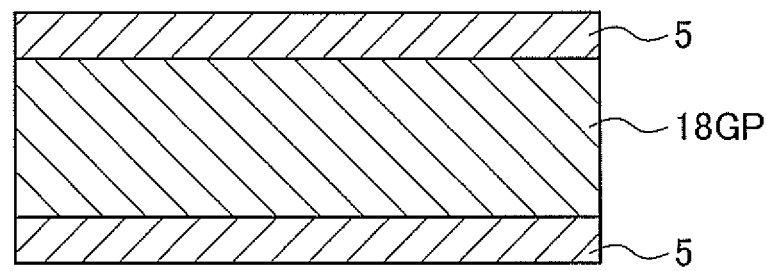
FIG. 48 is a schematic cross-sectional structure diagram showing a modified example of a graphite plate included in the power module according to the seventh embodiment.

FIG. 48 shows a schematic cross-sectional structure showing a modified example of the graphite plate included in the power module according to the seventh embodiment. As shown in FIG. 48, Cu layers 5 thinner than the graphite plate 18GP are respectively formed on both surfaces of the graphite plate 18GP. Herein, although the Cu layer 5 is illustrated, other metals, ceramics, etc. may be adopted instead of the Cu.

FIG. 49 shows a schematic cross-sectional structure of a power module using the graphite plate 18GP shown in FIG. 48. As shown in FIG. 49, the Cu layers 5A are respectively formed on an upper surface and lower surface of the first graphite plate 18GP (XY). Moreover, Cu layers 5B1 and 5C1 are respectively formed on side surfaces of the second graphite plates 18GP (XZ)1 and 18GP (XZ)2. Accordingly, Mises stress applied to the bonded portion can be reduced by matching it with the synthetic CTE of the power module 1.

Figure 50:
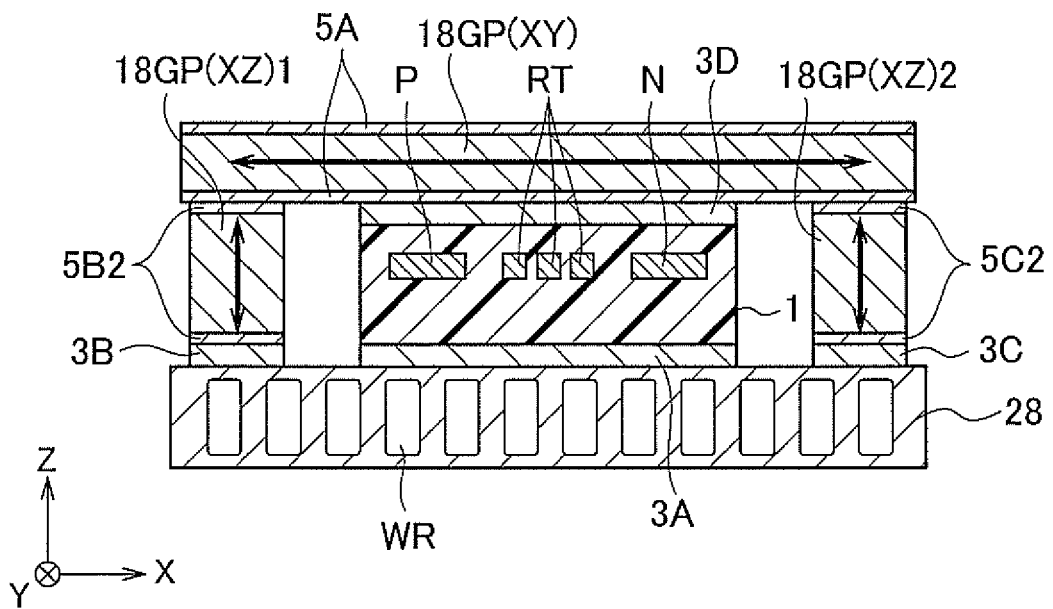
FIG. 50 is a schematic cross-sectional structure diagram of another power module using the graphite plate shown in FIG. 48.

FIG. 50 shows a schematic cross-sectional structure of another power module using the graphite plate 18GP shown in FIG. 48. A different point from the power module shown in FIG. 49 is a point that Cu layers 5B2 and 5C2 are respectively formed on upper surfaces and lower surfaces of the second graphite plates 18GP (XZ) 1 and 18GP (XZ) 2. Also in this case, Mises stress applied to the bonded portion can be reduced by matching it with the synthetic CTE of the power module 1.

(Heat Radiator)

Figure 51:
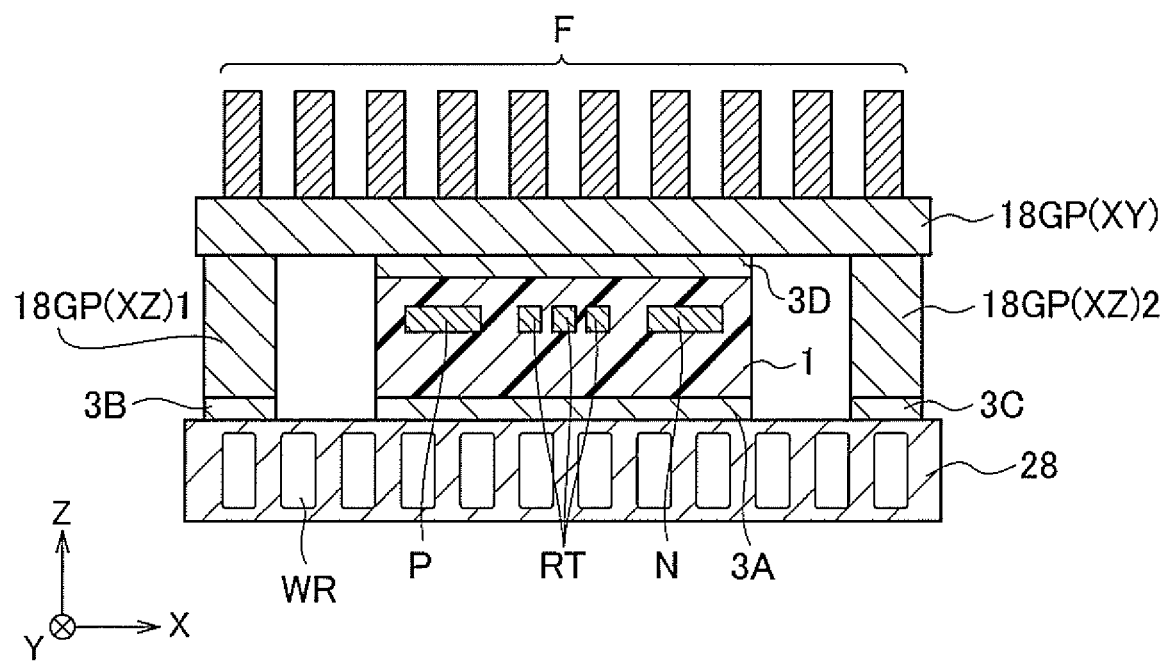
FIG. 51 is a schematic cross-sectional structure diagram showing a modified example of the power module according to the seventh embodiment.

FIG. 51 shows a schematic cross-sectional structure showing a modified example of the power module according to the seventh embodiment. As shown in FIG. 51, a heat radiator (fin) F composed by including a metal, ceramics, graphite, etc. may be disposed on the first graphite plate 18GP (XY). Accordingly, it is possible to further improve the cooling performance since the heat can also be radiated from the upper surface of the first graphite plate 18GP (XY).

(6-in-1 Module)

Figure 52A:
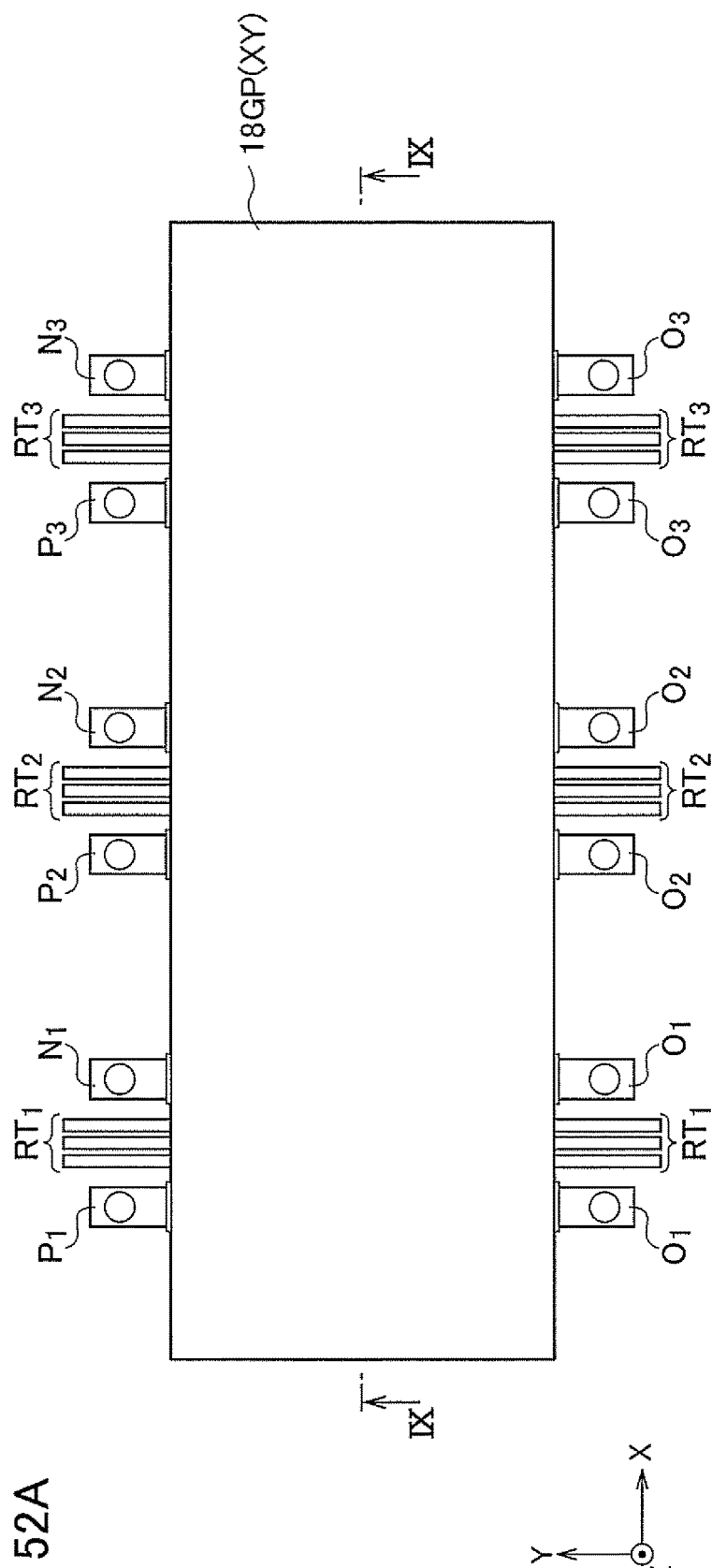
FIG. 52A is a schematic planar pattern configuration diagram showing a modified example of the power module according to the seventh embodiment.
Figure 52B:
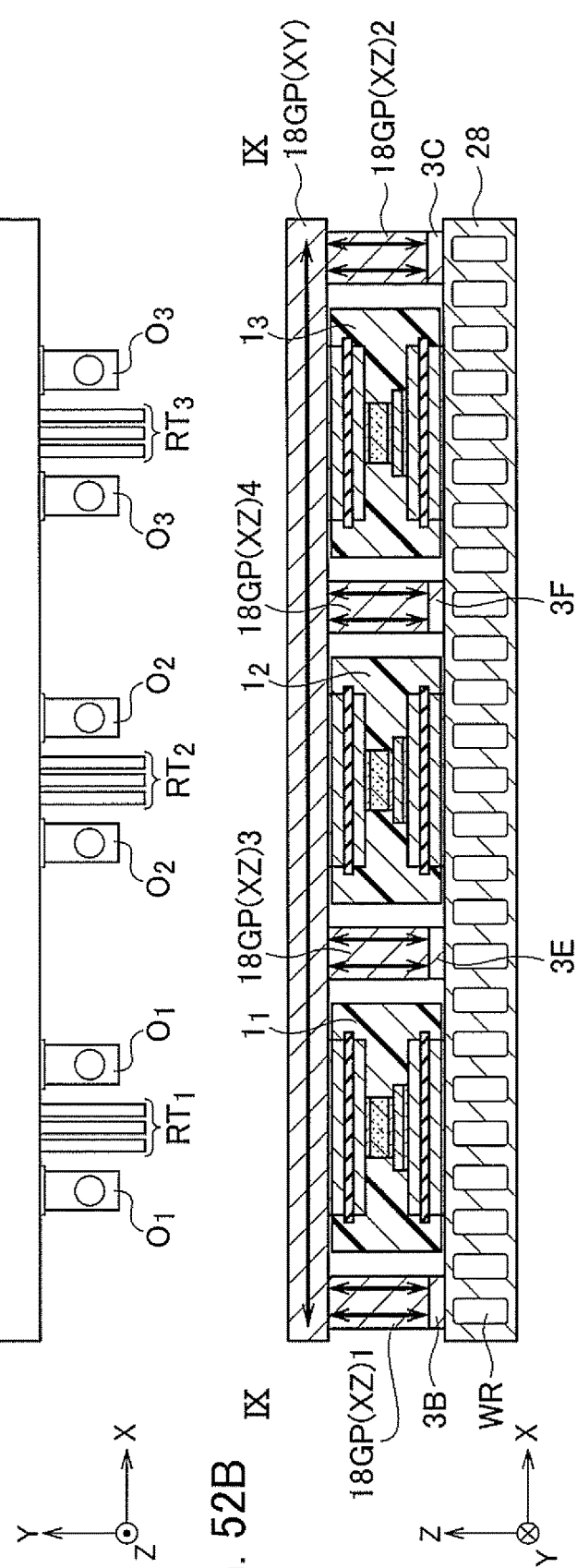
FIG. 52B is a schematic cross-sectional structure diagram taken in the line IX-IX of FIG. 52A.

FIG. 52A shows a schematic planar pattern configuration showing a modified example of the power module according to the seventh embodiment. Moreover, FIG. 52B shows a schematic cross-sectional structure taken in the line IX-IX of FIG. 52A.

In the power module, the 6-in-1 module type power module is adopted as the power device. More specifically, as shown in FIG. 52, there are included power modules $1_1$, $1_2$, and $1_3$ respectively including the sealed power devices, and there are also power terminals ($P_1$, $N_1$), ($P_2$, $N_2$), and ($P_3$, $N_3$) for supplying power to the power device, output terminals $O_1$, $O_2$, and $O_3$ for executing output from the power device, and signal unit terminals $RT_1$, $RT_2$, and $RT_3$ for controlling operations of the power device. The signal unit terminals $RT_1$, $RT_2$, and $RT_3$ are bent so as to be connected to a gate drive circuit. It is covered with a mold resin except for a part of the power terminals ($P_1$, $N_1$), ($P_2$, $N_2$), and ($P_3$, $N_3$), the output terminals $O_1$, $O_2$, and $O_3$, the signal unit terminal $RT_1$, $RT_2$, and $RT_3$.

In such a 6-in-1 module type, the length in the X direction of the first graphite plate 18GP (XY) becomes longer. Accordingly, it is preferable that the second graphite plates 18GP (XZ)1 and 18GP (XZ)2 are bonded to not only the both ends of the first graphite plate 18GP (XY), but the second graphite plates 18GP (XZ)3 and 18GP (XZ)4 4 are also bonded to each connecting portion of the power modules $1_1$, $1_2$, and $1_3$. Thus, since the heat is conducted through the four second graphite plates 18GP (XZ) 1, 18GP (XZ) 2, 18GP (XZ) 3, and 18GP (XZ)4, the cooling performance is not reduced, even compared with the 2-in-1 module type. Moreover, since the second graphite plates 18GP (XZ)3 and 18GP (XZ)4 4 are bonded on each connecting portion of the power modules $1_1$, $1_2$, and $1_3$, there is an effect of uniformly cooling each power module $1_1$, $1_2$, and $1_3$. It is preferred for such a power module to be applied to inverter circuits, e.g. an air-conditioner, or converter circuits, e.g. power supply equipment.

Although the case of applying the power module according to the seventh embodiment to the 2-in-1 module type and the 6-in-1 module type as the power device has been explained, the module types are not limited to these. For example, it is applicable to 1-in-1 module type power modules, 4-in-1 module type power modules, 7-in-1 module type power modules composed of 6-in-1 module type power modules including a snubber capacitor etc., 8-in-1 module type power modules, 12-in-1 module type power modules, 14-in-1 module type power modules, etc.

Detailed Example of Cross-Sectional Structure

Next, a detailed example of a cross-sectional structure of the power module according to the seventh embodiment will now be explained. Hereinafter, each part corresponding to the power module shown in FIG. 45 will be explained using the same reference numeral.

Detailed Example 1 of Cross-Sectional Structure

FIG. 53 shows a detailed cross-sectional structure of the power module according to the seventh embodiment. As shown in FIG. 53, the power module according to the seventh embodiment includes: a lower insulating substrate 20D including electrode patterns 1A and 1C disposed on both surfaces of a ceramics substrate 1B; a power device 1E disposed on the electrode pattern 1C via a bonding material 1D; a metal 1J disposed on the power device 1E via a bonding material 1F; an upper insulating substrate 20U disposed via an bonding material 1K so as to face the metal 1J, the upper insulating substrate 20U including electrode patterns 1G and 1I respectively disposed on both surfaces of a ceramics substrate 1H; a cooling apparatus 28 disposed on the electrode pattern 1A of the lower insulating substrate 20D via a bonding member 3A; and a first graphite plate 18GP (XY) disposed via a bonding material 3D on the electrode pattern 1I of the upper insulating substrate 20U; and second graphite plates 18GP (XZ)1 and 18GP (XZ)2 of which upper surfaces are bonded in a direction orthogonal to the first graphite plate 18GP (XY) and lower surfaces are respectively bonded to the cooling apparatus 28 via bonding materials 3B and 3C, wherein the electrode pattern (upper electrode) 1I is exposed from an upper surface of a mold resin 6, and the electrode pattern (lower electrode) 1A is exposed from a lower surface of the mold resin 6. More specifically, since the metals are respectively exposed from the upper surface and the lower surface of the mold resin 6, the first graphite plate 18GP (XY) and the cooling apparatus 28 can be strongly bonded using the bonding materials 3D and 3A, e.g. solder or an Ag fired body.

In addition, the ceramics substrates 1B and 1H are SiN layers, AlN layers, etc., for example. The electrode patterns 1A, 1C, 1G, and 1I are Cu layers, Al layers, etc., for example. The power device 1E is a SiC chip, an Si-based IGBT, etc., for example. The metal 1J is a Cu layer, a CuMo layer, etc., for example.

Detailed Example 2 of Cross-Sectional Structure

Figure 54:
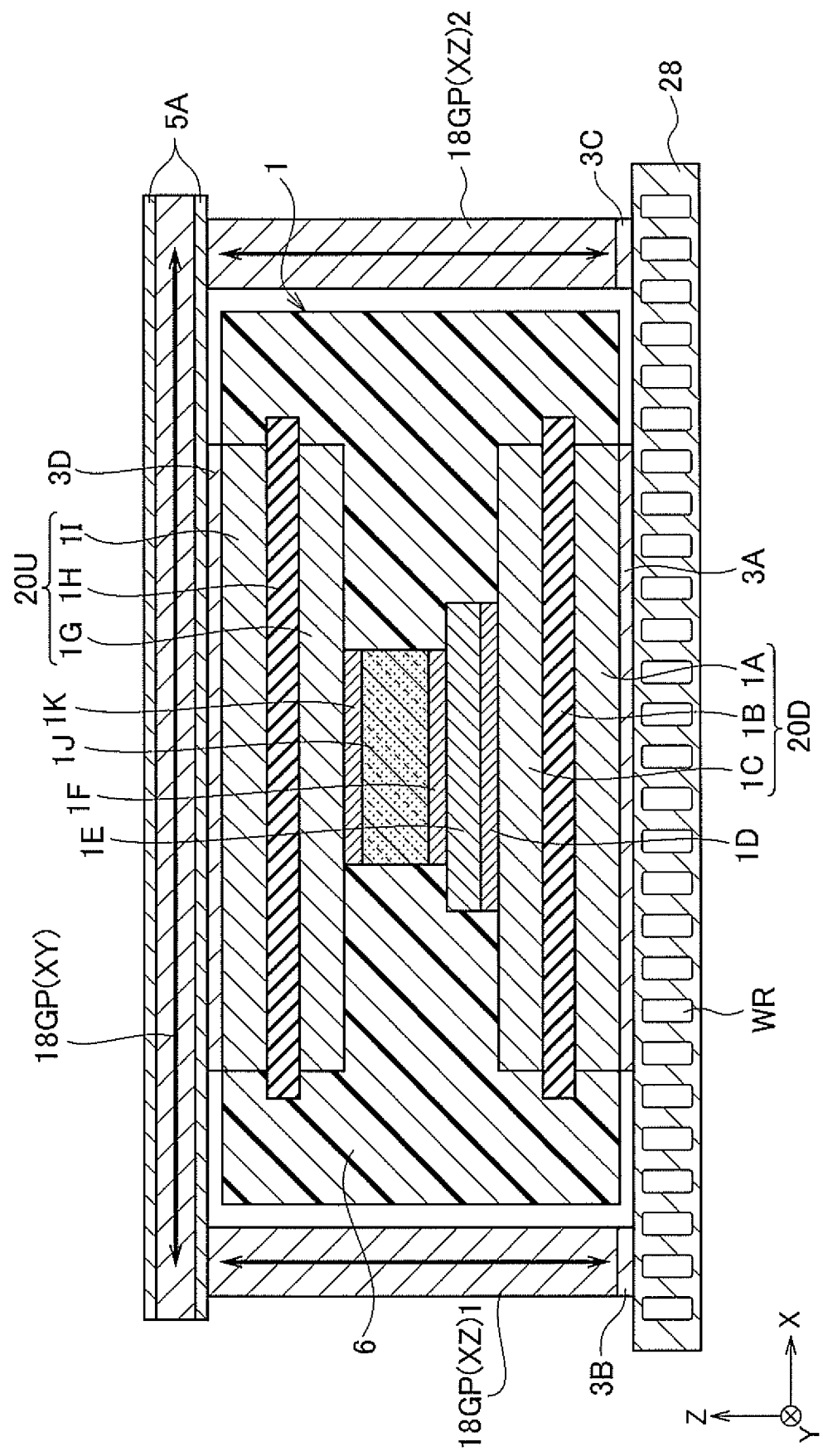
FIG. 54 is a detailed cross-sectional configuration diagram of another power module according to the seventh embodiment.

FIG. 54 shows a detailed cross-sectional structure of another power module according to the seventh embodiment. A different point from the power module shown in FIG. 53 is a point that a Cu layers 5A are respectively formed on both surfaces of the first graphite plate 18GP (XY). Other metals, ceramics, etc. can be adopted instead of the Cu, as already explained.

According to such a power module, Mises stress applied to the bonded portion can be reduced by matching it with the synthetic CTE of the power module 1. Naturally, also in such the power module, as explained using FIG. 49, the Cu layers 5B1 and 5C1 may be respectively formed on the side surfaces of the second graphite plates 18GP (XZ) 1 and 18GP (XZ) 2. Moreover, as explained using FIG. 52, the Cu layers 5B2 and 5C2 may be respectively formed on the upper surface and the lower surface of the second graphite plates 18GP (XZ)1 and 18GP (XZ)2.

Concrete Example of Semiconductor Device

FIG. 28 shows a schematic circuit representation of SiC MOSFET of 1-in-1 module 50 applicable as a semiconductor device, in the power module according to the seventh embodiment.

The diode DI connected to the MOSFET Q inversely in parallel is shown in FIG. 28. A main electrode of the MOSFET Q is expressed with a drain terminal DT and a source terminal ST. Moreover, an IGBT (not shown) of the 1-in-1 module 50 applicable as the semiconductor device, corresponding to the power module according to the seventh embodiment, can also be realized.

FIG. 29 shows a detailed circuit representation of SiC MOSFET of 1-in-1 module 50 applicable as a semiconductor device, in the power module according to the seventh embodiment.

In the power module according to the seventh embodiment, a plurality of semiconductor devices include a configuration of 1-in-1 module 50, for example. More specifically, a plurality of one kind of MOSFET Q chips are included therein so as to be connected to one module in parallel. As an example, five chips (MOSFET×5) can be mounted thereon, and a maximum of five pieces of the MOSFETs Q respectively can be connected to one another in parallel. Note that it is also possible to mount a part of five pieces of the chips for the diode DI thereon.

More particularly, as shown in FIG. 29, a sense MOSFET Qs is connected to the MOSFET Q in parallel. The sense MOSFET Qs is formed as a minuteness transistor in the same chip as the MOSFET Q.

In FIG. 29, reference numeral SS denotes a source sense terminal, reference numeral CS denotes a current sense terminal, and reference numeral G denotes a gate signal terminal. Note that, also in the semiconductor chip Q according to the seventh embodiment, the sense MOSFET Qs may be formed as a minuteness transistor in the same chip.

(Circuit Configuration)

Next, a circuit configuration example of the semiconductor device in the power module according to the seventh embodiment will now be more specifically explained.

There will now be explained a semiconductor package device (the so-called 2-in-1 type of module) in which two types of semiconductor devices Q1 and Q4 are sealed into one mold resin, as a module applicable as the semiconductor device of the power module according to the seventh embodiment.

FIG. 30 shows a circuit configuration of 2-in-1 module 130A to which the SiC MOSFET is applied as the semiconductor devices Q1 and Q4.

More specifically, as shown in FIG. 30, the 2-in-1 module 130A includes a configuration of a module with the built-in half-bridge included as one module so that two types of the SiC MOSFETs Q1 and Q4 are connected in series between the power terminals P and N for supplying power to each power device, a connecting point thereof is connected to the output terminal O, and the signals for controlling operation of each power device is connected to the signal unit terminals G1 and G2.

In this case, although the module can be considered as one large transistor, one or a plurality of transistor chip in which a plurality of transistor cells are connected in parallel into one chip can be connected in parallel. More specifically, although the modules include 1-in-1 module, 2-in-1 module, 4-in-1 module, 6-in-1 module, etc. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 30, the 2-in-1 module 130A includes two SiC MOSFETs Q1 and Q4, and diodes DI1 and DI4 connected in reversely parallel to the SiC MOSFETs Q1 and Q4, as one module.

In FIG. 30, reference numeral G1 denotes a lead terminal for gate signal of the SiC MOSFET Q1, and reference numeral S1 denotes a lead terminal for source signal of the SiC MOSFET Q1. Similarly, reference numeral G4 denotes a lead terminal for gate signal of the SiC MOSFET Q4, and reference numeral S4 denotes a lead terminal for source signal of the SiC MOSFET Q4.

Reference numeral P denotes a positive side power input terminal electrode, reference numeral N denotes a negative side power input terminal electrode, and reference numeral O denotes an output terminal electrode.

Moreover, a 2-in-1 module (not shown) to which the IGBT is applied as the semiconductor devices Q1 and Q4 can also be realized, as a module applicable as the semiconductor device of the power module according to the seventh embodiment.

Reference numeral P denotes a positive side power input terminal electrode, reference numeral N denotes a negative side power input terminal electrode, and reference numeral O denotes an output terminal electrode.

The semiconductor devices Q2 and Q5 and semiconductor devices Q3 and Q6 applicable to the power module according to the seventh embodiment can also be similarly realized.

(Device Structure)

FIG. 31 shows a schematic cross-sectional structure of an SiC MOSFET 130A including a source pad electrode SP and a gate pad electrode GP, which is an example of the semiconductor devices Q1 and Q4 applicable to the power module according to the seventh embodiment.

As shown in FIG. 31, the SiC MOSFET 130A includes: a semiconductor layer 31 composed by including an n− type high resistivity layer; a p body region 32 formed on a front surface side of the semiconductor layer 32; a source region 33 formed on a front side surface of the p body region 32; a gate insulating film 33 disposed on a front side surface of the semiconductor layer 31 between the p body regions 32S; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

The gate pad electrode GP is connected to the gate electrode 35 disposed on the gate insulating film 34, and the source pad electrode SP is connected to the source electrode 36 connected to the source region 33 and the p body region 32. Moreover, as shown in FIG. 31, the gate pad electrode GP and the source pad electrode SP are disposed on an interlayer insulating film 39 for passivation which covers the surface of the SiC MOSFET 130A.

In addition, a microstructural transistor structure (not shown) may be formed in the semiconductor layer 31 below the gate pad electrode GP and the source pad electrode SP.

Furthermore, as shown in FIG. 31, the source pad electrode SP may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 31, it may be composed by including a trench-gate type n channel vertical SiC Trench MOSFET (SiC TMOSFET) etc, as shown in FIG. 34 mentioned below.

Alternatively, a GaN-based FET etc. instead of the SiC-based MOSFET can also be adopted to the semiconductor device (Q1, Q4) which can be applied to the power module according to the seventh embodiment.

The semiconductor devices Q2 and Q5 and semiconductor devices Q3 and Q6 applicable to the power module according to the seventh embodiment can also be similarly realized.

Furthermore, a wide-bandgap type semiconductor of which the bandgap energy is from 1.1 eV to 8 eV, for example, can be used for the semiconductor devices Q1 to Q9 applicable to the power module according to the seventh embodiment.

Similarly, FIG. 32 shows a schematic cross-sectional structure of an IGBT 130B including an emitter pad electrode EP and a gate pad electrode GP, which is an example of the semiconductor devices Q1 and Q4 applicable to the power module according to the seventh embodiment.

As shown in FIG. 32, the IGBT 130B includes: a semiconductor layer 31 composed by including an n− type high resistivity layer; a p body region 32 formed on a front surface side of the semiconductor layer 32; an emitter region 33E formed on a front side surface of the p body region 32; a gate insulating film 33 disposed on a front surface of the semiconductor layer 31 between the p body regions 32S; a gate electrode 35 disposed on the gate insulating film 34; an emitter electrode 36E connected to the emitter region 33E and the p body region 32; a p+ collector region 37P disposed on a back side surface opposite to the surface of the semiconductor layer 31; and a collector electrode 38 connected to the p+ collector region 37P.

The gate pad electrode GP is connected to the gate electrode 35 disposed on the gate insulating film 34, and the emitter pad electrode EP is connected to the emitter electrode 36E connected to the emitter region 33E and the p body region 32. Moreover, as shown in FIG. 32, the gate pad electrode GP and the emitter pad electrode EP are disposed on an interlayer insulating film 39 for passivation which covers the surface of IDBT 130B.

In addition, a microstructural IGBT structure (not shown) may be formed in the semiconductor layer 31 below the gate pad electrode GP and the emitter pad electrode EP.

Furthermore, as shown in FIG. 32, the emitter pad electrode EP may be disposed to be extended onto the interlayer insulating film 39 for passivation, also in the IGBT structure of the center portion.

In FIG. 32, although the IGBT 130B is composed by including a planar-gate-type n channel vertical IGBT, the IGBT 130B may be composed by including a trench-gate-type n channel vertical IGBT, etc.

The semiconductor devices Q2 and Q5 and semiconductor devices Q3 and Q6 applicable to the power module according to the seventh embodiment can also be similarly realized.

SiC based power devices, e.g. SiC DIMOSFET and SiC TMOSFET, or GaN based power devices, e.g. GaN based High Electron Mobility Transistor (HEMT), are applicable as the semiconductor devices Q1 to Q6. In some instances, power devices, e.g. Si based MOSFETs and IGBT, are also applicable thereto.

—SiC DIMOSFET—

FIG. 33 shows a schematic cross-sectional structure of an SiC DIMOSFET 130D, which is an example of a semiconductor device which can be applied to the power module according to the seventh embodiment.

As shown in FIG. 33, the SiC DIMOSFET 130D includes: a semiconductor layer 31 composed by including an n− type high resistivity layer; a p body region 32 formed on a front surface side of the semiconductor layer 32; an n+ source region 33 formed on a front side surface of the p body region 32; a gate insulating film 33 disposed on a front side surface of the semiconductor layer 31 between the p body regions 32S; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

In the SiC DIMOSFET 130D shown in FIG. 33, the p body region 32 and the n+ source region 33 formed on the front side surface of the p body region 32 are formed with double ion implantation (DII), and the source pad electrode SP is connected to the source region 33 and the source electrode 36 connected to the p body region 32.

Moreover, a gate pad electrode GP (not shown) is connected to the gate electrode 35 disposed on the gate insulating film 34. Moreover, as shown in FIG. 33, the gate pad electrode GP and the source pad electrode SP are disposed on an interlayer insulating film 39 for passivation which covers the surface of the SiC DIMOSFET 130D.

As shown in FIG. 33, in the SiC DIMOSFET, since a depletion layer as shown with the dashed lines is formed in the semiconductor layer 31 composed of a n− type high resistivity layer inserted into the p body regions 32, channel resistance $R_{JFET}$ accompanying the junction type FET (JFET) effect is formed. Moreover, as shown in FIG. 32, body diodes BD are respectively formed between the p body regions 32 and the semiconductor layers 31.

—SiC TMOSFET—

FIG. 34 shows a schematic cross-sectional structure of an SiC TMOSFET, which is an example of a semiconductor device which can be applied to the power module according to the seventh embodiment.

As shown in FIG. 34, the SiC TMOSFET 130C includes: a semiconductor layer 31 composed by including an n layer; a p body region 32 formed on a front surface side of the semiconductor layer 31N; an n+ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n+ drain region 37 disposed on aback side surface opposite to the surface of the semiconductor layer 31N; and a drain electrode 38 connected to the n+ type drain area 37.

In FIG. 34, a trench gate electrode 35TG passing through the p body region 32 is formed in the trench formed up to the semiconductor layer 31N via the gate insulating film 34 and the interlayer insulating films 39U and 39B; and the source pad electrode SP is connected to the source region 33 and the source electrode 36 connected to the p body region 32.

Moreover, a gate pad electrode GP (not shown) is connected to the trench gate electrode 35TG disposed on the gate insulating film 34. Moreover, as shown in FIG. 34, the gate pad electrode GP and the source pad electrode SP are disposed on an interlayer insulating film 39U for passivation which covers the surface of the SiC TMOSFET 130C.

In the SiC TMOSFET 130C, channel resistance $R_{JFET}$ accompanying the junction type FET (JFET) effect as the SiC DIMOSFET 130D is not formed. Moreover, body diodes BD are respectively formed between the p body regions 32 and the semiconductor layers 31N, in the same manner as FIG. 33.

(Example of Application)

FIG. 35 shows an example of a circuit configuration in which the SiC MOSFET is applied as a semiconductor device, and a snubber capacitor C is connected between the power terminal PL and the earth terminal (ground terminal) NL, in a three-phase AC inverter 40A composed using the power module according to the seventh embodiment.

Similarly, a three-phase AC inverter (not shown) in which a snubber capacitor C is connected between the power terminal PL and the earth terminal (ground terminal) NL can also be realized by applying the IGBT as the semiconductor device.

When connecting the mower module to the power source E to execute switching operations, large surge voltage Ldi/dt is produced by an inductance L included in a connection line due to a high switching speed of the SiC MOSFET and IGBT. For example, the surge voltage Ldi/dt is expressed as follows: Ldi/dt=3×10$^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

(Concrete Example)

Next, there will now be explained the three-phase AC inverter 42A composed using the power module according to the seventh embodiment to which the SiC MOSFET is applied as the semiconductor device, with reference to FIG. 36.

As shown in FIG. 36, the three-phase AC inverter 42A includes: a power module unit 130 connected to a gate driver (GD) 180; a three-phase AC motor unit 51; a power supply or storage battery (E) 53; and a converter 55. U-phase, V-phase, and W-phase inverters are respectively connected to the three-phase AC motor unit 54 so as to correspond to U phase, V phase, and W phase of the three-phase AC motor unit 51, in the power module unit 130.

In this case, the GD 180 is connected to SiC MOSFETs Q1 and Q4, SiC MOSFETs Q2 and Q5, and SiC MOSFETs Q3 and Q6.

The power module unit 130 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. Moreover, flywheel diodes DI1 to DI6 are respectively connected reversely in parallel between the source and the drain of the SiC MOSFETs Q1 to Q6.

Although not shown, a three-phase AC inverter composed by using the power module according to the seventh embodiment can also be realized by applying the IGBT as the semiconductor device.

As mentioned above, according to the seventh embodiment, there can be provided: an inexpensive power module having cooling performance near the cooling performance of double-sided cooling system which can be exhibited even by one cooling apparatus; and a graphite plate used therefor.

In the power module according to the seventh embodiment, molded-type power modules, e.g. a four terminal electrodes structure, can also be adopted, as a module applicable as the semiconductor device, for example.

As the semiconductor device applicable to the power module according to the seventh embodiment, not only SiC based power devices but also wide-bandgap type power devices, e.g. GaN-based or Si-based power device, can be adopted.

Moreover, it can be applied to not only molded-type power modules by which resin molding is performed but also power modules packaged with case type packages.

Basic Technology in Eighth to Fourteenth Embodiments

Before explaining power modules according to the eighth to fourteenth embodiments, a basic technology used as a basis will now be briefly explained. Herein, a case of applying an SiC MOSFET will now be explained as an example as a semiconductor device (power device) for power elements.

Figure 55:
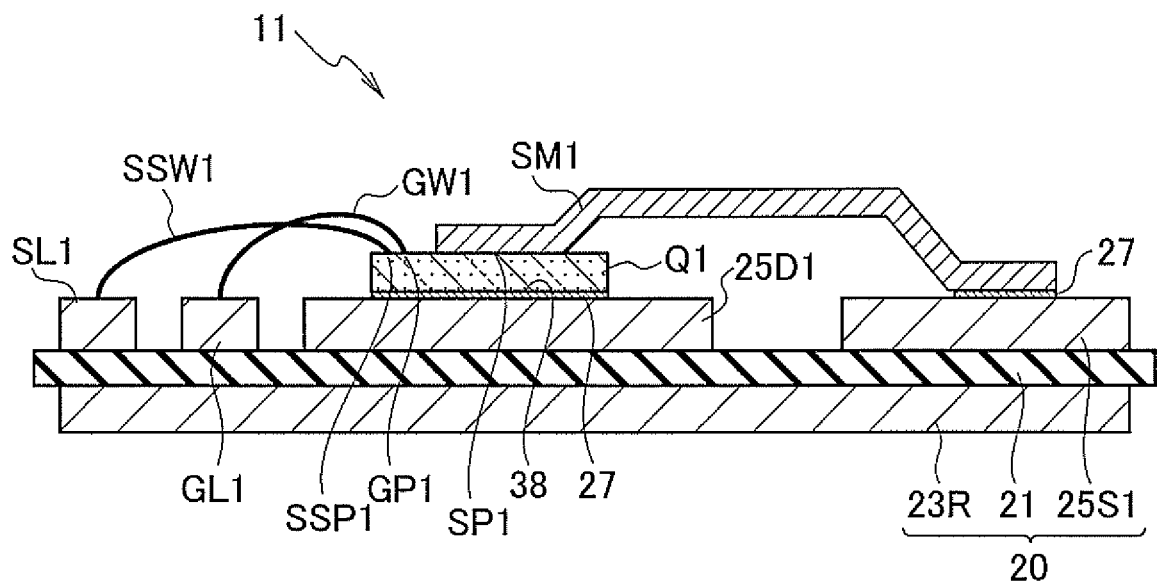
FIG. 55 is a schematic cross-sectional structure diagram of a 1-in-1 module to which an SiC MOSFET is applied as a semiconductor device, in a power module according to a basic technology used as a basis of eighth to fourteenth embodiments.
Figure 56:
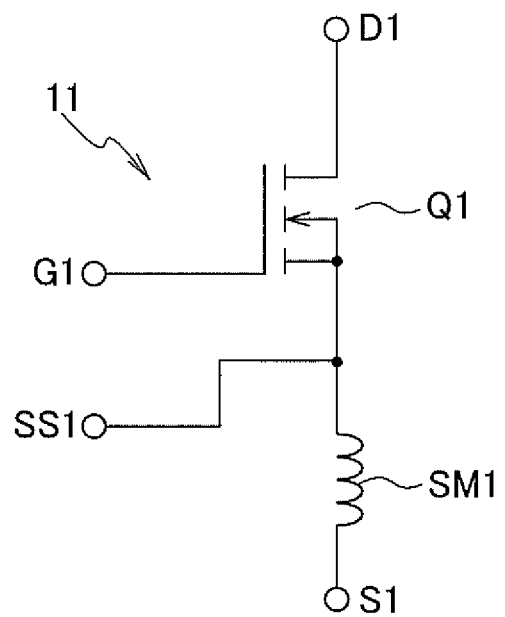
FIG. 56 is a schematic circuit representative diagram of the 1-in-1 module to which an SiC MOSFET is applied as the semiconductor device, in the power module according to a basic technology used as the basis of the eighth to fourteenth embodiments.

FIG. 55 shows a schematic cross-sectional structure of 1-in-1 module in which an SiC MOSFET Q1 is applied to the semiconductor device, in the PM 11 according to the basic technology used as a basis of the power module (PM) 11 according to the eighth to fourteenth embodiments. FIG. 56 shows a schematic circuit configuration of the PM 11.

Figure 57A:
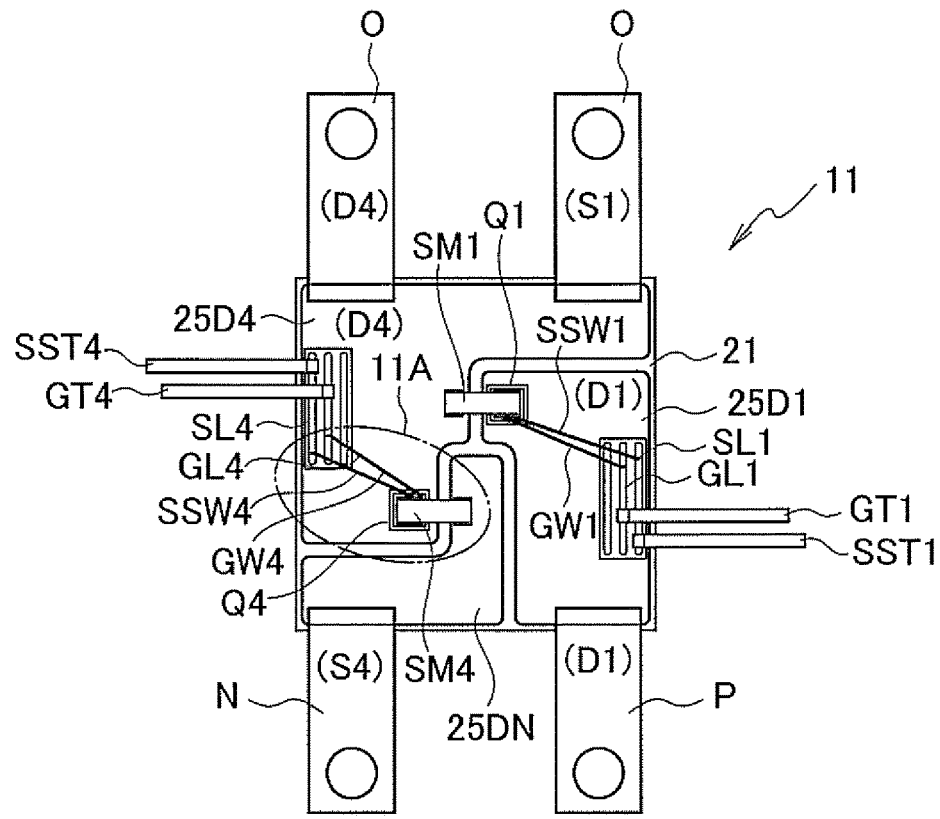
FIG. 57A is a schematic cross-sectional structure diagram of a 2-in-1 module to which an SiC MOSFET is applied as a semiconductor device, in the power module according to the basic technology used as the basis of the eighth to fourteenth embodiments.
Figure 57B:
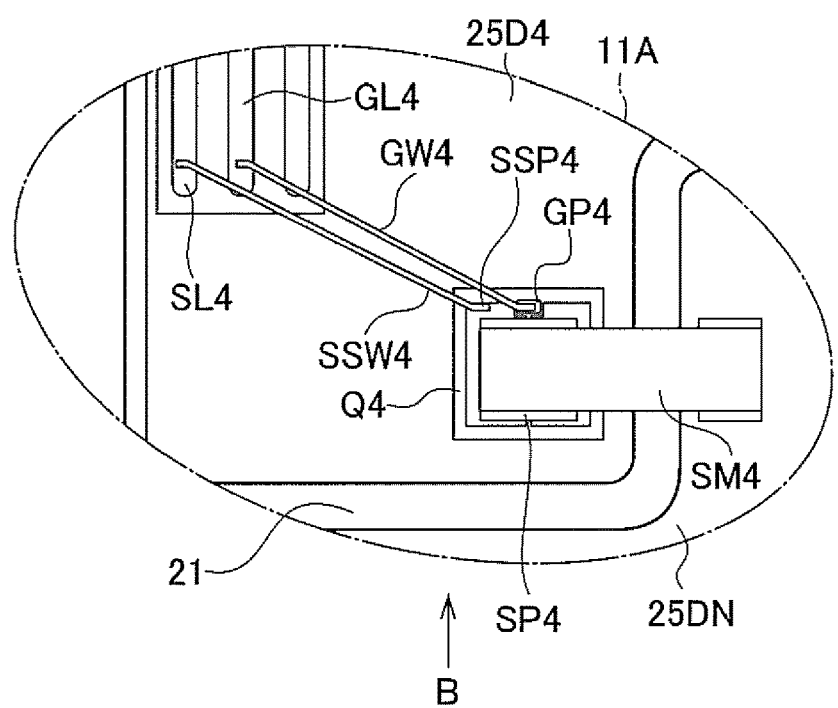
FIG. 57B is an enlarged view showing an enlarged principal portion (11A portion) of FIG. 57A of the 2-in-1 module to which the SiC MOSFET is applied to the semiconductor device, in the power module according to the basic technology used as the basis of the eighth to fourteenth embodiments.

FIG. 57A shows a schematic planar pattern configuration of a 2-in-1 module to which an SiC MOSFETs Q1 and Q4 are applied as the semiconductor device, in the PM 11 according to the basic technology of the eighth to fourteenth embodiments. FIG. 57B shows an enlarging configuration of the portion 11A (principal portion) of FIG. 57A.

Since the fundamental configuration of the 2-in-1 module and the fundamental configuration of the 1-in-1 module are substantially similar to each other, the 1-in-1 module shown in FIG. 55 will now be specifically explained, and the 2 in 1 module will be simply explained.

As shown in FIG. 55, the 1-in-1 module type PM 11 according to basic technology includes an insulating substrate 20, the insulating substrate 20 including: a ceramics substrate 21; a drain electrode pattern 25D1 and a source electrode pattern 25S1, and a source signal electrode pattern SL1 and a gate signal electrode pattern GL1, each disposed on an upper surface side of the ceramics substrate 21; and a back electrode pattern 23R disposed on a lower surface side of the ceramics substrate 21.

In FIG. 55, an upper side of an insulating substrate 20 is defined as a U (UP) side, and a lower side of the insulating substrate 20 is defined as a D (DOWN) side, herein. This definition is also applied to all of the drawings shown hereinafter.

The 1-in-1 module type PM 11 includes the SiC MOSFET Q1 disposed in a face up on the drain electrode pattern 25D1, as the semiconductor device, as shown in FIG. 55. The SiC MOSFET Q1 includes a source pad electrode SP1, a source sense pad electrode SSP1, and a gate pad electrode GP1 on a front surface side thereof, and includes a drain electrode 38 on a back surface side thereof.

As shown in FIG. 55, the 1-in-1 module type PM 11 includes a leadframe SM1 connected between the source pad electrode SP1 and the source electrode pattern 25S1 of the SiC MOSFET Q1, the leadframe SM1 is a main wiring for source power line wiring.

As shown in FIG. 55, the 1-in-1 module type PM 11 includes: a bonding wire SSW1 for source sense configured to connect the source sense pad electrode SSP1 to the source signal electrode pattern SL1; and a bonding wire GW1 for gate signal configured to connect the gate pad electrode GP1 to the gate signal electrode pattern GL1.

In the 1-in-1 module type PM 11, a position of a wire bonding portion on the SiC MOSFET Q1 of the bonding wire SSW1 for source sense to be connected to the source signal electrode pattern SL1 is a position on the source sense pad electrode SSP1 of the SiC MOSFET Q1. More specifically, in the PM 11 according to the basic technology, as shown in FIG. 56, the bonding wire SSW1 for source sense is connected inside the leadframe SM1 nearer to the SiC MOSFET Q1.

Accordingly, in the PM 11 to which the SiC MOSFET Q1 is applied as the semiconductor device, for example, a temperature of the source sense pad electrode SSP1 is greatly increased due to an influence of thermal stress by operations of SiC MOSFET Q1 leading to high temperatures, and therefore connectivity of the bonding wire SSW1 for source sense is degraded due to a stress concentration to the bonding interface between the source sense pad electrode SSP1 and the bonding wire SSW1 for source sense, a local change of grain diameter in the bonding wire SSW1 for source sense, etc.

In the case of the bonding wire GW1 for gate signal, such degradation can be suppressed, since there is no cell of the MOSFET structure fundamentally directly under the gate pad electrode GP1 to be bonded and the increase in temperature therein is not larger than that of the source sense pad electrode SSP1.

Similarly, also in the case of the 2-in-1 module type PM 11 according to the basic technology, as shown in FIGS. 57A and 57B, positions of wire bonding portions on the SiC MOSFETs Q1 and Q4 of the bonding wires SSW1 and SSW4 for source sense to be connected to the source signal electrode patterns SL1 and SL4 are respectively a position on the source sense pad electrode SSP1 of the SiC MOSFET Q1 and a position on the source sense pad electrode SSP4 of the SiC MOSFET Q4. Accordingly, the problem is degradation of the connectivity of the bonding wires SSW1 and SSW4 for source sense.

Thus, for the PM 11 in which the SiC MOSFET Q which performs a high temperature operation is mounted as the semiconductor device, the problem is degradation of the connectivity of the bonding wire SSW for source sense.

Eighth Embodiment

Figure 58A:
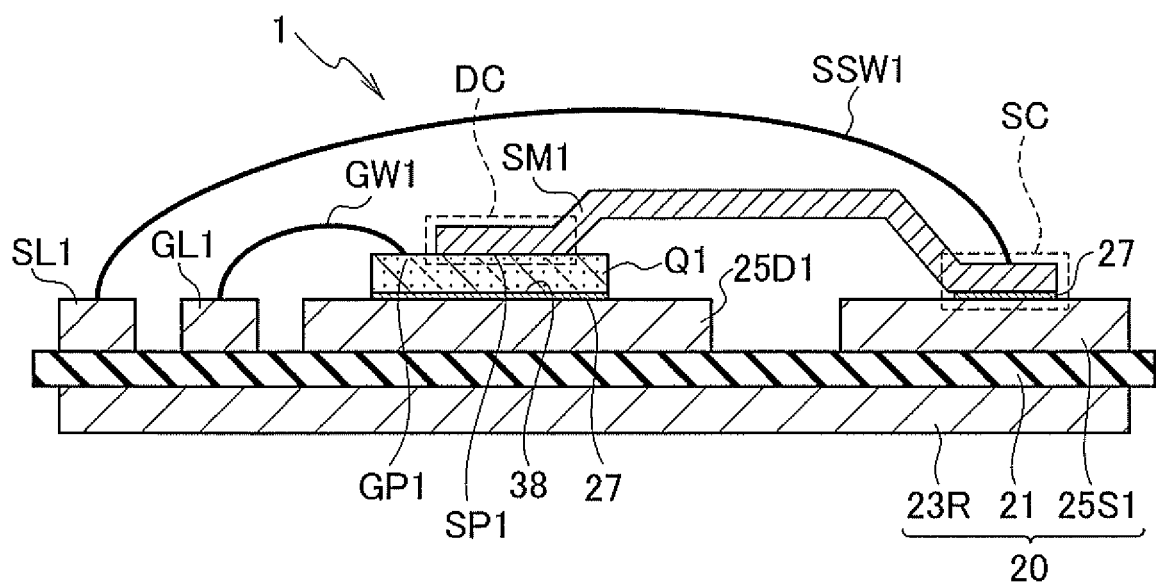
FIG. 58A is a schematic cross-sectional structure diagram of a 1-in-1 module to which an SiC MOSFET is applied as a semiconductor device, in a power module according to the eighth embodiment.
Figure 58B:
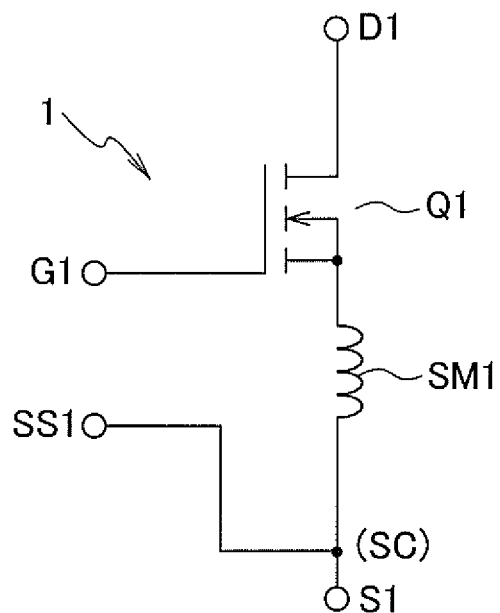
FIG. 58B is a schematic circuit representative diagram of the 1-in-1 module to which the SiC MOSFET is applied as the semiconductor device, in the power module according to the eighth embodiment.
Figure 59:
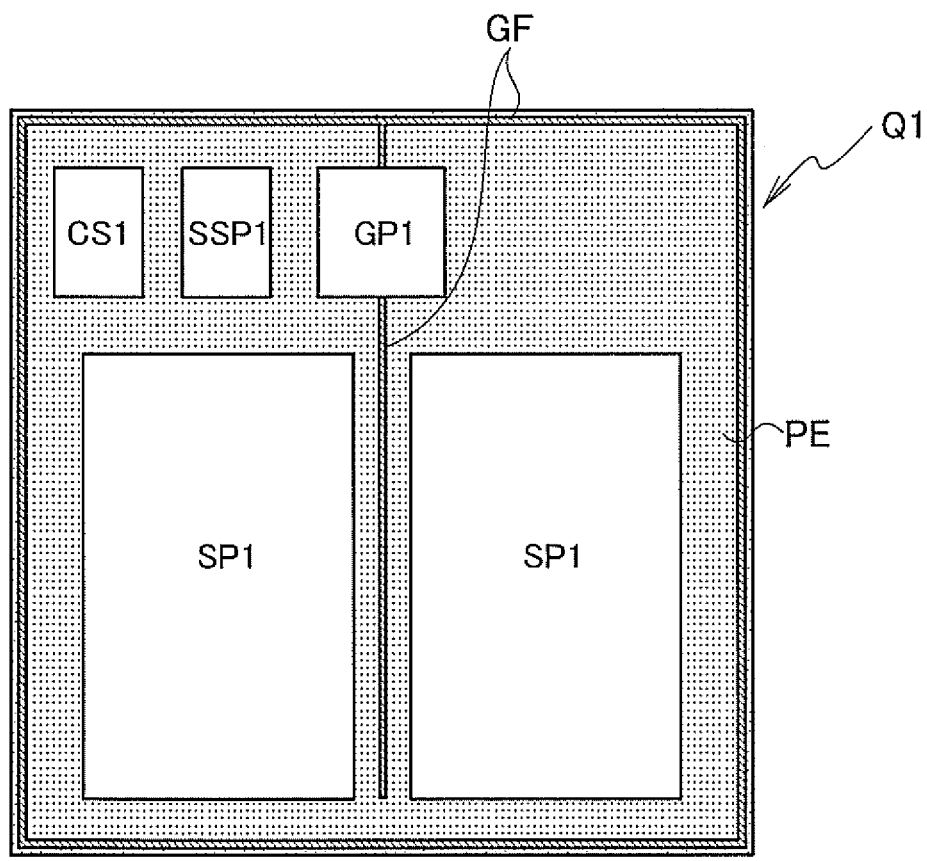
FIG. 59 is a schematic planar pattern configuration diagram of a semiconductor device applicable to the power module according to the eighth embodiment.

FIG. 58A shows a schematic cross-sectional structure of a PM 1 according to the eighth embodiment, and FIG. 58B shows a schematic circuit configuration of the PM 1. FIG. 59 shows a schematic planar pattern configuration of a semiconductor device applicable to the PM 1 according to the eighth embodiment.

Herein, a case of applying an SiC MOSFET Q1 will now be explained as an example as a semiconductor device (power device) for power elements.

As shown in FIGS. 58A and 58B, the PM 1 according to the eighth embodiment includes an insulating substrate 20, the insulating substrate 20 including: an SiN-based ceramics substrate 21; a drain electrode pattern (second main electrode pattern) 25D1 and a source electrode pattern (first main electrode pattern) 25S1, and a source signal electrode pattern (signal wiring pattern) SL1 and a gate signal electrode pattern (control signal wiring pattern) GL1, e.g. Cu foil, each formed on an upper surface (U) side of the ceramics substrate 21; and aback electrode patterns 23R, e.g. Cu foil, formed on a lower surface (D) side of the ceramics substrate 21.

In this case, as shown in FIG. 58B, the source sense terminal SS1 (SST1) is connected to the source signal electrode pattern SL1, and the gate terminal G1 (GT1) is connected to the gate signal electrode pattern GL1.

Moreover, the PM 1 according to the eighth embodiment includes the SiC MOSFET Q1 disposed on the drain electrode pattern 25D1 as a semiconductor device. As shown, for example in FIG. 59, the SiC MOSFET Q1 includes: two source pad electrodes (main pad electrode) SP1, one gate pad electrode (control pad electrode) GP1, one current sense pad electrode CS1, and one source sense pad electrode SSP1 on a front side surface of the SiC MOSFET Q1. The gate finger electrodes GF are disposed at a peripheral portion and a center portion.

A surface protection film PE formed by including a polyimide resin etc. is disposed on a front side surface of the SiC MOSFET Q1, except for front side surfaces of the source pad electrode SP1, the gate pad electrode GP1, the current sense pad electrode CS1, and the source sense pad electrode SSP1.

Although illustration is omitted in FIG. 59, a drain electrode (main electrode) 38 is disposed on a back surface side opposite to the front surface side of the SiC MOSFET Q1.

As other configuration examples, two source pad electrode SP1 may not always be required, and a configuration of including one source pad electrode SP1 can be adopted. Moreover, the source sense pad electrode SSP1 can be omitted.

The SiC MOSFET Q1 is implemented in a face up on the insulating substrate 20 by bonding the drain electrode 38 to the drain electrode pattern 25D1 using bonding members 27, e.g. an Ag firing body or solder, as shown in FIG. 58A.

As shown in FIG. 55, the PM 11 according to the eighth embodiment includes a leadframe SM1 connected between the source pad electrode SP1 and the source electrode pattern 25S1 of the SiC MOSFET Q1, the leadframe SM1 is a main wiring for source power line wiring. The leadframe SM1 includes a parasitic inductance Lsm and a parasitic resistance Rsm.

The leadframe SM1 includes any one of Cu, Al, cladding materials (e.g., a layered structure of Cu/invar/Cu), or CuMo.

A bonding member 27 is used for a connection between the source electrode pattern 25S1 and the leadframe SM1, and a connection between the source pad electrode SP1 and the leadframe SM1.

In the following explanation, a bonded portion between the source pad electrode SP1 and the leadframe SM1 is referred to as a device-side bonded portion (first bonded portion) DC, and a bonded portion between the leadframe SM1 and the source electrode pattern 25S1 is referred to as a land-side bonded portion (second bonded portion) SC. The land-side bonded portion (second bonded portion) SC is separated from the device-side bonded portion DC, and a temperature of the land-side bonded portion SC is relatively low since an influence of heat generated is smaller than that of the device-side bonded portion DC.

As shown in FIG. 58A, in the case of the PM 1 according to the eighth embodiment, the drain electrode pattern 25D1 is positioned between the source electrode pattern 25S1 and the source signal electrode pattern SL1, and the device-side bonded portion DC is disposed so as to be adjacent to the source signal electrode pattern SL1 rather than the land-side bonded portion SC.

The PM 1 according to the eighth embodiment includes: bonding wire (first bonding wire) SSW1 for source sense configured to connect the leadframe SM1 to the source signal electrode pattern SL1 at the land-side bonded portion SC side; and bonding wire (second bonding wire) GW1 for gate signal configured to connect the gate pad electrode GP1 to the gate signal electrode pattern GL1 at the device-side bonded portion DC side.

More specifically, in the PM 1 according to the eighth embodiment, as shown in FIG. 58B, the bonding wire SSW1 for source sense is connected to the land-side bonded portion SC side which is farer away from the SiC MOSFET Q1 (outside observing from the SiC MOSFET Q1 of the leadframe SM1).

The bonding wire SSW1 for source sense and the bonding wire GW1 for gate signal include Al, Cu, a cladding material, or an alloy of at least one of these substances.

The bonding wire SSW1 for source sense of which the wire diameter φ is approximately 150 μm is subjected to wedge bonding, and the bonding wire GW1 for gate signal of which the wire diameter φ is approximately 150 μm is subjected to wedge bonding.

Moreover, the PM 1 according to the eighth embodiment becomes a molded-package type power module by wholly sealing the perimeter of the SiC MOSFET Q1 with a mold resin (resin molding), or a case-shaped package type power module by being contained in a case.

Although the bonding wire SSW1 for source sense is connected to the leadframe SM1 at the land-side bonded portion SC side in the above-mentioned PM 1 according to the eighth embodiment, the bonding wire SSW1 for source sense may be connected to the source electrode pattern 25S1 (similarly also in other embodiments mentioned below).

More specifically, the PM 1 according to the eighth embodiment includes: a ceramics substrate 21 including a source electrode pattern 25S1 and a source signal electrode pattern SL1; an SiC MOSFET Q1 including a source pad electrode SP1 on a front side surface thereof, the SiC MOSFET Q1 disposed on the ceramics substrate 21; a leadframe SM1 connected between the source pad electrode SP1 and the source electrode pattern 25S1; a land-side bonded portion SC between the leadframe SM1 and the source electrode pattern 25S1, the land-side bonded portion SC being separated from the device-side bonded portion DC between the leadframe SM1 and the source pad electrode SP1; and a bonding wire SSW1 for source sense connected between the land-side bonded portion SC and the source signal electrode pattern SL1, wherein the land-side bonded portion SC has a temperature relatively lower than a temperature of the device-side bonded portion DC during semiconductor device operations.

Moreover, the PM 1 according to the eighth embodiment includes: an insulating substrate 20 including an insulative ceramics substrate 21, the insulating substrate 20 further including a source electrode pattern 25S1, a drain electrode pattern 25D1, a source signal electrode pattern SL1 and a gate signal electrode pattern GL1 disposed on the ceramics substrate 21; an SiC MOSFET Q1 including a source pad electrode SP1 and a gate pad electrode GP1 on a front surface side thereof and a drain electrode 38 on a back surface side thereof, the SiC MOSFET Q1 disposed in a face up on the drain electrode pattern 25D1; a leadframe SM1 connected between the source pad electrode SP1 and the source electrode pattern 25S1; a land-side bonded portion SC between the leadframe SM1 and the source electrode pattern 25S1, the land-side bonded portion SC being separated from the device-side bonded portion DC between the leadframe SM1 and the source pad electrode SP1, the land-side bonded portion SC having a temperature relatively lower than a temperature of the device-side bonded portion DC during semiconductor device operations; a bonding wire SSW1 for source sense connected between the land-side bonded portion SC and the source signal electrode pattern SL1; and a bonding wire GW1 for gate signal connected between the gate pad electrode GP1 and the gate signal electrode pattern GL1, wherein one end of the bonding wire SSW1 for source sense is connected to the source signal electrode pattern SL1 and the other end is connected to the leadframe SM1 of the land-side bonded portion SC or the source electrode pattern 25S1.

Although Active Metal Brazed, Active Metal Bond (AMB) substrates can be applied to the insulating substrate 20, for example, Direct Bonding Copper (DBC) substrates or Direct Brazed Aluminum (DBA) substrates can also be applied to the insulating substrate 20, for example.

Moreover, a heat radiator (not shown), e.g. a heat sink or a cooling apparatus, may be disposed on the back electrode pattern 23R of the insulating substrate 20, in order to improve the cooling effect.

(Fabrication Method)

For example, a fabrication method of the PM 1 according to the eighth embodiment includes: disposing an SiC MOSFET Q1 in a face up on a drain electrode pattern 25D1 of an insulating substrate 20, the insulating substrate 20 including an insulative ceramics substrate 21, the insulating substrate 20 further including a source electrode pattern 25S1, a drain electrode pattern 25D1, a source signal electrode pattern SL1 and a gate signal electrode pattern GL1 disposed on the ceramics substrate 21, the SiC MOSFET Q1 including a source pad electrode SP1 and a gate pad electrode GP1 on a front surface side thereof and a drain electrode 38 on a back surface side thereof; connecting a leadframe SM1 between the source pad electrode SP1 and the source electrode pattern 25S1; connecting a bonding wire SSW1 for source sense between a land-side bonded portion SC and the source signal electrode pattern SL1, the land-side bonded portion SC between the leadframe SM1 and the source electrode pattern 25S1 being separated from the device-side bonded portion DC between the leadframe SM1 and the source pad electrode SP1, the land-side bonded portion SC having a temperature relatively lower than a temperature of the device-side bonded portion DC; and connecting a bonding wire GW1 for gate signal between the gate pad electrode GP1 and the gate signal electrode pattern GL1.

—Explanation of Function of Source Sense Terminal in the Light of Switching Power Loss—

A switching power loss due to a parasitic inductance of the leadframe SM will now be explained, as an example of the SiC power module to which the SiC MOSFET is applied as the semiconductor device, in the PM 1 according to the eighth embodiment.

Figure 60A:
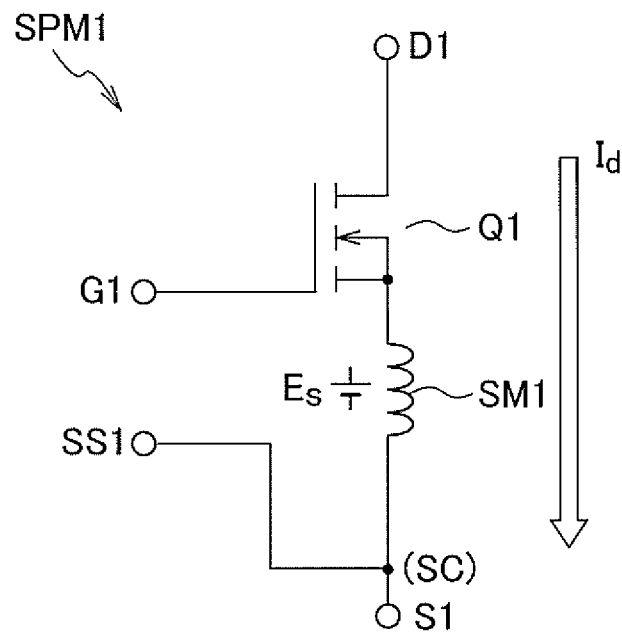
FIG. 60A is a schematic circuit diagram for explaining a switching power loss due to a parasitic inductance during turn-on in an example of the 1-in-1 module to which the SiC MOSFET is applied as the semiconductor device, in the power module according to the eighth embodiment.
Figure 60B:
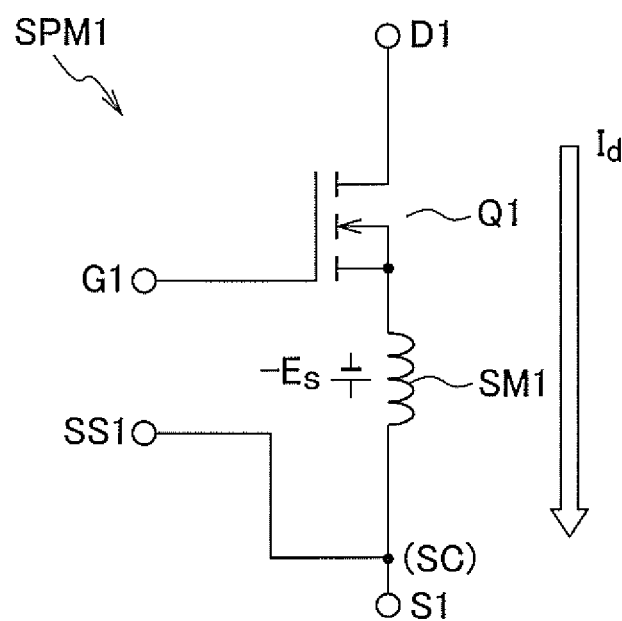
FIG. 60B is a schematic circuit diagram for explaining a switching power loss due to a parasitic inductance during turn-off in an example of the 1-in-1 module to which the SiC MOSFET is applied as the semiconductor device, in the power module according to the eighth embodiment.

As shown in FIGS. 60A and 60B, in the SiC power module SPM1 to which the SiC MOSFET Q1 is applied as the semiconductor device, only $-L_{sm} \cdot d(I_d)/dt$ is electrified due to a parasitic inductance Lsm of the leadframe SM1 with respect to an electric current Id which flows between a drain (D1) and a source (S1) of the SiC MOSFET Q1. In addition, an electromotive voltage Es of a gate (G1) is assumed to be $L_g \cdot (di/dt)$, for example, where di is a current variation accompanied with switching and dt is a time variation accompanied with switching.

Then, when rising of the electric current during turn-on, as shown in FIG. 60A, the electromotive voltage Es is generated in a direction for suppressing an increase in a voltage applied to the parasitic capacitance between the gate (G1) and the source (S1). Accordingly, a storage time until reaching to the applied voltage of the parasitic capacitance between the gate and the source required for flowing a load current is long, and it leads to prolonged period of time of switching, and increase of the switching power loss, as a result.

On the other hand, when rising of the electric current during turn-off, as shown in FIG. 60B, the electromotive voltage Es is generated in a direction for suppressing a decrease in the voltage applied to the parasitic capacitance between the gate (G1) and the source (S1). Accordingly, a discharging time until it is lower than a gate threshold voltage is long, and it leads to prolonged period of time of the switching, and increase of the switching power loss, as a result.

On the other hand, since a conduction power loss is principal in a loss of a three-phase bridge circuit (module) in motor driving, an influence on an increase in a loss of the whole due to a change of a position of the wire bonding portion of the bonding wire SSW1 for source sense toward the side of the land-side bonded portion SC is small, and therefore a merit of realizing of higher heat resistance of a wire connection and securing of reliability with respect to high temperature operations is obtained without large trade-off.

In particular, in a motor for driving at low frequency of approximately 5 kHz to approximately 10 kHz that does not require high-speed switching operations (high frequency driving) and an SiC power module SPM1 to be used for inverters (it can be operated also at high temperatures), influence on the loss to be generated by increasing the inductance due to the change of the position of the wire bonding portion is small.

Thus, by applying the leadframe SM1 (which is not a thin wire) to the main wiring for source power line wiring, the parasitic inductance (Ls) is reduced and an area (device-side bonded portion DC) becoming high temperatures by heat generated by flowing a concentrated large current can be avoided. Moreover, by connecting the bonding wire SSW1 for source sense to the land-side bonded portion SC side in which an influence of heat generated is smaller and the temperature is relatively lower than that of the device-side bonded portion DC, the increase in the switching power loss due to the parasitic inductance Ls can be suppressed, and thereby it can be introduced without a large trade-off.

More specifically, for such an SiC power module SPM1 used for inverters which easily lead to high temperatures, it is effective to bond the bonding wire SSW1 for source sense required for signal sensing to the side of the land-side bonded portion SC which does not lead to high temperatures compared with the device-side bonded portion DC even when operating the SiC power module SPM1.

The change of the position of the wire bonding portion of the bonding wire SSW1 for source sense to the land-side bonded portion SC is applicable to both of the case and molding type modules.

Accordingly, even if the temperature of the source pad electrode SP1 becomes the same degree as a junction temperature due to a large current flowing into the SiC MOSFET Q1, it can avoid a rupture of the wire SSW1 in a case type module with which the wire diameter is easily coarsened, and a rupture in the contact surface (interface) of the wire SSW1 due to a thermal stress in a mold type module.

As described above, according to the PM 1 according to the eighth embodiment, by applying the leadframe SM1 to the main wiring for source power line wiring, and bonding the bonding wire SSW1 for source sense to the side of the land-side bonded portion SC which does not lead to high temperatures compared with the device-side bonded portion DC during the operation of the SiC MOSFET Q1, an influence of thermal stress to the wire connection due to operations leading to high temperatures can be reduced, and thereby improving higher heat resistance and reliability with respect to the wire connection characteristics.

SiC-based power devices, e.g. SiC DI MOSFET or SiC T MOSFET, or GaN-based power devices, e.g. GaN-based High Electron Mobility Transistor (HEMT), can be applied to the SiC MOSFET Q1. In some instances, power devices, e.g. Si-based MOSFETs or SiC-based IGBT, can be applied to the SiC MOSFET Q1.

As the SiC MOSFET Q1, a configuration of connecting a plurality of chips in parallel may be used instead of the one chip (Device) configuration.

If the configuration of the SiC MOSFET Q1 is a configuration of connecting a plurality of chips in parallel, the leadframe SM1, the bonding wire SSW1 for source sense, etc. are commonly connected to the plurality of the chips.

Ninth Embodiment

Figure 61:
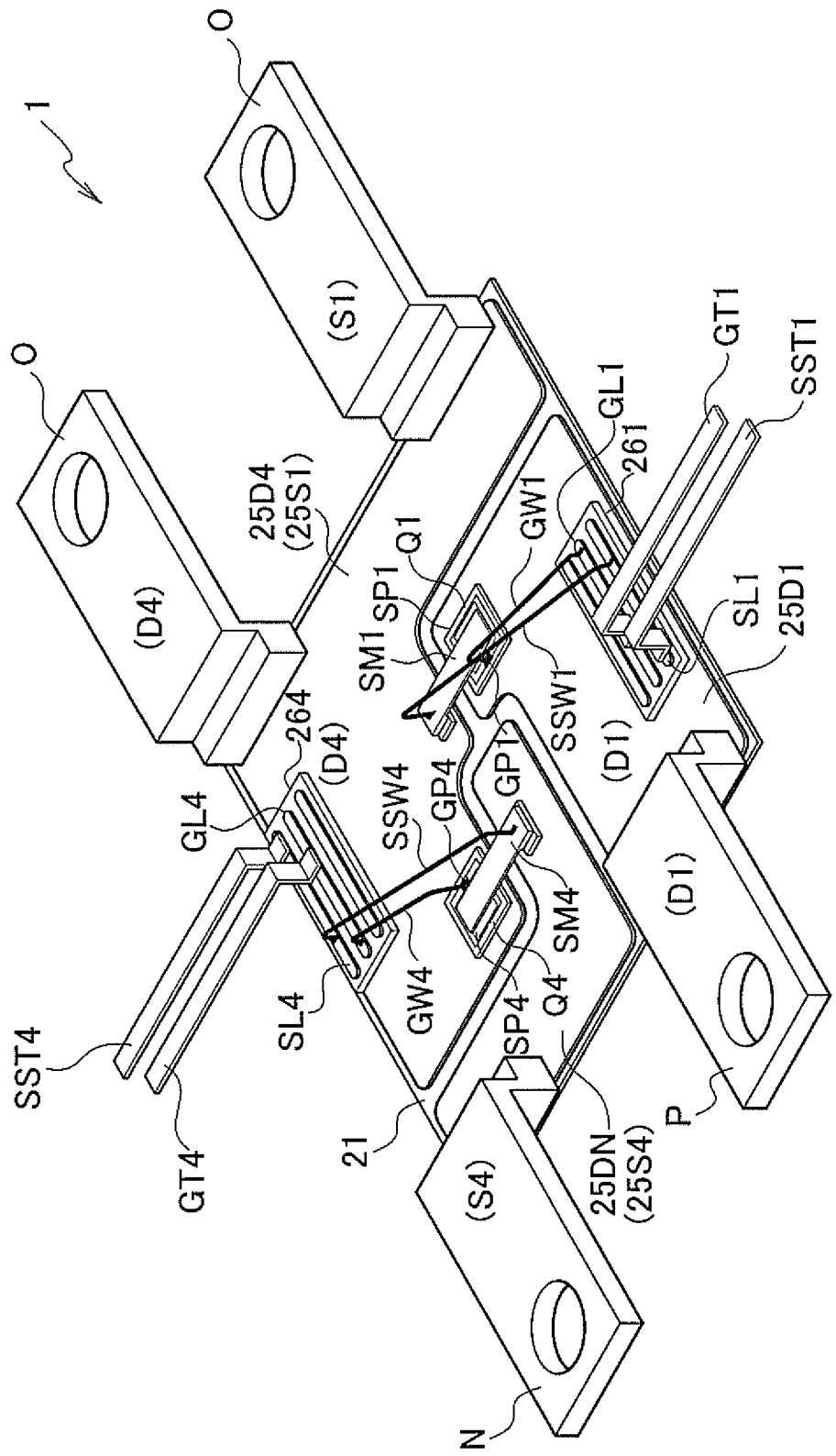
FIG. 61 is a schematic bird's-eye view pattern configuration diagram of a 2 in 1 module (module with the built-in half-bridge) to which an SiC MOSFET is applied as a semiconductor device, in a power module according to a ninth embodiment.

FIG. 61 shows a schematic bird's-eye view pattern configuration before resin molding, in a PM 1 according to the ninth embodiment. Herein, a case of a 2-in-1 module type module with the built-in half-bridge to which SiC MOSFETs Q1 and Q4 are applied will now be explained as an example as a semiconductor device (power device) for power elements.

Figure 62A:
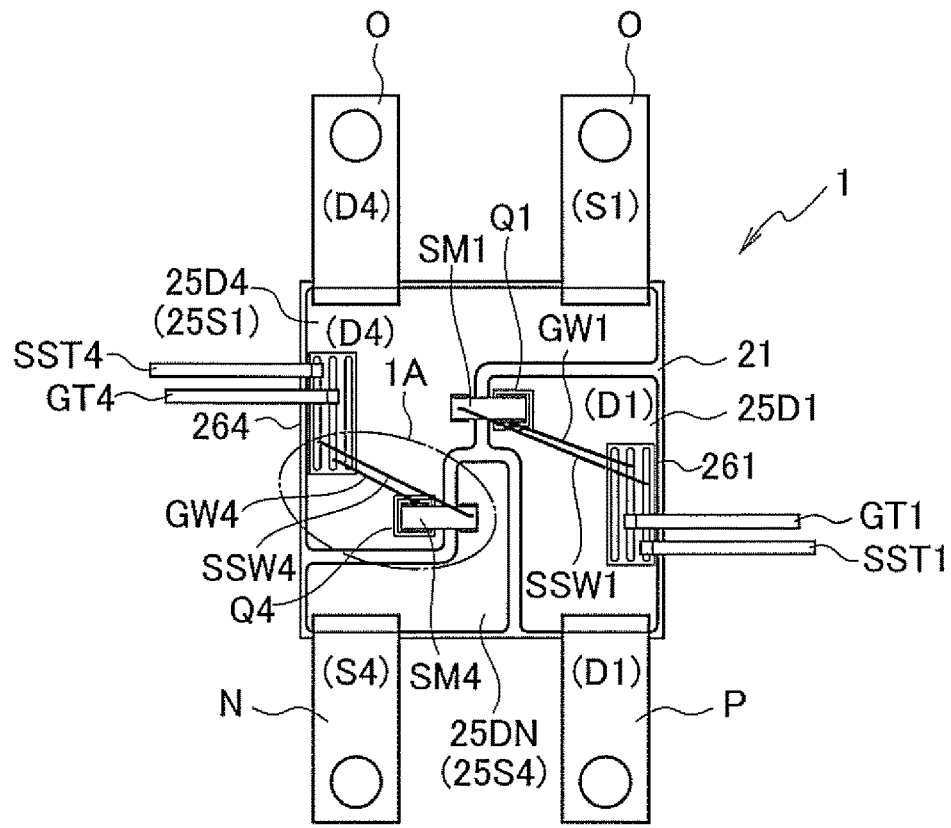
FIG. 62A is a schematic planar pattern configuration diagram of the module with the built-in half-bridge to which the SiC MOSFET is applied as the semiconductor device, in the power module according to the ninth embodiment.
Figure 62B:
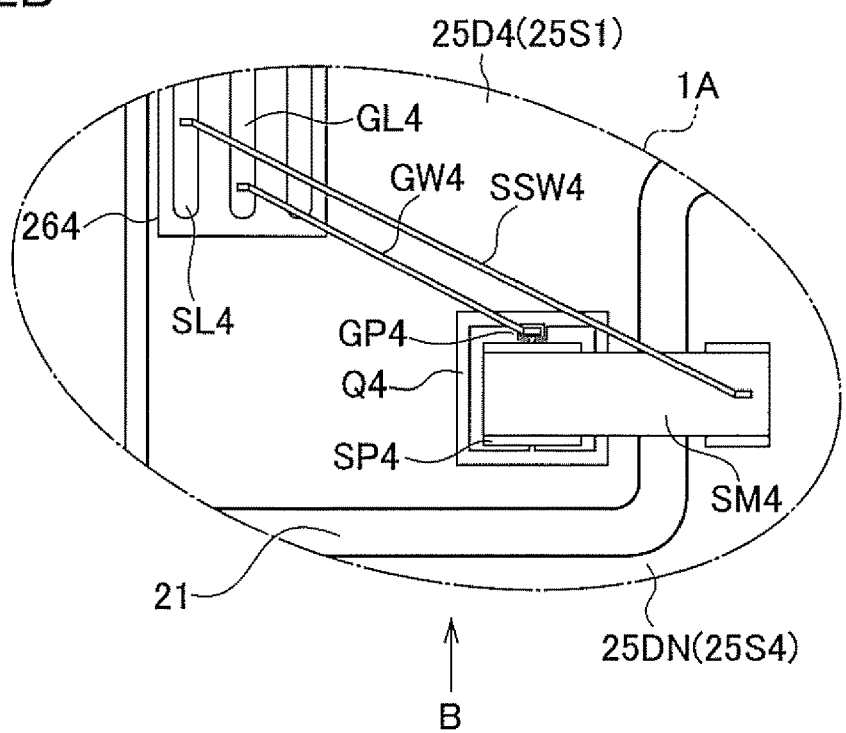
FIG. 62B is an enlarged view showing an enlarged principal portion (portion 1A) of FIG. 62A of the module with the built-in half-bridge to which the SiC MOSFET is applied as the semiconductor device, in the power module according to the ninth embodiment.

FIG. 62A shows a schematic planar pattern configuration of a module with the built-in half-bridge to which the SiC MOSFETs Q1 and Q4 are applied, in the PM 1 according to the ninth embodiment. FIG. 62B shows an enlarging configuration of the portion 1A (principal portion) of FIG. 62A.

Figure 63:
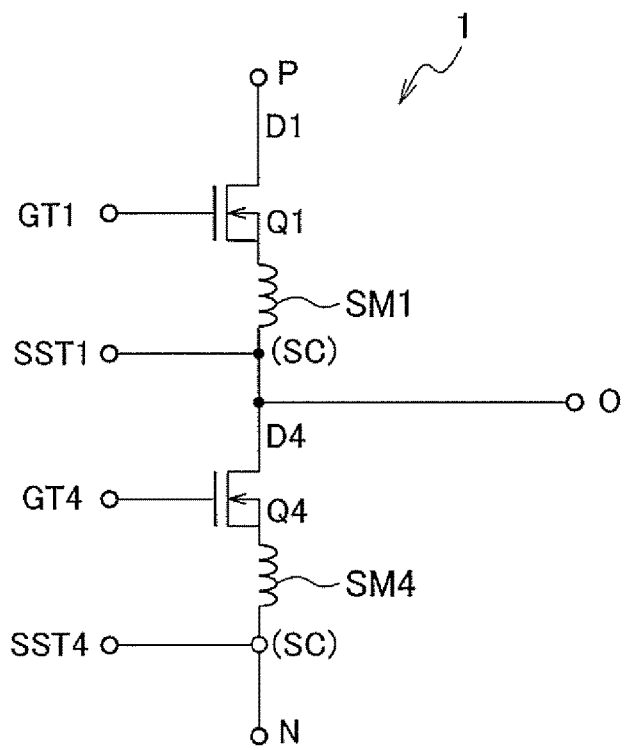
FIG. 63 is a schematic circuit representative diagram of the module with the built-in half-bridge to which the SiC MOSFET is applied as the semiconductor device, in the power module according to the ninth embodiment.

FIG. 63 shows a circuit configuration of a module with the built-in half-bridge to which the SiC MOSFETs Q1 and Q4 is applied, in the PM 1 according to the ninth embodiment.

Figure 64:
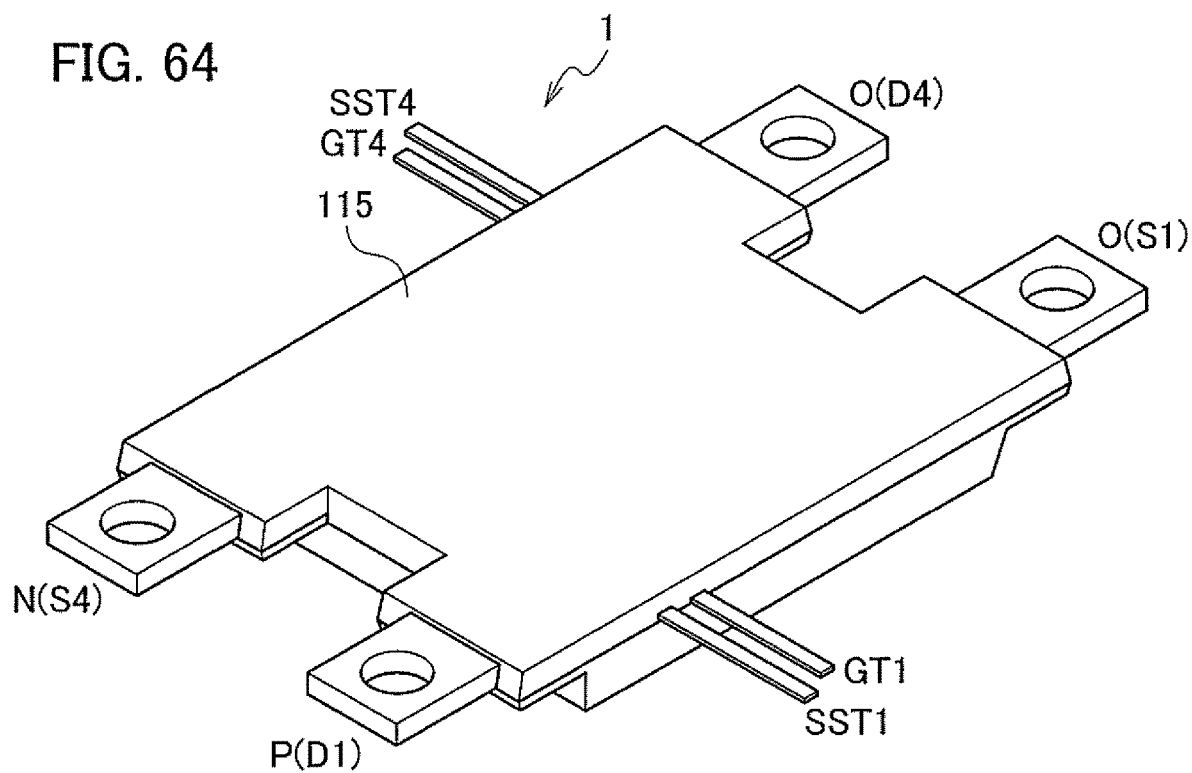
FIG. 64 is a schematic bird's-eye view configuration diagram after a resin molding of the module with the built-in half-bridge as a mold type module, in the power module according to the ninth embodiment.

Moreover, FIG. 64 shows a schematic bird's-eye view configuration after the resin molding of the module with the built-in half-bridge as a mold type module, in the PM 1 according to the ninth embodiment.

Figure 65:
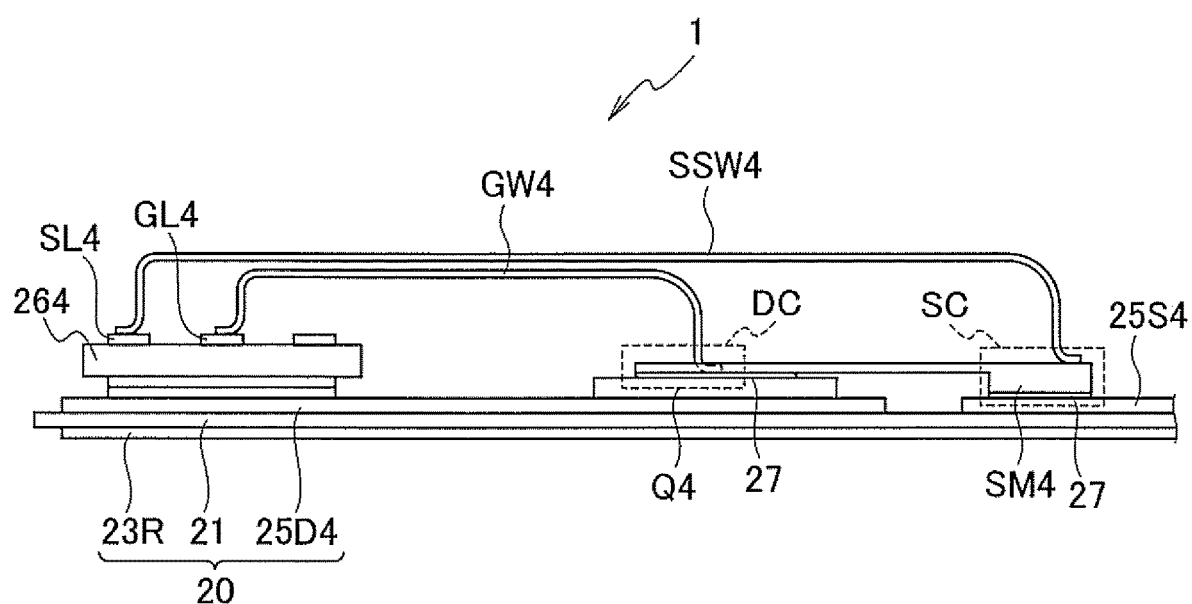
FIG. 65 is a schematic enlarged side-surface view showing a configuration of the principal portion shown from the arrow B direction of FIG. 62B, in the power module according to the ninth embodiment.

FIG. 65 shows a schematic side surface configuration of a principal portion observed from the arrow B direction of FIG. 62B, in the PM 1 according to the ninth embodiment.

The PM 1 according to the ninth embodiment includes a configuration of a module with the built-in half-bridge in which two SiC MOSFETs Q1 and Q4 connected in series are built in one module.

As shown in FIG. 64, the PM 1 according to the ninth embodiment includes: a positive side power input terminal electrode (positive-side power terminal) P and a negative side power input terminal electrode (negative-side power terminal) N disposed at a first side of a ceramics substrate 21 covered with a resin molding layer 115; a gate terminal (gate) GT1 and a source sense terminal SST1 disposed at a second side adjacent to the first side; an output terminal electrode (output terminal) 0 disposed at a third side opposite to the first side; and a gate terminal GT4 and a source sense terminal SST4 disposed at a fourth side opposite to the second side.

The PM 1 according to the ninth embodiment is a power module of 4 power terminals structure including two output terminals O. In the present embodiment, as shown in FIGS. 61 to 65, the gate terminal GT1 and the source sense terminal SST1 are connected to the gate signal electrode pattern GL1 and the source signal electrode pattern SL1 in the SiC MOSFET Q1; and the gate terminal GT4 and the source sense terminal SST4 are connected to the gate signal electrode pattern GL4 and the source signal electrode pattern SL4 in the SiC MOSFET Q4.

As shown in FIGS. 61 to 65, gate terminals GT1 and GT4 and source sense terminals SST1 and SST4 for external extraction are connected to the gate signal electrode patterns GL1 and GL4 and the source sense signal electrode patterns SL1 and SL4 by soldering etc.

In addition, as shown in FIGS. 61 to 65, gate signal electrode patterns GL1 and GL4 and source signal electrode patterns SL1 and SL4 are disposed on signal substrates 261 and 264, and the signal substrates 261 and 264 are connected with soldering etc. on the ceramics substrate 21.

The signal substrates 261 and 264 can be formed by including a ceramics substrate. The ceramic substrate may be formed by including $Al_2O_3$, AlN, SiN, AlSiC, or SiC of which at least the surface is insulation, for example.

Although illustration is omitted in FIGS. 61 to 65, the diodes may be connected reversely in parallel respectively between D1 and S1 and between D4 and S4 of the SiC MOSFETs Q1 and Q4.

The positive-side power terminal P and the negative-side power terminal N, and the gate terminals GT1 and GT4 and the source sense terminals SST1 and SST4 for external extraction can be formed of Cu, for example.

The electrode pattern 25D1, 25D4, and 25DN which are main wiring conductors can be formed by including Cu, for example.

In the example of the 2-in-1 module type module with the built-in half-bridge shown in FIGS. 61 to 65, the electrode pattern 25D1 functions as a drain electrode pattern for an upper-arm (High) side device (SiC MOSFET Q1).

Moreover, the electrode pattern 25D4 functions as a drain electrode pattern for a lower-arm (Low) side device (SiC MOSFET Q4), and also functions as a source electrode pattern for an upper-arm (High) side device (25S1). More specifically, the drain electrode pattern 25D4 is a drain electrode of the SiC MOSFET Q4, and is also a source electrode of the SiC MOSFET Q1.

Furthermore, the electrode pattern 25DN connected to the negative-side power terminal N functions also as a source electrode pattern for the lower-arm (Low) side device (25S4).

More specifically, in the PM 1 according to the ninth embodiment, as shown in FIGS. 61 to 65, the SiC MOSFET Q1 is mounted on the electrode pattern 25D1, the drain D1 is connected to the electrode pattern 25D1, and the source S1 is connected to the electrode pattern 25D4 via the leadframe SM1. Similarly, the SiC MOSFET Q4 is mounted on the electrode pattern 25D4, the drain D4 is connected to the electrode pattern 25D4, and the source S4 is connected to the electrode pattern 25DN via the leadframe SM4.

Moreover, as shown in FIGS. 61 to 65, the PM 1 according to the ninth embodiment includes: bonding wire (first bonding wire) SSW1 for source sense configured to connect the leadframe SM1 to the land-side bonded portion SC side at a source signal electrode pattern SL1; and bonding wire (second bonding wire) GW1 for gate signal configured to connect the gate pad electrode GP1 tot the gate signal electrode pattern GL1 at a device-side bonded portion DC side opposite to the land-side bonded portion SC.

Similarly, the PM 1 includes: bonding wire (first bonding wire) SSW4 for source sense configured to connect the leadframe SM4 to the land-side bonded portion SC side at a source signal electrode pattern SL4; and bonding wire (second bonding wire) GW4 for gate signal configured to connect the gate pad electrode GP4 tot the gate signal electrode pattern GL4 at a device-side bonded portion DC side opposite to the land-side bonded portion SC.

More specifically, as shown in FIG. 63, the bonding wire SSW1 and SSW4 for source sense for connecting the source electrode patterns 25S1 and 25S4 or the leadframes SM1 and SM4 are bonded with wedge bonding to each of the source signal electrode patterns SL1 and SL4 of the SiC MOSFETs Q1 and Q4, at the land-side bonded portion SC side.

Other configurations and methods of fabrication are substantially similar to those in the case of the eighth embodiment.

As described above, also according to the PM 1 according to the ninth embodiment, an influence of thermal stress to the wire connection due to operations leading to high temperatures can be reduced, and thereby improving higher heat resistance and reliability with respect to the wire connection characteristics, by applying the leadframes SM1 and SM4 to the main wiring for source power line wiring, and bonding the bonding wires SSW1 and SSW4 for source sense to the side of the land-side bonded portion SC which does not lead to high temperatures compared with the device-side bonded portion DC during the operation of the SiC MOSFETs Q1 and Q4.

According to the ninth embodiment, there can be provided the 2-in-1 module type module with the built-in half-bridge, as the PM capable of reducing influence of thermal stress to the wire connection due to operations leading to high temperatures and thereby improving higher heat resistance and reliability with respect to the wire connection characteristics.

Tenth Embodiment

Figure 66:
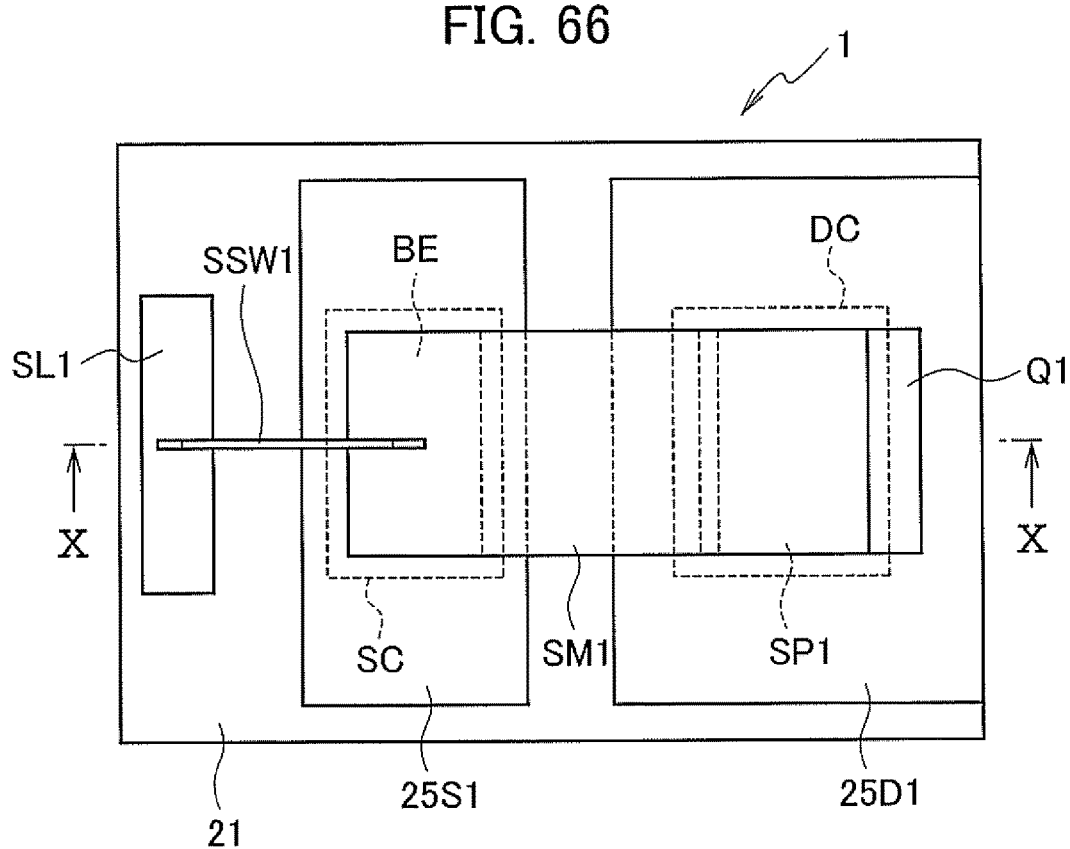
FIG. 66 is a schematic planar pattern configuration diagram of a 1-in-1 module to which an SiC MOSFET is applied as a semiconductor device, in a power module according to the tenth embodiment.
Figure 67:
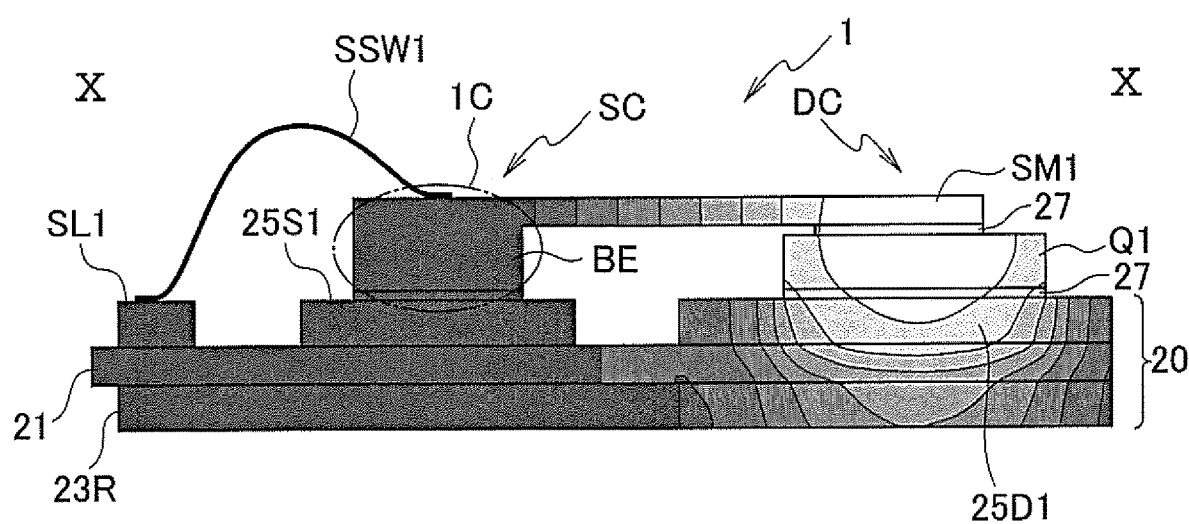
FIG. 67 is a diagram showing a simulation result of thermal diffusion during heat generation, in an example of the 1-in-1 module to which the SiC MOSFET is applied as the semiconductor device, in the power module according to the tenth embodiment.

FIG. 66 shows a schematic planar pattern configuration of a PM 1 according to the tenth embodiment. Moreover, FIG. 67 shows a simulation result of thermal diffusion (temperature distribution) during heat generation of the PM 1 according to the tenth embodiment.

In this case, as shown in FIG. 66, the PM 1 according to the tenth embodiment includes the substantially same configuration as that of the PM 1 according to the eighth embodiment, except for a difference in arrangement of the device-side bonded portion DC which is a bonded portion between the source pad electrode SP1 and the leadframe SM1, and the land-side bonded portion SC which is a bonded portion between the leadframe SM1 and the source electrode pattern 25S1.

More specifically, the PM 1 according to the tenth embodiment includes: an insulating substrate 20 including a ceramics substrate 21, the insulating substrate 20 further including a drain electrode pattern (second main electrode pattern) 25D1, a source electrode pattern (first main electrode pattern) 25S1, a and source signal electrode pattern (signal wiring pattern) SL1 disposed on an upper surface (U) side of the ceramics substrate 21, and a back electrode pattern 23R disposed on a lower surface (D) side of the ceramics substrate 21; a semiconductor device (SiC MOSFET) Q1 for power elements disposed in a face up on the drain electrode pattern 25D1, the semiconductor device Q1 including a source pad electrode (main pad electrode) SP1 on a front side surface thereof; a leadframe SM1 connected between the source pad electrode SP1 and the source electrode pattern 25S1, the leadframe SM1 is a main wiring for source power line wiring; and a bonding wire SSW1 for source sense configured to connect between the land-side bonded portion SC and the source signal electrode patterns SL1.

In the case of the PM 1 according to the tenth embodiment, the source electrode pattern 25S1 is positioned between the drain electrode pattern 25D1 and the source signal electrode pattern SL1, and the land-side bonded portion SC is disposed so as to be adjacent to the source signal electrode pattern SL1 rather than the device-side bonded portion DC.

In FIGS. 66 and 67, illustration is omitted with regard to the gate pad electrode (GP1) on the SiC MOSFET Q1, the gate signal electrode pattern on the ceramics substrate 21 (GL1), the bonding wire for gate signal (GW1) configured to connect between the gate pad electrode (GP1) and the gate signal electrode pattern (GL1), and the package (resin molding layer 115).

Moreover, reference numeral BE shown in FIG. 67 denotes a block electrode composed by including a metallic column for connecting the leadframe SM1 to the source electrode pattern 25S1. The block electrode BE can be formed by including Cu etc. The block electrode BE may be integrally formed as a part of the leadframe SM1.

Moreover, FIG. 67 shows a simulation result of thermal diffusion (temperature distribution) during heat generation of the PM 1 according to the tenth embodiment. FIG. 67 corresponds to the cross section taken in the X-X of FIG. 66, and shows higher temperatures as the lighter-colored portions. This simulation result shows a time of a saturation from which the temperature is not changed any more after a certain amount of time elapses from an operation of the SiC MOSFET Q1.

As clearly from FIG. 67, a temperature substantially near the device-side bonded portion DC is increased due to the operation of the SiC MOSFET Q1, but the temperature is not significantly increased in an area (near land-side bonded portion SC) shown by the portion 1C in FIG. 67.

Accordingly, even if the temperature of the source pad electrode SP1 becomes the same degree as a junction temperature due to a large current flowing into the SiC MOSFET Q1, it can avoid a rupture of the bonding wire SSW1 for source sense and a rupture of the contact surface of the bonding wire SSW1 for source sense.

The PM 1 shown in tenth embodiment can be applied to the power modules shown in other embodiments.

Eleventh Embodiment

Figure 68:
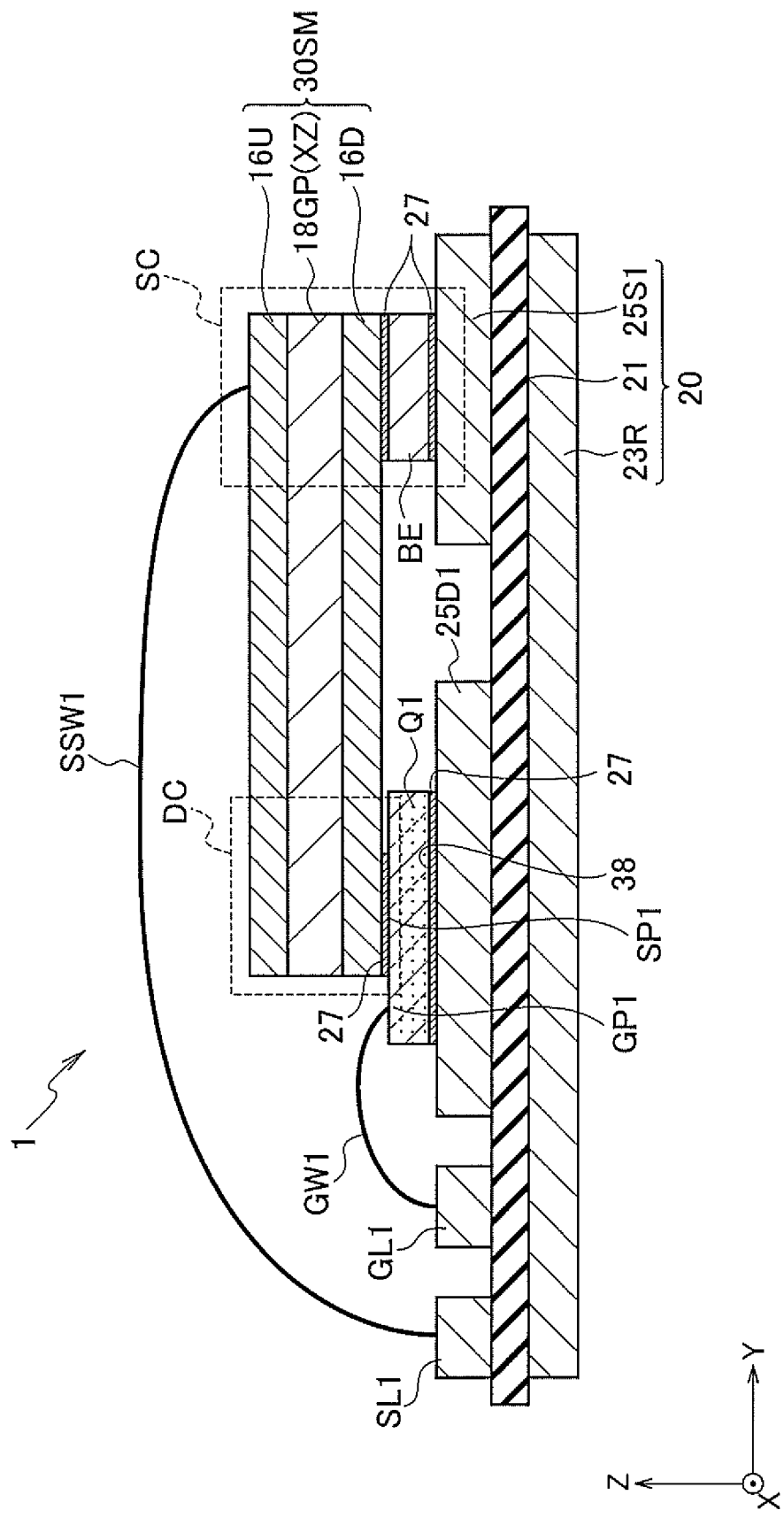
FIG. 68 is a schematic cross-sectional structure diagram of a 1-in-1 module to which an SiC MOSFET is applied as a semiconductor device, in a power module according to the eleventh embodiment.

FIG. 68 shows a schematic cross-sectional structure of a PM 1 according to the eleventh embodiment.

In this case, as shown in FIG. 68, the PM 1 according to the eleventh embodiment includes the substantially same configuration as that of the PM 1 according to the eighth embodiment, except for a configuration of the leadframe SM1. Accordingly, the duplicated description is avoided, but different portions will now be explained.

More specifically, as shown in FIG. 68, the PM 1 according to the eleventh embodiment corresponds to an example of adopting wiring lead portion (leadframe) 30SM as the main wiring for source power line wiring instead of the leadframe SM1. The wiring lead portion 30SM includes: a graphite plate (graphite wiring) 18GP (XZ) provided with anisotropic thermal conductivity and anisotropic CTE; and a lower Cu wiring pattern 16D disposed on a lower surface side of the graphite plate 18GP (XZ) and an upper Cu wiring pattern 16U disposed on an upper surface side of the graphite plate 18GP (XZ), wherein One end side thereof is connected to the source pad electrode SP1 of the semiconductor device (SiC MOSFET) Q1, and the other end side thereof is connected to the source electrode pattern 25S1 on the ceramics substrate 21 via the block electrode BE.

The graphite plate 18GP (XZ) has an XZ orientation of which a thermal conductivity in a thickness direction is higher than the thermal conductivity in a plane direction. The XZ orientation substantially corresponds to the direction of the XZ plane which is orthogonal to the Y direction which is an extending direction of the wiring lead portion 30SM. More specifically, the graphite wiring 18GP (XZ) is provided with an orientation of which the thermal conductivity is relatively low in the plane direction, and is provided with the XZ orientation of which the thermal conductivity in the thickness direction is relatively high than that in a plane direction.

Moreover, the bonding wire SSW1 for source sense for connecting the wiring lead portion 30SM or the source electrode pattern 25S1 is bonded with wedge bonding to the source signal electrode pattern SL1 at the land-side bonded portion SC side.

The graphite plate 18GP (XZ) will now be briefly explained. FIG. 5 shows a schematic configuration (an example of laminated structure) of the graphite sheet (graphene) GS composing the graphite plate 18GP.

There are a graphite plate 18GP (XY) having an XY orientation of which the thermal conductivity in a plane direction is higher than the thermal conductivity in a thickness direction, and a graphite plate 18GP (XZ) having an XZ orientation of which the thermal conductivity in the thickness direction is higher than the thermal conductivity in the plane direction. The graphite plate 18GP (XY) is expressed as shown in FIG. 6A, and the graphite plate 18GP (XZ) is expressed as shown in FIG. 6B.

As shown in FIG. 5, graphite sheets GS1, GS2, GS3, . . . , GSn of each surface composed of n layers have many covalent bonding of hexagonal crystal in one laminated crystal structure, and between the graphite sheets GS1, GS2, GS3, . . . , GSn of each surface are bonded to one another with Van der Waals force.

More specifically, the graphite which is a carbon based anisotropic thermal conducting material is a laminated crystal body of a hexagonal mesh structure of carbon atom, and the thermal conduction thereof also has anisotropy, and the graphite sheets GS1, GS2, GS3, . . . , GSn shown in FIG. 5 have an amount of thermal conductivity (high thermal conductivity) larger than that in a thickness direction of Z-axis with respect to a crystal surface direction (on the XY plane).

Accordingly, as shown in FIG. 6A, the graphite plate 18GP (XY) having XY orientation is provided with thermal conductivities X=1500 (W/mK), Y=1500 (W/mK), and Z=5 (W/mK), for example.

On the other hand, as shown in FIG. 6B, the graphite plate 18GP (XZ) having XZ orientation is provided with thermal conductivities X=1500 (W/mK), Y=5 (W/mK), and Z=1500 (W/mK), for example.

In addition, the density of each graphite plate 18GP (XY) and 18GP (XZ) is approximately 2.2 (g/cm$^3$), and the thickness thereof is approximately 0.7 mm to approximately 10 mm, and the size thereof is equal to or less than approximately 40 mm×approximately 40 mm.

According to the PM 1 according to the eleventh embodiment, heat which is generated at the device-side bonded portion DC side to be transferred to the land-side bonded portion SC side via the wiring lead portion 30SM when the SiC MOSFET Q1 is operated at high temperatures can be suppressed by adopting the graphite plate 18GP (XZ).

Accordingly, also in the PM 1 according to the eleventh embodiment, an influence of thermal stress to the wire connection due to operations leading to high temperatures can be reduced more effectively, and thereby improving higher heat resistance and reliability with respect to the wire connection characteristics, by adopting the graphite plate 18GP (XZ) as the main wiring for the source power line wiring leadframe SM1, and by bonding the bonding wire SSW1 for source sense to the side of the land-side bonded portion SC which does not lead to high temperatures compared with the device-side bonded portion DC during the operation of the SiC MOSFET Q1.

Moreover, by adopting the graphite plate 18GP into the wiring lead portion 30SM as the PM 1 according to the eleventh embodiment, it can suppress the common Ls (resistance) by which only an amount of the wiring lead portion 30SM is increased.

The PM 1 shown in eleventh embodiment can be applied to the power modules shown in other embodiments.

Twelfth Embodiment

Figure 69:
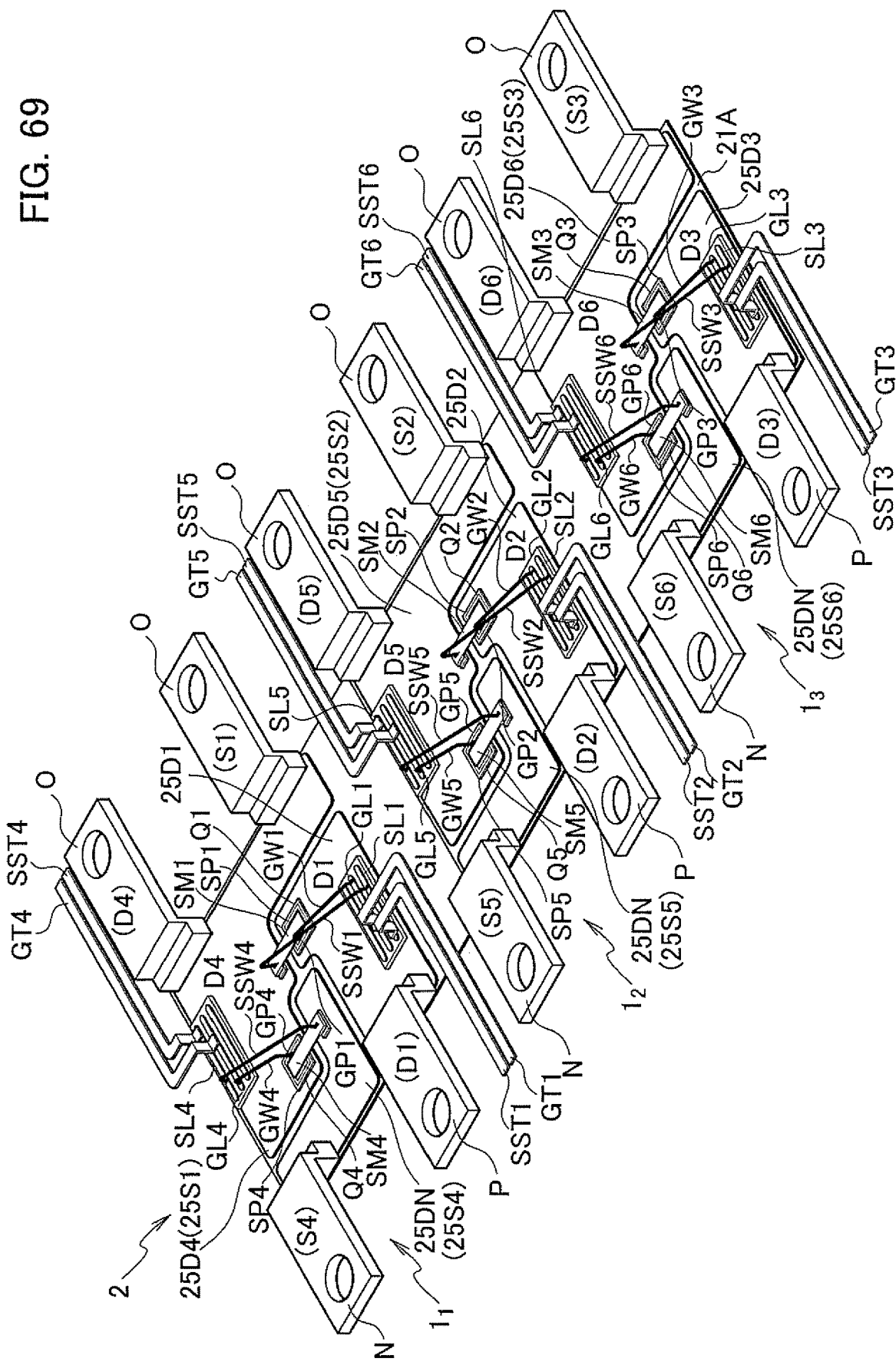
FIG. 69 is a schematic bird's-eye view pattern configuration diagram of a 6-in-1 module, in a power module according to the twelfth embodiment.

FIG. 69 shows a schematic bird's-eye view pattern configuration of a 6-in-1 module, in a PM 2 according to the twelfth embodiment.

The PM 2 according to the twelfth embodiment corresponds to an example of disposing in parallel three PMs 1 shown in FIG. 59, for example on the common ceramics substrate 21A in order to configure a 6-in-1 module type switching module.

A fundamental structure of the 6-in-1 module type switching module is the same as that of the 1-in-1 module type PM or the 2-in-1 module type PM. More specifically, the 6-in-1 module type switching module which is the PM 2 according to the twelfth embodiment includes 2-in-1 module type PMs $1_1$, $1_2$, and $1_3$, as shown in FIG. 69.

The PM $1_1$ includes an SiC MOSFETs Q1 and Q4 as the semiconductor device, for example, the PM $1_2$ includes an SiC MOSFETs Q2 and Q5, for example, and the PM $1_3$ includes an SiC MOSFETs Q3 and Q6, for example. Since the PMs $1_1$, $1_2$, and $1_3$ are the same as the PM 1, the detailed explanation is omitted.

The 6-in-1 module type switching module which is the PM 2 according to the twelfth embodiment includes a configuration composed by integrally sealing 2-in-1 module type PMs $1_1$, $1_2$, and $1_3$ with a common mold resin or common case (not shown), for example.

More specifically, in the 6-in-1 module type switching module (PM 2 according to the twelfth embodiment), the PMs $1_1$, $1_2$, and $1_3$ are disposed in parallel on the common ceramics substrate 21A so as to be sealed as an integral-type package (resin molding layer (not shown)), and thereby the back electrode pattern 23R can be commonalized (integrated).

Alternatively, the 2-in-1 module type PMs $1_1$, $1_2$, and $1_3$ sealed as a different element in an individual mold resin or case are disposed in parallel on the common ceramics substrate 21A, and thereby a 6-in-1 module type switching module can be formed.

As shown in FIG. 69, also in the configuration of the PM 2 according to the twelfth embodiment (6-in-1 module type switching module), the PMs $1_2$, $1_2$, and $1_3$ includes: leadframes (SM1, SM4), (SM2, SM5), and (SM3, SM6) respectively connected between source pad electrodes (SP1, SP4), (SP2, SP5), and (SP3, SP6) and source electrode patterns (25S1 (25D4), 25S4 (25DN)), (25S2 (25D5), 25S5 (25DN)), and (25S3 (25D6), 25S6 (25DN)); and bonding wires (SSW1, SSW4), (SSW2, SSW5), and (SSW3, SSW6) for source sense configured to respectively connect between the leadframes (SM1, SM4), (SM2, SM5), and (SM3, SM6) of the land-side bonded portion SC and source signal electrode patterns (SL1, SL4), (SL2, SL5), and (SL3, SL6). Accordingly, an influence of thermal stress to the wire connection due to operations leading to high temperatures can be reduced, and thereby improving higher heat resistance and reliability with respect to the wire connection characteristics.

In addition, the bonding wires (SSW1, SSW4), (SSW2, SSW5), and (SSW3, SSW6) for source sense may be respectively connected to source electrode patterns (25S1 (25D4), 25S4 (25DN)), (25S2 (25D5), 25S5 (25DN)), and (25S3 (25D6), 25S6 (25DN)) at the land-side bonded portion SC side.

Thirteenth Embodiment

Figure 70A:
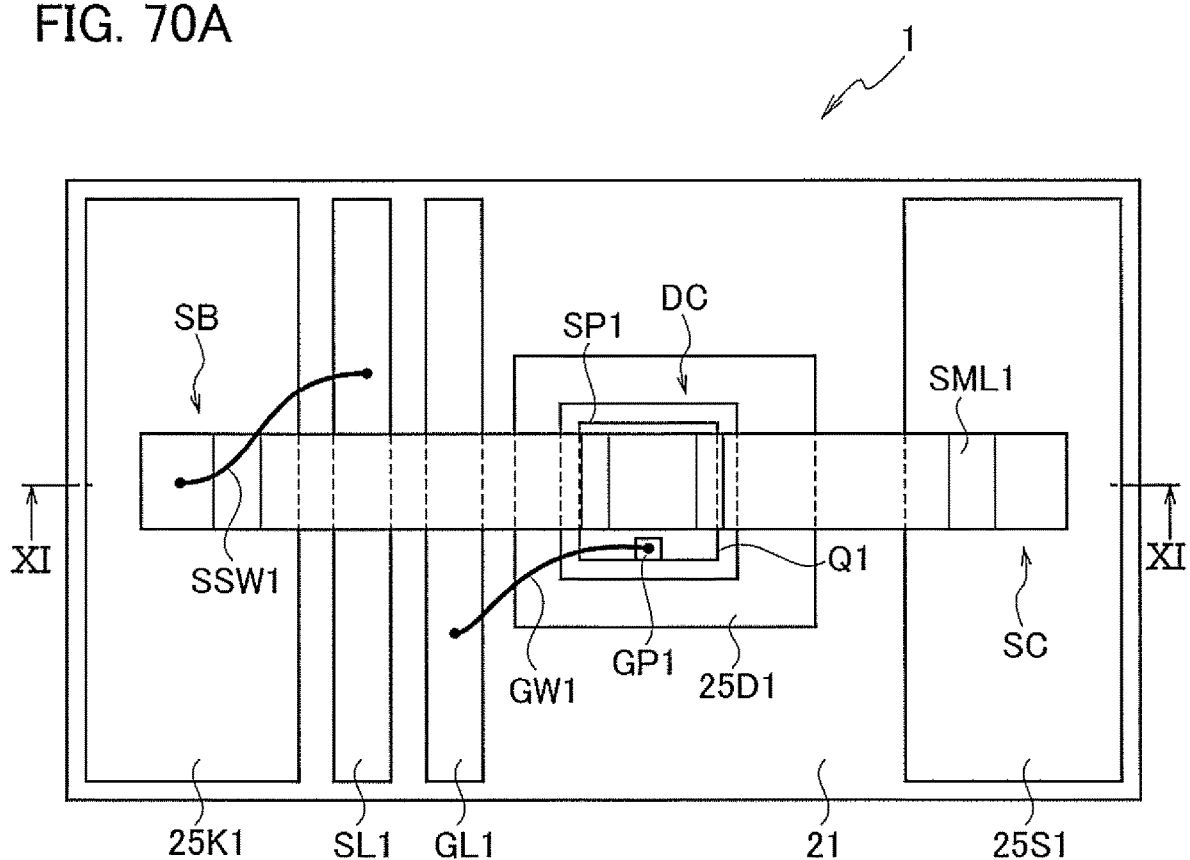
FIG. 70A is a schematic planar pattern configuration diagram of a power module according to the thirteenth embodiment.
Figure 70B:
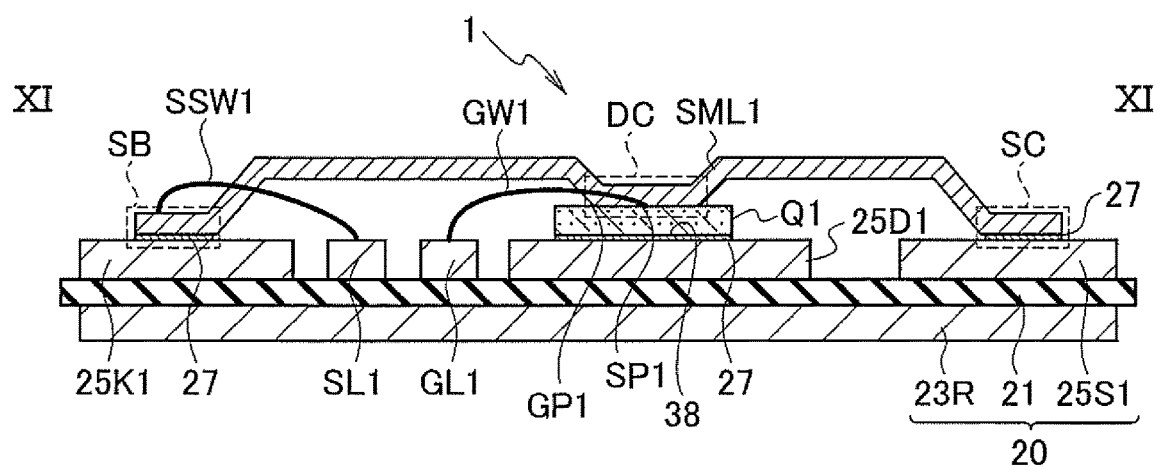
FIG. 70B is a schematic cross-sectional structure diagram taken in the line XI-XI of FIG. 70A.

FIG. 70A shows a schematic planar pattern configuration of a 1-in-1 module, in a PM 4 according to the thirteenth embodiment. FIG. 70B shows a schematic cross-sectional structure taken in the line XI-XI of FIG. 70A.

In this case, as shown in FIGS. 70A and 70B, the PM 1 according to the thirteenth embodiment includes the substantially same configuration as that of the PM 1 according to the eighth embodiment, except for a configuration of the leadframe SM1. Accordingly, the duplicated description is avoided, but different portions will now be explained.

The PM 1 according to the thirteenth embodiment corresponds to an example of adopting extended leadframe (leadframe) SML1 as the main wiring for source power line wiring, as shown in FIGS. 70A and 70B. One end side of the extended leadframe SML1 is connected to the source electrode pattern 25S1 on the ceramics substrate 21. The other end side of the extended leadframe SML1 connected to the source pad electrode SP1 of the SiC MOSFET (semiconductor device) Q1 is extended to be connected to the electrode pattern (wiring electrode pattern) 25K1 other than the source electrode pattern 25S1.

Moreover, the extended leadframe SML1 or the other electrode pattern 25K1 is connected to the source signal electrode pattern SL1 via the bonding wire SSW1 for source sense at a second land-side bonded portion (third bonded portion) SB side with the another electrode pattern 25K1.

More specifically, the PM 1 according to the thirteenth embodiment includes: an insulating substrate 20 including a ceramics substrate 21, the insulating substrate 20 further including a drain electrode pattern 25D1, a source electrode pattern 25S1, a source signal electrode pattern SL1, a gate signal electrode pattern GL1, and an electrode pattern 25K1 disposed on the ceramics substrate 21; an SiC MOSFET Q1 disposed in a face up on the drain electrode pattern 25D1, the SiC MOSFET Q1 including a source pad electrode SP1 and a gate pad electrode GP1 on a front side surface thereof, and a drain electrode 38 on a back side surface thereof; an extended leadframe SML1 connected between the source pad electrode SP1 and the source electrode pattern 25S1, the extended leadframe SML1 connected to the electrode pattern 25K1 by extending a connecting end side with the source pad electrode SP1; a device-side bonded portion DC between the extended leadframe SML1 and the source pad electrode SP1, a land-side bonded portion SC between the extended leadframe SML1 and the source electrode pattern 25S1, the land-side bonded portion SC being separated from the device-side bonded portion DC, the land-side bonded portion SC having a temperature relatively lower than a temperature of the device-side bonded portion DC during semiconductor device operations, and a second land-side bonded portion SB between the extended leadframe SML1 and the electrode pattern 25K1, the second land-side bonded portion SB having a temperature relatively lower than a temperature of the device-side bonded portion DC during the device operations; a bonding wire SSW1 for source sense of which one end is connected to source signal electrode pattern SL1 and the other end is connected to the second land-side bonded portion SB; a bonding wire GW1 for gate signal connected between the gate pad electrode GP1 and the gate signal electrode pattern GL1, wherein the other end of the bonding wire SSW1 for source sense is connected to the extended leadframe SML1 or the electrode pattern 25K1 of the second land-side bonded portion SB.

Also in such a configuration, the bonding wire SSW1 for source sense is bonded to the side of the second land-side bonded portion SB which does not lead to high temperatures compared with the device-side bonded portion DC during the operation of the SiC MOSFET Q1. Accordingly, an influence of thermal stress to the wire connection due to operations leading to high temperatures can be reduced, and thereby improving higher heat resistance and reliability with respect to the wire connection characteristics.

According to the PM 1 according to the thirteenth embodiment, although the length of the module (resin molding layer (not shown)) is increased in accordance with the length of the extended leadframe SML1, both of the wire lengths of the bonding wire SSW1 for source sense and the bonding wire GW1 for gate signal can be shortened since the gate signal electrode pattern GL1 and the source signal electrode pattern SL1 exist between the bonded portions SB and DC.

The PM 1 shown in thirteenth embodiment can be applied to the power modules shown in other embodiments.

Fourteenth Embodiment

Figure 71A:
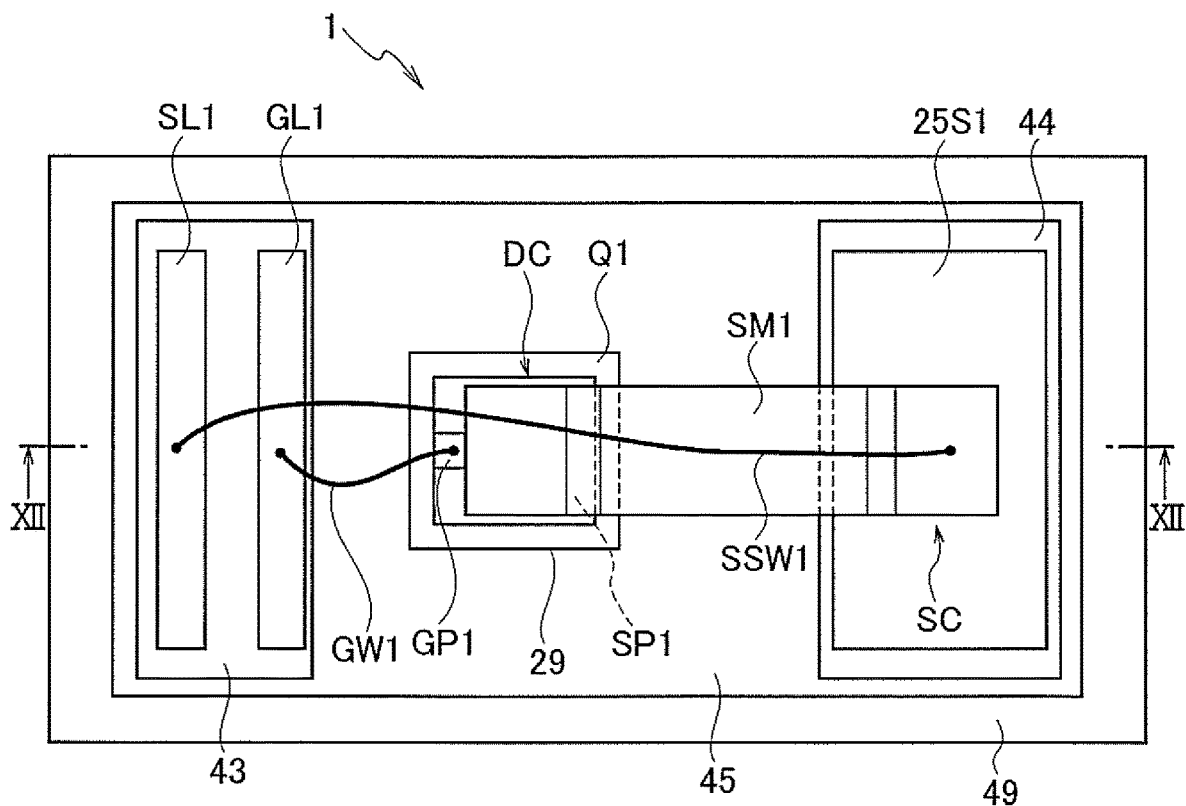
FIG. 71A is a schematic planar pattern configuration diagram of the power module according to the fourteenth embodiment.
Figure 71B:
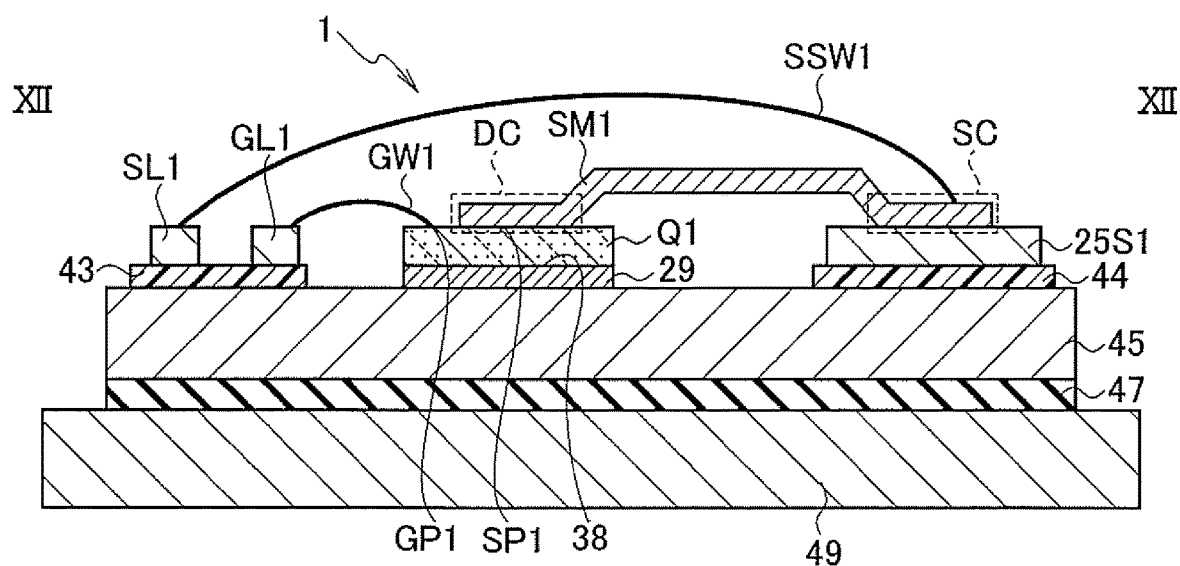
FIG. 71B is a schematic cross-sectional structure diagram taken in the line XII-XII of FIG. 71A.

FIG. 71A shows a schematic planar pattern configuration of a 1-in-1 module, in a PM 2 according to the fourteenth embodiment. FIG. 71B shows a schematic cross-sectional structure taken in the line XII-XII of FIG. 71A.

In this case, as shown in FIGS. 71A and 71B, the PM 1 according to the fourteenth embodiment includes the substantially same configuration as that of the PM 1 according to the eighth embodiment, except for a configuration of the insulating substrate 20. Accordingly, the duplicated description is avoided, but different portions will now be explained.

As shown in FIGS. 71A and 71B, the PM 1 according to the fourteenth embodiment includes a metallic plate (e.g., thick copper substrate) 45 having electrical conductivity. An SiC MOSFET (semiconductor device) Q1 is disposed at an upper surface (U) side of the thick copper substrate 45 via a solder layer 29.

Since the thick copper substrate 45 cannot hold an insulating state alone, adhesive insulating layers 43 and 44 composed by including inorganic adhesive agents etc. are respectively disposed at both sides of the SiC MOSFET Q1 which is a U side of the thick copper substrate 45. The source signal electrode pattern SL1 and the gate signal electrode pattern GL1 are disposed on the adhesive insulating layer 43. The source electrode pattern 25S1 is disposed on the adhesive insulating layer 44.

At the lower surface (D) side of the thick copper substrate 45, a water-cooling (liquid-cooling) type cooling apparatus 49 may be disposed via the insulation layer (e.g., an insulating substrate, an insulating resin sheet, etc.) 47. In the case of the cooling apparatus, cooling apparatuses having a sufficient thermal conductivity, such as coolant water (water, or a mixed solution to which water and ethylene glycol are mixed at a rate of every 50%), cooling gas (cold air), etc., are used, for example.

More specifically, the PM 1 according to the fourteenth embodiment includes: an electrically-conductive thick copper substrate 45; a source electrode pattern 25S1, a source signal electrode pattern SL1, and a gate signal electrode pattern GL1 respectively disposed via adhesive insulating layers 43, 44 on the thick copper substrate 45; an SiC MOSFET Q1 including a main pad electrode on a front side surface thereof, the SiC MOSFET Q1 disposed on the substrate; a leadframe SM1 connected between the source pad electrode SP1 and the source electrode pattern 25S1; a land-side bonded portion SC between the leadframe SM1 and the source electrode pattern 25S1, the land-side bonded portion SC being separated from the device-side bonded portion DC between the leadframe SM1 and the source pad electrode SP1, the land-side bonded portion SC having a temperature relatively lower than a temperature of the device-side bonded portion DC during device operations;

and a bonding wire SSW1 for source sense connected between the land-side bonded portion SC and the source signal electrode pattern SL1.

One end of the bonding wire SSW1 for source sense is connected to the source signal electrode pattern SL1, and the other end is connected with the leadframe SM1 or the source electrode pattern 25S1 at the land-side bonded portion SC side.

In the PM 1 according to the fourteenth embodiment, the bonding wire GW1 for gate signal is connected between the gate pad electrode GP1 on the front side surface of the SiC MOSFET Q1 and the gate signal electrode pattern GL1.

Also according to the PM 1 according to the fourteenth embodiment, an influence of thermal stress to the wire connection due to operations leading to high temperatures can be reduced, and thereby improving higher heat resistance and reliability with respect to the wire connection characteristics, by applying the leadframe SM1 to the main wiring for source power line wiring, and by bonding the bonding wire SSW1 for source sense to the side of the land-side bonded portion SC which does not lead to high temperatures compared with the device-side bonded portion DC during the operation of the SiC MOSFET Q1.

Moreover, according to the PM 1 according to the fourteenth embodiment, a warpage of the whole substrate can be reduced at low cost by adopting the thick copper substrate 45.

The PM 1 shown in fourteenth embodiment can be applied to other power modules shown in the eighth to fourteenth embodiments.

Examples of Power Module

Hereinafter, a concrete example of the PMs according to the eighth to fourteenth embodiments will now be explained. Naturally, also in the PM explained hereinafter, the leadframe SM which is a main wiring for source power line wiring is adopted, and the bonding wire SSW for source sense is configured to connect between the land-side bonded portions SC and SB between the leadframe SM and the source signal electrode pattern SL. As the main wiring for source power line wiring, the wiring lead portion 30SM and the extended leadframe SML can be used.

Although the SiC MOSFET has been explained as an example as the semiconductor device in some embodiments among the above-mentioned eighth to fourteenth embodiments, the power elements (switching element) disposed in the PM may be elements other than the SiC MOSFET.

For example, an Si-IGBT, an SiC-IGBT, an SiC-bipolar junction transistor, an SiC-JFET, etc. may be used, as the switching element.

If the switching element is the SiC-IGBT in FIG. 32, the source pad electrode SP, the drain electrode 38, the gate pad electrode GP, and the source sense pad electrode SSP respectively correspond to an emitter pad electrode, a collector electrode, a gate pad electrode, and an emitter sense pad electrode of the SiC-IGBT.

If the switching element is the SiC-bipolar junction transistor, the source pad electrode SP, the drain electrode 38, the gate pad electrode GP, and the source sense pad electrode SSP respectively correspond to an emitter pad electrode, a collector electrode, abase pad electrode, and an emitter sense pad electrode of the SiC-bipolar junction transistor (not shown).

As the PMs according to eighth to fourteenth embodiments, it is not limited to the 1-in-1 module type, the 2-in-1 module type, and the 6-in-1 module type modules. For example, it is applicable to 4-in-1 module type PMs, 7-in-1 module type PMs composed of 6-in-1 module type PMs including a snubber capacitor etc., 8-in-1 module type PMs, 12-in-1 module type PMs, 14-in-1 module type PMs, etc.

Concrete Example of Semiconductor Device

FIG. 28 shows a schematic circuit representation of SiC MOSFET of 1-in-1 module type PM 50 applicable as a semiconductor device, in the PMs according to the eighth to fourteenth embodiments.

The diode DI connected to the SiC MOSFET Q inversely in parallel is shown in FIG. 28. A main electrode of the SiC MOSFET Q is expressed with a drain terminal DT and a source terminal ST. Moreover, an IGBT (not shown) of the 1 in 1 module 50 applicable as the semiconductor device, corresponding to the PMs 1 according to the eighth to fourteenth embodiments, can also be realized.

Moreover, FIG. 29 shows a detailed circuit representation of SiC MOSFET of 1-in-1 module type PM 50 applicable as a semiconductor device, in the PMs according to the eighth to fourteenth embodiments.

The PMs 1 according to the eighth to fourteenth embodiments includes a configuration in which the semiconductor device is the 1-in-1 module type PM 50, for example. More specifically, the SiC MOSFET Q in which a plurality of MOSFET cells are connected in parallel is included in one module. As an example, five chips (MOSFET×5) can be mounted thereon, and a maximum of five pieces of the MOSFETs Q respectively can be connected to one another in parallel. Note that it is also possible to mount a part of five pieces of the chips for the diode DI thereon.

More particularly, as shown in FIG. 29, a sense MOSFET Qs is connected to the SiC MOSFET Q in parallel. The sense MOSFET Qs is formed as a minuteness transistor in the same chip as the SiC MOSFET Q.

In FIG. 29, reference numeral SS denotes a source sense terminal, reference numeral CS denotes a current sense terminal, and reference numeral G denotes a gate terminal. Note that, also in the SiC MOSFET Q according to the eighth to fourteenth embodiments, the sense MOSFET Qs may be formed as a minuteness transistor in the same chip.

(Circuit Configuration)

Next, a circuit configuration example of the semiconductor device in the PMs 1 according to the eighth to fourteenth embodiments will now be more specifically explained.

There will now be explained a semiconductor package device (the so-called 2-in-1 type of module) in which two semiconductor devices are sealed into one mold resin, as a module applicable as the semiconductor device of PMs according to the eighth to fourteenth embodiments.

FIG. 30 shows a circuit configuration of the 2-in-1 module type PM (2-in-1 module) 130A to which the SiC MOSFETs Q1 and Q4 are applied as the semiconductor device, for example.

More specifically, as shown in FIG. 30, the 2-in-1 module 130A includes a configuration of module with the built-in half-bridge in which two SiC MOSFETs Q1 and Q4 is included as one module.

In this case, although the module can be considered as one large transistor, one chip or a plurality of chips may be contained therein. More specifically, although the modules include 1-in-1 module, 2-in-1 module, 4-in-1 module, 6-in-1 module, etc. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 30, the 2-in-1 module 130A includes two SiC MOSFETs Q1 and Q4, and diodes DI1 and DI4 connected in reversely parallel to the SiC MOSFETs Q1 and Q4, as one module. Note that the diodes DI1 and DI4 can also be omitted by using a parasitic diode.

In FIG. 30, reference numeral G1 denotes a lead terminal for gate signal (the so-called gate terminal) of the SiC MOSFET Q1, and reference numeral S1 denotes a lead terminal for source signal (the so-called source sense terminal) of the SiC MOSFET Q1. Similarly, reference numeral G4 denotes a lead terminal for gate signal of the SiC MOSFET Q4, and reference numeral S4 denotes a lead terminal for source signal of the SiC MOSFET Q4.

Reference numeral P denotes a positive side power input terminal electrode, reference numeral N denotes a negative side power input terminal electrode, and reference numeral O denotes an output terminal electrode.

Moreover, a 2-in-1 module (not shown) to which the IGBT is applied as the semiconductor devices Q1 and Q4 can also be realized, as a module applicable as the semiconductor device of the power module according to eighth to fourteenth embodiments.

Reference numeral P denotes a positive side power input terminal electrode, reference numeral N denotes a negative side power input terminal electrode, and reference numeral O denotes an output terminal electrode.

The semiconductor devices (Q2 and Q5) and semiconductor devices (Q3 and Q6) applicable to the PM 2 according to the twelfth embodiment can also be similarly realized, shown in FIG. 69.

(Device Structure)

FIG. 31 shows a schematic cross-sectional structure of an SiC MOSFET 130A including a source pad electrode SP and a gate pad electrode GP, which is an example of the semiconductor devices Q1 and Q4 applicable to the PMs according to the eighth to fourteenth embodiments.

As shown in FIG. 31, the SiC MOSFET 130A includes: a semiconductor layer 31 composed by including an n− type high resistivity layer; a p body region 32 formed on a front surface side of the semiconductor layer 32; a source region 33 formed on a front side surface of the p body region 32; a gate insulating film 33 disposed on a front side surface of the semiconductor layer 31 between the p body regions 32S; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

The gate pad electrode GP is connected to the gate electrode 35 disposed on the gate insulating film 34, and the source pad electrode SP is connected to the source electrode 36 connected to the source region 33 and the p body region 32. Moreover, as shown in FIG. 31, the gate pad electrode GP and the source pad electrode SP are disposed on an interlayer insulating film 39 for passivation which covers the surface of the SiC MOSFET 130A.

In addition, a microstructural transistor structure (not shown) may be formed in the semiconductor layer 31 below the gate pad electrode GP and the source pad electrode SP.

Furthermore, as shown in FIG. 31, the source pad electrode SP may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 31, the SiC MOSFET 130A may be composed by including a trench-gate type n channel vertical SiC-TMOSFET, etc., shown in FIG. 34 mentioned below.

Alternatively, a GaN-based FET etc. instead of the SiC-based MOSFET can also be adopted to the semiconductor device which can be applied to the PMs according to the eighth to fourteenth embodiments.

The semiconductor devices (Q2, Q5) and (Q3, Q6) applicable to the PMs according to the eighth to fourteenth embodiments can also be similarly realized.

Furthermore, a wide-bandgap type semiconductor of which the bandgap energy is from 1.1 eV to 8 eV, for example, can be used for the semiconductor devices Q1 to Q9 applicable to the PMs according to the eighth to fourteenth embodiments.

Similarly, FIG. 32 shows a schematic cross-sectional structure of an IGBT 130B including an emitter pad electrode EP and a gate pad electrode GP, which is an example of the semiconductor devices (Q1, Q4) applicable to the PMs according to the eighth to fourteenth embodiments.

As shown in FIG. 32, the IGBT 130B includes: a semiconductor layer 31 composed by including an n− type high resistivity layer; a p body region 32 formed on a front surface side of the semiconductor layer 32; an emitter region 33E formed on a front side surface of the p body region 32; a gate insulating film 33 disposed on a front side surface of the semiconductor layer 31 between the p body regions 32S; a gate electrode 35 disposed on the gate insulating film 34; an emitter electrode 36E connected to the emitter region 33E and the p body region 32; a p+ collector region 37P disposed on aback side surface opposite to the surface of the semiconductor layer 31; and a collector electrode 38 connected to the p+ collector region 37P.

The gate pad electrode GP is connected to the gate electrode 35 disposed on the gate insulating film 34, and the emitter pad electrode EP is connected to the emitter electrode 36E connected to the emitter region 33E and the p body region 32. Moreover, as shown in FIG. 32, the gate pad electrode GP and the emitter pad electrode EP are disposed on an interlayer insulating film 39 for passivation which covers the surface of IDBT 130B.

In addition, a microstructural IGBT structure (not shown) may be formed in the semiconductor layer 31 below the gate pad electrode GP and the emitter pad electrode EP.

Furthermore, as shown in FIG. 32, the emitter pad electrode EP may be disposed to be extended onto the interlayer insulating film 39 for passivation, also in the IGBT structure of the center portion.

In FIG. 32, although the IGBT 130B is composed by including a planar-gate-type n channel vertical IGBT, the IGBT 130B may be composed by including a trench-gate-type n channel vertical IGBT, etc.

The semiconductor devices (Q2, Q5) and (Q3, Q6) applicable to the PMs according to the eighth to fourteenth embodiments can also be similarly realized.

GaN-based power devices, e.g. SiC-based power devices, e.g. SiC DI MOSFET or SiC T MOSFET, or a GaN-based high electron mobility transistor (HEMT), can be applied as the semiconductor devices Q1 to Q6. In some instances, power devices, e.g. Si based MOSFETs and IGBT, are also applicable thereto.

—SiC DIMOSFET—

FIG. 33 shows a schematic cross-sectional structure of an SiC DIMOSFET 130D, which is an example of a semiconductor device which can be applied to the PMs according to the eighth to fourteenth embodiments.

As shown in FIG. 33, the SiC DIMOSFET 130D includes: a semiconductor layer 31 composed by including an n− type high resistivity layer; a p body region 32 formed on a front surface side of the semiconductor layer 32; an n+ source region 33 formed on a front side surface of the p body region 32; a gate insulating film 33 disposed on a front side surface of the semiconductor layer 31 between the p body regions 32S; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

In the SiC DIMOSFET 130D shown in FIG. 33, the p body region 32 and the n+ source region 33 formed on the front side surface of the p body region 32 are formed with double ion implantation (DII), and the source pad electrode SP is connected to the source region 33 and the source electrode 36 connected to the p body region 32.

Moreover, a gate pad electrode GP (not shown) is connected to the gate electrode 35 disposed on the gate insulating film 34. Moreover, as shown in FIG. 33, the gate pad electrode GP and the source pad electrode SP are disposed on an interlayer insulating film 39 for passivation which covers the surface of the SiC DIMOSFET 130D.

As shown in FIG. 33, in the SiC DIMOSFET, since a depletion layer as shown with the dashed lines is formed in the semiconductor layer 31 composed of a n− type high resistivity layer inserted into the p body regions 32, channel resistance $R_{JFET}$ accompanying the junction type FET (JFET) effect is formed. Moreover, as shown in FIG. 32, body diodes BD are respectively formed between the p body regions 32 and the semiconductor layers 31.

—SiC TMOSFET—

FIG. 34 shows a schematic cross-sectional structure of an SiC TMOSFET, which is an example of a semiconductor device which can be applied to the PMs according to the eighth to fourteenth embodiments.

As shown in FIG. 34, the SiC TMOSFET 130C includes: a semiconductor layer 31 composed by including an n layer; a p body region 32 formed on a front surface side of the semiconductor layer 31N; an n+ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n+ drain region 37 disposed on a back side surface opposite to the surface of the semiconductor layer 31N; and a drain electrode 38 connected to the n+ type drain area 37.

In FIG. 34, a trench gate electrode 35TG passing through the p body region 32 is formed in the trench formed up to the semiconductor layer 31N via the gate insulating film 34 and the interlayer insulating films 39U and 39B; and the source pad electrode SP is connected to the source region 33 and the source electrode 36 connected to the p body region 32.

Moreover, a gate pad electrode GP (not shown) is connected to the trench gate electrode 35TG disposed on the gate insulating film 34. Moreover, as shown in FIG. 34, the gate pad electrode GP and the source pad electrode SP are disposed on an interlayer insulating film 39U for passivation which covers the surface of the SiC TMOSFET 130C.

In the SiC TMOSFET 130C, channel resistance $R_{JFET}$ accompanying the junction type FET (JFET) effect as the SiC DIMOSFET 130D is not formed. Moreover, body diodes BD are respectively formed between the p body regions 32 and the semiconductor layers 31N, in the same manner as FIG. 33.

Example of Application

FIG. 35 shows an example of a circuit configuration in which the SiC MOSFET is applied as a semiconductor device, and a snubber capacitor C is connected between the power terminal PL and the earth terminal (ground terminal) NL, in a three-phase AC inverter 40A composed using the PMs according to the eighth to fourteenth embodiments.

Similarly, a three-phase AC inverter (not shown) in which a snubber capacitor C is connected between the power terminal PL and the earth terminal (ground terminal) NL can also be realized by applying the IGBT as the semiconductor device.

Since a switching speed of the SiC MOSFET or IGBT is fast if the PM is connected to the power E and then a switching operation is executed, large surge voltage Ldi/dt is produced due to an inductance L which the connection line has. For example, the surge voltage Ldi/dt is expressed as follows: Ldi/dt=3×10⁹ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. The snubber capacitor C connected between the power terminal PL and the ground terminal NL is formed for the purpose of reducing a value of the inductance L which affects the volume of the surge voltage Ldi/dt.

Concrete Example

Next, there will now be explained the three-phase AC inverter 42A composed using the PMs according to the eighth to fourteenth embodiments to which the SiC MOSFET is applied as the semiconductor device, with reference to FIG. 36.

As shown in FIG. 36, the three-phase AC inverter 42A includes: a power module unit 130 connected to a gate driver (GD) 180; a three-phase AC motor unit 51; a power supply or storage battery (E) 53; and a converter 55. U-phase, V-phase, and W-phase inverters are respectively connected to the three-phase AC motor unit 54 so as to correspond to U phase, V phase, and W phase of the three-phase AC motor unit 51, in the power module unit 130.

The power module unit 130 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. A control signal from the GD 180 is supplied to a gate of each of the SiC MOSFETs Q1 and Q4, SiC MOSFETs Q2 and Q5, and the SiC MOSFETs Q3 and Q6. Moreover, flywheel diodes DI1 to DI6 are respectively connected reversely in parallel between the source and the drain of the SiC MOSFETs Q1 to Q6.

Although not shown, a three-phase AC inverter composed by using the power module according to the eighth to fourteenth embodiments can also be realized by applying the IGBT as the semiconductor device.

As explained above, according to the eighth to fourteenth embodiments, there can be realized: the PM capable of reducing an influence of thermal stress to the wire connection due to operations at high temperatures and capable of improving the heat resistance and reliability with respect to the wire connection; and a fabrication method od such a PM.

In the PMs according to the eighth to fourteenth embodiments, power modules, e.g. a three power terminal electrodes structure, can also be adopted, as a module applicable as the semiconductor device, for example.

As the semiconductor device applicable to the PMs according to the eighth to fourteenth embodiments, not only SiC based power devices but also wide-bandgap type power devices, e.g. GaN-based or Si-based power device, can be adopted.

The PMs according to eighth to fourteenth embodiments are not limited to be applied to the 1-in-1 module, the 2-in-1 module, or the 6-in-1 module, each of the PMs can be applied to a 4-in-1 module type PM, a 7-in-1 module type PM, a 8-in-1 module type PM, a 12-in-1 module type PM, a 14-in-1 module type PM, etc.

Fifteenth Embodiment (Basic Configuration)

Figure 72A:
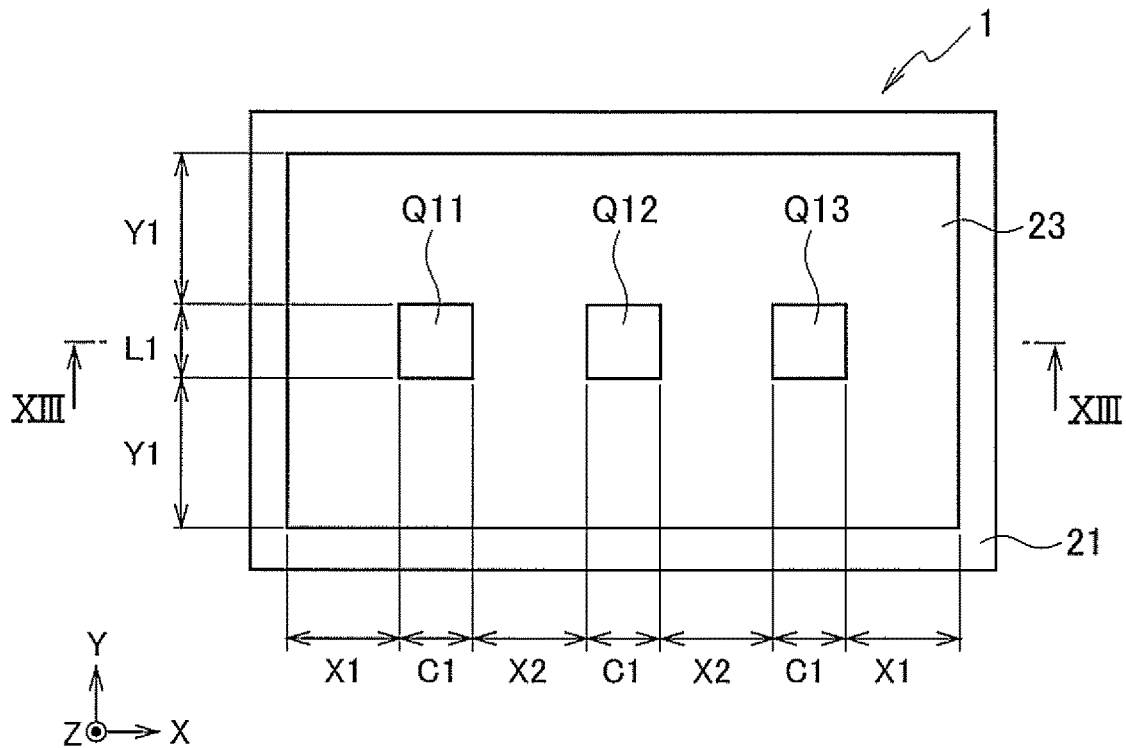
FIG. 72A is a schematic planar pattern configuration diagram showing a schematic structure of a power module according to a fifteenth embodiment.
Figure 72B:
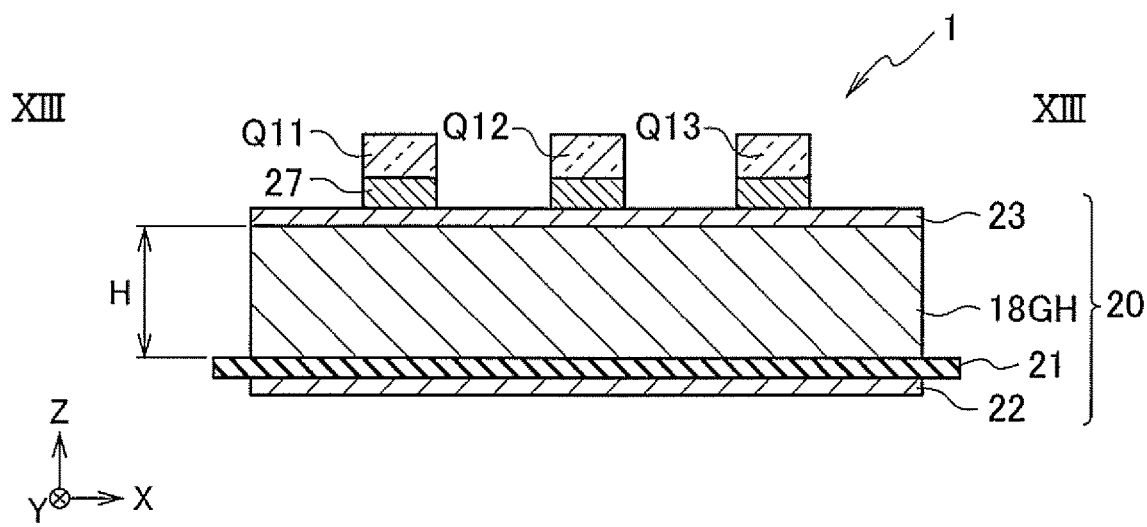
FIG. 72B is a schematic cross-sectional structure diagram taken in the line XIII-XIII of FIG. 72A.

FIG. 72A shows a schematic planar pattern configuration of a Power Module (PM) 1 according to fifteenth embodiment, and FIG. 72B shows a schematic cross-sectional structure taken in the line XIII-XIII of FIG. 72A. FIGS. 72A and 72B show an example of mounting three semiconductor devices (modules) Q11, Q12, and Q13, for example, as an example of a plurality of the semiconductor devices (power transistor devices) Q.

As shown in FIG. 72B, the PM 1 according to fifteenth embodiment includes: an insulation layer 21; a graphite substrate 18GH disposed on the insulation layer 21, the graphite substrate 18GH provided with an anisotropic thermal conductivity; and semiconductor devices Q11, Q12, and Q13 disposed on the graphite substrate 18GH, the semiconductor devices Q11, Q12, and Q13 generating heat during operations.

The graphite substrate 18GH includes a surface electrode layer 23 of the graphite substrate on a front side surface thereof. More specifically, the graphite substrate 18GH may include a combined material of which one surface is bonded to a metal.

Each of the semiconductor devices Q11, Q12, and Q13 may be bonded to the surface electrode layer 23 via an Ag fired layer 27.

A high coefficient of thermal conductivity is orientated in a thickness direction of graphite of the graphite substrate 18GH.

The insulation layer 21 may include a ceramics substrate. A copper foil layer 22 may be disposed on a back side surface of the ceramics substrate. More specifically, the insulation layer 21 may include a combined material between a ceramics substrate and a metal.

Modified Example 1

Figure 73A:
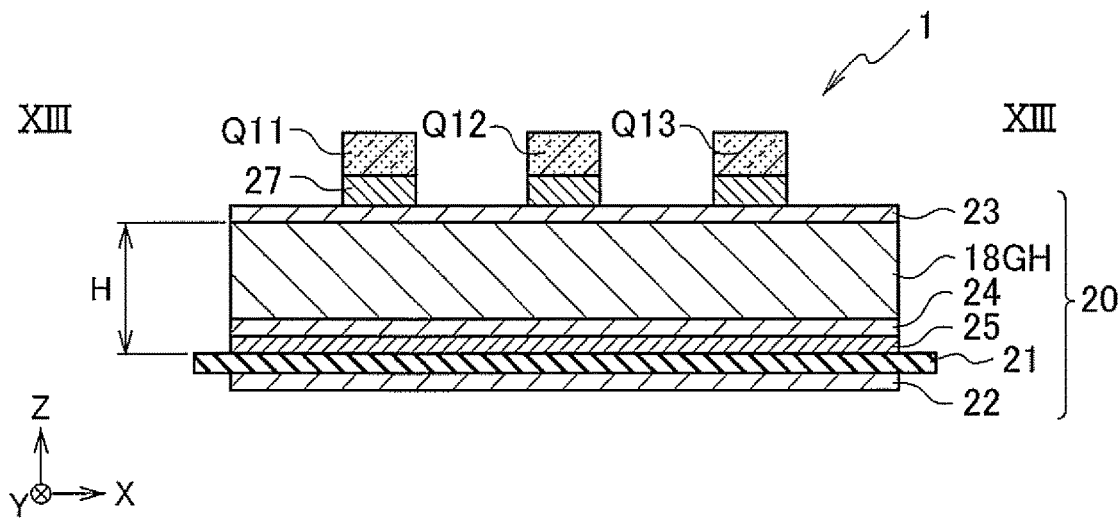
FIG. 73A is a schematic cross-sectional structure diagram taken in the line XIII-XIII of a schematic planar pattern configuration which is similar to FIG. 72A, in a power module according to a modified example 1 of the fifteenth embodiment.

FIG. 73A shows a schematic cross-sectional structure taken in the line XIII-XIII similar to the schematic planar pattern configuration shown in FIG. 72A, in the PM 1 according to a modified example 1 of fifteenth embodiment. FIG. 73A shows an example of mounting three semiconductor devices (modules) Q11, Q12, and Q13, for example, as an example of a plurality of the semiconductor devices (power transistor devices) Q.

As shown in FIG. 73A, the PM 1 according to the modified example 1 of the fifteenth embodiment includes: an insulation layer 21; a graphite substrate 18GH disposed on the insulation layer 21; and semiconductor devices Q11, Q12, and Q13 disposed on the graphite substrate 18GH.

The graphite substrate 18GH includes a surface electrode layer 23 of the graphite substrate on a front side surface thereof. Moreover, the graphite substrate 18GH includes a back electrode layer 24 of the graphite substrate on aback side surface thereof. More specifically, the graphite substrate 18GH may include a combined material of which both of a front side surface and a back side surface are respectively bonded to metals.

Each of the semiconductor devices Q11, Q12, and Q13 may be bonded to the surface electrode layer 23 via an Ag fired layer 27.

A high coefficient of thermal conductivity is orientated in a thickness direction of graphite of the graphite substrate 18GH.

Moreover, as shown in FIG. 73A, the insulation layer 21 and the graphite substrate 18GH are contacted with each other via a thermal conduction layer 25.

The insulation layer 21 may include a ceramics substrate. Moreover, the ceramics substrate may include a back surface electrode layer 22 of the ceramics substrate on a back side surface thereof. More specifically, the insulation layer 21 may include a combined material between a ceramics substrate and a metal.

The thermal conduction layer 25 may include any one of a thermal conduction sheet layer, a soldering layer or an Ag fired layer.

The ceramics substrate may include any one of an $Al_2O_3$, $Si_3N_4$ or AlN.

Modified Example 2

Figure 73B:
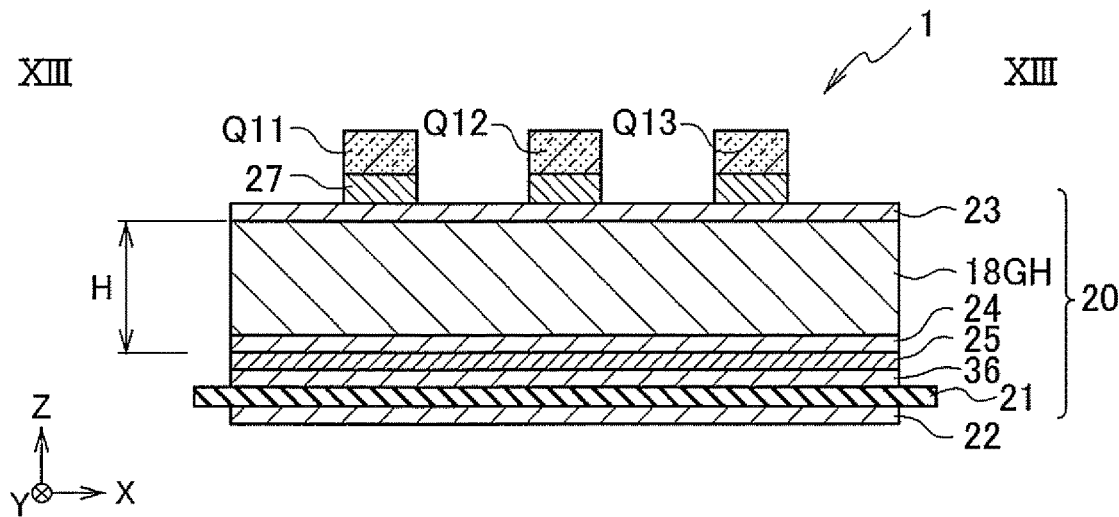
FIG. 73B is a schematic cross-sectional structure diagram taken in the line XIII-XIII of the schematic planar pattern configuration which is similar to FIG. 72A, in a power module according to a modified example 2 of the fifteenth embodiment.

FIG. 73B shows a schematic cross-sectional structure taken in the line XIII-XIII similar to the schematic planar pattern configuration shown in FIG. 72A, in the PM 1 according to a modified example 2 of fifteenth embodiment. FIG. 73B shows an example of mounting three semiconductor devices (modules) Q11, Q12, and Q13, for example, as an example of a plurality of the semiconductor devices (power transistor devices) Q.

As shown in FIG. 73B, the PM 1 according to the modified example 2 of the fifteenth embodiment includes: an insulation layer 21; a graphite substrate 18GH disposed on the insulation layer 21; and semiconductor devices Q11, Q12, and Q13 disposed on the graphite substrate 18GH.

The graphite substrate 18GH includes a surface electrode layer 23 of the graphite substrate on a front side surface thereof. Moreover, the graphite substrate 18GH includes a back electrode layer 24 of the graphite substrate on aback side surface thereof. More specifically, the graphite substrate 18GH may include a combined material of which both of a front side surface and a back side surface are respectively bonded to metals.

Each of the semiconductor devices Q11, Q12, and Q13 may be bonded to the surface electrode layer 23 via an Ag fired layer 27.

A high coefficient of thermal conductivity is orientated in a thickness direction of graphite of the graphite substrate 18GH.

Moreover, as shown in FIG. 73B, the insulation layer 21 and the graphite substrate 18GH are contacted with each other via a thermal conduction layer 25.

The insulation layer 21 may include a ceramics substrate. Moreover, a surface electrode layer 36 of the ceramics substrate may be disposed on a surface of the ceramics substrate, and a back electrode layer 22 of the ceramics substrate may be disposed on a back side surface thereof. As a result, the insulation layer 21 may include a DBC substrate including a combined material between a ceramics substrate and a metal.

The thermal conduction layer 25 may include any one of a thermal conduction sheet layer, a soldering layer or an Ag fired layer.

The ceramics substrate may include anyone of an $Al_2O_3$, $Si_3N_4$ or AlN.

The PM 1 according to the fifteenth embodiment and its modified examples 1 and 2 includes a bonding structure between the graphite substrate 18GH and the insulation layer (ceramics substrate).

The PM 1 according to the fifteenth embodiment and its modified examples 1 and 2 may include a power module structure using a Direct Bonding Copper (DBC) substrate in which a low cost ceramics substrate, e.g., $Al_2O_3$, is bonded to the graphite plate. Moreover, the bonding structure may include a vertical structure to be bonded with a carbon sheet, a soldering layer, or an Ag fired layer. Thus, a low cost substrate structure capable of securing reliability can be obtained. Moreover, the bonding structure may include a vertical structure of bonding a ceramics substrate of $Al_2O_3$ to the graphite plate by brazing etc.

Comparative Example 1 of Fifteenth Embodiment

Figure 74A:
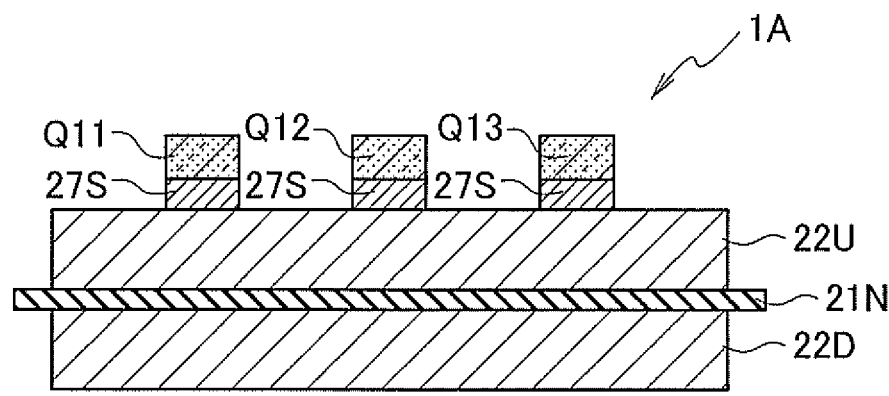
FIG. 74A is a schematic cross-sectional structure diagram of a power module according to a comparative example 1 of the fifteenth embodiment.

FIG. 74A shows a schematic cross-sectional structure of a PM 1A according to a comparative example 1 of the fifteenth embodiment. FIG. 74A shows an example of mounting three semiconductor devices (modules) Q11, Q12, and Q13, for example, as an example of a plurality of the semiconductor devices (power transistor devices) Q.

As shown in FIG. 74A, the PM 1A according to the comparative example 1 of the fifteenth embodiment includes: an insulation layer 21N; a thick copper layer 22U disposed on a front side surface of the insulation layer 21N; a thick copper layer 22D disposed on a back side surface of the insulation layer 21N; and semiconductor devices Q11, Q12, and Q13 disposed via a soldering layer 27S on the thick copper layer 22U. A thick copper insulating substrate is composed consequently by including the thick copper layer 22U/insulation layer 21N/thick copper layer 22D. As the insulation layer 21N, an SiN-based ceramics layer etc. can be applied, for example.

Comparative Example 2 of Fifteenth Embodiment

Figure 74B:
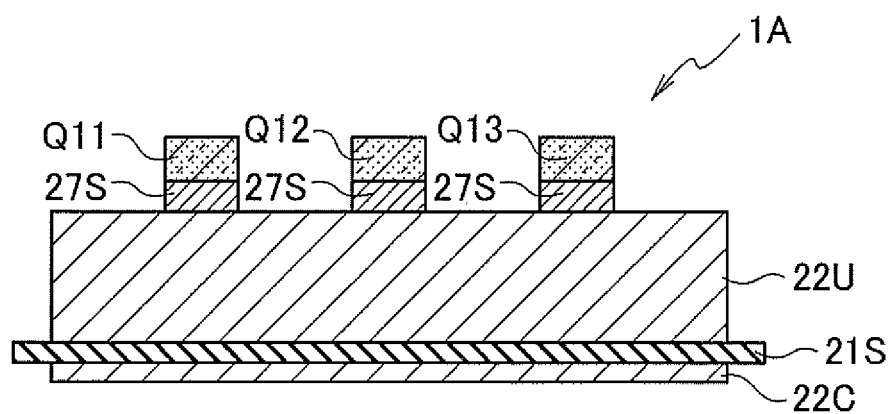
FIG. 74B is a schematic cross-sectional structure diagram of a power module according to a comparative example 2 of the fifteenth embodiment.

FIG. 74B shows a schematic cross-sectional structure of a PM 1A according to a comparative example 2 of the fifteenth embodiment. FIG. 74B shows an example of mounting three semiconductor devices (modules) Q11, Q12, and Q13, for example, as an example of a plurality of the semiconductor devices (power transistor devices) Q, in the same manner as an example shown in FIG. 74A.

As shown in FIG. 74B, the PM 1A according to the comparative example 2 of the fifteenth embodiment includes: an insulation layer 21S; a thick copper layer 22U disposed on a front side surface of the insulation layer 21S; a copper foil layer 22C disposed on aback side surface of the insulation layer 21S; and semiconductor devices Q11, Q12, and Q13 disposed via a soldering layer 27S on the thick copper layer 22U. A thick copper insulating sheet substrate including the thick copper and the insulating sheet is composed consequently by including the thick copper layer 22U/insulation layer 21S/copper foil layer 22C. As the insulation layer 21S, a semi-cured material sheet layer including an epoxy based resin or polyimide based resin, as a base resin, can be applied, for example.

(Thermal Resistance Simulation)

In a thermal resistance simulation, as boundary conditions, a back-side surface temperature is 65° C., a coefficient of heat transfer is 5000 ($W/m^2K$), and a calorific value of the SiC semiconductor device Q is 100 W.

It is assumed that the back-side surface temperature of 65° C. is to be kept at 65° C. with respect to a lower-layer surface of a cooling apparatus 28, as the boundary conditions. It assumed that it is a water cooled type and the coefficient of heat transfer is 5000 ($W/m^2K$). More specifically, a temperature of cooling water is kept at 65° C., in the cooling apparatus 28 made of aluminum. A coefficient of heat transfer is ease of being transferred of heat which passes through a contact surface between two substances, and the coefficient of heat transfer is different from a thermal conductivity.

Thermal resistance Rthjw (° C./W) indicates a thermal resistance between Tj (junction temperature) of the SiC semiconductor device Q and Tw (temperature of cooling water).

Fifteenth Embodiment

Figure 75A:
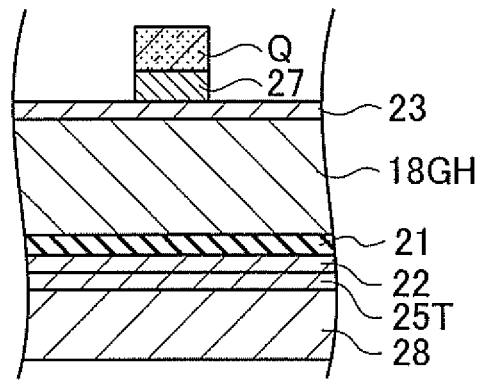
FIG. 75A shows a schematic cross-sectional structure applied to a thermal resistance simulation, in an example of the power module according to the fifteenth embodiment.

FIG. 75A shows a schematic cross-sectional structure applied to a thermal resistance simulation of the PM 1 according to the fifteenth embodiment, and a thermal conduction layer 25T and a cooling apparatus 28 are added thereto. Material/thickness of each layer to be applied to the thermal resistance simulation is as follows: Semiconductor device Q (SiC/0.25 mm), Ag fired layer 27 (Ag/0.03 mm), Surface electrode layer 23 (Cu/1 mm) of graphite substrate 18GH, Graphite substrate 18GH (graphite/3 mm), Ceramics substrate 21 ($Al_2O_3$/0.32 mm), Back electrode layer 22 (Cu/0.5 mm) of ceramics substrate 21, Thermal conduction layer 25T (carbon sheet/0.2 mm), and Cooling apparatus 28 (Al/1 mm).

In an example of applying a ceramics substrate ($Si_3N_4$) as the insulation layer 21, the material/thickness of each layer is as follows: Semiconductor device Q (SiC/0.25 mm), Ag fired layer 27 (Ag/0.08 mm), Surface electrode layer 23 (Cu/1 mm) of graphite substrate 18GH, Graphite substrate 18GH (graphite/3 mm), Ceramics substrate 21 ($Si_3N_4$/0.32 mm), Back electrode layer 22 (Cu/0.5 mm) of ceramics substrate 21, Thermal conduction layer 25T (carbon sheet/0.2 mm), and Cooling apparatus 28 (Al/1 mm).

Modified Example 1

Figure 75B:
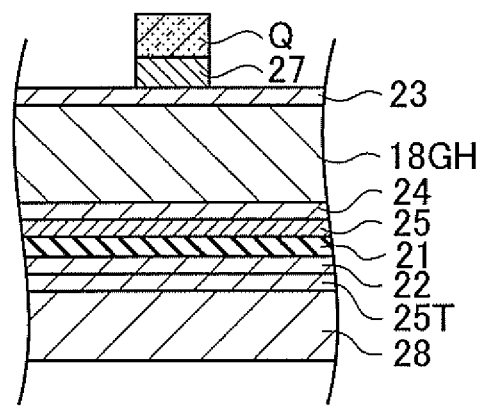
FIG. 75B shows a schematic cross-sectional structure applied to the thermal resistance simulation, in an example of a modified example 1 of the power module according to the fifteenth embodiment.

FIG. 75B shows a schematic cross-sectional structure applied to a thermal resistance simulation of the PM 1 according to a modified example 1 of the fifteenth embodiment, and a thermal conduction layer 25T and a cooling apparatus 28 are added thereto. Material/thickness of each layer to be applied to the thermal resistance simulation is as follows: Semiconductor device Q (SiC/0.25 mm), Ag fired layer 27 (Ag/0.03 mm), Surface electrode layer 23 (Cu/0.7 mm) of graphite substrate 18GH, Graphite substrate 18GH (graphite/3 mm), Back electrode layer 24 (Cu/0.7 mm) of graphite substrate 18GH, Thermal conduction layer 25 (carbon sheet/0.2 mm), Ceramics substrate 21 ($Al_2O_3$/0.32 mm), Back electrode layer 22 (Cu/0.1 mm) of ceramics substrate 21, Thermal conduction layer 25T (carbon sheet/0.2 mm), and Cooling apparatus (Al/1 mm).

Modified Example 2

Figure 75C:
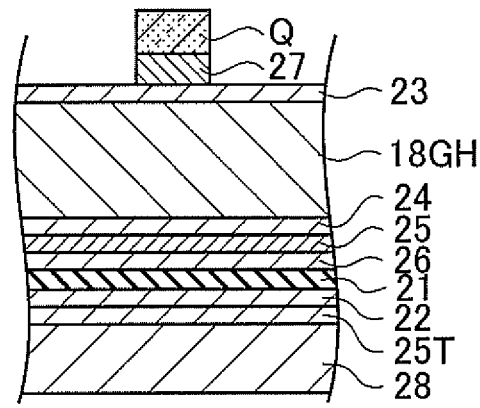
FIG. 75C shows a schematic cross-sectional structure applied to the thermal resistance simulation, in an example of a modified example 2 of the power module according to the fifteenth embodiment.

FIG. 75C shows a schematic cross-sectional structure applied to a thermal resistance simulation of the PM 1 according to a modified example 2 of the fifteenth embodiment, and a thermal conduction layer 25T and a cooling apparatus 28 are added thereto. Material/thickness of each layer to be applied to the thermal resistance simulation is as follows: Semiconductor device Q (SiC/0.25 mm), Ag fired layer 27 (Ag/0.03 mm), Surface electrode layer 23 (Cu/0.7 mm) of graphite substrate 18GH, Graphite substrate 18GH (graphite/3 mm), Back electrode layer 24 (Cu/0.7 mm) of graphite substrate 18GH, Thermal conduction layer 25 (carbon sheet/0.2 mm), Surface electrode layer 36 (Cu/0.1 mm) of ceramics substrate 21, Ceramics substrate 21 ($Al_2O_3$/0.32 mm), Back electrode layer 22 (Cu/0.1 mm) of ceramics substrate 21, Thermal conduction layer 25T (carbon sheet/0.2 mm), and Cooling apparatus 28 (Al/1 mm).

Comparative Example 1 of Fifteenth Embodiment

Figure 76A:
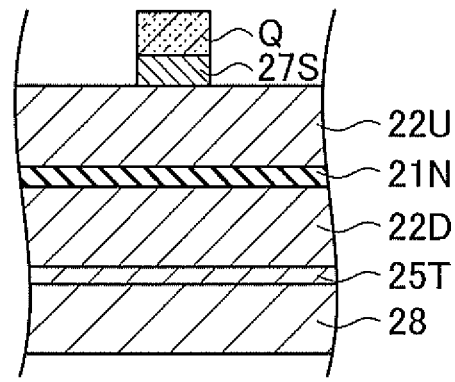
FIG. 76A shows a schematic cross-sectional structure applied to the thermal resistance simulation, in an example of the modified example 1 of the power module according to the fifteenth embodiment.

FIG. 76A shows a schematic cross-sectional structure applied to a thermal resistance simulation of the PM 1A according to the comparative example 1 of the fifteenth embodiment. Material/thickness of each layer to be applied to the thermal resistance simulation is as follows: Semiconductor device Q (SiC/0.25 mm), Soldering layer 27S (solder/0.15 mm), Thick copper layer 22U (Cu/1.5 mm), Insulation layer 21N ($Si_3N_4$/0.32 mm), Thick copper layer 22D (Cu/1.5 mm), Thermal conduction layer 25T (carbon sheet/0.2 mm), and Cooling apparatus 28 (Al/1 mm).

Comparative Example 2 of Fifteenth Embodiment

Figure 76B:
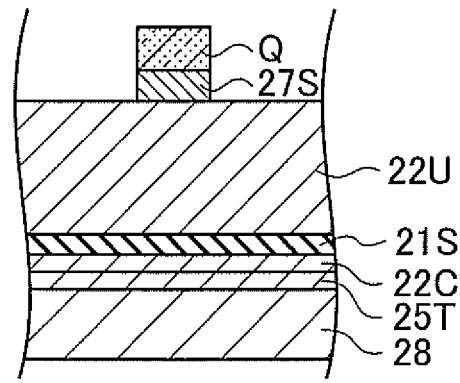
FIG. 76B shows a schematic cross-sectional structure applied to the thermal resistance simulation, in an example of the modified example 2 of the power module according to the fifteenth embodiment.

FIG. 76B shows a schematic cross-sectional structure applied to a thermal resistance simulation of the PM 1A according to the comparative example 2 of the fifteenth embodiment. Material/thickness of each layer to be applied to the thermal resistance simulation is as follows: Semiconductor device Q (SiC/0.25 mm), Soldering layer 27S (solder/0.15 mm), Thick copper layer 22U (Cu/3 mm), Insulation layer 21S (resin sheet/0.1 mm), Copper foil layer 22C (Cu/0.3 mm), Thermal conduction layer 25T (carbon sheet/0.2 mm), and Cooling apparatus 28 (Al/1 mm).
(Comparison Result of Thermal Resistance Simulation)

Figure 77:
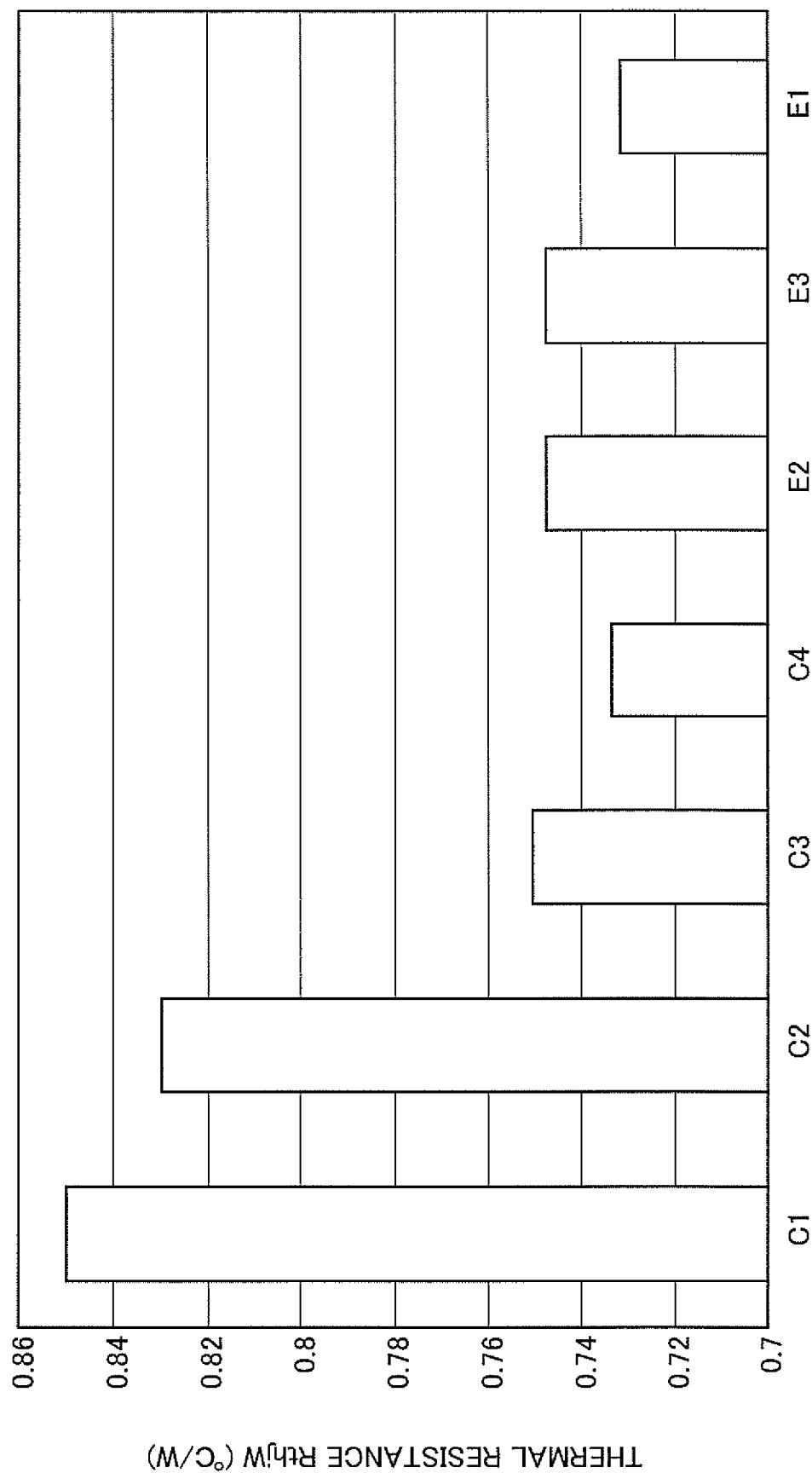
FIG. 77 shows a comparison result of the thermal resistance simulation between the power modules according to the fifteenth embodiment (E1) and its modified examples 1 and 2 (E2 and E3) and the power module according to the comparative examples 1 to 4 (C1 to C4) of the fifteenth embodiment.

FIG. 77 shows a comparison result of the thermal resistance simulation of PM 1 according to the fifteenth embodiment and its modified examples 1 and 2 and the PM 1A according to comparative examples 1 to 4 of the fifteenth embodiment.

Reference numeral C1 of FIG. 77 corresponds to an example of applying the soldering layer 27S as a bonding layer under chip, as shown in FIG. 76A, in the comparative example 1 of the fifteenth embodiment.

Reference numeral C2 of FIG. 77 corresponds to an example of applying the soldering layer 27S as a bonding layer under chip, as shown in FIG. 76B, in the comparative example 2 of the fifteenth embodiment.

Reference numeral C3 of FIG. 77 indicates a comparative example 3 of the fifteenth embodiment, corresponding to an example of applying the Ag fired layer 27 as a bonding layer under chip in the comparative example 1 of the fifteenth embodiment.

Reference numeral C4 of FIG. 77 indicates a comparative example 4 of the fifteenth embodiment, corresponding to an example of applying the Ag fired layer 27 as a bonding layer under chip in the comparative example 2 of the fifteenth embodiment.

According to the thermal resistance simulation result of the PM 1A according to the comparative examples 1 to 4 of the fifteenth embodiment, values of the thermal resistance Rthjw (° C./W) of approximately 0.85 (° C./W)/0.83 (° C./W)/0.75 (° C./W)/0.73 (° C./W) are obtained with respects to C1/C2/C3/C4.

Reference numeral E1 of FIG. 77 corresponds to a structure example including the Cu (23)/graphite substrate (18GH)/ceramics substrate 21 ($Al_2O_3$)/Cu (22) in the fifteenth embodiment.

Reference numeral E2 of FIG. 77 corresponds to a structure example including the Cu (23)/graphite substrate (18GH)/Cu(24)/thermal conduction layer (carbon sheet: 25)/ceramics substrate 21 ($Al_2O_3$)/Cu (22) in the modified example 1 of the fifteenth embodiment.

Reference numeral E3 of FIG. 77 corresponds to a structure example including the Cu(23)/graphite substrate (18GH)/Cu(24)/thermal conduction layer (carbon sheet: 25)/Cu (36)/ceramics substrate 21 ($Al_2O_3$)/Cu (22) in the modified example 2 of the fifteenth embodiment.

According to the thermal resistance simulation result of the PM 1 according to the fifteenth embodiment and its modified examples 1 and 2, values of the thermal resistance Rthjw (° C./W) of approximately 0.73 (° C./W)/0.74 (° C./W)/0.74 (° C./W) are obtained with respects to E1/E2/E3.

In the PM 1A according to the comparative examples 1 and 2 of the fifteenth embodiment, relatively high thermal resistances are obtained, as a result of the thermal resistance simulation, as compared with the PM 1 according to the comparative examples 3 and 4 (the case of the under portion of the chip being bonded with Ag) of the fifteenth embodiment, or the fifteenth embodiment and its modified examples 1 and 2.

On the other hand, in the comparative examples 3 and 4 (the case of the under portion of the chip being bonded with Ag) of the fifteenth embodiment, the same degree of the thermal resistance simulation results as those of the PM 1 according to the fifteenth embodiment and its modified examples 1 and 2 are obtained. However, reliability is reduced in the comparative examples 3 and 4 of the fifteenth embodiment of replacing the soldering layer 27S of the PM 1A according to the comparative examples 1 and 2 of the fifteenth embodiment by the Ag fired layer 27 (the case of the under portion of the chip being bonded with Ag). This reason is as follows.

In the case of the structures of the comparative examples 1 to 4 of the fifteenth embodiment, since the copper plate of which the thickness is equal to or greater than 2 mm is used for the substrate, a thermal stress is applied to the soldering layer 27S and the Ag fired layer 27 which are bonded portions due to an environmental temperature or a temperature variation by heat generated from a device. In this case, the coefficients of linear thermal expansion between the copper (Cu) and the SiC (rate of expansion of materials with respect to a temperature variation) are greatly different from each other (the coefficient of linear thermal expansion of copper is approximately 16.5 ppm/K, and the coefficient of linear thermal expansion of SiC is approximately 3 ppm/K, for example), thereby reducing the reliability of the PM 1A according to the comparative examples 3 and 4 of the fifteenth embodiment including the bonded portion composed of including Ag fired layer. The reason why the soldering layer is capable of securing the reliability more than the Ag fired layer is because the coefficient of elasticity is relatively low. However, the solder is not suitable for driving the SiC device at high temperatures since a melting point thereof is relatively low. The unit ppm used herein denotes $10^{-6}$. The same applies hereafter.

On the other hand, in the PM 1 according to the fifteenth embodiment and its modified examples 1 and 2 shown in FIG. 77, since the under portion of the chip is bonded with the Ag fired layer, it is possible to hold the reliability. This reason is as follows. That is, graphite has anisotropy of approximately 25.2 ppm/K in a low TC direction and approximately −0.6 ppm/K in a high TC direction, for example, and a synthetic coefficient of linear thermal expansion of the composite substrate (Cu/graphite/Cu) with copper is lower than that of copper. Furthermore, since the coefficient of elasticity of copper is 120 GPa and the coefficient of elasticity of graphite is 50 GPa (relatively softer), the thermal stress applied to the bonding portion under chip can be reduced. As a result, the reliability of the bonded portion of Ag fired body, in the PM 1 according to the fifteenth embodiment and its modified examples 1 and 2 is higher than that of the comparative examples 3 and 4 (the case of the under portion of the chip being bonded with Ag) of the fifteenth embodiment. More specifically, in the PM 1 according to the fifteenth embodiment and its modified examples 1 and 2, the thermal resistance is relatively low and therefore high reliability can be obtained.

Fifteenth Embodiment: Ceramics Substrate Dependency

Figure 78:
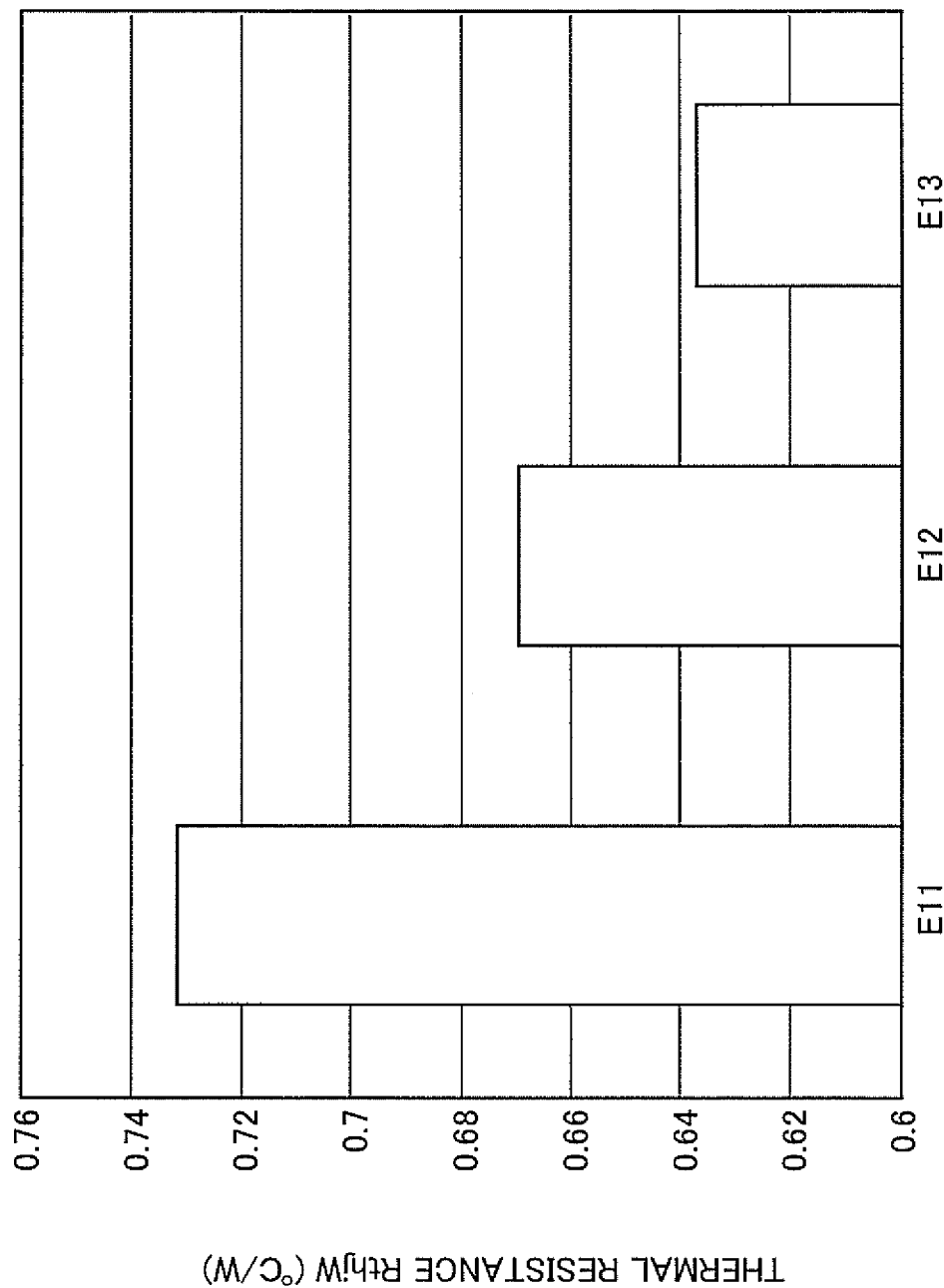
FIG. 78 shows a result of a thermal resistance simulation with a ceramics substrate ($Al_2O_3$/$Si_3N_4$/AlN), in the power module according to the fifteenth embodiment.

FIG. 78 shows a thermal resistance simulation result in the case of changing materials of the ceramics substrate 21 to $Al_2O_3/Si_3N_4/AlN$, in the PM 1 according to the fifteenth embodiment. In FIG. 78, reference numerals E11/E12/E13 correspond to an example of using $Al_2O_3/Si_3N_4/AlN$ as the ceramics substrate 21. As a result of the thermal resistance simulation, values of the thermal resistance Rthjw (° C./W) of approximately 0.73 (° C./W)/0.67 (° C./W)/0.64 (° C./W) are obtained with respects to E11/E12/E13.

In the example shown in FIG. 78, the material/thickness of each layer to be applied to the thermal resistance simulation is as follows: Semiconductor device Q (SiC/0.25 mm), Ag fired layer 27 (Ag/0.03 mm), Surface electrode layer 23 (Cu/1 mm) of graphite substrate, Graphite substrate 18GH (graphite/3 mm), Ceramics substrate 21 ($Al_2O_3/Si_3N_4/AlN/0.32$ mm), Back electrode layer 22 (Cu/1 mm) of ceramics substrate, Thermal conduction layer 25T (carbon sheet/0.2 mm), and Cooling apparatus 28 (Al/1 mm).

Modified Example 1 of Fifteenth Embodiment: Dependency of Combination Between Thermal Conduction Layer and Ceramics Substrate FIG. 79 shows a thermal resistance simulation result of a combination between the thermal conduction layer 25 (thermal conduction sheet layer/soldering layer/Ag fired layer) and the ceramics substrate 21 ($Al_2O_3/Si_3N_4/AlN$), in the PM 1 according to the modified example 1 of the fifteenth embodiment.

Figure 79:
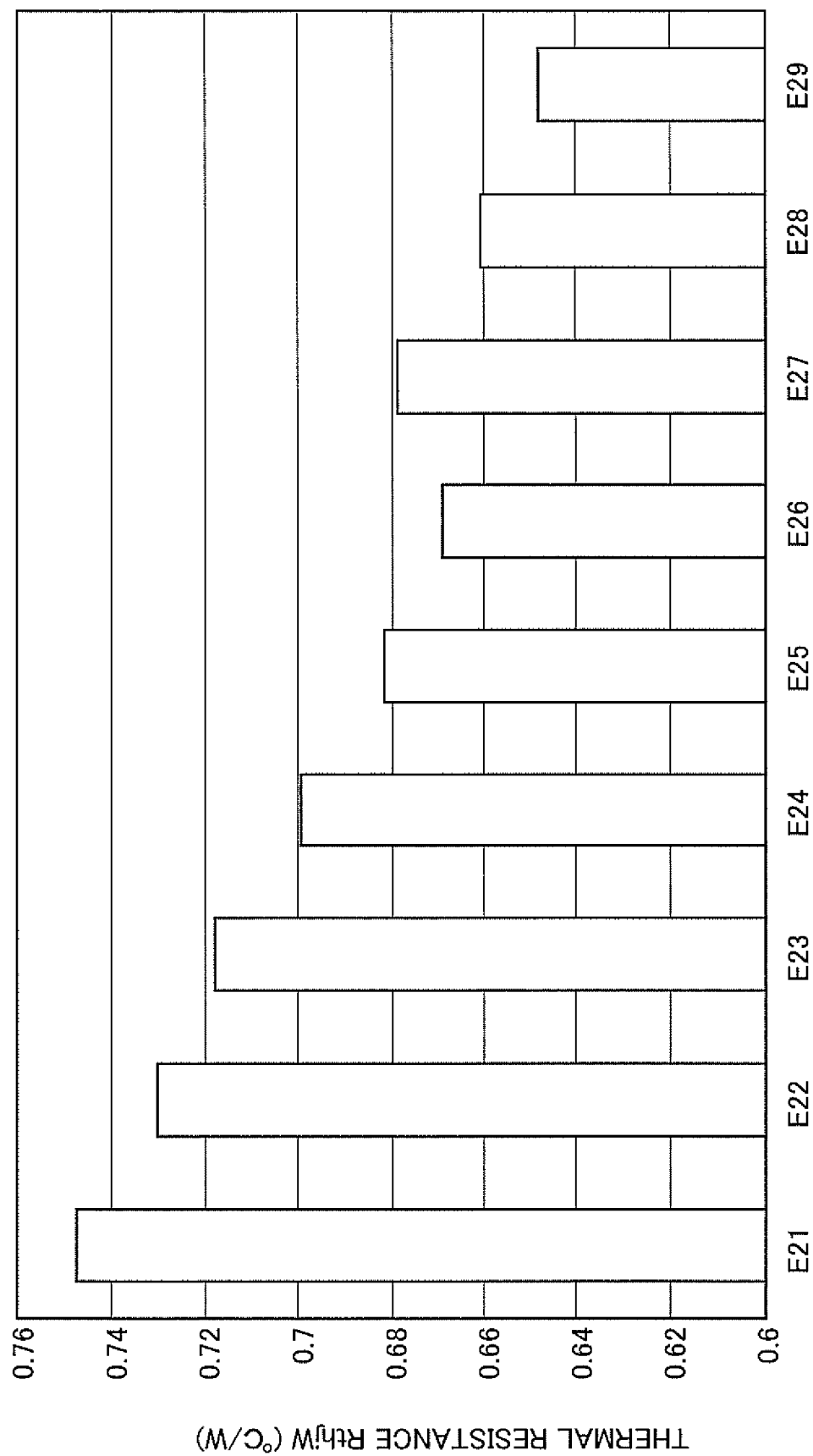
FIG. 79 shows a result of a thermal resistance simulation with a combination between a thermal conduction layer (thermal conduction sheet layer/soldering layer/Ag fired layer) and the ceramics substrate ($Al_2O_3$/$Si_3N_4$/AlN), in the power module according to the modified example 1 of the fifteenth embodiment.

Reference numeral E21 of FIG. 79 corresponds to thermal conduction sheet layer/$Al_2O_3$ as a combination of thermal conduction layer 25/ceramics substrate 21.

Reference numeral E22 of FIG. 79 corresponds to soldering layer/$Al_2O_3$ as a combination of thermal conduction layer 25/ceramics substrate 21.

Reference numeral E23 of FIG. 79 corresponds to Ag fired layer/$Al_2O_3$ as a combination of thermal conduction layer 25/ceramics substrate 21.

Reference numeral E24 of FIG. 79 corresponds to thermal conduction sheet layer/$Si_3N_4$ as a combination of thermal conduction layer 25/ceramics substrate 21.

Reference numeral E25 of FIG. 79 corresponds to soldering layer/$Si_3N_4$ as a combination of thermal conduction layer 25/ceramics substrate 21.

Reference numeral E26 of FIG. 79 corresponds to Ag fired layer/$Si_3N_4$ as a combination of thermal conduction layer 25/ceramics substrate 21.

Reference numeral E27 of FIG. 79 corresponds to thermal conduction sheet layer/AlN as a combination of thermal conduction layer 25/ceramics substrate 21.

Reference numeral E28 of FIG. 79 corresponds to soldering layer/AlN as a combination of thermal conduction layer 25/ceramics substrate 21.

Reference numeral E29 of FIG. 79 corresponds to Ag fired layer/AlN as a combination of thermal conduction layer 25/ceramics substrate 21.

In the example shown in FIG. 79, the material/thickness of each layer to be applied to the thermal resistance simulation is as follows: Semiconductor device Q (SiC/0.25 mm), Ag fired layer 27 (Ag/0.03 mm), Surface electrode layer 23 (Cu/0.8 mm) of graphite substrate 18GH, Graphite substrate 18GH (graphite/3 mm), Back electrode layer 24 (Cu/0.8 mm) of graphite substrate 18GH, Thermal conduction layer 25 (thermal conduction sheet layer/0.2 mm/soldering layer/Ag fired layer), Ceramics substrate 21 ($Al_2O_3$/0.32 mm/$Si_3N_4$/AlN), Back electrode layer 22 (Cu/0.1 mm) of ceramics substrate 21, Thermal conduction layer 25T (carbon sheet/0.2 mm), and Cooling apparatus 28 (Al/1 mm).

According to the thermal resistance simulation result of the combination between the thermal conduction layer 25 (thermal conduction sheet layer/soldering layer/Ag fired layer) and the ceramics substrate 21 ($Al_2O_3/Si_3N_4/AlN$) in the PM 1 according to the modified example 1 of the fifteenth embodiment, values of thermal resistance Rthjw (° C./W) of approximately 0.75 (° C./W)/0.73 (° C./W)/0.72 (° C./W)/0.70 (° C./W)/0.68 (° C./W)/0.67 (° C./W)/0.68 (° C./W)/0.66 (° C./W)/0.65 (° C./W) are obtained, with respect to E21/E22/E23/E24/E25/E26/E27/E28/E29.

Modified Example 2 of Fifteenth Embodiment: Dependency of Combination Between Thermal Conduction Layer and Ceramics Substrate FIG. 80 shows a result of a thermal resistance simulation with the combination of the thermal conduction layer (thermal conduction sheet layer/soldering layer/Ag fired layer) and the ceramics substrate ($Al_2O_3/Si_3N_4/AlN$), in the power module according to the modified example 2 of the fifteenth embodiment.

Figure 80:
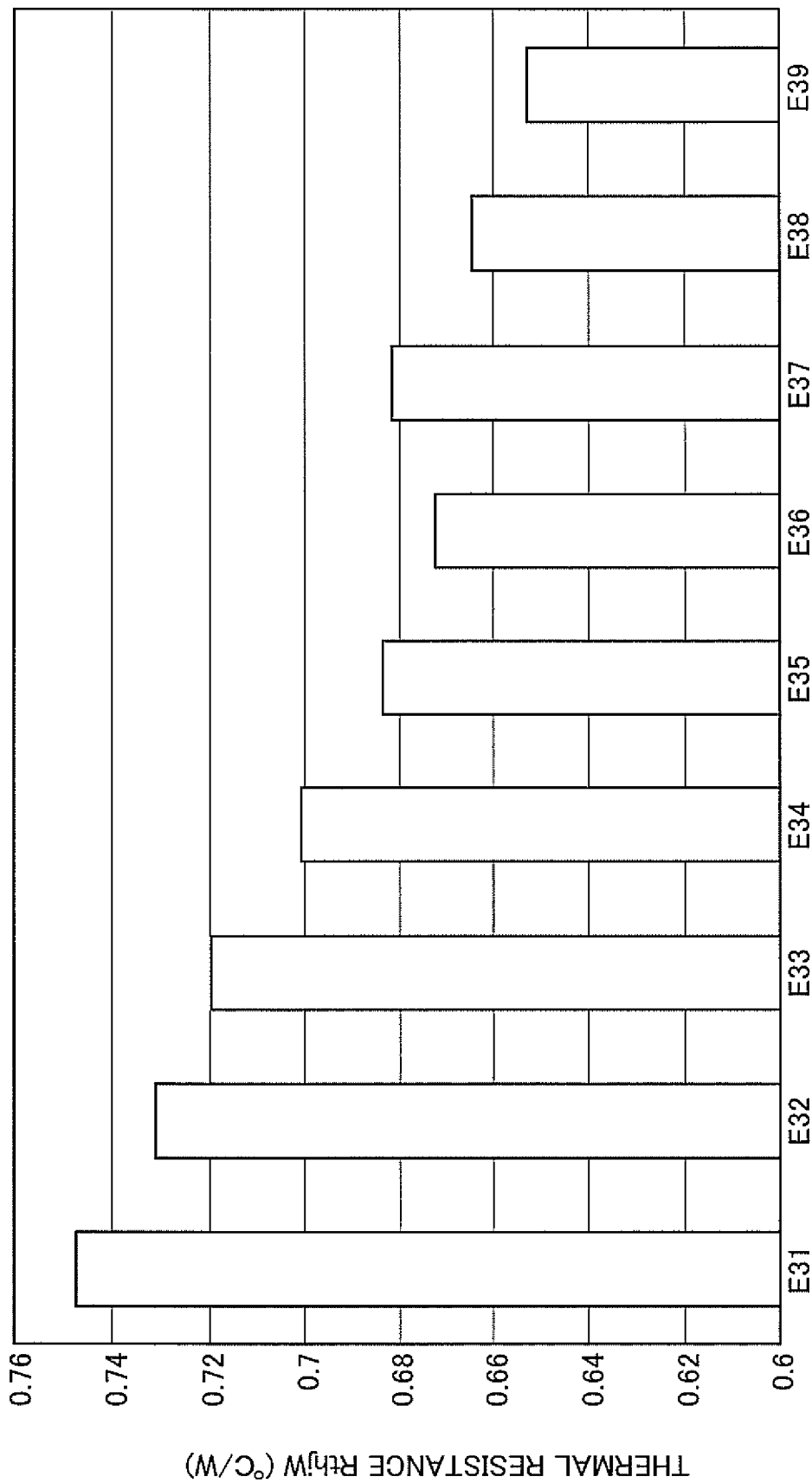
FIG. 80 shows a result of a thermal resistance simulation with the combination of the thermal conduction layer (thermal conduction sheet layer/soldering layer/Ag fired layer) and the ceramics substrate ($Al_2O_3$/$Si_3N_4$/AlN), in the power module according to the modified example 2 of the fifteenth embodiment.

Reference numeral E31 of FIG. 80 corresponds to thermal conduction sheet layer/$Al_2O_3$ as a combination of thermal conduction layer 25/ceramics substrate 21.

Reference numeral E32 of FIG. 80 corresponds to soldering layer/$Al_2O_3$ as a combination of thermal conduction layer 25/ceramics substrate 21.

Reference numeral E33 of FIG. 80 corresponds to Ag fired layer/$Al_2O_3$ as a combination of thermal conduction layer 25/ceramics substrate 21.

Reference numeral E34 of FIG. 80 corresponds to thermal conduction sheet layer/$Si_3N_4$ as a combination of thermal conduction layer 25/ceramics substrate 21.

Reference numeral E35 of FIG. 80 corresponds to soldering layer/$Si_3N_4$ as a combination of thermal conduction layer 25/ceramics substrate 21.

Reference numeral E36 of FIG. 80 corresponds to Ag fired layer/$Si_3N_4$ as a combination of thermal conduction layer 25/ceramics substrate 21.

Reference numeral E37 of FIG. 80 corresponds to thermal conduction sheet layer/AlN as a combination of thermal conduction layer 25/ceramics substrate 21.

Reference numeral E38 of FIG. 80 corresponds to soldering layer/AlN as a combination of thermal conduction layer 25/ceramics substrate 21.

Reference numeral E39 of FIG. 80 corresponds to Ag fired layer/AlN as a combination of thermal conduction layer 25/ceramics substrate 21.

In the example shown in FIG. 80, the material/thickness of each layer to be applied to the thermal resistance simulation is as follows: Semiconductor device Q (SiC/0.25 mm), Ag fired layer 27 (Ag/0.03 mm), Surface electrode layer 23 (Cu/0.8 mm) of graphite substrate 18GH, Graphite substrate 18GH (graphite/3 mm), Back electrode layer 24 (Cu/0.8 mm) of graphite substrate 18GH, Thermal conduction layer 25 (thermal conduction sheet layer/0.2 mm/soldering layer/Ag fired layer), Surface electrode layer 36 (Cu/0.1 mm) of ceramics substrate 21, Ceramics substrate 21 ($Al_2O_3$/0.32 mm/$Si_3N_4$/AlN), Back electrode layer 22 (Cu/0.1 mm) of ceramics substrate 21, Thermal conduction layer 25T (carbon sheet/0.2 mm), and Cooling apparatus 28 (Al/1 mm).

According to the thermal resistance simulation result of the combination between the thermal conduction layer 25 (thermal conduction sheet layer/soldering layer/Ag fired layer) and the ceramics substrate 21 ($Al_2O_3$/$Si_3N_4$/AlN) in the PM 1 according to the modified example 2 of the fifteenth embodiment, values of thermal resistance Rthjw (° C./W) of approximately 0.75 (° C./W)/0.73 (° C./W)/0.72 (° C./W)/0.70 (° C./W)/0.68 (° C./W)/0.67 (° C./W)/0.68 (° C./W)/0.66 (° C./W)/0.65 (° C./W) are obtained with respect to E31/E32/E33/E34/E35/E36/E37/E38/E39.

As shown in FIGS. 72A and 72B, the PM 1 according to the fifteenth embodiment includes: a graphite insulating substrate 20 including an electrically-conductive graphite substrate (graphite plate) 18GH disposed on an upper surface (first surface) of an SiN-based ceramics substrate 21, a back electrode pattern (first electrode pattern) 22, e.g. Cu foil, formed on a lower surface (second surface) of the ceramics substrate 21, and a surface electrode pattern (second electrode pattern) 23, e.g. Cu foil, disposed on the graphite substrate 18GH; and three semiconductor devices Q11, Q12, and Q13 arranged side by side along the X direction of the arrow on the surface electrode pattern 23.

The PM 1 according to the fifteenth embodiment becomes a molded-package type power module or a case-shaped package type power module by being contained in a case by wholly sealing (resin molding) of the perimeter of the semiconductor devices Q11, Q12, and Q13 a mold resin (not shown).

The graphite substrate 18GH has a plate type structure having substantially uniform thickness which is thicker than that of the ceramics substrate 21.

In the PM 1 according to the fifteenth embodiment, the graphite substrate 18GH is provided with an anisotropic thermal conductivity of which the thermal conductivity in a thickness direction (XZ plane, YZ plane) is higher than that in a plane direction (XY plane) as a graphite thermal conductivity orientation.

More specifically, there is an orientation direction where the thermal diffusion is the most satisfactory in the graphite substrate 18GH with respect to a direction of arrangement (plane direction) of the semiconductor devices Q11, Q12, and Q13.

In graphite substrate 18GH, the orientation direction where the thermal diffusion is the most satisfactory is a direction where the thermal conductivity is relatively high, and is the YZ direction substantially vertical to the X direction (YZ plane which is substantially orthogonal to the X direction), for example, if the direction of arrangement of the semiconductor devices Q11, Q12, and Q13 is the X direction.

In addition, the orientation direction is expressed as GH(XZ) when the orientation of the graphite substrate 18GH is the XZ direction, and is expressed as GH(YZ) when the orientation of the graphite substrate 18GH is the YZ direction.

More specifically, the PM 1 according to the fifteenth embodiment includes: a graphite substrate 18GH provided with an anisotropic thermal conductivity; and three semiconductor devices Q11, Q12, and Q13 arranged on the graphite substrate 18GH side by side, semiconductor devices Q11, Q12, and Q13 generating heat during operations, wherein the arrangement direction of the semiconductor devices Q11, Q12, and Q13 is within a range from −45 degree to +45 degrees (allowable amount of displacement: refer to FIG. 81) on the basis of the X direction (arrangement direction) of which the thermal conductivity of graphite substrate 18GH is relatively low, on the plane of the graphite substrate 18GH.

The PM 1 according to the fifteenth embodiment includes: a ceramics substrate 21; a graphite substrate 18GH provided with an anisotropic thermal conductivity disposed on an upper surface of the ceramics substrate 21; aback electrode pattern 22 disposed on an upper surface opposite to the lower surface of the ceramics substrate 21; a surface electrode pattern 23 disposed on the graphite substrate 18GH; and three semiconductor devices Q11, Q12, and Q13 arranged on the graphite substrate 18GH side by side via the surface electrode pattern 23, the semiconductor devices Q11, Q12, and Q13 generating heat during operations, wherein the graphite substrate 18GH has an orientation where a thermal conductivity in a thickness direction is relatively higher than the thermal conductivity in a plane direction, wherein the arrangement direction of three semiconductor devices Q11, Q12, and Q13 is within a range from −45 degree to +45 degrees on the basis of an orientation direction of which the thermal conductivity of graphite substrate 18GH is relatively low, on the plane of the graphite substrate 18GH.

Alternatively, the PM 1 according to the fifteenth embodiment includes: a graphite insulating substrate 20 including a ceramics substrate 21 and a graphite substrate 18GH having anisotropy in the CTE disposed on an upper surface of the ceramics substrate 21; and three semiconductor devices Q11, Q12, and Q13 arranged on the graphite substrate 18GH side by side, semiconductor devices Q11, Q12, and Q13 generating heat during operations, wherein the graphite substrate 18GH has an orientation where a thermal conductivity in a thickness direction is relatively higher than the thermal conductivity in a plane direction, wherein the arrangement direction of three semiconductor devices Q11, Q12, and Q13 is within a range from −45 degree to +45 degrees on the basis of an orientation direction of which the thermal conductivity of graphite substrate 18GH is relatively low, on the plane of the graphite substrate 18GH.

In the PM 1 according to the fifteenth embodiment, the semiconductor devices Q11, Q12, and Q13 are respectively bonded via the Ag fired layers 27 on the surface electrode pattern 23. It is also possible to use an SnAgCu-based solder, etc. for bonding of the semiconductor devices Q11, Q12, and Q13, instead of the Ag fired body. More specifically, not only the solder bonding but also bonding with the Ag fired body can be used since the surface electrode pattern 23 is disposed on the graphite substrate 18GH.

In the PM 1 according to the fifteenth embodiment shown in FIGS. 72A and 72B, the thickness of the ceramics substrate 21 is approximately 0.32 mm, the thickness (H) of the graphite substrate 18GH is approximately 2.5 mm, the thickness of the back electrode pattern 22 is approximately 0.2 mm, the thickness of the surface electrode pattern 23 is approximately 0.3 mm, the thickness of the Ag fired layer 27 is approximately 60 μm, and the thickness of the semiconductor devices Q11, Q12, and Q13 is approximately 350 μm, for example.

A coefficient of heat transfer of the back electrode pattern 22 is approximately 30000 (W/m²K).

Moreover, the size (C1×L1) in the X direction and the Y direction of the semiconductor devices Q11, Q12, and Q13 are approximately 5 mm×approximately 5 mm. In the semiconductor devices Q11, Q12, and Q13, a distance from each edge of the surface electrode pattern 23 is X1 with respect to the X direction, an interval distance between the respective semiconductor devices Q11, Q12, and Q13 is with respect to the X direction, and a distance from each edge of the surface electrode pattern 23 is Y1 with respect to the Y direction.

In the PM 1 according to the fifteenth embodiment, the interval distance X2 in the arrangement direction of the semiconductor devices Q11, Q12, and Q13 is shorter than the distance Y1 from the semiconductor devices Q11, Q12, and Q13 to the edge of the graphite substrate 18GH.

As the semiconductor devices Q11, Q12, and Q13, it is not limited to the power transistor devices, e.g. SiC MOSFET and IGBT. For example, devices including a Fast Recovery Diode (FRD), a Schottky barrier diode, etc. may be used, or module type device of which the perimeter of one or more chips is sealed with a mold resin or a case may be used.

In the case of the SiC MOSFET, it is formed so that a source electrode is formed on an upper side and a drain electrode is formed on a lower side thereof. In the case of the IGBT, it is formed so that an emitter electrode is formed on an upper side, and a collector electrode is formed on a lower side thereof. Other semiconductor devices mentioned below are similar to such an arrangement.

Although illustration is omitted, it is also possible to bond a heat sink made by Al, a heat radiation fin, or a heat radiation pin, as the heat radiator, or a cooling apparatus to the back electrode pattern 22. In the case of liquid cooling (water cooling), liquid cooling (water cooling) systems having a sufficient thermal conductivity, such as coolant water (water, or a mixed solution to which water and ethylene glycol are mixed at a rate of every 50%), cooling gas (cold air), etc., are used, for example.

According to the PM 1 according to the fifteenth embodiment, the thermal resistance can further be reduced by approximating (substantially matching) an orientation direction of the graphite substrate 18GH to the direction of which thermal diffusion is the most satisfactory in the modular structure in the case of arranging a plurality of the semiconductor device Q side by side.

Of course, the number of the plurality of the semiconductor devices Q is not limited to three pieces, and it is not limited to the case of arranging the plurality of the semiconductor devices Q side by side.

Moreover, as the graphite insulating substrate 20, it is also possible to use a configuration in which an insulative substrate etc. are disposed on an upper surface of the graphite substrate 18GH. For example, insulating substrates, such as Active Metal Brazed, Active Metal Bond (AMB) substrates, Direct Bonding Copper (DBC) substrates, or Direct Brazed Aluminum (DBA) substrates, provided with a graphite plate can also be applied thereto.

(Graphite Plate)
(Basic Configuration)

In the PM 1 according to the fifteenth embodiment, two types of graphite plates of which the orientations are different from each other can be used, as the graphite substrate 18GH.

FIG. 5 shows a schematic configuration (an example of laminated structure) of the graphite sheet (graphene) GS composing the graphite plate 18GH applicable as the graphite substrate 18GH.

There are a graphite plate 18GH (XZ) having an XZ orientation of which the thermal conductivity in a thickness direction is higher than the thermal conductivity in a plane direction, and a graphite plate 18GH (YZ) having an YZ orientation of which the thermal conductivity in the thickness direction is higher than the thermal conductivity in the plane direction, which can be applied to the graphite substrate 18GH. The graphite plate 18GH(YZ) is expressed as shown in FIG. 81A, and the graphite plate 18GH(YZ) is expressed as shown in FIG. 81B.

As shown in FIG. 5, graphite sheets GS1, GS2, GS3, . . . , GSn of each surface composed of n layers have many covalent bonding of hexagonal crystal in one laminated crystal structure, and between the graphite sheets GS1, GS2, GS3, . . . , GSn of each surface are bonded to one another with Van der Waals force.

More specifically, the graphite which is a carbon based anisotropic thermal conducting material is a laminated crystal body of a hexagonal mesh structure of carbon atom, and the thermal conduction thereof also has anisotropy, and the graphite sheets GS1, GS2, GS3, . . . , GSn shown in FIG. 5 have an amount of thermal conductivity (high thermal conductivity) larger than that in a thickness direction of Z-axis with respect to a crystal surface direction (on the XY plane).

Figure 81A:
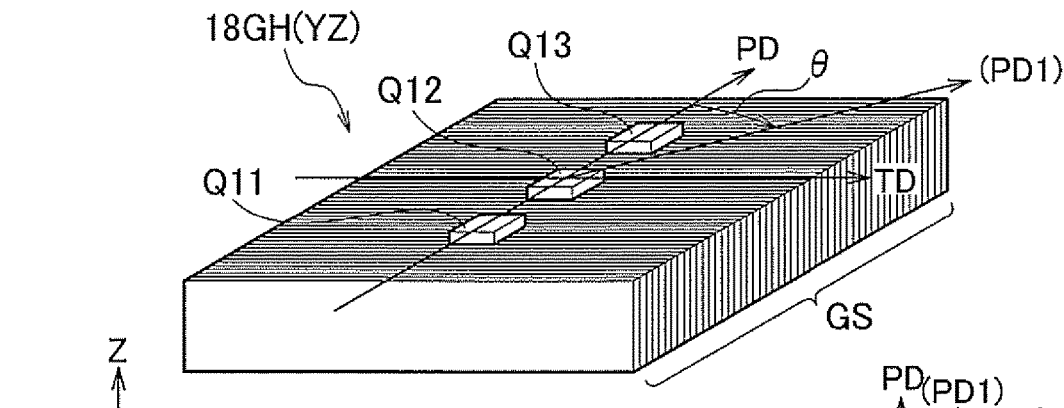
FIG. 81A is a schematic bird's-eye view configuration diagram showing an application example of a graphite substrate of YZ orientation, in an example of a graphite substrate applicable to the power module according to the fifteenth embodiment.
Figure 81B:
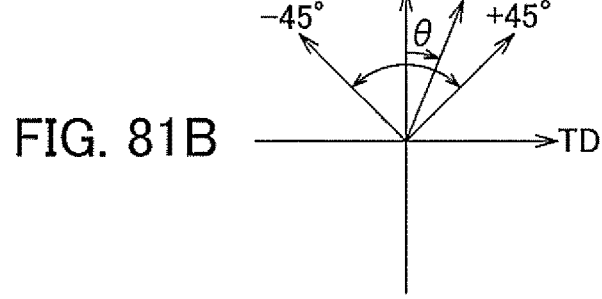

On the other hand, as shown in FIG. 81A, the graphite plate 18GH(YZ) having GH(YZ) orientation is provided with thermal conductivities X=5 (W/mK), Y=1500 (W/mK), and Z=1500 (W/mK), for example. On the other hand, as shown in FIG. 81A, the graphite plate 18GH (YZ) having GH (YZ) orientation is provided with thermal conductivities X=5 (W/mK), Y=1500 (W/mK), and Z=1500 (W/mK), for example.

Meanwhile, as shown in FIG. 81B, the graphite plate 18GH (XZ) having GH (XZ) orientation is provided with thermal conductivities X=1500 (W/mK), Y=5 (W/mK), and Z=1500 (W/mK), for example.

In addition, the density of each graphite plate 18GH(XZ) and 18GH(YZ) is approximately 2.2 (g/cm³), and the thickness thereof is approximately 0.7 mm to approximately 10 mm, and the size thereof is equal to or less than approximately 40 mm×approximately 40 mm.

As shown in FIGS. 81A and 81B, in the PM 1 according to the fifteenth embodiment in which the graphite plate 18 GH(YZ) is applied as the graphite substrate 18GH, a direction PD1 of arrangement of the semiconductor devices Q11, Q12, and Q13 is within a range of an angle θ from approximately −45 degree to approximately +45 degrees in a clockwise direction, and is preferably within a range of an angle θ from approximately −30 degree to approximately +30 degrees, with respect to an orientation direction PD, of which a thermal conductivity is relatively low, substantially orthogonal to a GH(YZ) orientation direction TD of the graphite substrate 18GH which is substantially matched with the X direction, in a plane (substrate face) of the graphite substrate 18GH.

Figure 81C:
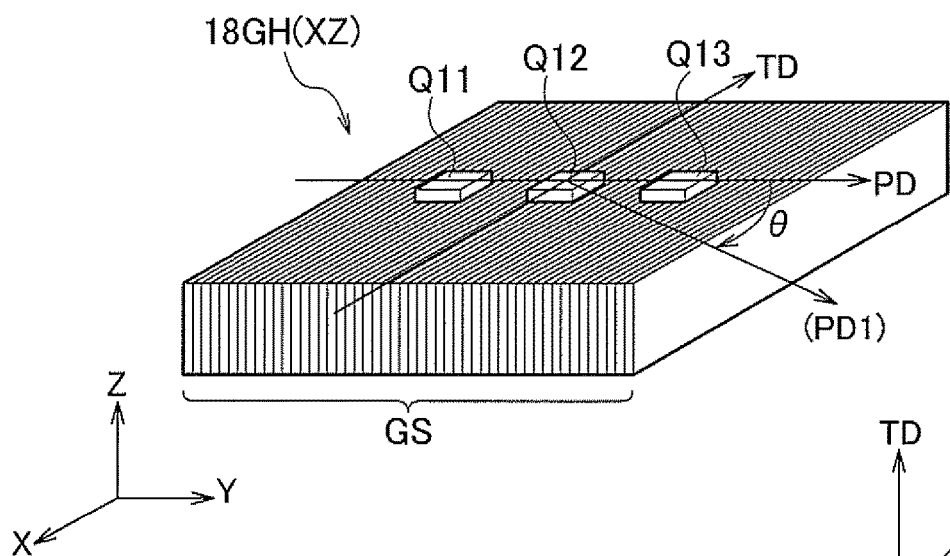
Figure 81D:
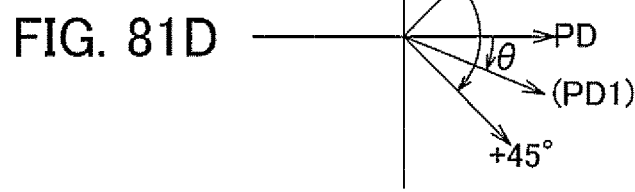

On the other hand, as shown in FIGS. 81C and 81D, in the PM 1 according to the fifteenth embodiment in which the graphite plate 18 GH(XZ) is applied as the graphite substrate 18GH, a direction PD1 of arrangement of the semiconductor devices Q11, Q12, and Q13 is within a range of an angle θ from approximately −45 degree to approximately +45 degrees in a clockwise direction, and is preferably within a range of an angle θ from approximately −30 degree to approximately +30 degrees, with respect to an orientation direction PD, of which a thermal conductivity is relatively low, substantially orthogonal to a GH(XZ) orientation direction TD of the graphite substrate 18GH which is substantially matched with the Y direction, in a plane (substrate face) of the graphite substrate 18GH.

(Thermal Resistance Simulation with Orientation Direction)

Figure 82A:
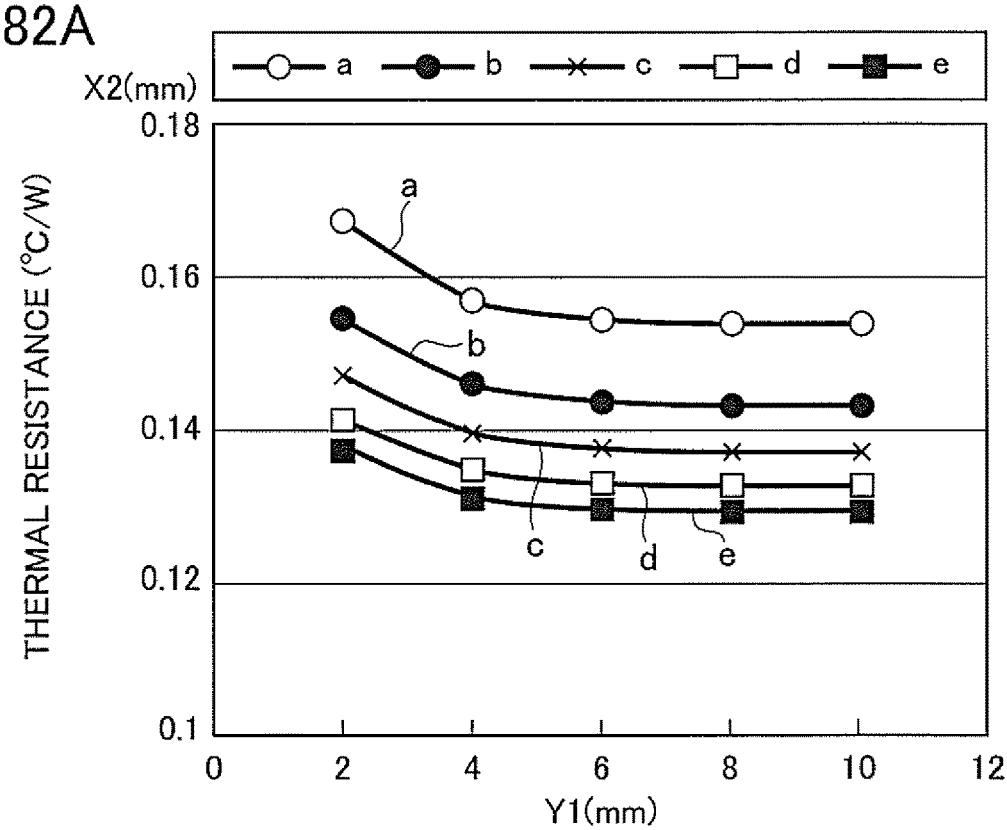
Figure 82B:
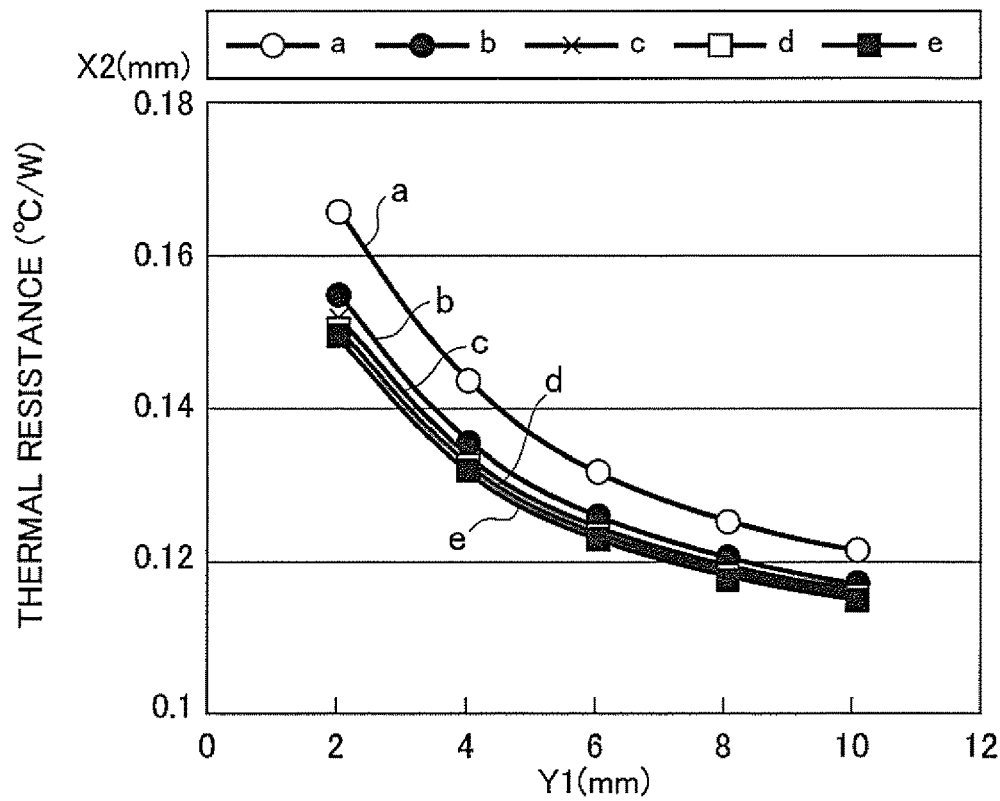

FIG. 82A shows a result of a simulation of thermal resistance characteristics of the PM 1 according to the fifteenth embodiment executed as an example of the GH(XZ) orientation, and FIG. 82B shows a result of a simulation executed as an example of the GH (YZ) orientation.

Both of the simulations were executed with regard to the thermal resistance (° C./W), where X1 is 2 mm, Y1 is 2 mm, 4 mm, 6 mm, 8 mm, and 10 mm, and X2 is 2 mm (Line a), 4 mm (Line b), 6 mm (Line c), 8 mm (Line d), and 10 mm (Line e), in the PM 1 shown in FIGS. 72A and 72B.

As clear from FIGS. 82A and 82B, in the modular structure of arranging a plurality of the semiconductor devices Q, the thermal resistance is reduced as the a distance (X2) in X direction is extended if the graphite substrate 18GH has the GH(XZ) orientation, and the thermal resistance is reduced as the distance (Y1) in the Y direction is extended if the graphite substrate 18GH has the GH (YZ) orientation.

It is also proved from the above-mentioned result that the thermal interference can be prevented with respect to the orientation direction where the thermal conductivity is relatively low if there is a certain amount of distance (e.g., X2 and Y1 is equal to or greater than approximately 4 mm).

More specifically, as shown in FIGS. 82A and 82B, it is more available to adopt the graphite substrate 18GH of GH(YZ) orientation in order to reduce the thermal resistance in the PM 1 in which a plurality of the semiconductor devices Q are arranged in the X direction, and it is more available to adopt the graphite substrate 18GH of the GH(XZ) orientation in order to reduce the thermal resistance in the PM 1 in which a plurality of the semiconductor devices Q are arranged in the Y direction.

According to the PM 1 according to the fifteenth embodiment, there can be provided the inexpensive power module having a simple structure and satisfied heat diffusibility, capable of further reducing thermal resistance by setting the orientation direction TD of the graphite plates 18GH(XZ) and 18GH(YZ) orientation of which the thermal diffusion is the most satisfactory to be substantially vertical to the direction of arrangement in the Y direction and X direction of the plurality of semiconductor devices Q, in the modular structure of arranging a plurality of the semiconductor device Q side by side on the graphite substrate 18GH using the graphite insulating substrate 20 using the graphite plates 18GH(XZ) and 18GH(YZ) having the high coefficient of thermal conductivity which is anisotropic.

Sixteenth Embodiment (Schematic Structure)

Figure 83A:
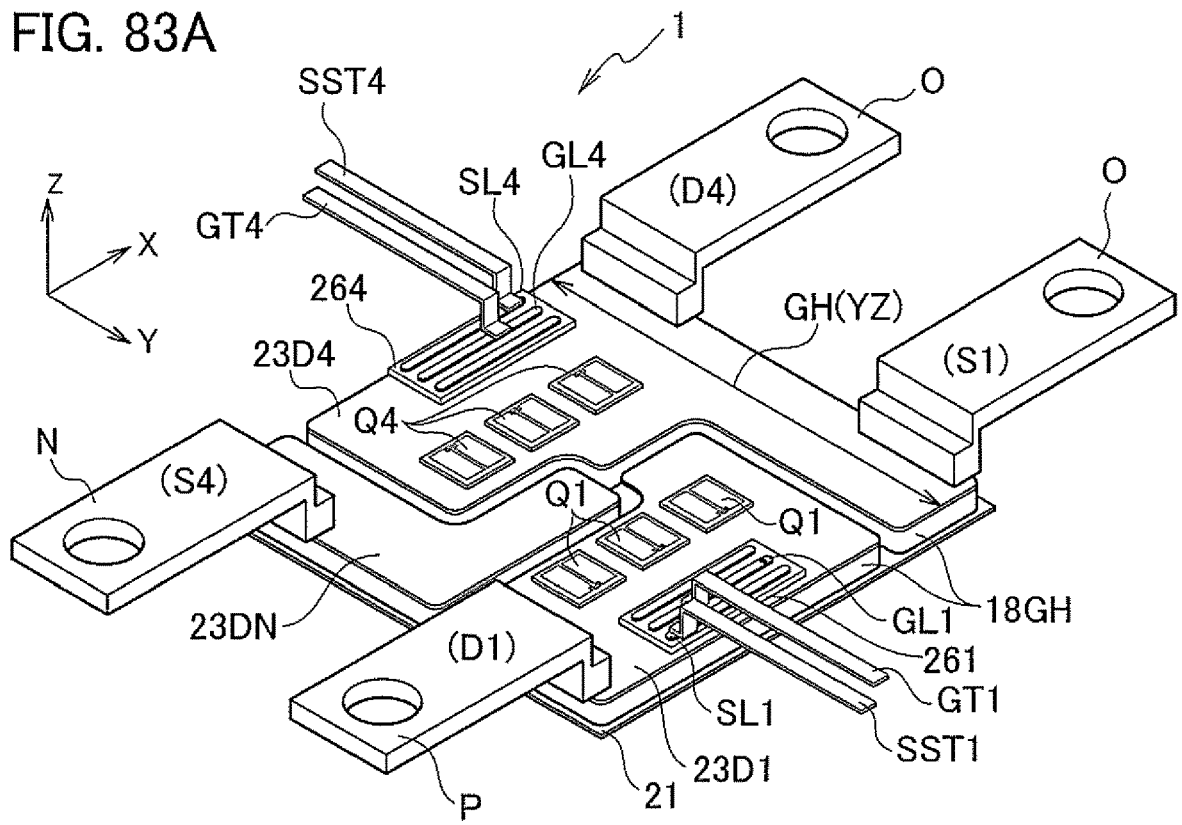
Figure 83B:
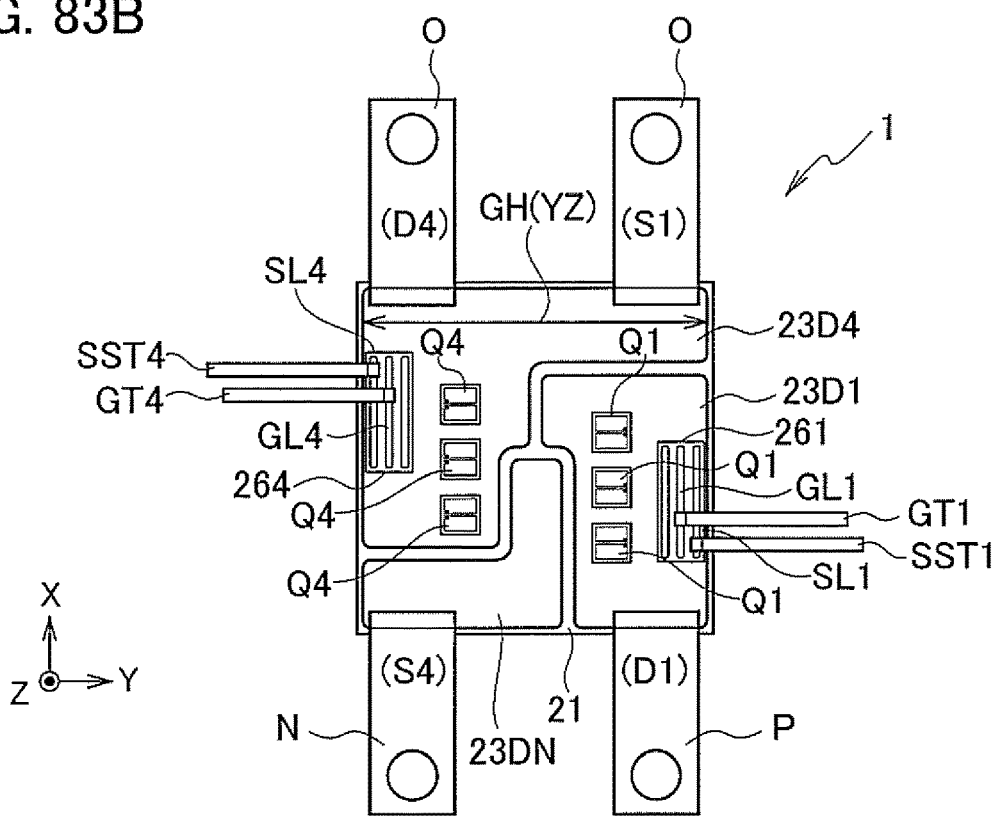

FIG. 83A shows a schematic bird's-eye view pattern configuration before resin molding, in the PM 1 according to sixteenth embodiment, and FIG. 83B shows a schematic planar pattern configuration thereof. FIGS. 83A and 83B show a concrete example of arrangement of the semiconductor devices in the PM 1, and a 2-in-1 module type module with the built-in half-bridge to which SiC MOSFETs Q1 and Q4 are applied is illustrated as the semiconductor device Q.

The PM 1 according to the sixteenth embodiment includes a configuration of a module with the built-in half-bridge in which two SiC MOSFETs Q1 and Q4 connected in series are built in one module, as shown in FIG. 30, for example.

The PM 1 according to the sixteenth embodiment includes: a positive side power input terminal electrode (positive-side power terminal) P and a negative side power input terminal electrode (negative-side power terminal) N disposed at a first side of a ceramics substrate 21 covered with a resin molding layer (not shown); a gate terminal (gate G1) GT1 and a source sense terminal SST1 (source S1) disposed at a second side adjacent to the first side; an output terminal electrode (output terminal) O disposed at a third side opposite to the first side; and a gate terminal GT4 (gate G4) and a source sense terminal SST4 (source S4) disposed at a fourth side opposite to the second side.

The PM 1 according to the sixteenth embodiment is a power module of 4 power terminals structure including two output terminals O.

In this case, as shown in FIGS. 83A and 83B, two SiC MOSFETs Q1 and Q4 respectively include three devices (chips), each chip of the SiC MOSFET Q1 is commonly connected to the gate terminal GT1 and the source sense terminal SST1, and each chip of the SiC MOSFET Q4 is commonly connected to the gate terminal GT4 and the source sense terminal SST4.

The gate terminal GT1 and the source sense terminal SST1 are connected to the gate signal electrode pattern GL1 and the source signal electrode pattern SL1 in the SiC MOSFET Q1, and the gate terminal GT4 and the source sense terminal SST4 are connected to the gate signal electrode pattern GL4 and the source signal electrode pattern SL4 in the SiC MOSFET Q4.

As shown in FIGS. 83A and 83B, gate terminals GT1 and GT4 and source sense terminals SST1 and SST4 for external extraction are connected to the gate signal electrode patterns GL1 and GL4 and the source sense signal electrode patterns SL1 and SL4 by soldering etc.

In addition, as shown in FIGS. 83A and 83B, gate signal electrode patterns GL1 and GL4 and source signal electrode patterns SL1 and SL4 may be disposed on signal substrates 261 and 264, and the signal substrates 261 and 264 may be connected with soldering etc. on the ceramics substrate 21.

The signal substrates 261 and 264 can be formed by including a ceramics substrate. The ceramic substrate may be formed by including $Al_2O_3$, AlN, SiN, AlSiC, or SiC of which at least the surface is insulation, for example.

Although illustration is omitted in FIGS. 83A and 83B, diodes (DI1 and DI4) may be respectively connected reversely in parallel between a drain D1 and a source S1 and between a drain D4 and a source S4 of the SiC MOSFETs Q1 and Q4.

The positive-side power terminal P and the negative-side power terminal N, and the gate terminals GT1 and GT4 and the source sense terminals SST1 and SST4 for external extraction can be formed of Cu, for example.

The surface electrode pattern 23 (23D1, 23D4, and 23DN) which are main wiring conductors can be formed by including Cu, for example.

In the example of the 2-in-1 module type module with the built-in half-bridge shown in FIGS. 83A and 83B, the surface electrode pattern 23D1 functions as a drain electrode pattern for an upper-arm (High) side device (SiC MOSFET Q1).

Moreover, the surface electrode pattern 23D4 functions as a drain electrode pattern for a lower-arm (Low) side device (SiC MOSFET Q4), and also functions as a source electrode pattern for an upper-arm (High) side device (23S1). More specifically, the drain electrode pattern 23D4 is a drain electrode of the SiC MOSFET Q4, and is also a source electrode of the SiC MOSFET Q1.

Furthermore, the surface electrode pattern 23DN connected to the negative-side power terminal N functions also as a source electrode pattern for the lower-arm (Low) side device (23S4).

More specifically, in the PM 1 according to sixteenth embodiment, as shown in FIGS. 83A and 83B, the SiC MOSFET Q1 is mounted on the surface electrode pattern 23D1, the drain D1 is connected to the surface electrode pattern 23D1, and the source S1 is connected to the surface electrode pattern 23D4 via a bonding wire (source bonding wire for signal (not shown)).

Similarly, the SiC MOSFET Q4 is mounted on the surface electrode pattern 23D4, the drain D4 is connected to the surface electrode pattern 23D4, and the source S4 is connected to the surface electrode pattern 23D4 via a bonding wire (source bonding wire for signal (not shown)).

Although illustration is omitted, the PM 1 according to sixteenth embodiment includes: a bonding wire for source sense configured to connect the source sense pad electrode of the SiC MOSFET Q1 to the source signal electrode pattern SL1; and a bonding wire for gate signal configured to connect the gate pad electrode to the gate signal electrode pattern GL1.

Similarly, although illustration is omitted, the PM 1 according to sixteenth embodiment includes: a bonding wire for source sense configured to connect the source sense pad electrode of the SiC MOSFET Q4 to the source signal electrode pattern SL4; and a bonding wire for gate signal configured to connect the gate pad electrode to the gate signal electrode pattern GL4.

Accordingly, the bonding wire for source sense for connecting the source sense pad electrode is bonded with wedge bonding to each of the source signal electrode patterns SL1 and SL4 of the SiC MOSFETs Q1 and Q4.

Other configurations are substantially similar to those in the case of the fifteenth embodiment, the graphite substrate 18GH having the GH(YZ) orientation composing the graphite insulating substrate is disposed on a lower surface of the surface electrode patterns 23D1, 23D4, and 23DN, on an upper surface of the ceramics substrate 21.

More specifically, as shown in FIGS. 83A and 83B, the PM according to sixteenth embodiment includes: a graphite insulating substrate including a ceramics substrate 21, a graphite substrate 18GH disposed on an upper surface (first surface) of the ceramics substrate 21, a surface electrode patterns (second electrode pattern) 23D1, 23D4, and 23DN disposed on the graphite substrate 18GH, aback electrode pattern (first electrode pattern) (not shown) disposed on a lower surface (second surface) of the ceramics substrate 21; and a plurality of SiC MOSFETs Q1 and Q4 respectively arranged side by side along the arrow X direction on the surface electrode patterns 23D1 and 23D4.

In the PM 1 according to sixteenth embodiment, the GH(YZ) orientation of graphite substrate 18GH is an orientation direction TD which is substantially orthogonal to the X direction of arrangement of the plurality of SiC MOSFETs Q1 and Q4 and is substantially matched with the Y direction. Accordingly, an allowed amount (allowable amount of displacement) of displacement of the arrangement direction PD1 with respect to the orientation direction TD of GH(YZ) of the SiC MOSFETs Q1 and Q4 disposed on the X direction side by side is within a range of an angle θ from approximately −45 degree to approximately +45 degrees, and is preferably within a range of an angle θ from approximately −30 to approximately +30 degrees in a clockwise direction, on the plane (substrate face) of the graphite substrate 18GH, based on the orientation direction PD corresponding to the X direction.

In FIGS. 83A and 83B, if the semiconductor device Q is an SiC MOSFET, reference numerals GT1 and GT4 are lead terminals for gate signal (the so-called gate terminal) of the SiC MOSFETs Q1 and Q4, and reference numerals SST1 and SST4 are lead terminals for source signal (the so-called source sense terminal) of the SiC MOSFETs Q1 and Q4.

On the other hand, in the case of IGBT, reference numerals GT1 and GT4 are lead terminals for gate signal of the IGBTs Q1 and Q4, and reference numerals SST1 and SST4 are lead terminals for emitter signal of the IGBTs Q1 and Q4.

According to the PM 1 according to the sixteenth embodiment, a high thermal diffusion effect can be expected by approximating the direction PD1 of arrangement of the plurality of semiconductor devices Q to the orientation direction PD, of which the thermal conductivity is relatively low, which is substantially orthogonal to the orientation direction TD of GH (XZ) and GH (YZ) orientations of the graphite substrate 18GH, by adopting the graphite insulating substrate to which the graphite substrate 18GH is applied.

More specifically, also according to the PM 1 according to sixteenth embodiment, there can be provided the inexpensive power module having a simple structure and satisfied heat diffusibility, capable of further reducing thermal resistance.

As the 2-in-1 module type PM 1, it is applicable also to a structure of providing the source electrode pattern above the semiconductor devices Q1 and Q4, and it is not limited to the 2-in-1 module type.

(Thermal Interference Action)

Hereinafter, a thermal interference action in the PM according to the fifteenth to eighteenth embodiments will now be explained.

In the PM, if the semiconductor device Q is disposed in proximity for a miniaturization or the graphite substrate 18GH is made thick beyond necessity for high thermal diffusion effect, a thermal interference action will easily occur.

Figure 84A:
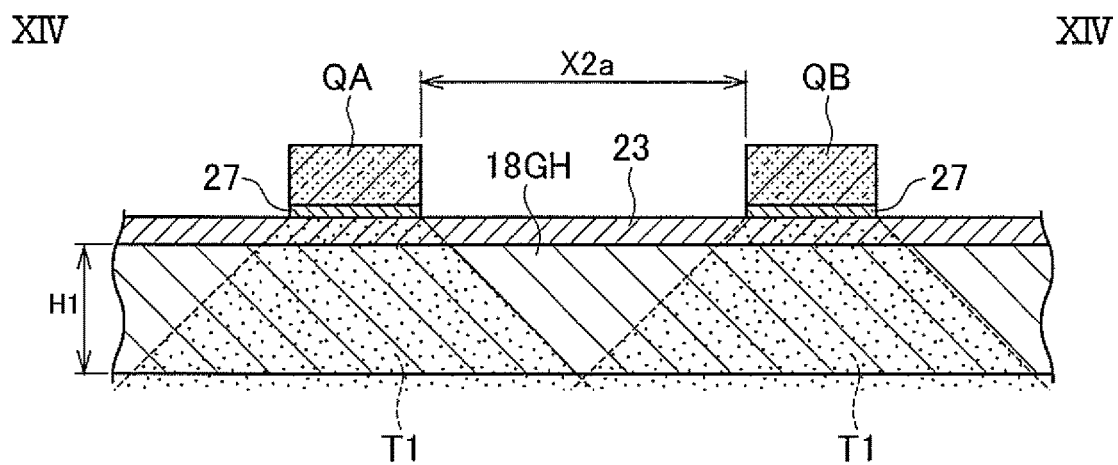
Figure 84B:
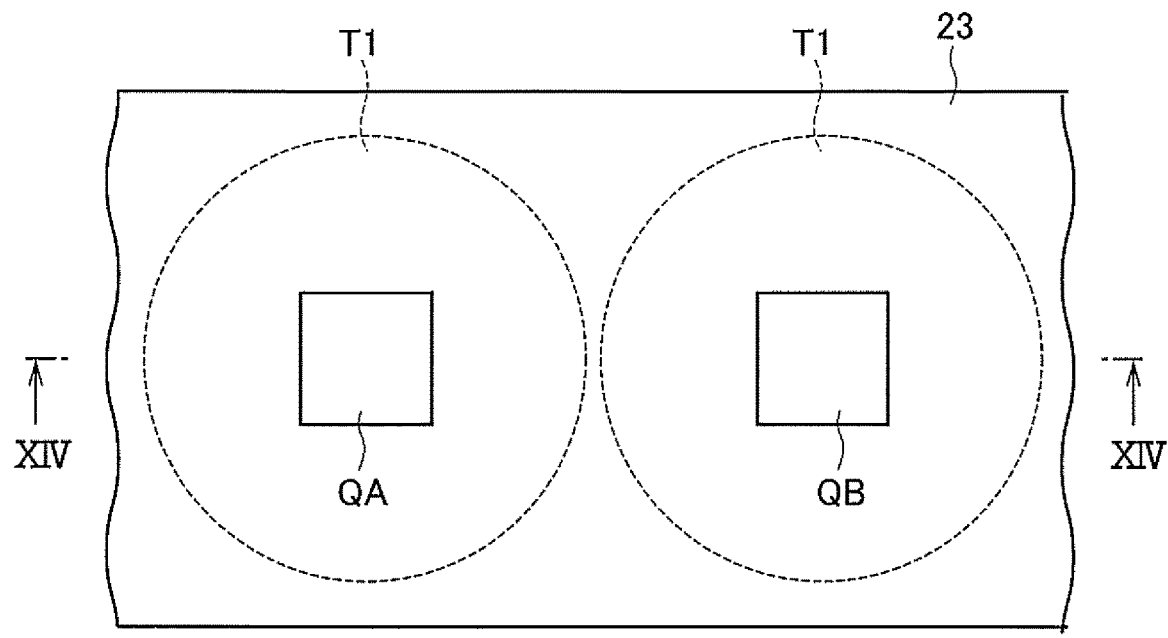

FIG. 84A shows a schematic cross-sectional structure example for explaining a thermal interference action in the case of increasing a distance (e.g., X2 of FIG. 72A) between devices, in the PM according to the fifteenth to eighteenth embodiments, and FIG. 84B shows a schematic plane configuration corresponding to FIG. 84A. The cross-sectional structure of FIG. 84A corresponds to a cross section taken in the XIV-XIV of FIG. 84B.

In this case, assuming that heat from the semiconductor devices QA and QB is diffused downward at an angle of approximately 45 degrees, there is hardly an area in which the heat T1 from the semiconductor device QA and the heat T1 from the semiconductor device QB are interfered with each other in the graphite substrate 18GH, as shown in FIG. 84A and FIG. 84B, if the thickness (H) of the graphite substrate 18GH is H1 mm and the distance between devices is X2a (X2a>X2) mm.

More specifically, the interval distance X2a in the X direction of the arranged semiconductor devices QA and QB is preferable equal to or greater than approximately twice as long as the distance (H) from the semiconductor devices QA and QB to a lower surface (second surface) opposite to an upper surface (first surface) of the graphite substrate 18GH.

Figure 85A:
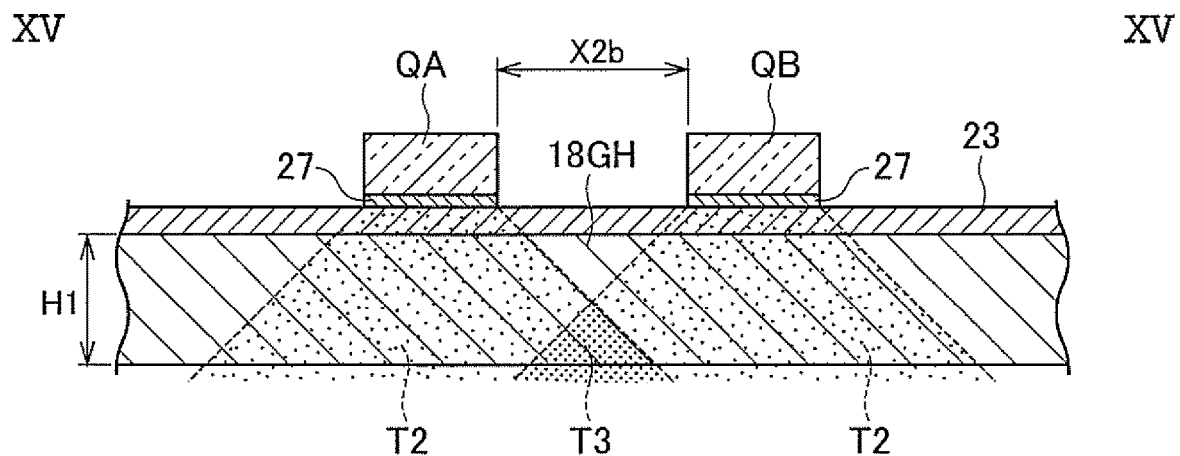
Figure 85B:
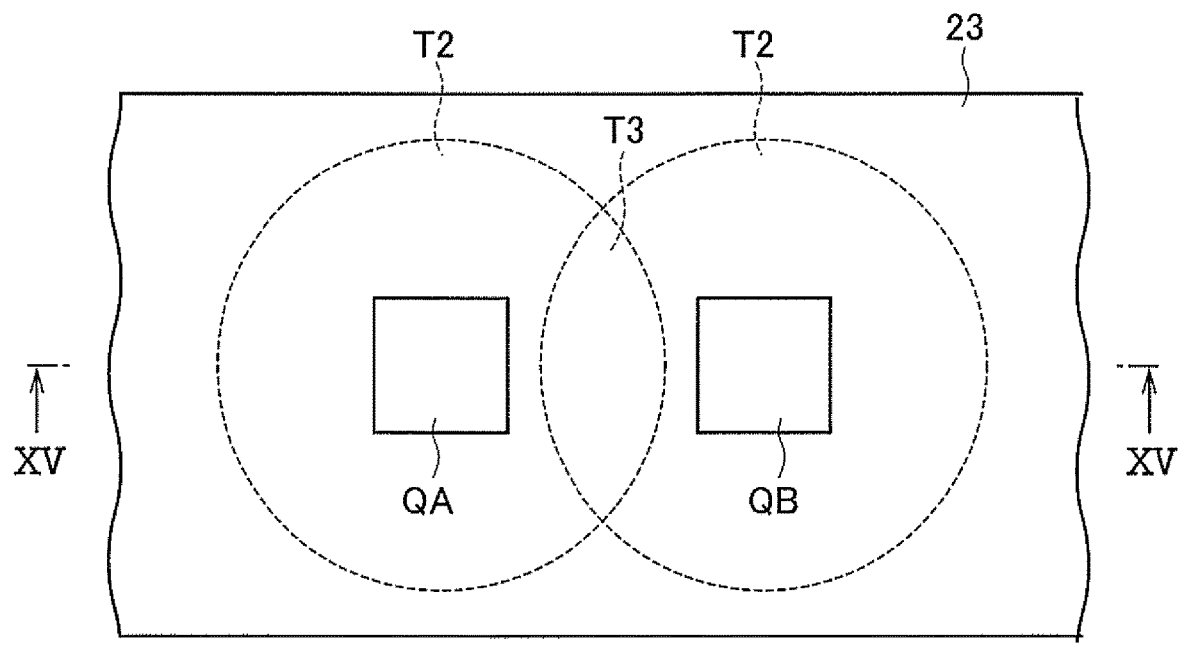

On the other hand, FIG. 85A shows a schematic cross-sectional structure example for explaining a thermal interference action in the case of decreasing the distance (e.g., X2 of FIG. 72A) between devices, in the PM according to the fifteenth to eighteenth embodiments, and FIG. 85B shows a schematic plane configuration corresponding to FIG. 85A. The cross-sectional structure of FIG. 85A corresponds to a cross section taken in the XV-XV of FIG. 85B.

As shown in FIG. 85A and FIG. 85B, there is an area T3 in which the heat T2 from the semiconductor device QA and the heat T2 from the semiconductor device QB are interfered with each other in the graphite substrate 18GH if the thickness (H) of the graphite substrate 18GH is H1 mm and the distance between devices is X2b (X2b<X2) mm. Such an area T3 is not preferable since it leads to a factor of raising the thermal resistance.

As shown in FIG. 86A, if the distance between devices is set to X2a (X2a>X2) mm, and the thickness (H) of the graphite substrate 18GH is thickened to H2 (H2>H1) mm with an expectation of high thermal diffusion effect, there is an area T3 in which the heat T1 from the semiconductor device QA and the heat T1 from the semiconductor device QB are interfered with each other in the graphite substrate 18GH.

Conversely, as shown in FIG. 86B, if the distance between devices is set to X2b (X2b<X2) mm, and the thickness (H) of the graphite substrate 18GH is made thin to H3 (H3<H1) mm at the sacrifice of the thermal diffusion effect, there is hardly an area in which the heat T1 from the semiconductor device QA and the heat T1 from the semiconductor device QB are interfered with each other in the graphite substrate 18GH.

Thus, since there is trade-off relationship between the thickness (H) of the graphite substrate 18GH and the distance (X2) between the semiconductor devices QA and QB, the thermal resistance can be more effectively reduced by approximating (substantially matching) the orientation direction TD of the graphite substrate 18GH to the direction having the most satisfied thermal diffusion.

In addition, if the semiconductor devices QA and QB are obliquely disposed at a predetermined angle, although an area in which heat is interfered with each other cannot be formed since it can make the distance between devices a little compared with the case of linearly arranged on the same straight line, it is difficult to completely suppress it.

(Arrangement Example of Semiconductor Device)

FIGS. 87A to 87C show an arrangement example of semiconductor devices Q11, Q12, and Q13, in the PM according to the fifteenth to eighteenth embodiments.

For example, as shown in FIG. 87A, the semiconductor devices Q11, Q12, and Q13 are substantially linearly arranged along the orientation direction PD corresponding to the X direction in the direction PDA of the arrangement, on a substrate face of the graphite substrate 18GH.

As shown, for example in FIG. 87B, the semiconductor devices Q11, Q12, and Q13 may be substantially linearly arranged in an arrangement direction PDB inclined at a predetermined angle in the minus (−) direction with respect to the orientation direction PD along the X direction corresponding to one side of the graphite substrate 18GH, on the substrate face of the graphite substrate 18GH.

As shown, for example in FIG. 87C, the semiconductor devices Q11, Q12, and Q13 can be arranged (so-called arranged in zigzag) in an arrangement direction PDC in which the semiconductor device Q13 is inclined at only a predetermined angle in the minus direction from the orientation direction PD to the arrangement direction PDD in which the semiconductor device Q11 is inclined at only a predetermined angle in the plus (+) direction from the orientation direction PD along the X direction, with respect to the centered semiconductor device Q12, on the substrate face of the graphite substrate 18GH.

Furthermore, as shown in FIG. 89, on the substrate face of the graphite substrate 18GH of FIG. 87C, for example, it is available to adopt a combination so that one of the semiconductor devices Q11 or Q13 is arranged on the same straight line (orientation direction PD) as the semiconductor device Q12, and the other of the semiconductor device Q11 or Q13 is arranged in the direction PDD or PDC of arrangement inclined at only a predetermined angle with respect to the semiconductor device Q12.

(Relationship between Arrangement and Thermal Resistance)

Next, a relationship between an amount of displacement of arrangement of semiconductor devices and thermal resistance will now be explained for the PM according to the fifteenth to eighteenth embodiments.

FIG. 88A shows a schematic plane configuration of a simulation model used for a thermal resistance simulation, in the PM according to the fifteenth to eighteenth embodiments, FIG. 88B shows a result of the thermal resistance simulation, and FIG. 88C shows an effect (allowable amount of displacement) of reduction of the thermal resistance based on the simulation result.

In the simulation model, as shown in FIG. 88A, the semiconductor devices Q11, Q12, and Q13 are arranged along Y direction shown by the arrow in zigzag (are arranged alternately with a predetermined amount of displacement in the X direction). The size (C1×L1) in the X direction and the Y direction of the semiconductor devices Q11, Q12, and Q13 is 5 mm×5 mm.

In the semiconductor devices Q11 and Q13, the distance X1 from a nearer edge in the X direction of the surface electrode pattern 23 is 2 mm, and the distance Y1 from a nearer edge in the Y direction is 2 mm.

In the semiconductor device Q12, the distance Y2 from each of the semiconductor devices Q11 and Q13 which are adjacent to each other in the Y direction is 4 mm.

The simulation of thermal resistance was executed so that: if X1 of the semiconductor devices Q13 is 2 mm, X2 is 0, and then X2 is increased from 0 by every 1 mm in the X direction; and if X1 of the semiconductor device Q11 is 2 mm X3 is 0, and then X3 is set to 0 mm (Mark a), 1 mm (Mark b), 2 mm (Mark c), 3 mm (Mark d), 4 mm (Mark e), 5 mm (Mark f), 6 mm (Mark g), 7 mm (Mark h), 8 mm (Mark i), and 9 mm (Mark j), as shown in FIG. 88B.

The simulation result of FIG. 88B is normalized by being set as 1 on the basis of the case where X2 is 9 mm and X3 is 9 mm.

As clear also from a result of FIG. 88B, when the semiconductor devices Q11, Q12, and Q13 are arranged in zigzag in the Y direction, the thermal resistance is increased if at least one of the semiconductor devices Q11 and Q13 is also displaced from a straight line in the Y direction (YZ direction) to the X direction, with respect to the semiconductor device Q12 arranged in the center.

In the simulation model which has such characteristics, when proving the GH (XZ) orientation along the X direction substantially orthogonal to the Y direction in which the semiconductor devices Q11, Q12, and Q13 are arranged, as the graphite substrate 18GH, the increase in the thermal resistance can be suppressed to approximately 6% if the amount of displacement of the semiconductor devices Q11 and Q13 with respect to the centered semiconductor device Q12 is equal to or less than 45 degrees as the hatched area YR shows in FIG. 88C.

More specifically, in the case of the arrangement example shown in FIGS. 87B and 87C, at the time of setting the orientation direction (X direction) PD substantially orthogonal to the orientation direction TD corresponding to the GH(YZ) orientation of the graphite substrate 18GH to zero, it is preferable to be arranged so that the angle of the directions PDD and PDC of the arrangement of the semiconductor devices Q11, Q12, and Q13 is within a range from approximately −45 degree to +45 degrees, preferably from approximately −30 degrees to +30 degrees, in a clockwise direction, on the plane (substrate face) of the graphite substrate 18GH, in order to suppress the increase the in thermal resistance.

FIG. 89 shows another example of the model used for the thermal resistance simulation in the PM according to the fifteenth to eighteenth embodiments, in an example of arranging the semiconductor device Q11 so as to not be displaced in the X direction from the centered semiconductor device Q12, and the semiconductor device Q13 so as to be obliquely displaced in the X direction at a predetermined angle from the centered semiconductor device Q12.

In the simulation model, the size (C1×L1) in the X direction and the Y direction of the semiconductor devices Q11, Q12, and Q13 is 5 mm×5 mm.

In the semiconductor device Q13, the distance X1 from a nearer edge in the X direction of the surface electrode pattern 23 is 2 mm, and the distance Y1 from a nearer edge in the Y direction is 2 mm.

In the semiconductor device Q12, the distance Y2 from each of the semiconductor devices Q11 and Q13 which are adjacent to each other in the Y direction is 4 mm.

In the semiconductor device Q11, the distance Y1 from a nearer edge is 2 mm in the Y direction.

In the case of this simulation model, it is arranged so that the amount of displacement in the X direction of the semiconductor device Q11 with respect to the centered semiconductor device Q12 is equal to or less than 9. More specifically, distance from a farther edge in the X direction of the semiconductor device Q13 is 20 (X2=18) with respect to the distance 11 from an edge (farther edge) of the surface electrode pattern 23 farther from the semiconductor device Q11 (Q12) (X3=9). Accordingly, as shown by the hatched area YR in FIG. 88C, the amount of displacement of the semiconductor devices Q11 and Q13 with respect to the centered semiconductor device Q12 is equal to or less than 45 degrees, thereby suppressing the increase in thermal resistance to approximately 6%.

Seventeenth Embodiment (Schematic Structure)

FIG. 90A shows a schematic bird's-eye view pattern configuration of a PM 1 according to seventeenth embodiment, FIG. 90B shows a schematic planar pattern configuration thereof. FIGS. 90A and 90B exemplify a case of being applied to PM 1 of three power terminals structure.

As shown in FIGS. 90A and 90B, the PM 1 according to the fourth embodiment includes the substantially same configuration as that of the PM 1 according to the first embodiment, except for a structure of the power terminals.

More specifically, as shown in FIGS. 90A and 90B, the PM 1 according to seventeenth embodiment includes: a graphite insulating substrate including a ceramics substrate 21, a graphite substrate 18GH disposed on an upper surface (first surface) of the ceramics substrate 21, a surface electrode patterns (second electrode pattern) 23D1, 23D4, and 23DN disposed on the graphite substrate 18GH, aback electrode pattern (first electrode pattern) (not shown) disposed on a lower surface (second surface) of the ceramics substrate 21; and a plurality of semiconductor devices (modules) Q1 and Q4 respectively arranged side by side along the arrow X direction on the surface electrode patterns 23D1 and 23D4.

In the PM 1 according to seventeenth embodiment, the GH(YZ) orientation in the orientation direction TD of the graphite substrate 18GH is a direction which is substantially orthogonal to the orientation direction PD along the X direction of a plurality of the semiconductor devices Q1 and Q4.

In FIGS. 90A and 90B, reference numeral P denotes a positive side power input terminal electrode, reference numeral N denotes a negative side power input terminal electrode, and reference numeral O denotes an output terminal electrode, and thereby providing PM having a three power terminals structure including one output terminal electrode O.

In FIGS. 90A and 90B, reference numeral GL1 denotes a gate signal electrode pattern to which a lead terminal (not shown) for gate signals of the SiC MOSFET Q1 is connected, and reference numeral SL1 denotes a source signal electrode pattern to which a lead terminal (not shown) for source signal of the SiC MOSFET Q1 is connected. Similarly, reference numeral GL4 denotes a gate signal electrode pattern to which a lead terminal (not shown) for gate signals of the SiC MOSFET Q4 is connected, and reference numeral SL4 denotes a source signal electrode pattern to which a lead terminal (not shown) for source signal of the SiC MOSFET Q4 is connected.

Reference numeral BW1 in FIG. 90 denotes a source bonding wire for signal for commonly connecting the source pad electrode of the SiC MOSFET Q1 to the surface electrode pattern 23D4 functioning also as a source electrode; and reference numeral BW4 denotes a source bonding wire for signal for commonly connecting the source pad electrode of the SiC MOSFET Q4 to the surface electrode pattern 23DN functioning also as a source electrode.

Also according to the PM 1 according to seventeenth embodiment, there can be provided the inexpensive power module having a simple structure and satisfied heat diffusibility, capable of further reducing thermal resistance, by setting the direction PD1 of arrangement of the plurality of semiconductor devices Q1 and Q4 to the orientation direction (X direction) PD substantially orthogonal to the orientation direction (Y direction) TD corresponding to the GH(YZ) orientation of the graphite substrate 18GH, on the substrate face of the graphite substrate 18GH.

Eighteenth Embodiment (Schematic Structure)

FIG. 91 shows a schematic planar pattern configuration of a PM 1 according to the eighteenth embodiment. FIG. 91 shows an example to which an FRD QA2 of diode, an IGBT QA1 including Schottky barrier diode, etc., for example is applied as the semiconductor device Q.

The PM 1 according to the eighteenth embodiment includes a graphite substrate 18GH having anisotropy in a thermal conductivity and a CTE disposed on an upper surface (first surface) of the ceramics substrate 21, a surface electrode pattern (second electrode pattern) (not shown) on which the IGBT QA1 and the FRD QA2 are arranged in parallel is disposed on the graphite substrate 18GH, a back electrode pattern (first electrode pattern) (not shown) is disposed on a lower surface (second surface) of the ceramics substrate 21.

The Graphite substrate 18GH is provided with the XZ orientation, the direction PD1 of arrangement of the IGBT QA1 and the FRD QA2 arranged side by side is set to the orientation direction (Y direction) PD substantially orthogonal to the orientation direction TD of the GH(XZ) shown by the arrow of FIG. 91.

Although the IGBT QA1 and the FRD QA2 are actually bonded to a surface electrode pattern on the graphite substrate 18GH, the illustration is omitted in explanation herein.

Also according to the PM 1 according to eighteenth embodiment, there can be provided the inexpensive power module having a simple structure and satisfied heat diffusibility, capable of further reducing thermal resistance by setting the Direction PD1 of arrangement of the IGBT QA1 and the FRD QA2 to the orientation direction (Y direction) PD substantially orthogonal to the orientation direction (X direction) TD of the GH(XZ) of graphite substrate 18GH.

In the PM 1 according to the eighteenth embodiment, in addition to the thermal diffusion effect due to the graphite structure, the stress applied of the bonded portion (Ag fired layer) can be reduced by changing a shape (e.g., the direction and vertical and horizontal sizes) of the semiconductor device Q (QA1, QA2) bonded on the surface electrode pattern.

The strong stress is applied to the bonded portion due to a difference between both CTEs in an orientation where the CTE is large since the thermal conductivity and CTE have an anisotropy on the graphite substrate 18GH when square-shaped semiconductor device Q is bonded on the graphite substrate 18GH. However, the stress applied to the bonded portion can be reduced by successfully matching the shape of the semiconductor device Q with the CTE of the graphite substrate 18GH.

The reduction of the stress to be applied to the bonded portion is not limited to the PM 1 according to the eighteenth embodiment, but can be similarly applied to the PM of the configurations according to other embodiments.

(Stress Relaxation Structure)

Hereinafter, the stress applied to the bonded portion will now be explained, as an example of a case where the graphite substrate having anisotropy in the CTE is applied to the PM according to the embodiments.

FIG. 19A shows a schematic planar pattern configuration (PMa) for explaining an arrangement example of an FRD SC1 and an IGBT SC2 with respect to the graphite substrate 18GH1. FIG. 19B shows a schematic planar pattern configuration (PMb) for explaining an arrangement example of an SiC MOSFET SC3 with respect to the graphite substrate 18GH1.

Although illustration is omitted in this explanation, the semiconductor device Q is actually bonded to the surface electrode pattern disposed on the graphite substrate 18GH1.

In the case of the IGBT including a diode etc., as shown in FIG. 19A, the FRD SC1 and the IGBT SC2 are arranged side by side as the semiconductor device Q, on the graphite substrate 18GH1.

In the case of the SiC MOSFETs SC3 and SC4, as shown in FIG. 19B, the SiC MOS SC3 are arranged side by side as the semiconductor device Q on the graphite substrate 18GH1.

If the orientation of the CTE of the graphite substrate 18GH1 is X=0.5 ppm/K, Y=25 ppm/K, and z=0.5 ppm/K, for example, a rectangular device (H1>C1) having a size H1 in the X direction and a size C1 in the Y direction is used for each of the FRD SC1, the IGBT SC2, and the SiC MOS SC3, and each Y direction C1 is made to correspond to an orientation of which the CTE is larger. Thus, reduction of a stress applied to the bonded portion is achieved with a thermal diffusion effect by graphite substrate 18GH1.

Hereinafter, a stress reduction effect by applying the graphite substrate to the PMs according to the fifteenth to eighteenth embodiments will now further be explained.

Working Example 1

FIG. 20A shows an example of a schematic planar pattern configuration of a simulation model MD for executing a simulation of a stress applied to the bonded portion, when the graphite substrate having anisotropy in the CTE is applied thereto. FIG. 20B shows a schematic cross-sectional structure taken in the line VI-VI of FIG. 20A.

In this context, in the simulation model MD having the configuration shown in FIGS. 20A and 20B, a laminated substrate structure composed by including a lower surface Cu foil (back electrode pattern 22)/an $Si_3N_4$ substrate (ceramics substrate 21)/a graphite plate (graphite substrates 18GH1 and 18GH2)/an upper surface Cu foil (electrode patterns 231 and 232) is referred to as a graphite insulating substrate 20.

Since the graphite plate has an anisotropy thermal conductivity and CTE, a strong stress is applied on the bonded portion due to a difference between the CTEs in an orientation of which the CTE is larger, when die bonding of square-shaped device is performed. However, the stress applied to the bonded portion can be reduced by successfully matching the shape of the device with the CTE of the graphite plate.

In the simulation model MD, as shown in FIGS. 20A and 20B, an SiN based ceramics substrate 21 of 10 mm (GX)×21 mm (LY1) is used, a Cu foil of 10 mm (GX)×10 mm (LY) is used as the surface electrode pattern 231 to which the semiconductor device Q is bonded, and the surface electrode pattern 232 to which a block electrode (not shown) is bonded.

The surface electrode patterns 231 and 232 are separated from each other by the distance LY2=1 mm.

The size of the back electrode pattern 22 is approximately identical to the size of the ceramics substrate 21 (10 mm×21 mm).

The graphite substrates 18GH1 and 18GH2 are substantially identical sizes (10 mm×10 mm) to the surface electrode patterns 231 and 232.

A square-shaped SiC MOSFET of 5 mm (H1)×5 mm (C1) is used (H1=C1) as the semiconductor device Q, and is bonded on a substantially center portion of the surface electrode pattern 231 (at distances of X1 (2.5 mm) and Y1 (2.5 mm) from edges of the surface electrode pattern 231) with the Ag fired layer 27.

The orientation of the CTE of the graphite substrates 18GH1 and 18GH2 is X=25 ppm/K, Y=0.1 ppm/K, and Z=0.1 ppm/K, for example.

As shown in FIG. 21, the thickness (mm) of each part is optimized so that the thermal resistance may become the lowest. In the case of the simulation model MD, for example, the semiconductor device 10 is optimized to approximately 0.35 mm thickness, the graphite substrates 18GH1 and 18GH2 are optimized to approximately 1.5 mm thickness, the ceramics substrate 21 is optimized to approximately 0.32 mm thickness, the back electrode pattern 22 is optimized to approximately 0.2 mm thickness, and the Ag fired layer 27 is optimized to approximately 0.05 mm thickness.

In such a configuration, a stress applied to the Ag fired layer 27 is obtained by calculating Mises stress under 25° C., as a non-stress state is at 200° C., for example.

FIG. 22 shows a result (whole warped shape) of executing a simulation of a stress applied to the Ag fired layer 27 in the case of the orientation of CTE of the graphite substrates 18GH1 and 18GH2 is X=25 ppm/K, Y=0.5 ppm/K, and Z=0.5 ppm/K, for example, in the simulation model MD of the configuration shown in FIG. 20.

The warpage of the simulation model MD is 0.079 μm at maximum, but is 26.322 μm at minimum.

In this context, Mises stress is one of equivalent stresses used in order to indicate a stress state which occurs inside a substance as a single value. The definitional equation of Mises $$\sigma_w = \sqrt{\frac{1}{2}\{(\sigma 1 - \sigma 2)^2 + (\sigma 2 - \sigma 3)^2 + (\sigma 3 - \sigma 1)^2\}}$$

stress is expressed as follows:

where σ1 is the maximum principal stress, σ2 is an intermediate principal stress, and σ3 is the minimum principal stress, in the definitional equation. In this case, the principal stress σ1, σ2, and σ3 applied to the Ag fired layer 27 are respectively selected from a principal stress in the X direction, a principal stress in the Y direction, and a principal stress in the Z axial direction.

Next, simulation models respectively having different configurations will now be explained. In the simulation model MD having the configuration shown in FIG. 20, a simulation model MD1 is corresponds to a case of bonding the square-shaped semiconductor device Q.

FIG. 23A illustrates a case where bonding a longwise semiconductor device (H2×C2, H2>C2) Qa (simulation model MD2), in the simulation model MD having the configuration shown in FIG. 20. A rectangular SiC MOSFET of 6.25 mm (H2)×4 mm (C2) is used as the semiconductor device Qa, and is bonded on a substantially center portion of the surface electrode pattern 231 (at distances of X2 (1.875 mm) and Y2 (3 mm) from edges of the surface electrode pattern 232) with the Ag fired layer 27.

FIG. 23B illustrates a case where bonding a laterally-long semiconductor device (H3×C3, H3<C3) Qb (simulation model MD3), in the simulation model MD having the configuration shown in FIG. 20. A rectangular SiC MOSFET of 4 mm (H3)×6.25 mm (C3) is used as the semiconductor device Qb, and is bonded on a substantially center portion of the surface electrode pattern 231 (at distances of X3 (3 mm) and Y3 (1.875 mm) from edges of the surface electrode pattern 231) with the Ag fired layer 27.

FIG. 23C illustrates a case where bonding a longwise semiconductor device (H4×C4, H4 is extremely larger than C4) Qc (simulation model MD4), in the simulation model MD having the configuration shown in FIG. 20. A rectangular SiC MOSFET of 8.33 mm (H4)×3 mm (C4) is used as the semiconductor device Qc, and is bonded on a substantially center portion of the surface electrode pattern 231 (at distances of X4 (0.835 mm) and Y4 (3.5 mm) from edges of the surface electrode pattern 231) with the Ag fired layer 27.

FIG. 23D illustrates a case where bonding a laterally-long semiconductor device (H5×C5, C5 is extremely larger than H5) Qd (simulation model MD5), in the simulation model MD having the configuration shown in FIG. 20. A rectangular SiC MOSFET of 3 mm (H5)×8.33 mm (C5) is used as the semiconductor device Qd, and is bonded on a substantially center portion of the surface electrode pattern 231 (at distances of X5 (3.5 mm) and Y5 (0.835 mm) from edges of the surface electrode pattern 231) with the Ag fired layer 27.

In the case of applying the graphite substrate having anisotropy in the CTE, in the power modules according to the fifteenth to eighteenth embodiments, FIG. 24A is a characteristic diagram for explaining a relationship between the distance (Y1-Y5) from the edge (EDG) and Mises stress (GPa) when executing the simulation using the simulation models MD1 to MD5, FIG. 24B is a characteristic diagram for explaining a relationship between the simulation models MD1 to MD5 and a ratio of Mises stress.

FIGS. 24A and 24B show an example where the orientation of the CTE of the graphite substrate 18GH1 is X=25 ppm/K, Y=0.5 ppm/K, and Z=0.5 ppm/K, for example. FIG. 24A shows Mises stress to be applied to the Ag fired layer 27. The CTE is set as 1 GPa with respect to the case of a simulation model MD1 in FIG. 24B.

As shown in FIG. 24A and FIG. 24B, if the ratio of Mises stress of the simulation model MD1 is set as 1, the ratio of Mises stress of the simulation models MD2 and MD4 is 1.05, the ratio of Mises stress of the simulation model MD3 is 0.83, and the ratio of Mises stress of the simulation model MD5 is 0.84.

If the orientation of the CTE of the graphite substrate 18GH1 is X=25 ppm/K, Y=0.5 ppm/K, and z=0.5 ppm/K, for example, the stress (at 25° C.) applied to the Ag fired layer 27 of the simulation models MD1 to MD5 can be reduced by decreasing the size of the orientation (X) of which the CTE is larger, like the stress in the semiconductor devices Qb and Qd of the simulation models MD3 and MD5, as a non-stress state is at 200° C., for example.

Working Example 2

Next, an example of a stress applied to the Ag fired layer 27 where there is no surface electrode 232 pattern will now be explained.

FIG. 25A shows a schematic planar pattern configuration of the simulation model MD1 in the case of including no surface electrode pattern 231, and FIG. 25B shows a schematic cross-sectional structure taken in the line VII-VII of FIG. 25A.

The orientation of CTE of the graphite substrate 18GH1 is X=0.1 ppm/K, Y=25 ppm/K, and Z=0.1 ppm/K, for example, and as shown in FIG. 21, the thickness (mm) of each part (Q, 18GH1, 21, 231, and 27) is optimized so that the thermal resistance may become the lowest.

Also the cases of the simulation models MD2 and MD3 are substantially similar thereto, except for shapes of the semiconductor devices Qa and Qb being different from the MD1 in FIGS. 25A and 25B.

FIG. 26A is a characteristic diagram for explaining a relationship between the distance (Y1-Y5) from the edge (EDG) and Mises stress when executing the simulation using the simulation models MD1 to MD3, in the case of applying the graphite substrate having anisotropy in the CTE, in the power modules according to the fifteenth to eighteenth embodiments. FIG. 26B is a characteristic diagram for explaining a relationship between the simulation models MD1 to MD3 and a ratio of Mises stress.

FIGS. 26A and 26B show an example where the orientation of the CTE of the graphite substrate 18GH1 is X=0.5 ppm/K, Y=25 ppm/K, and Z=0.5 ppm/K, for example.

FIG. 26A shows Mises stress to be applied to the Ag fired layer 27.

The CTE is set as 1 GPa with respect to the case of a simulation model MD1 in FIG. 26B.

As shown in FIGS. 26A and 26B, if the ratio of Mises stress of the simulation model MD1 is 1, the ratio of Mises stress of the simulation model MD2 is 0.96, and the ratio of Mises stress of the simulation model MD3 is 1.02.

More specifically, if the orientation of the CTE of the graphite substrate 18GH1 is X=0.5 ppm/K, Y=25 ppm/K, and Z=0.5 ppm/K, and a non-stress state is at 200° C., for example, the stress (at 25° C.) applied to the Ag fired layer 27 of the simulation models MD1 to MD3 can be reduced by decreasing the size of the orientation (Y) of which the CTE is larger, like the stress in the semiconductor device Qa of the simulation model MD2.

In the simulation models MD1 to MD3 of the configuration shown in FIGS. 23 and 25, FIGS. 92A to 92C show a result (whole warped shape) of executing a simulation of a stress applied to the Ag fired layer 27 in the case of the orientation of CTE of the graphite substrate 18GH1 is X=0.1 ppm/K, Y=25 ppm/K, and Z=0.1 ppm/K, for example.

The warpage of the simulation model MD1 is 22.599 µm at maximum, but is 0.128 µm at minimum. The warpage of the simulation model MD2 is 22.313 µm at maximum, but is 0.146 µm at minimum. The warpage of the simulation model MD3 is 22.972 µm at maximum, but is 0.322 µm at minimum.

The cases of being applied to the 1-in-1 module type PMs as the semiconductor device have been explained for the PMs 1 according to the fifteenth to eighteenth embodiments, but it is not limited thereto. For example, it is applicable to 2-in-1 module type PMs, 4-in-1 module type PMs, 6-in-1 module type PMs, 7-in-1 module type PMs composed of 6-in-1 module type PMs including a snubber capacitor etc., 8-in-1 module type PMs, 12-in-1 module type PMs, 14-in-1 module type PMs, etc.

Concrete Example of Semiconductor Device

FIG. 28 shows a schematic circuit representation of SiC MOSFET of 1-in-1 module type PM 50 applicable as a semiconductor device, in the PMs according to the fifteenth to eighteenth embodiments.

The diode DI connected to the SiC MOSFET Q inversely in parallel is shown in FIG. 28. It can ne also omitted, if using a parasitic diode as diode DI. A main electrode of the SiC MOSFET Q is expressed with a drain terminal DT and a source terminal ST. Moreover, an IGBT (not shown) of the 1 in 1 module 50 applicable as the semiconductor device, corresponding to the PMs 1 according to the fifteenth to eighteenth embodiments, can also be realized.

Moreover, FIG. 29 shows a detailed circuit representation of SiC MOSFET of 1-in-1 module type PM 50 applicable as a semiconductor device, in the PMs according to the fifteenth to eighteenth embodiments.

The PMs 1 according to the fifteenth to eighteenth embodiments includes a configuration in which the semiconductor device is the 1-in-1 module type PM 50, for example. More specifically, one piece of the MOSFET Q is included in one module. As an example, five chips (MOSFET×5) can be mounted thereon, and a maximum of five pieces of the MOSFETs Q respectively can be connected to one another in parallel. Note that it is also possible to mount a part of five pieces of the chips for the diode DI thereon.

More particularly, as shown in FIG. 29, a sense MOSFET Qs is connected to the SiC MOSFET Q in parallel. The sense MOSFET Qs is formed as a minuteness transistor in the same chip as the SiC MOSFET Q.

In FIG. 29, reference numeral SS denotes a source sense terminal, reference numeral CS denotes a current sense terminal, and reference numeral G denotes a gate terminal. Note that, also in the SiC MOSFET Q according to the fifteenth to eighteenth embodiments, the sense MOSFET Qs may be formed as a minuteness transistor in the same chip. (Circuit Configuration)

Next, a circuit configuration example of the semiconductor device in the PMs 1 according to the fifteenth to eighteenth embodiments will now be more specifically explained.

There will now be explained a semiconductor package device (the so-called 2-in-1 type of module) in which two semiconductor devices are sealed into one mold resin, as a module applicable as the semiconductor device of PMs according to the fifteenth to eighteenth embodiments.

FIG. 30 shows a circuit configuration of the 2-in-1 module type PM (2-in-1 module) 130A to which the SiC MOSFETs Q1 and Q4 are applied as the semiconductor device, for example.

More specifically, as shown in FIG. 30, the 2 in 1 module 130A includes a configuration of module with the built-in half-bridge in which two SiC MOSFETs Q1 and Q4 are included as one module.

In this case, although the module can be considered as one large transistor, one chip or a plurality of chips may be contained therein. More specifically, although the modules include 1-in-1 module, 2-in-1 module, 4-in-1 module, 6-in-1 module, etc. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 30, the 2-in-1 module 130A includes two SiC MOSFETs Q1 and Q4, and diodes DI1 and DI4 connected in reversely parallel to the SiC MOSFETs Q1 and Q4, as one module.

In FIG. 30, reference numeral G1 denotes a lead terminal for gate signal (the so-called gate terminal) of the SiC MOSFET Q1, and reference numeral S1 denotes a lead terminal for source signal (the so-called source sense terminal) of the SiC MOSFET Q1. Similarly, reference numeral G4 denotes a lead terminal for gate signal of the SiC MOSFET Q4, and reference numeral S4 denotes a lead terminal for source signal of the SiC MOSFET Q4.

Reference numeral P denotes a positive side power input terminal electrode, reference numeral N denotes a negative side power input terminal electrode, and reference numeral O denotes an output terminal electrode.

Moreover, a 2-in-1 module (not shown) to which the IGBT is applied as the semiconductor devices Q1 and Q4 can also be realized, as a module applicable as the semiconductor device of the power module according to fifteenth to eighteenth embodiments.

The semiconductor devices Q2 and Q5 and semiconductor devices Q3 and Q6 applicable to the PMs 1 according to the fifteenth to eighteenth embodiments can also be similarly realized.

—Power Supply Equipment—

According to the 2-in-1 module 130A according to the fifteenth to eighteenth embodiments, power supply equipment (power supply circuit) can be configured so that an SiC MOSFET (first switching device) Q1 and an SiC MOSFET (second switching device) Q4 are connected in series between a positive side power input terminal electrode (first power source) P and a negative side power input terminal electrode (second power source) N, and a voltage of the connecting point is output from the output terminal electrode O.

In particular, there can be provided the power supply equipment having a simple structure and satisfied heat diffusibility, capable of further reducing thermal resistance by composing the SiC MOSFETs Q1 and Q4 respectively as a plurality of chips, and by setting the distance (X2) between the chips in an arrangement direction of the plurality of the chips shorter than the distance (Y1) from each chip to an end surface of the graphite substrate, in the power supply equipment.

Although the detailed description is omitted herein, also in the case of the PM according to other embodiments, it is similarly applicable to the PM to which the IGBT Q1, Q4 is applied, for example as the semiconductor device. Moreover, the plurality of chips may be arranged side by side respectively so as to be substantially orthogonal to the orientation direction of the graphite substrate.

(Device Structure)

FIG. 31 shows a schematic cross-sectional structure of an SiC MOSFET 130A including a source pad electrode SP and a gate pad electrode GP, which is an example of the semiconductor devices Q1 and Q4 applicable to the PMs according to the fifteenth to eighteenth embodiments.

As shown in FIG. 31, the SiC MOSFET 130A includes: a semiconductor layer 31 composed by including an n− type high resistivity layer; a p body region 32 formed on a front surface side of the semiconductor layer 32; a source region 33 formed on a front side surface of the p body region 32; a gate insulating film 33 disposed on a front side surface of the semiconductor layer 31 between the p body regions 32S; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

The gate pad electrode GP is connected to the gate electrode 35 disposed on the gate insulating film 34, and the source pad electrode SP is connected to the source electrode 36 connected to the source region 33 and the p body region 32. Moreover, as shown in FIG. 31, the gate pad electrode GP and the source pad electrode SP are disposed on an interlayer insulating film 39 for passivation which covers the surface of the SiC MOSFET 130A.

In addition, a microstructural transistor structure (not shown) may be formed in the semiconductor layer 31 below the gate pad electrode GP and the source pad electrode SP.

Furthermore, as shown in FIG. 31, the source pad electrode SP may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 31, the SiC MOSFET 130A may be composed by including a trench-gate type n channel vertical SiC-TMOSFET, etc., shown in FIG. 34 mentioned below.

Alternatively, a GaN-based FET etc. instead of the SiC-based MOSFET can also be adopted to the semiconductor device which can be applied to the PMs according to the fifteenth to eighteenth embodiments.

The semiconductor devices (Q2, Q5) and (Q3, Q6) applicable to the PMs according to the fifteenth to eighteenth embodiments can also be similarly realized.

Furthermore, a wide-bandgap type semiconductor of which the bandgap energy is from 1.1 eV to 8 eV, for example, can be used for the semiconductor devices Q1 to Q9 applicable to the PMs according to the fifteenth to eighteenth embodiments.

Similarly, FIG. 32 shows a schematic cross-sectional structure of an IGBT 130B including an emitter pad electrode EP and a gate pad electrode GP, which is an example of the semiconductor devices (Q1, Q4) applicable to the PMs according to the fifteenth to eighteenth embodiments.

As shown in FIG. 32, the IGBT 130B includes: a semiconductor layer 31 composed by including an n− type high resistivity layer; a p body region 32 formed on a front surface side of the semiconductor layer 32; an emitter region 33E formed on a front side surface of the p body region 32; a gate insulating film 33 disposed on a front side surface of the semiconductor layer 31 between the p body regions 32S; a gate electrode 35 disposed on the gate insulating film 34; an emitter electrode 36E connected to the emitter region 33E and the p body region 32; a p+ collector region 37P disposed on a back side surface opposite to the surface of the semiconductor layer 31; and a collector electrode 38 connected to the p+ collector region 37P.

The gate pad electrode GP is connected to the gate electrode 35 disposed on the gate insulating film 34, and the emitter pad electrode EP is connected to the emitter electrode 36E connected to the emitter region 33E and the p body region 32. Moreover, as shown in FIG. 32, the gate pad electrode GP and the emitter pad electrode EP are disposed on an interlayer insulating film 39 for passivation which covers the surface of IDBT 130B.

In addition, a microstructural IGBT structure (not shown) may be formed in the semiconductor layer 31 below the gate pad electrode GP and the emitter pad electrode EP.

Furthermore, as shown in FIG. 32, the emitter pad electrode EP may be disposed to be extended onto the interlayer insulating film 39 for passivation, also in the IGBT structure of the center portion.

In FIG. 32, although the IGBT 130B is composed by including a planar-gate-type n channel vertical IGBT, the IGBT 130B may be composed by including a trench-gate-type n channel vertical IGBT, etc.

The semiconductor devices (Q2, Q5) and (Q3, Q6) applicable to the PMs according to the fifteenth to eighteenth embodiments can also be similarly realized.

SiC based power devices, e.g. SiC DIMOSFET and SiC TMOSFET, or GaN based power devices, e.g. GaN based High Electron Mobility Transistor (HEMT), are applicable as the MOSFETs Q1 to Q6. In some instances, power devices, e.g. Si based MOSFETs and IGBT, are also applicable thereto.

—SiC DIMOSFET—

FIG. 33 shows a schematic cross-sectional structure of an SiC DIMOSFET 130D, which is an example of a semiconductor device which can be applied to the PMs according to the fifteenth to eighteenth embodiments.

As shown in FIG. 33, the SiC DIMOSFET 130D includes: a semiconductor layer 31 composed by including an n− type high resistivity layer; a p body region 32 formed on a front surface side of the semiconductor layer 32; an n+ source region 33 formed on a front side surface of the p body region 32; a gate insulating film 33 disposed on a front side surface of the semiconductor layer 31 between the p body regions 328; a gate electrode 35 disposed on the gate insulating film 34; a source electrode 36 connected to the source region 33 and the p body region 32; an n+ drain region 37 disposed on a back side surface opposite to the surface of the semiconductor layer 31; and a drain electrode 38 connected to the n+ type drain area 37.

In the SiC DIMOSFET 130D shown in FIG. 33, the p body region 32 and the n+ source region 33 formed on the front side surface of the p body region 32 are formed with double ion implantation (DII), and the source pad electrode SP is connected to the source region 33 and the source electrode 36 connected to the p body region 32.

Moreover, a gate pad electrode GP (not shown) is connected to the gate electrode 35 disposed on the gate insulating film 34. Moreover, as shown in FIG. 33, the gate pad electrode GP and the source pad electrode SP are disposed on an interlayer insulating film 39 for passivation which covers the surface of the SiC DIMOSFET 130D.

As shown in FIG. 33, in the SiC DIMOSFET, since a depletion layer as shown with the dashed lines is formed in the semiconductor layer 31 composed of a n− type high resistivity layer inserted into the p body regions 32, channel resistance $R_{JFET}$ accompanying the junction type FET (JFET) effect is formed. Moreover, as shown in FIG. 32, body diodes BD are respectively formed between the p body regions 32 and the semiconductor layers 31.

—SiC TMOSFET—

FIG. 34 shows a schematic cross-sectional structure of an SiC TMOSFET, which is an example of a semiconductor device which can be applied to the PMs according to the fifteenth to eighteenth embodiments.

As shown in FIG. 34, the SiC TMOSFET 130C includes: a semiconductor layer 31 composed by including an n layer; a p body region 32 formed on a front surface side of the semiconductor layer 31N; an n+ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n+ drain region 37 disposed on aback side surface opposite to the surface of the semiconductor layer 31N; and a drain electrode 38 connected to the n+ type drain area 37.

In FIG. 34, a trench gate electrode 35TG passing through the p body region 32 is formed in the trench formed up to the semiconductor layer 31N via the gate insulating film 34 and the interlayer insulating films 39U and 39B; and the source pad electrode SP is connected to the source region 33 and the source electrode 36 connected to the p body region 32.

Moreover, a gate pad electrode GP (not shown) is connected to the trench gate electrode 35TG disposed on the gate insulating film 34. Moreover, as shown in FIG. 34, the gate pad electrode GP and the source pad electrode SP are disposed on an interlayer insulating film 39U for passivation which covers the surface of the SiC TMOSFET 130C.

In the SiC TMOSFET 130C, channel resistance $R_{JFET}$ accompanying the junction type FET (JFET) effect as the SiC DIMOSFET 130D is not formed. Moreover, body diodes BD are respectively formed between the p body regions 32 and the semiconductor layers 31N, in the same manner as FIG. 33.

Example of Application

FIG. 35 shows an example of a circuit configuration in which the SiC MOSFET is applied as a semiconductor device, and a snubber capacitor C is connected between the power terminal PL and the earth terminal (ground terminal) NL, in a three-phase AC inverter 40A composed using the PMs according to the fifteenth to eighteenth embodiments.

Similarly, a three-phase AC inverter (not shown) in which a snubber capacitor C is connected between the power terminal PL and the earth terminal (ground terminal) NL can also be realized by applying the IGBT as the semiconductor device.

When connecting the PM according to the embodiments to the power source E to execute switching operations, large surge voltage Ldi/dt is produced by an inductance L included in a connection line due to a high switching speed of the SiC MOSFET and IGBT. For example, the surge voltage Ldi/dt is expressed as follows: $Ldi/dt=3\times10^9$ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

Concrete Example

Next, there will now be explained the three-phase AC inverter 42A composed using the PMs according to the fifteenth to eighteenth embodiments to which the SiC MOSFET is applied as the semiconductor device, with reference to FIG. 36.

As shown in FIG. 36, the three-phase AC inverter 42A includes: a power module unit 130 connected to a gate driver (GD) 180; a three-phase AC motor unit 51; a power supply or storage battery (E) 53; and a converter 55. U-phase, V-phase, and W-phase inverters are respectively connected to the three-phase AC motor unit 54 so as to correspond to U phase, V phase, and W phase of the three-phase AC motor unit 51, in the power module unit 130.

In this case, the GD 180 is connected to SiC MOSFETs Q1 and Q4, SiC MOSFETs Q2 and Q5, and SiC MOSFETs Q3 and Q6.

The power module unit 130 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected. Moreover, flywheel diodes DI1 to DI6 are respectively connected reversely in parallel between the source and the drain of the SiC MOSFETs Q1 to Q6.

Although not shown, a three-phase AC inverter composed by using the power module according to the fifteenth to eighteenth embodiments can also be realized by applying the IGBT as the semiconductor device.

As explained above, according to the fifteenth to eighteenth embodiments, the PM and the power supply equipment of which the heat diffusibility is satisfactory and the thermal resistance can be further reduced.

As the semiconductor device applicable to the PMs according to the fifteenth to eighteenth embodiments, not only SiC based power devices but also wide-bandgap type power devices, e.g. GaN-based or Si-based power device, can be adopted.

Moreover, it can be applied to not only molded-type power modules by which resin molding is performed but also power modules packaged with case type packages.

Other Embodiments

Some embodiments have been described, as a disclosure including associated description and drawings to be construed as illustrative, not restrictive. This disclosure makes clear a variety of alternative embodiments, working examples, and operational techniques for those skilled in the art.

Thus, the embodiments contain various embodiments etc. which have not been described an in this case.

INDUSTRIAL APPLICABILITY

The power module according to the embodiments can be used for manufacturing techniques for various semiconductor modules, e.g. IGBT modules, diode modules, MOS modules (Si, SiC, GaN), etc., using Si substrates, SiC substrates, and GaN substrates, and can also be applied to wide applicable fields including: industrial equipment, e.g. inverters for HEV (Hybrid Electric Vehicle)/EV (Electric Vehicle), and robots; inverters, converters for industries or household appliance, etc.; power supply equipment, etc.

What is claimed is:

1. A power module comprising:
   an insulating substrate having a first surface and a second surface opposite to the first surface;
   a plurality of first electrode patterns disposed on the second surface;
   a plurality of semiconductor devices arranged side-by-side on a surface of one of the plurality of first electrode patterns, the semiconductor devices generating heat during operation;
   a substrate disposed on the plurality of semiconductor devices and provided with an anisotropic thermal conductivity in a planar direction or/and a thickness direction thereof; and
   a second electrode pattern disposed between the substrate and the plurality of semiconductor devices and electrically connected to surface electrodes of the plurality of semiconductor devices,
   wherein an arrangement direction of the plurality of the semiconductor devices is within a range from −45 degree to +45 degrees, on the basis of an orientation direction in which a thermal conductivity of the substrate is relatively low.

2. The power module according to claim 1, wherein the arrangement direction of the plurality of the semiconductor devices is substantially orthogonal to an orientation direction in which a thermal conductivity of the substrate is relatively high.

3. The power module according to claim 1, wherein an interval distance in the arrangement direction of the plurality of the semiconductor devices is shorter than a distance each of from the semiconductor device to an end surface of the substrate parallel to the arrangement direction.

4. The power module according to claim 1, wherein the substrate is provided with an orientation where a coefficient of thermal conductivity in the thickness direction is relatively higher than the coefficient of thermal conductivity in the plane direction.

5. A power module comprising:
   an insulating substrate having a first surface and a second surface opposite to the first surface;
   a plurality of first electrode patterns disposed on the second surface;
   a plurality of semiconductor devices arranged side-by-side on a surface of one of the plurality of electrode patterns, the semiconductor devices generating heat during operation;
   a substrate disposed on the plurality of semiconductor devices and provided with an anisotropic thermal conductivity in a planar direction or/and a thickness direction thereof; and
   a second electrode pattern disposed between the substrate and the plurality of semiconductor devices and electrically connected to surface electrodes of the plurality of semiconductor devices,
   wherein a distance between the plurality of semiconductor devices is a distance where the heat from each of the plurality of semiconductor devices does not overlap one another on a surface opposite to the semiconductor device side of the substrate when the heat from each of the plurality of semiconductor devices is respectively spread at predetermined angles as the heat is transferred to the opposite surface.

6. The power module according to claim 5, wherein the substrate is provided with an orientation in which a coefficient of thermal conductivity in the thickness direction is relatively higher than the coefficient of thermal conductivity in the plane direction.

7. The power module according to claim 1, wherein the semiconductor device comprises one selected from the group consisting of SiC MOSFET and IGBT.

8. The power module according to claim 5, wherein the semiconductor device comprises one selected from the group consisting of SiC MOSFET and IGBT.

9. The power module according to claim 1, wherein the plurality of semiconductor devices are substantially linearly arranged along the orientation direction or are substantially linearly arranged along a direction inclined at a predetermined angle with respect to the orientation direction.

10. The power module according to claim 5, wherein the plurality of semiconductor devices are substantially linearly arranged along an orientation direction where a thermal conductivity of the graphite substrate is relatively low, or are substantially linearly arranged along a direction inclined at a predetermined angle with respect to the orientation direction.

11. The power module according to claim 1, wherein the plurality of semiconductor devices are arranged in zigzag with respect to the orientation direction.

12. The power module according to claim 5, wherein the plurality of semiconductor devices are arranged in zigzag with respect to an orientation direction in which a thermal conductivity of the graphite substrate is relatively low.

13. The power module according to claim 1, wherein the power module includes a configuration of module with the built-in half-bridge in which two pieces of the semiconductor devices are included as one module.

14. The power module according to claim 5, wherein a distance between the semiconductor devices is equal to or greater than approximately twice as long as a distance from the semiconductor devices to the opposite surface of the substrate.

15. The power module according to claim 1, wherein the substrate is a graphite substrate.

16. The power module according to claim 5, wherein the substrate is a graphite substrate.

17. The power module according to claim 2, wherein the substrate is thicker than the wiring pattern.

18. The power module according to claim 5, wherein a wiring pattern is formed between the substrate and the plurality of semiconductor devices.

19. The power module according to claim 6, wherein the substrate is thicker than the wiring pattern.

20. The power module according to claim 1, wherein the plurality of first electrode patterns disposed on the substrate include a first-first electrode pattern on which the semiconductor devices are disposed, and a second-first electrode pattern different from the first electrode pattern, the second-first electrode pattern being disposed at a position away from a position where the first electrode pattern is disposed.

21. The power module according to claim 5, wherein the plurality of first electrode patterns disposed on the substrate include a first-first electrode pattern on which the semiconductor devices are disposed, and a second-first electrode pattern different from the first electrode pattern, the second-first electrode pattern disposed at a position away from a position where the first electrode pattern is disposed.

22. The power module according to claim 1, wherein the second electrode pattern is electrically connected to the electrodes of the plurality of semiconductor devices via a bonding member.

23. The power module according to claim 5, wherein the second electrode pattern is electrically connected to the electrodes of the plurality of semiconductor devices via a bonding member.

* * * * *